US011456420B2

(12) United States Patent
Scheible et al.

(10) Patent No.: US 11,456,420 B2
(45) Date of Patent: Sep. 27, 2022

(54) ORGANIC ELECTROLUMINESCENT DEVICE

(71) Applicant: Merck Patent GmbH, Darmstadt (DE)

(72) Inventors: Katja Scheible, Darmstadt (DE); Beate Burkhart, Darmstadt (DE); Nils Koenen, Griesheim (DE); Lara-Isabel Rodriguez, Darmstadt (DE); Sebastian Meyer, Frankfurt Am Main (DE); Rouven Linge, Darmstadt (DE); Miriam Engel, Darmstadt (DE); Aaron Lackner, Mannheim (DE); Holger Heil, Frankfurt Am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 33 days.

(21) Appl. No.: 16/628,173

(22) PCT Filed: Jun. 29, 2018

(86) PCT No.: PCT/EP2018/067536
§ 371 (c)(1),
(2) Date: Jan. 2, 2020

(87) PCT Pub. No.: WO2019/007825
PCT Pub. Date: Jan. 10, 2019

(65) Prior Publication Data
US 2020/0144505 A1 May 7, 2020

(30) Foreign Application Priority Data

Jul. 3, 2017 (EP) .................................... 17179343

(51) Int. Cl.
*H01L 51/00* (2006.01)
*H01L 51/50* (2006.01)
*H01L 51/56* (2006.01)

(52) U.S. Cl.
CPC ...... *H01L 51/0056* (2013.01); *H01L 51/0043* (2013.01); *H01L 51/0058* (2013.01); *H01L 51/5012* (2013.01); *H01L 51/5056* (2013.01); *H01L 51/56* (2013.01)

(58) Field of Classification Search
CPC ............ C09K 11/06; C09K 2211/1011; C07D 209/86; C07D 307/91; C07D 405/12; H01L 51/06; H01L 51/006; H01L 51/0061; H01L 51/0072; H01L 51/5012; H01L 51/5056; H01L 51/5088; H05B 33/14
See application file for complete search history.

(56) References Cited

U.S. PATENT DOCUMENTS

| | | | |
|---|---|---|---|
| 8,981,354 B2 | 3/2015 | Steudel et al. | |
| 2009/0174311 A1 | 7/2009 | Patel et al. | |
| 2011/0215715 A1 | 9/2011 | Wu et al. | |
| 2012/0037898 A1 | 2/2012 | Wu et al. | |
| 2012/0187382 A1 | 7/2012 | Rostovtsev et al. | |
| 2013/0087779 A1 | 4/2013 | Park et al. | |
| 2014/0367617 A1 | 12/2014 | Yoshida et al. | |
| 2015/0069303 A1* | 3/2015 | Eckes .................. | C08G 61/10 252/500 |
| 2015/0076415 A1* | 3/2015 | Heil ...................... | C08L 79/02 252/500 |
| 2015/0115204 A1 | 4/2015 | Sekine et al. | |
| 2015/0115245 A1 | 4/2015 | Archer | |
| 2015/0188069 A1 | 7/2015 | Patel et al. | |
| 2016/0254456 A1 | 9/2016 | Heil et al. | |
| 2019/0322796 A1 | 10/2019 | Burkhart et al. | |

FOREIGN PATENT DOCUMENTS

| | | |
|---|---|---|
| JP | 2007-520858 A | 7/2007 |
| JP | 2012-509346 A | 4/2012 |
| JP | 2012-527470 A | 11/2012 |
| JP | 2013-534026 A | 8/2013 |
| JP | 2014-212333 A | 11/2014 |
| JP | 2015-514839 A | 5/2015 |
| JP | 2017-500278 A | 1/2017 |
| WO | 2013/114976 A1 | 8/2013 |
| WO | 2013/146806 A1 | 10/2013 |
| WO | 2013156129 A1 | 10/2013 |
| WO | 2013156130 A1 | 10/2013 |
| WO | 2014111269 A2 | 7/2014 |

OTHER PUBLICATIONS

International Search Report dated Aug. 30, 2018 in International Application PCT/EP2018/067536.

* cited by examiner

*Primary Examiner* — Shane Fang
(74) *Attorney, Agent, or Firm* — Faegre Drinker Biddle & Reath LLP

(57) ABSTRACT

The present application relates to a blue light-emitting organic electroluminescent device (OLED) having an anode, a cathode, at least one blue light-emitting layer and at least one hole-transport layer, wherein the at least one blue light-emitting layer comprises an elongated bis-indenofluorene derivative as a main component and wherein the at least one hole-transport layer comprises a polymer with non-conjugated units as a main component as well as to a method for producing the organic electroluminescent device.

15 Claims, No Drawings

ORGANIC ELECTROLUMINESCENT DEVICE

RELATED APPLICATIONS

This application is a national stage entry, filed pursuant to 35 U.S.C. § 371, of PCT/EP2018/067536, filed Jun. 29, 2018, which claims the benefit of European Patent Application No. 17179343.3, filed Jul. 3, 2017, which is incorporated herein by reference in its entirety.

The present application relates to a blue light-emitting organic electroluminescent device (OLED) having an anode, a cathode, at least one blue light-emitting layer and at least one hole-transport layer, wherein the at least one blue light-emitting layer comprises an elongated bis-indenofluorene derivative as a main component and wherein the at least one hole-transport layer comprises a polymer with non-conjugated units as a main component as well as to a method for producing the organic electroluminescent device.

The structure of OLEDs in which organic semiconductors are employed as functional materials is well known. Generally, an OLED comprises an anode, a cathode and an organic light emitting unit. The last one organic light emitting unit comprises several functional layers like, for example, hole- and/or electron-injection layers, hole- and/or electron-transport layers and at least one organic light emitting layer.

In the case of OLEDs, there is considerable interest in improving the performance data, in particular lifetime, efficiency and operating voltage.

An improvement of the performance data of OLEDs has been achieved in the past, in that the materials of each single layer have been optimized.

Consequently, many classes of materials have been developed having very good blue light-emitting properties, such as bis-indenofluorene derivatives as disclosed for example in WO 2014/111269 A1.

Also, many classes of materials have been developed having very good hole-transport properties, such as polymers with ortho-substituted triarylamine units as disclosed for example in WO 2013/156129 A1 and WO 2013/156130 A1.

However, there is still a need for a further improvement of the performance data of OLEDs, especially an improvement of the efficiency.

Surprisingly, it has now been found that it is possible to further improve the performance of an OLED, if an elongated bis-indenofluorene derivative is used as a main component in the blue light-emitting layer and a polymer with non-conjugated units is used as a main component in the hole-transport layer.

The present application thus relates to an organic electroluminescent device comprising:
- an anode;
- an cathode;
- at least one blue light-emitting layer arranged between the cathode and the anode; and
- at least one hole-transport layer arranged between the anode and the at least one blue light-emitting layer;

wherein the at least one blue light-emitting layer comprises an elongated bis-indenofluorene derivative, and
wherein the at least one hole-transporting layer comprises a polymer with non-conjugated units.

In a preferred embodiment, the elongated bis-indenofluorene derivative is a compound of general formula (1),

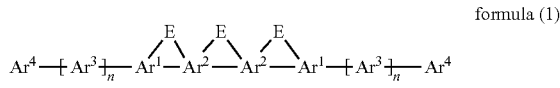

formula (1)

where the following applies to the symbols and indices used:

$Ar^1$ stands on each occurrence, identically or differently, for an aryl or heteroaryl group having 6 to 18 aromatic ring atoms, which may in each case be substituted by one or more radicals $R^1$, wherein at least one of the group $Ar^1$ in formula (1) has 10 or more aromatic ring atoms;

$Ar^2$ stands on each occurrence, identically or differently, for an aryl or heteroaryl group having 6 aromatic ring atoms, which may in each case be substituted by one or more radicals $R^1$;

$Ar^3$, $Ar^4$ stand on each occurrence, identically or differently, for an aromatic or heteroaromatic ring systems having 5 to 25 aromatic ring atoms, which may in each case be substituted by one or more radicals $R^1$;

E is identically or differently on each occurrence, selected from —$BR^0$—, —$C(R^0)_2$—, —$C(R^0)_2$—$C(R^0)_2$—, —$C(R^0)_2$—O—, —$C(R^0)_2$—S—, —$R^0C$=$CR^0$—, —$R^0C$=N—, $Si(R^0)_2$, —$Si(R^0)_2$—$Si(R^0)_2$—, —C(=O)—, —C(=$NR^0$)—, —C(=$C(R^0)_2$)—, —O—, —S—, —S(=O)—, —$SO_2$—, —$N(R^0)$—, —$P(R^0)$— and —$P((=O)R^0)$—, and two groups E may be in a cis- or trans-position relative to each other;

$R^0$, $R^1$ stand on each occurrence, identically or differently, for H, D, F, Cl, Br, I, CHO, CN, $N(Ar^5)_2$, $C(=O)Ar^5$, $P(=O)(Ar^5)_2$, $S(=O)Ar^5$, $S(=O)_2Ar^5$, $NO_2$, $Si(R^2)_3$, $B(OR^2)_2$, $OSO_2R^2$, a straight-chain alkyl, alkoxy or thioalkyl groups having 1 to 40 C atoms or branched or a cyclic alkyl, alkoxy or thioalkyl groups having 3 to 40 C atoms, each of which may be substituted by one or more radicals $R^2$, where in each case one or more non-adjacent $CH_2$ groups may be replaced by $R^2C$=$CR^2$, C≡C, $Si(R^2)_2$, $Ge(R^2)_2$, $Sn(R^2)_2$, C=O, C=S, C=Se, $P(=O)(R^2)$, SO, $SO_2$, O, S or $CONR^2$ and where one or more H atoms may be replaced by D, F, Cl, Br, I, CN or $NO_2$, an aromatic or heteroaromatic ring systems having 5 to 60 aromatic ring atoms, which may in each case be substituted by one or more radicals $R^2$, or an aryloxy groups having 5 to 40 aromatic ring atoms, which may be substituted by one or more radicals $R^2$, where two adjacent substituents $R^0$ and/or two adjacent substituents $R^1$ may form a mono- or polycyclic, aliphatic ring system or aromatic ring system, which may be substituted by one or more radicals $R^2$;

$R^2$ stands on each occurrence, identically or differently, for H, D, F, Cl, Br, I, CHO, CN, $N(Ar^5)_2$, $C(=O)Ar^5$, $P(=O)(Ar^5)_2$, $S(=O)Ar^5$, $S(=O)_2Ar^5$, $NO_2$, $Si(R^3)_3$, $B(OR^3)_2$, $OSO_2R^3$, a straight-chain alkyl, alkoxy or thioalkyl groups having 1 to 40 C atoms or branched or cyclic alkyl, alkoxy or thioalkyl groups having 3 to 40 C atoms, each of which may be substituted by one or more radicals $R^3$, where in each case one or more non-adjacent $CH_2$ groups may be replaced by $R^3C$=$CR^3$, C≡C, $Si(R^3)_2$, $Ge(R^3)_2$, $Sn(R^3)_2$, C=O, C=S, C=Se, $P(=O)(R^3)$, SO, $SO_2$, O, S or $CONR^3$ and where one or more H atoms may be replaced by D, F, Cl, Br, I, CN or $NO_2$, an aromatic or heteroaromatic ring systems having 5 to 60 aromatic ring atoms, which may in each case be substituted by one or more radicals $R^3$, or an aryloxy group having 5 to 60 aromatic ring atoms, which may be substituted by one or more radicals $R^3$, where two adjacent substituents $R^2$ may form a mono- or polycyclic, aliphatic ring system or aromatic ring system, which may be substituted by one or more radicals $R^3$;

$R^3$ stands on each occurrence, identically or differently, for H, D, F, Cl, Br, I, CN, a straight-chain alkyl, alkoxy or thioalkyl groups having 1 to 20 C atoms or branched or cyclic alkyl, alkoxy or thioalkyl groups having 3 to 20 C atoms, where in each case one or more non-adjacent $CH_2$ groups may be replaced by SO, $SO_2$, O, S and where one or more H atoms may be replaced by D, F, Cl, Br or I, or an aromatic or heteroaromatic ring system having 5 to 24 C atoms;

$Ar^5$ is an aromatic or heteroaromatic ring system having 5 to 24 aromatic ring atoms, preferably 5 to 18 aromatic ring atoms, which may in each case also be substituted by one or more radicals $R^3$;

n is an integer from 1 to 20;

wherein if n is equal to 1 and at least one of the group $Ar^3$ or $Ar^4$ stands for a phenyl group, then the compound of formula (1) bears at least one group $R^0$ or $R^1$, which stands for a straight-chain alkyl group having 2 to 40 C atoms or a branched or cyclic alkyl group having 3 to 40 C atoms, each of which may be substituted by one or more radicals $R^2$.

Concerning formula (1), the bonding between a group E and the groups $Ar^1$ and $Ar^2$ that are adjacent to this group E can occur at each free position of the adjacent groups $Ar^1$ and $Ar^2$. In the same way, the bonding between a group E and two groups $Ar^2$ that are adjacent to this group E can occur at each free position of these two adjacent groups $Ar^2$. Thus, it is to be understood that the groups E can be in cis- or in trans-position relative to each other, as mentioned in the definition of the group E above.

Adjacent substituents in the sense of the present invention are substituents which are bonded to atoms which are linked directly to one another or which are bonded to the same atom.

Furthermore, the following definitions of chemical groups apply for the purposes of the present application:

An aryl group in the sense of this invention contains 6 to 60 aromatic ring atoms, preferably 6 to 40 aromatic ring atoms, more preferably 6 to 20 aromatic ring atoms; a heteroaryl group in the sense of this invention contains 5 to 60 aromatic ring atoms, preferably 5 to 40 aromatic ring atoms, more preferably 5 to 20 aromatic ring atoms, at least one of which is a heteroatom. The heteroatoms are preferably selected from N, O and S. This represents the basic definition. If other preferences are indicated in the description of the present invention, for example with respect to the number of aromatic ring atoms or the heteroatoms present, these apply.

An aryl group or heteroaryl group here is taken to mean either a simple aromatic ring, i.e. benzene, or a simple heteroaromatic ring, for example pyridine, pyrimidine or thiophene, or a condensed (annellated) aromatic or heteroaromatic polycycle, for example naphthalene, phenanthrene, quinoline or carbazole. A condensed (annellated) aromatic or heteroaromatic polycycle in the sense of the present application consists of two or more simple aromatic or heteroaromatic rings condensed with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, iso-quinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aryloxy group in accordance with the definition of the present invention is taken to mean an aryl group, as defined above, which is bonded via an oxygen atom. An analogous definition applies to heteroaryloxy groups.

An aromatic ring system in the sense of this invention contains 6 to 60 C atoms in the ring system, preferably 6 to 40 C atoms, more preferably 6 to 20 C atoms. A heteroaromatic ring system in the sense of this invention contains 5 to 60 aromatic ring atoms, preferably 5 to 40 aromatic ring atoms, more preferably 5 to 20 aromatic ring atoms, at least one of which is a heteroatom. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, an $sp^3$-hybridised C, Si, N or O atom, an $sp^2$-hybridised C or N atom or an sp-hybridised C atom. Thus, for example, systems such as 9,9'-spirobifluorene, 9,9'-diarylfluorene, triarylamine, diaryl ether, stilbene, etc., are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl or heteroaryl groups are linked to one another via single bonds are also taken to be aromatic or heteroaromatic ring systems in the sense of this invention, such as, for example, systems such as biphenyl, terphenyl or diphenyltriazine.

An aromatic or heteroaromatic ring system having 5-60 aromatic ring atoms, which may in each case also be substituted by radicals as defined above and which may be linked to the aromatic or heteroaromatic group via any desired positions, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, terphenylene, quaterphenyl, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, iso-quinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole, or combinations of these groups.

For the purposes of the present invention, a straight-chain alkyl group having 1 to 40 C atoms or a branched or cyclic alkyl group having 3 to 40 C atoms or an alkenyl or alkynyl group having 2 to 40 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl. An alkoxy or thioalkyl group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The formulation that two or more radicals may form a ring with one another is, for the purposes of the present application, intended to be taken to mean, inter alia, that the two radicals are linked to one another by a chemical bond. This is illustrated by the following schemes:

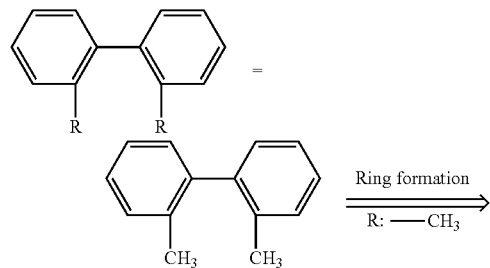

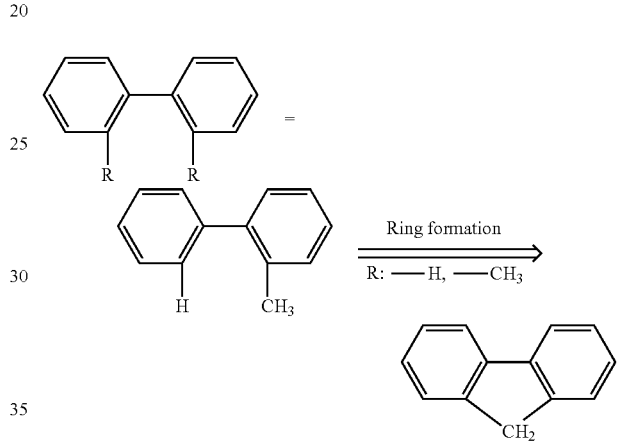

Furthermore, however, the above-mentioned formulation is also intended to be taken to mean that, in the case where one of the two radicals represents hydrogen, the second radical is bonded at the position to which the hydrogen atom was bonded, with formation of a ring. This is illustrated by the following scheme:

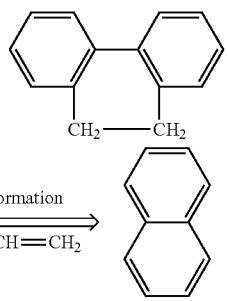

In accordance with a preferred embodiment, the bond between two adjacent groups $Ar^2$ and $Ar^1$ and the bond between two adjacent groups $Ar^2$ are in para positions.

In accordance with a preferred embodiment, n is an integer from 1 to 10, more preferably from 2 to 8, particularly preferably from 2 to 4.

In accordance with a preferred embodiment of the invention, the compounds of formula (1) bear at least one group $R^0$ or $R^1$, which stands for a straight-chain alkyl group having 2 to 40 C atoms, preferably 3 to 20 C atoms, very preferably 6 to 10 C atoms, or a branched or cyclic alkyl group having 3 to 40 C atoms, preferably 4 to 20 C atoms, very preferably 6 to 10 C atoms, each of which may be substituted by one or more radicals $R^2$.

It is very preferred that the compounds of formula (1) contain two adjacent groups $R^0$, which are selected, identically or differently, from a straight-chain alkyl group having 2 to 40 C atoms, preferably 3 to 20 C atoms, very preferably 6 to 10 C atoms, and a branched or cyclic alkyl group having 3 to 40 C atoms, preferably 4 to 20 C atoms, very preferably 6 to 10 C atoms, each of which may be substituted by one or more radicals $R^2$.

It is furthermore preferred that $Ar^1$ stands on each occurrence, identically or differently, for an aryl or heteroaryl group having 6 to 14 aromatic ring atoms, which may in each case be substituted by one or more radicals $R^1$, wherein at least one of the group $Ar^1$ in formula (1) has 10 or more aromatic ring atoms.

It is furthermore preferred that Ar² stands for a phenyl group, which may in each case be substituted by one or more radicals R¹;

In accordance to a preferred embodiment, both groups Ar¹ in formula (1) stand on each occurrence, identically or differently, for an aryl or heteroaryl group having 10 to 14 aromatic ring atoms, which may in each case be substituted by one or more radicals R¹.

More preferably, both groups Ar¹ in formula (1) stand for an aryl group having 10 aromatic ring atoms, which may in each case be substituted by one or more radicals R¹.

Particularly preferably, both groups Ar¹ stand for a naphthyl group, which may be substituted by one or more radicals R¹ and Ar² stand for a phenyl group, which may be substituted by one or more radicals R¹.

In accordance to a further preferred embodiment, one group Ar¹ in formula (1) stands for an aryl or heteroaryl group having 10 aromatic ring atoms and one group Ar¹ stands for an aryl or heteroaryl group having 6 aromatic ring, which may in each case be substituted by one or more radicals R¹.

Particularly preferably, one group Ar¹ stands for a naphthyl group and one group Ar¹ stands for a phenyl, which may in each case be substituted by one or more radicals R¹, and Ar² stand for a phenyl group, which may be substituted by one or more radicals R¹.

It is preferred that the group E is, identically or differently, on each occurrence, selected from —C(R⁰)₂—, —C(R⁰)₂—C(R⁰)₂—, —R⁰C=CR⁰—, —Si(R⁰)₂—, —C(=O)—, —O—, —S—, —S(O₂)— and N(R⁰), more preferably from —C(R⁰)₂—, —C(R⁰)₂—C(R⁰)₂—, —O—, —S— and N(R⁰). It is particularly preferred that E stands for —C(R⁰)₂—.

Preferably, R⁰ is selected on each occurrence, identically or differently, from the group consisting of H, D, F, CN, Si(R²)₃, a straight-chain alkyl having 1 to 10 C atoms or a branched or cyclic alkyl group having 3 to 10 C atoms, each of which may be substituted by one or more radicals R², where in each case one or more H atoms may be replaced by F, or an aryl or heteroaryl group having 5 to 40 aromatic ring atoms, which may in each case be substituted by one or more radicals R², where two adjacent substituents R⁰, may form a mono- or polycyclic, aliphatic ring system or aromatic ring system, which may be substituted by one or more radicals R².

According to a preferred embodiment of the invention, E stands for —C(R⁰)₂ and the two adjacent substituents R⁰ of the group —C(R⁰)₂— form a ring system, so that a spiro group is formed. More preferably, the two adjacent substituent R⁰ form a spiro-cyclohexane ring or a spiro-cyclopentane ring.

It is furthermore preferred that R¹ is selected, identically or differently on each occurrence, from the group consisting of H, D, F, CN, a straight-chain alkyl or alkoxy group having 1 to 10 C atoms or a branched or cyclic alkyl or alkoxy group having 3 to 10 C atoms, each of which may be substituted by one or more radicals R², where one or more non-adjacent CH₂ groups may be replaced by O and where one or more H atoms may be replaced by F, an aromatic or heteroaromatic ring system having 5 to 24 aromatic ring atoms, which may in each case be substituted by one or more radicals R².

It is furthermore preferred that R² is selected, identically or differently on each occurrence, from the group consisting of H, D, F, CN, a straight-chain alkyl or alkoxy group having 1 to 10 C atoms or a branched or cyclic alkyl or alkoxy group having 3 to 10 C atoms, each of which may be substituted by one or more radicals R³, where one or more non-adjacent CH₂ groups may be replaced by O and where one or more H atoms may be replaced by F, an aromatic or heteroaromatic ring system having 5 to 24 aromatic ring atoms, which may in each case be substituted by one or more radicals R³.

The compounds of general formula (1) are preferably selected from the compounds of formula (1-1) and formula (1-2),

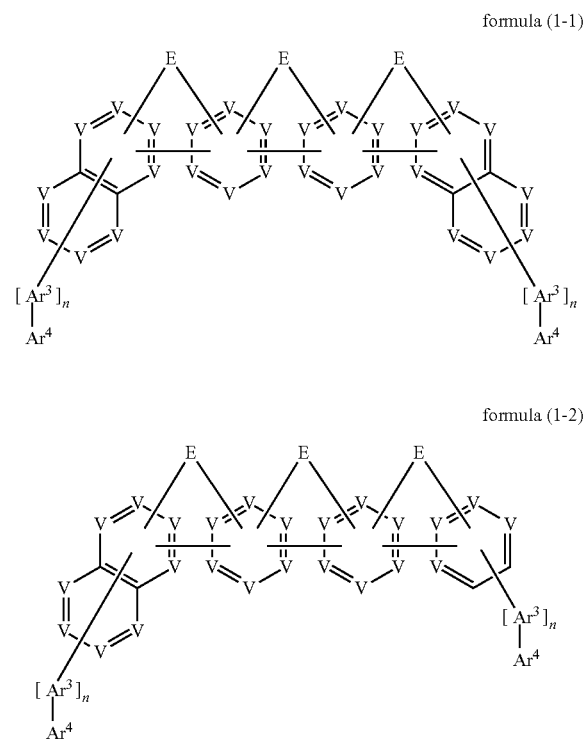

formula (1-1)

formula (1-2)

where the symbols E, Ar³, Ar⁴ and the index n have the same meaning as above, and where:

V is on each occurrence, identically or differently, CR¹ or N, wherein V is C when V is bonded to a group Ar³ or to a group E.

Concerning formulae (1-1) and (1-2), the bonding between a group E and an adjacent 6-membered ring containing X or an adjacent 10-membered ring containing E can occur at each free position. Thus, it is to be understood that the groups E can be in cis- or in trans-position relative to each other, as mentioned in the definition of the group E above.

It is preferred that maximal two groups V per 6-membered ring are equal to N. More preferably, V stands on each occurrence for CR¹.

In accordance with a preferred embodiment of the invention, the compounds of formula (1), (1-1) and (1-2) are selected from the compounds of the following formulae (1-1-1) to (1-1-11) and (1-2-1) to (1-2-7), formula (1-1-1)
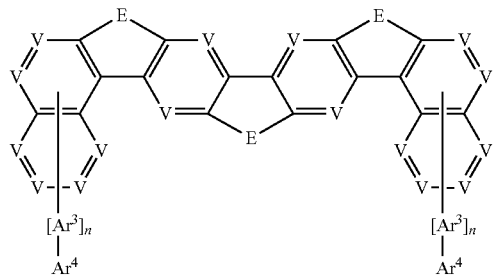
formula (1-1-2)
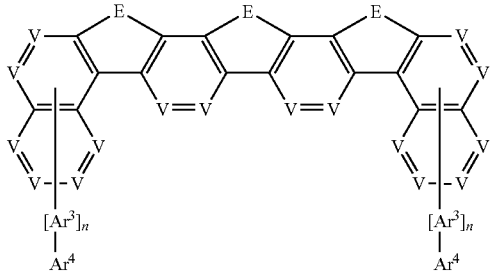
formula (1-1-3)
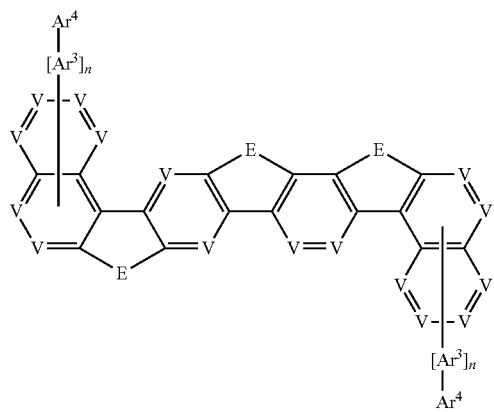
formula (1-1-4)
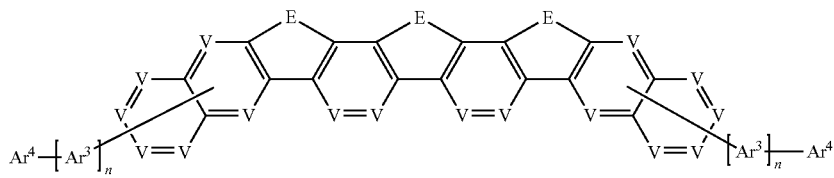
formula (1-1-5)
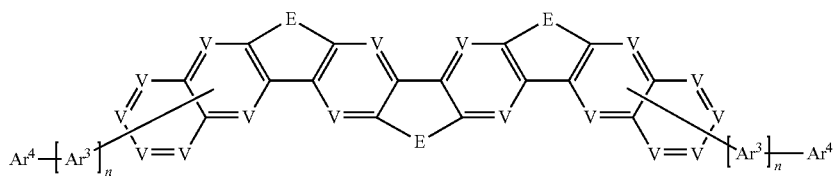
formula (1-1-6)
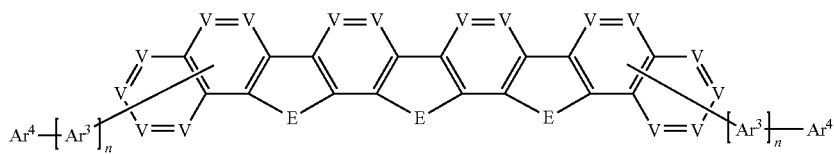
formula (1-1-7)
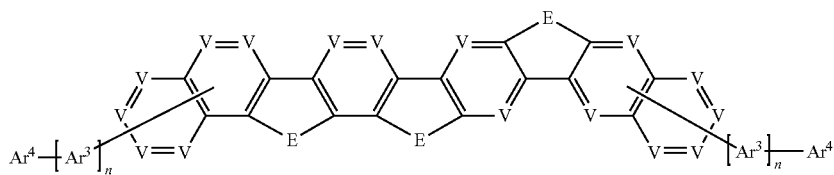
formula (1-1-8)
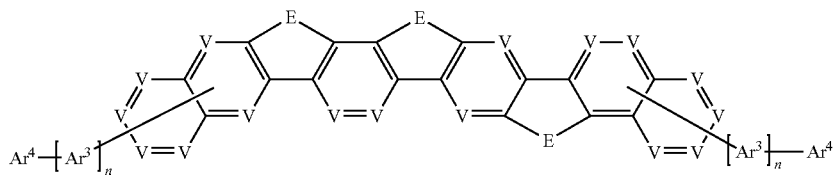

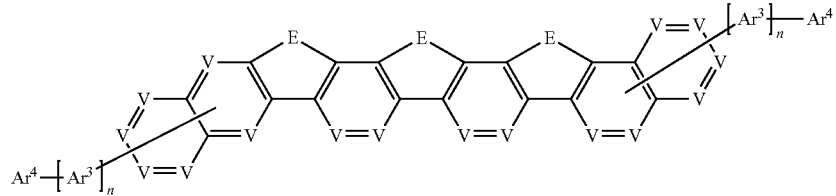
formula (1-1-9)
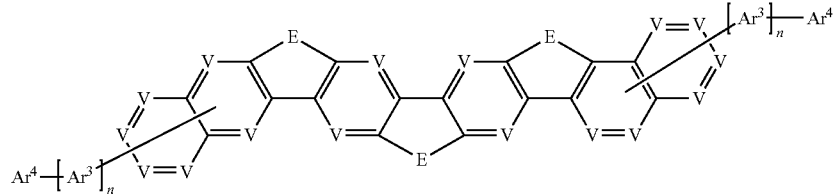
formula (1-1-10)
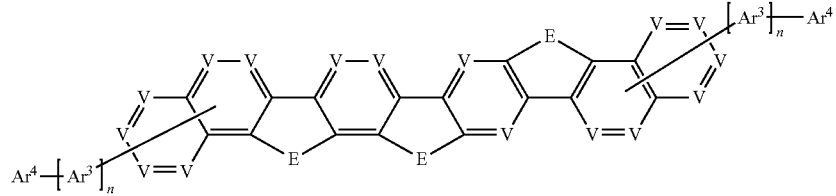
formula (1-1-11)
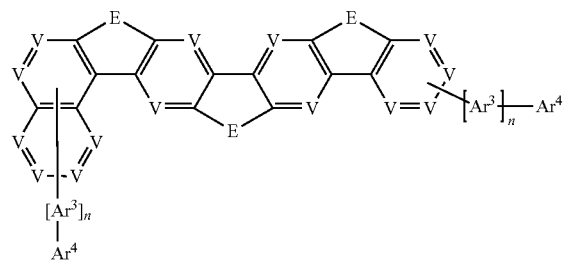
formula (1-2-1)
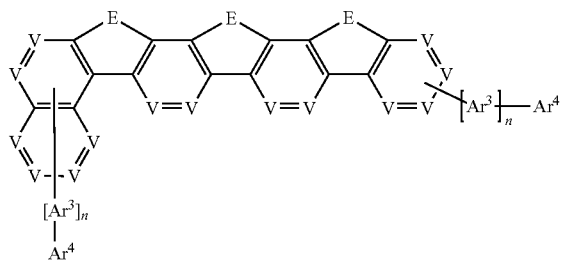
formula (1-2-2)
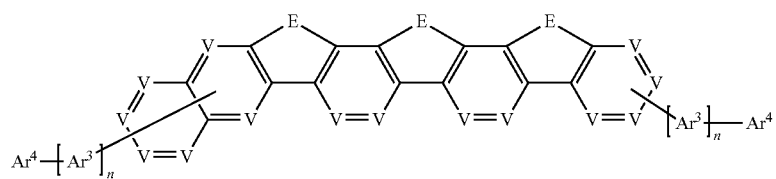
formula (1-2-3)
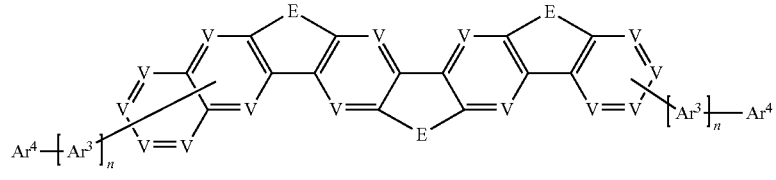
formula (1-2-4)
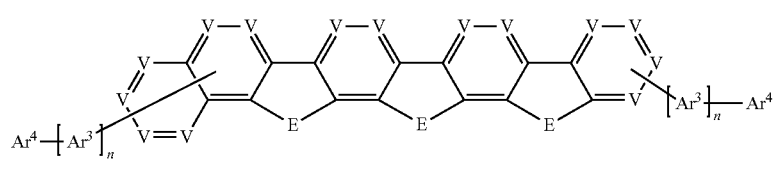
formula (1-2-5)
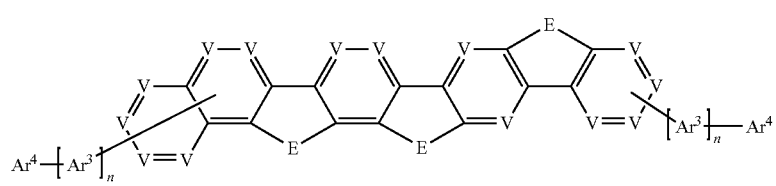
formula (1-2-6)

-continued

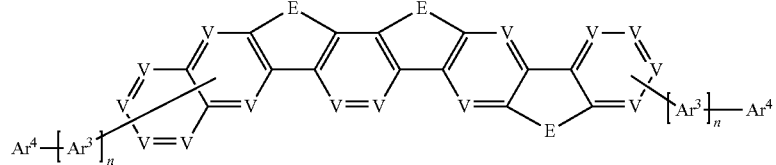
formula (1-2-7)

where the symbols V, E, $Ar^3$, $Ar^4$ and the index n have the same meaning as above.

Among formulae (1-1-1) to (1-1-11) and (1-2-1) to (1-2-7), the formulae (1-1-1) to (1-1-11) are preferred. Formulae (1-1-1) and (1-1-2) are particularly preferred. Formula (1-1-1) is very particularly preferred.

In accordance with a very preferred embodiment of the invention, the compounds of formula (1), (1-1) and (1-2), (1-1-1) to (1-1-11) and (1-2-1) to (1-2-7) are selected from the compounds of the formulae (1-1-1-a) to (1-1-11-a) and (1-2-1-a) to (1-2-7-a),

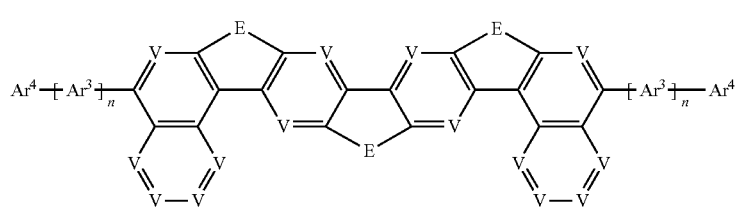
formula (1-1-1-a)

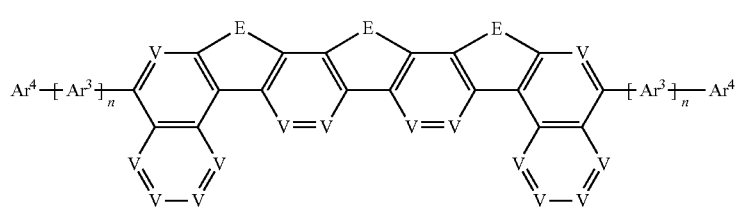
formula (1-1-2-a)

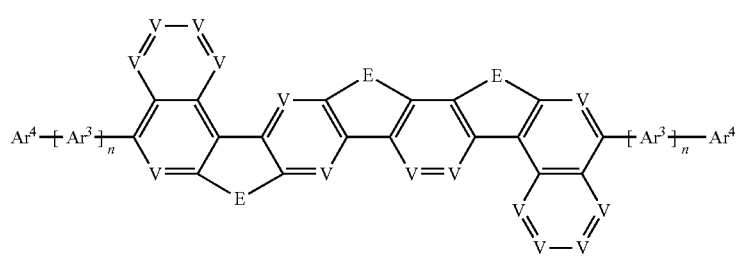
formula (1-1-3-a)

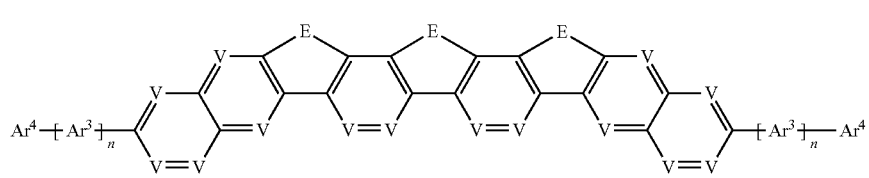
formula (1-1-4-a)

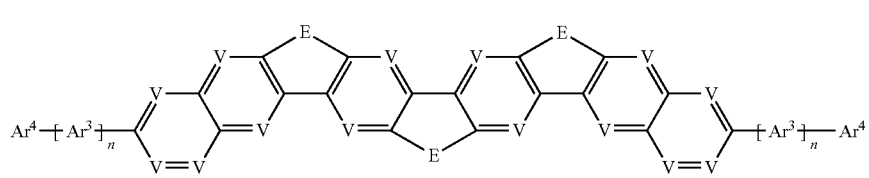
formula (1-1-5-a)

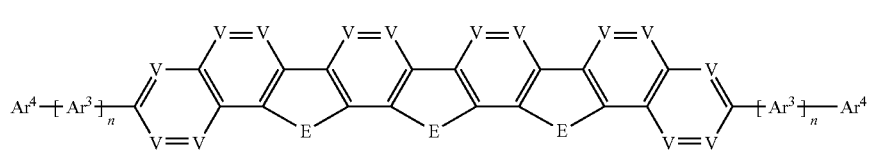
formula (1-1-6-a)

-continued
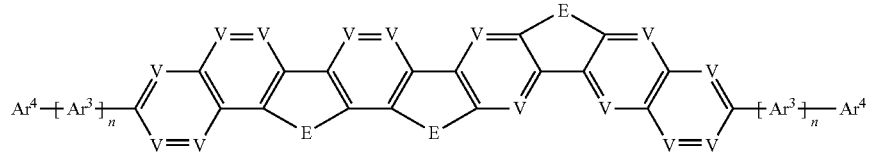
formula (1-1-7-a)
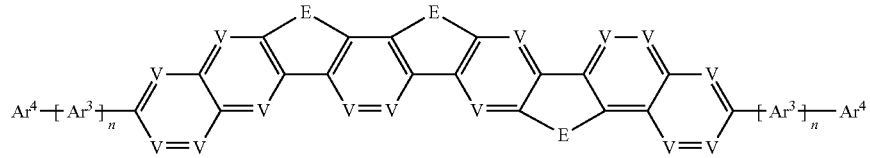
formula (1-1-8-a)
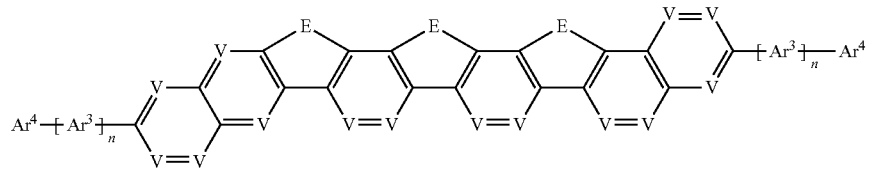
formula (1-1-9-a)
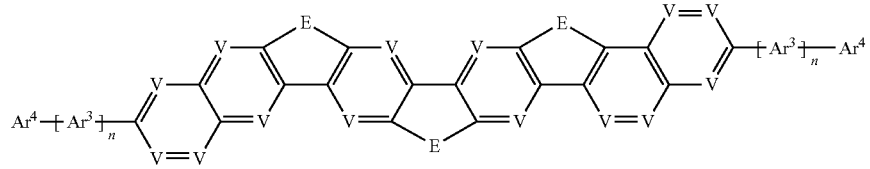
formula (1-1-10-a)
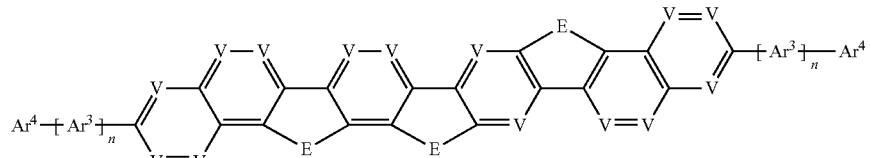
formula (1-1-11-a)
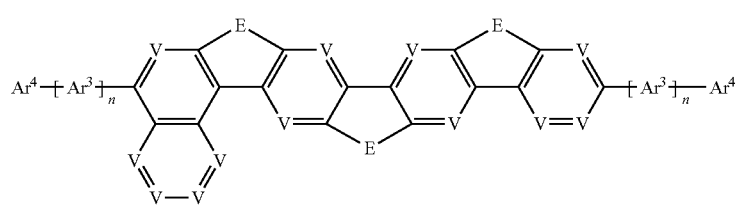
formula (1-2-1-a)
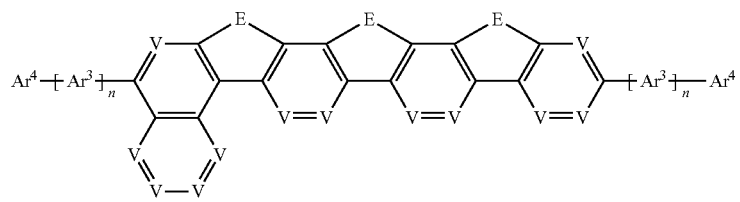
formula (1-2-2-a)
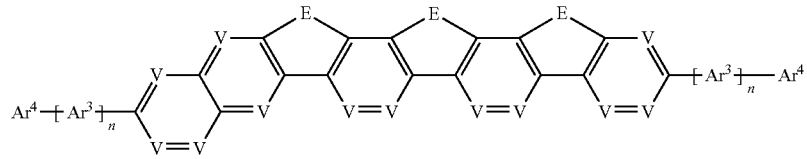
formula (1-2-3-a)
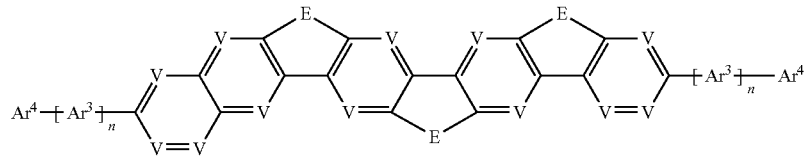
formula (1-2-4-a)

-continued formula (1-2-5-a)

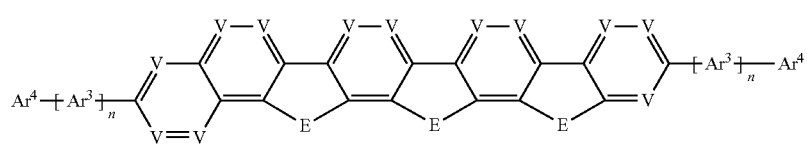

formula (1-2-6-a)

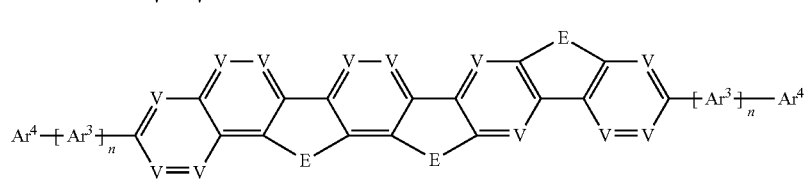

formula (1-2-7-a)

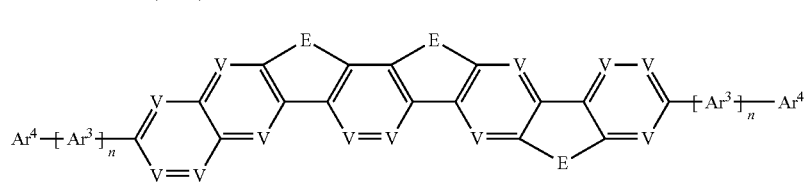

where the symbols V, E, Ar³, Ar⁴ and the index n have the same meaning as above.

Among formulae (1-1-1-a) to (1-1-11-a) and (1-2-1-a) to (1-2-7-a), the formulae (1-1-1-a) to (1-1-11-a) are preferred. Formulae (1-1-1-a) and (1-1-2-a) are particularly preferred. Formula (1-1-1-a) is very particularly preferred.

In accordance with a preferred embodiment, $Ar^3$ is selected from one of the formulae (Ar3-1) to (Ar3-25), (Ar3-1)

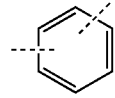

(Ar3-2)

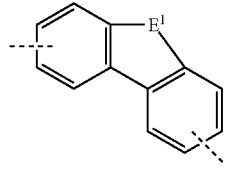

(Ar3-3)

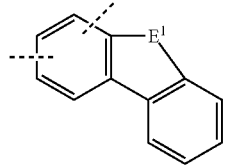

(Ar3-4)

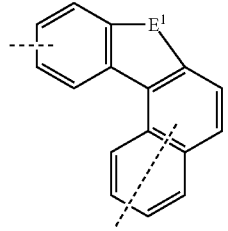

-continued (Ar3-5)

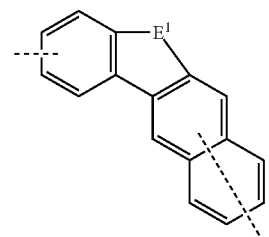

(Ar3-6)

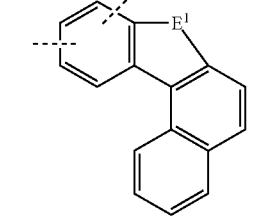

(Ar3-7)

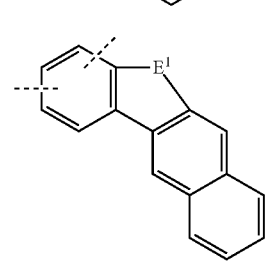

(Ar3-8)

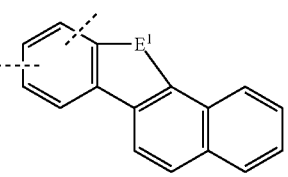

(Ar3-9)

-continued
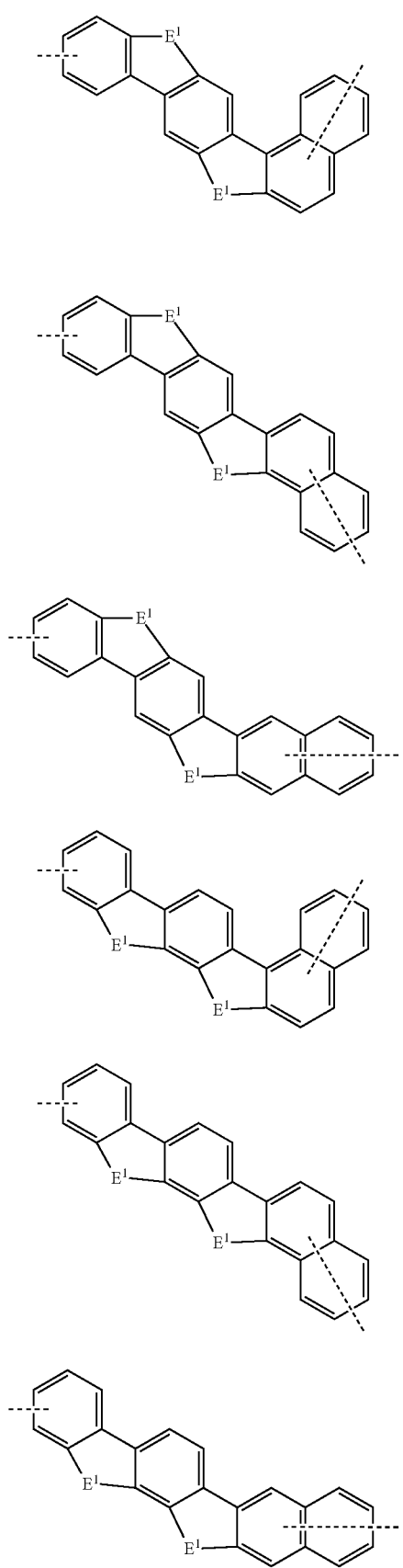
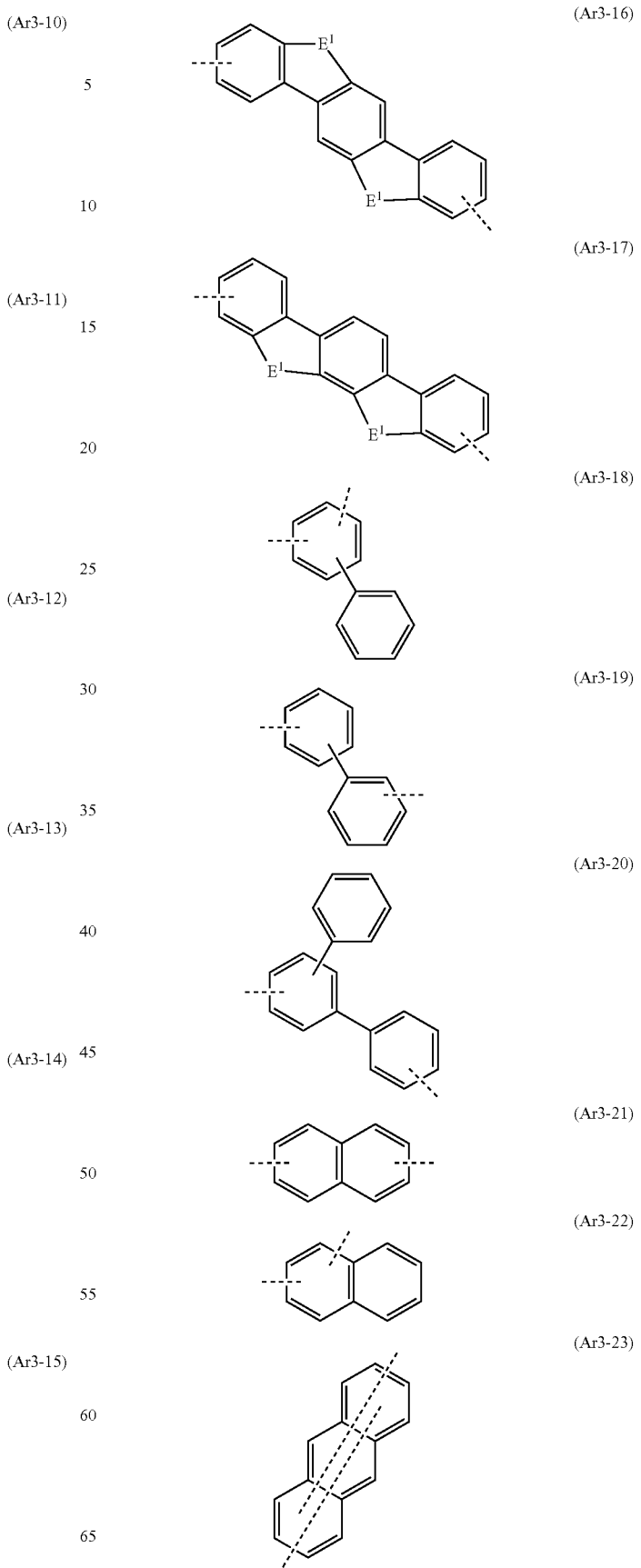

-continued (Ar3-24)
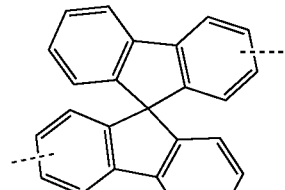

(Ar3-25)
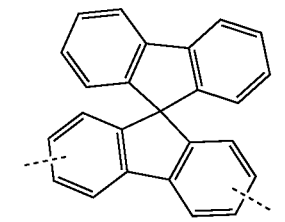

where the dashed bonds indicate the bonding to Ar¹ and to a group Ar³ or Ar⁴ and the groups of formulae (Ar3-1) to (Ar3-25) may be substituted at each free position by a group $R^1$, which has the same meaning as above, and where $E^1$ is selected from —B($R^0$—)—, —C($R^0$)$_2$—, —C($R^0$)$_2$—C($R^0$)$_2$—, —Si($R^0$)$_2$—, —C(=O)—, —C(=N$R^0$)—, —C=(C($R^0$))$_2$—, —O—, —S—, —S(=O)—, —SO$_2$—, —N($R^0$)—, —P($R^0$)— and —P((=O)$R^0$)—, where the substituent $R^0$ has the same meaning as above.

Preferably, $E^1$ is selected from —C($R^0$)$_2$—, —C($R^0$)$_2$—C($R^0$)$_2$—, —O—, —S— and —N($R^0$)—, where the substituent $R^0$ has the same meaning as above. Very preferably, E stands for —C($R^0$)$_2$—.

Among formulae (Ar3-1) to (Ar3-25), formulae (Ar3-1), (Ar3-2), (Ar3-4), (Ar3-10), (Ar3-13), (Ar3-16), (Ar3-19) and (Ar3-22) are preferred. Formulae (Ar3-1), (Ar3-2), (Ar3-4) and (Ar3-19) are particularly preferred.

In accordance with a very preferred embodiment, Ar³ is selected from one of the formulae (Ar3-1-1) to (Ar3-25-3), (Ar3-1-1)

(Ar3-1-2)
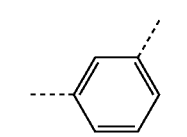

(Ar3-2-1)
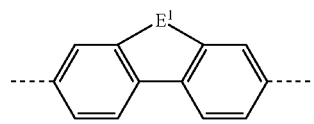

(Ar3-2-2)
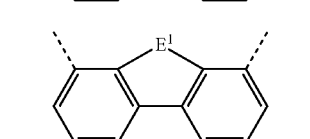

(Ar3-2-3)
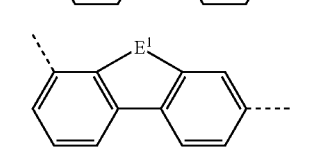

(Ar3-3-1)
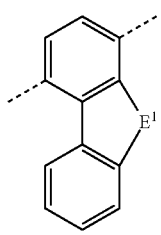

(Ar3-3-2)
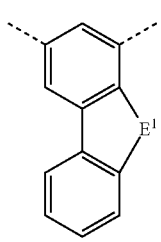

(Ar3-4-1)
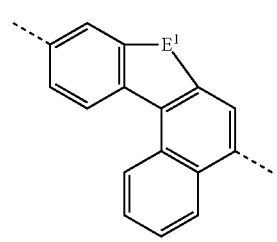

(Ar3-5-1)
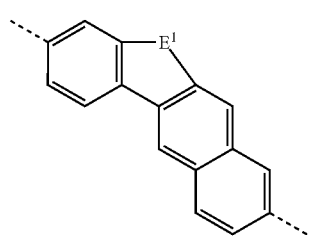

(Ar3-6-1)
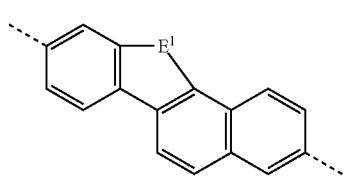

(Ar3-7-1)
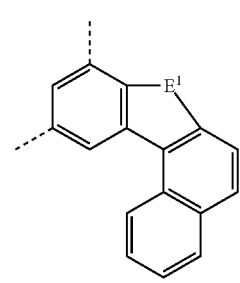

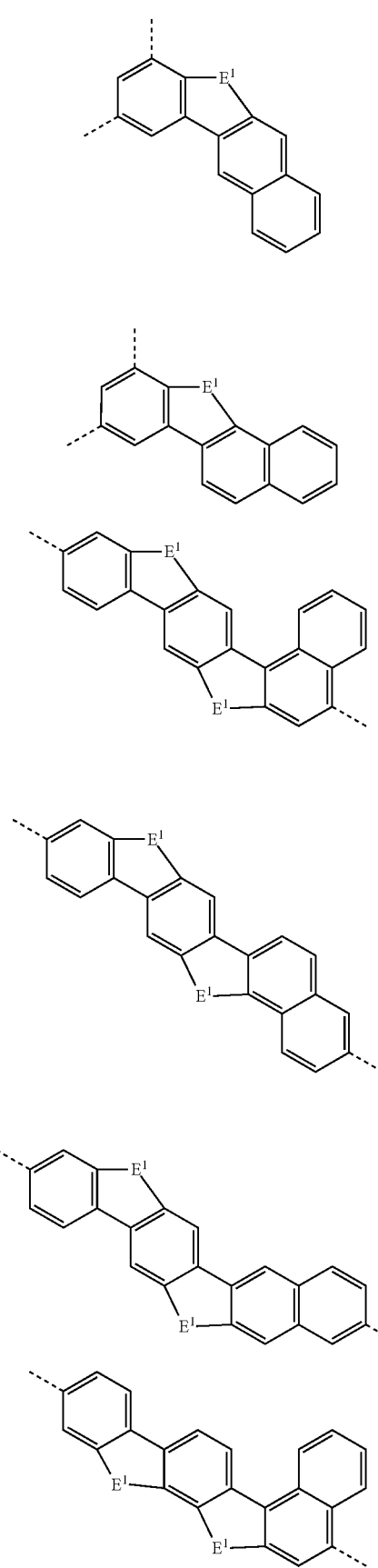

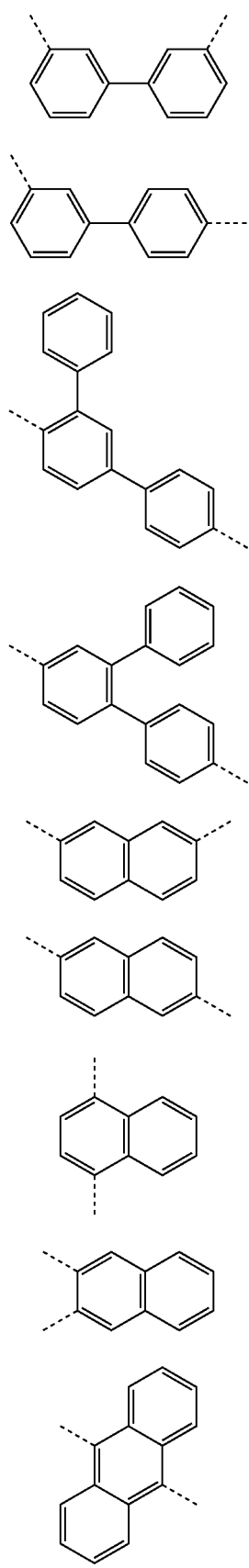
(Ar3-19-2)
(Ar3-19-3)
(Ar3-20-1)
(Ar3-20-2)
(Ar3-21-1)
(Ar3-21-2)
(Ar3-22-1)
(Ar3-22-2)
(Ar3-23-1)
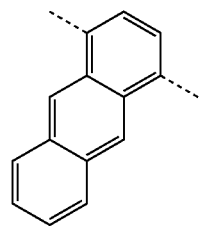
(Ar3-23-2)
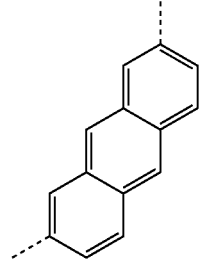
(Ar3-23-3)
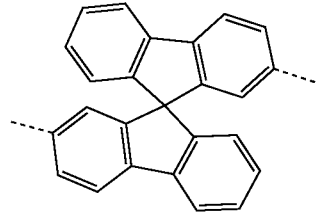
(Ar3-24-1)
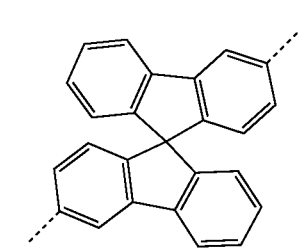
(Ar3-24-2)
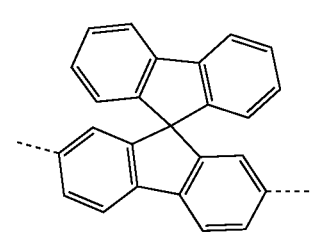
(Ar3-25-1)
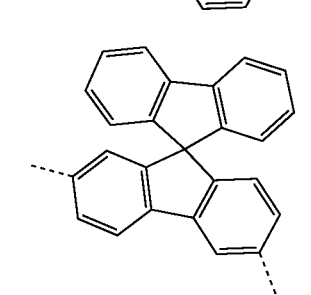
(Ar3-25-2)

(Ar3-25-3)

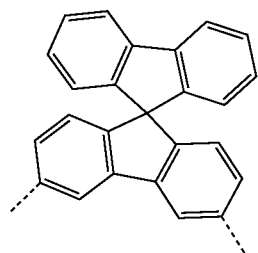

where the dashed bonds indicate the bonding to Ar¹ and to a group Ar³ or Ar⁴ and the groups of formulae (Ar3-1-1) to (Ar3-25-3) may be substituted at each free position by a group $R^1$, which has the same meaning as above, and where $E^1$ has the same meaning as above.

Among formulae (Ar3-1-1) to (Ar3-25-3), formulae (Ar3-1-1), (Ar3-2-1), (Ar3-4-1), (Ar3-10-1), (Ar3-13-1), (Ar3-16-1), (Ar3-19-1) and (Ar3-22-1) are preferred. Formulae (Ar3-1-1), (Ar3-2-1) and (Ar3-4-1) and (Ar3-19-1) are particularly preferred.

In accordance with a preferred embodiment, $Ar^4$ is selected from one of the formulae (Ar4-1) to (Ar4-27),

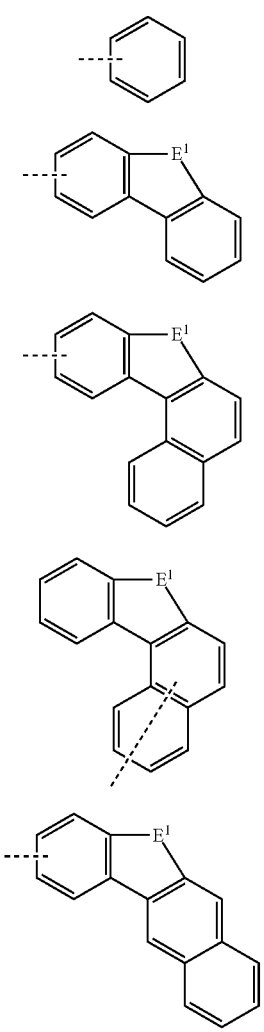

(Ar4-1)
(Ar4-2)
(Ar4-3)
(Ar4-4)
(Ar4-5)

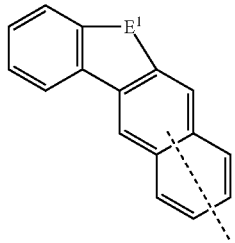

(Ar4-6)

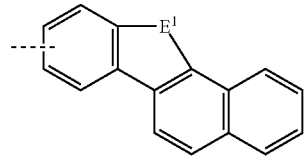

(Ar4-7)

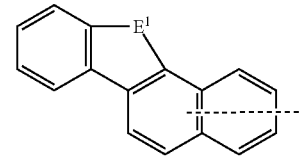

(Ar4-8)

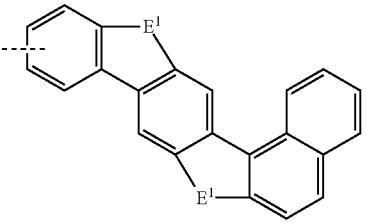

(Ar4-9)

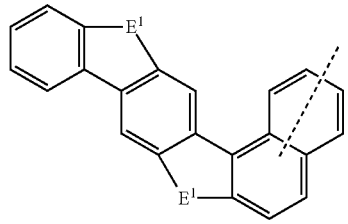

(Ar4-10)

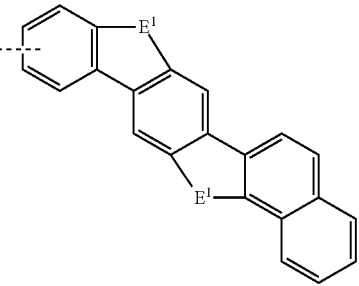

(Ar4-11)

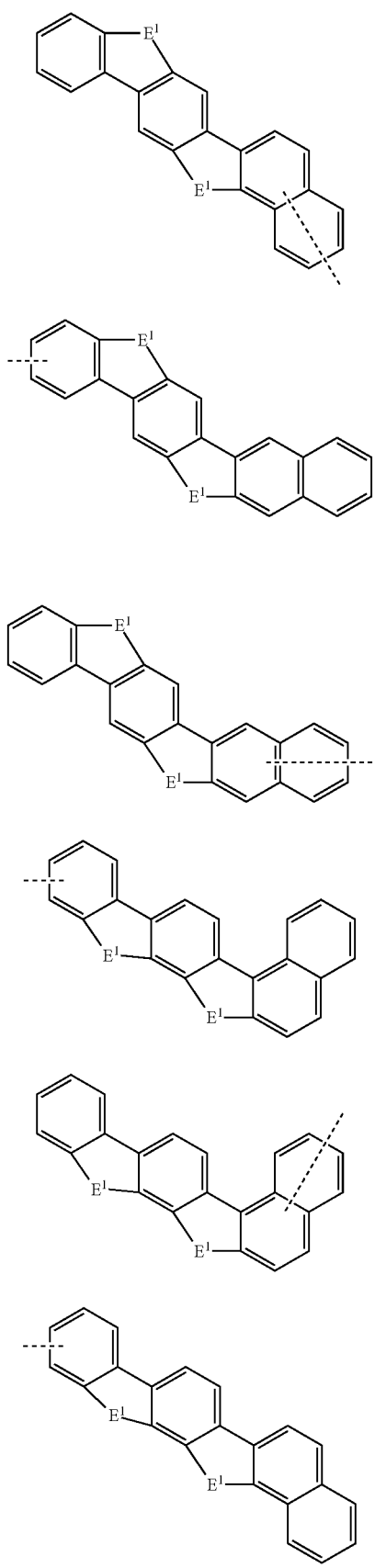
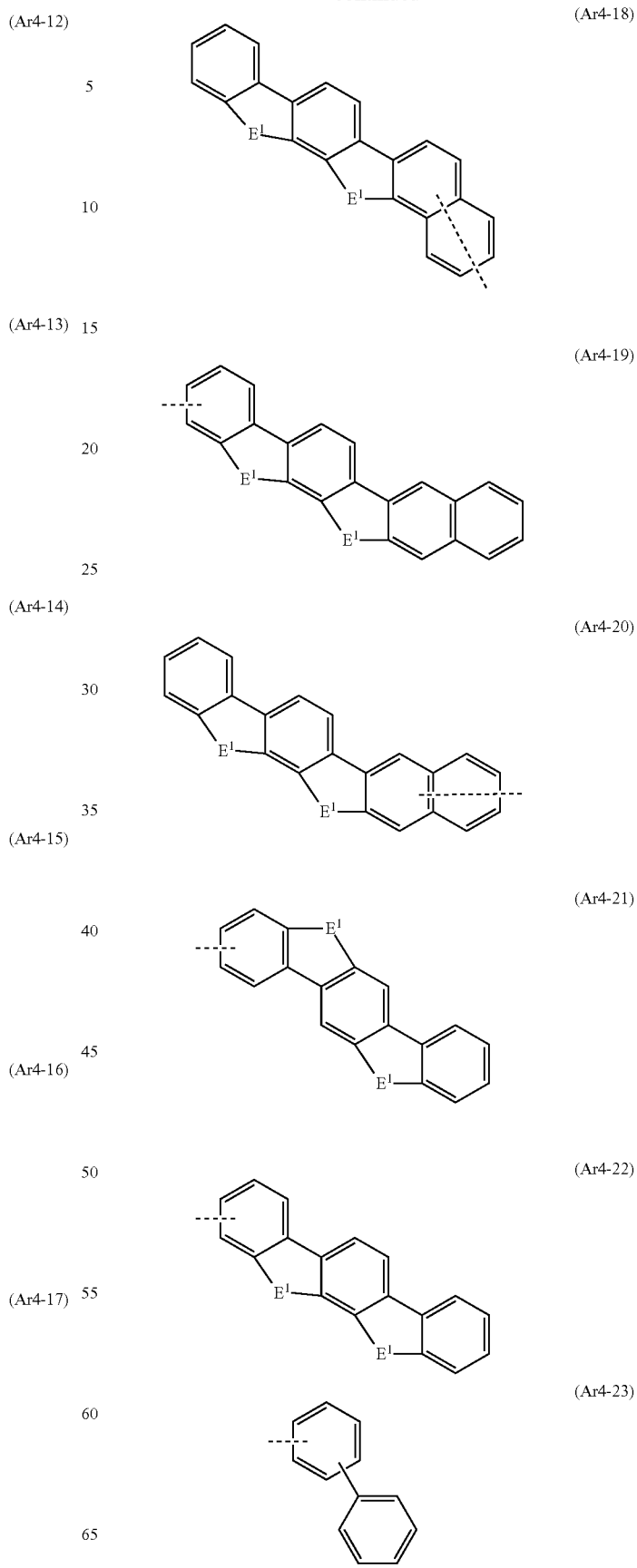

(Ar4-24)
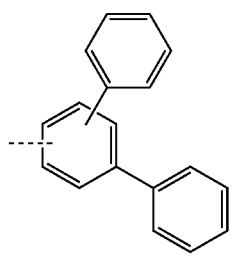

(Ar4-25)
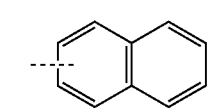

(Ar4-26)
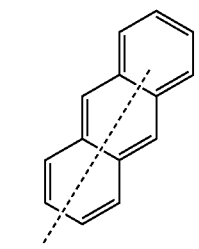

(Ar4-27)
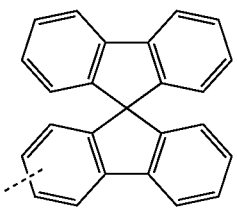

where the dashed bond indicates the bonding to $Ar^3$ and where $E^1$ has the same meaning as above and the groups of formulae (Ar4-1) to (Ar4-27) may be substituted at each free position by a group $R^1$, which has the same meaning as above.

Among formulae (Ar4-1) to (Ar4-27), formulae (Ar4-1), (Ar4-2), (Ar4-3), (Ar4-9), (Ar4-15), (Ar4-23), and (Ar4-25) are preferred. Formulae (Ar4-1), (Ar4-2) and (Ar4-3) are particularly preferred.

In accordance with a very preferred embodiment, $Ar^4$ is selected from one of the formulae (Ar4-1-1) to (Ar4-27-3), (Ar4-1-1)

(Ar4-2-1)
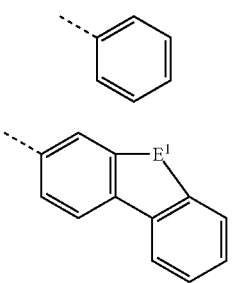

(Ar4-2-2)
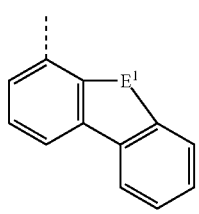

(Ar4-2-3)
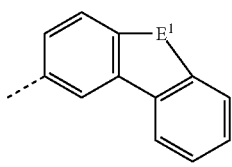

(Ar4-3-1)
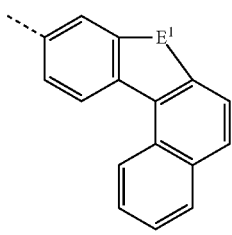

(Ar4-3-2)
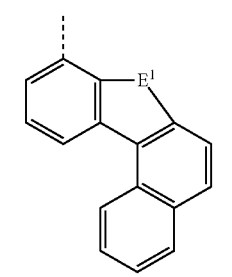

(Ar4-3-3)
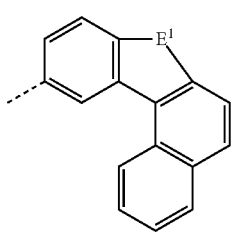

(Ar4-4-1)
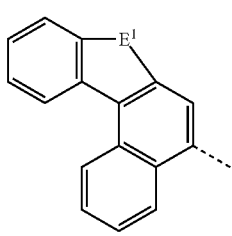

(Ar4-5-1)
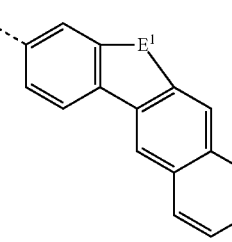

-continued
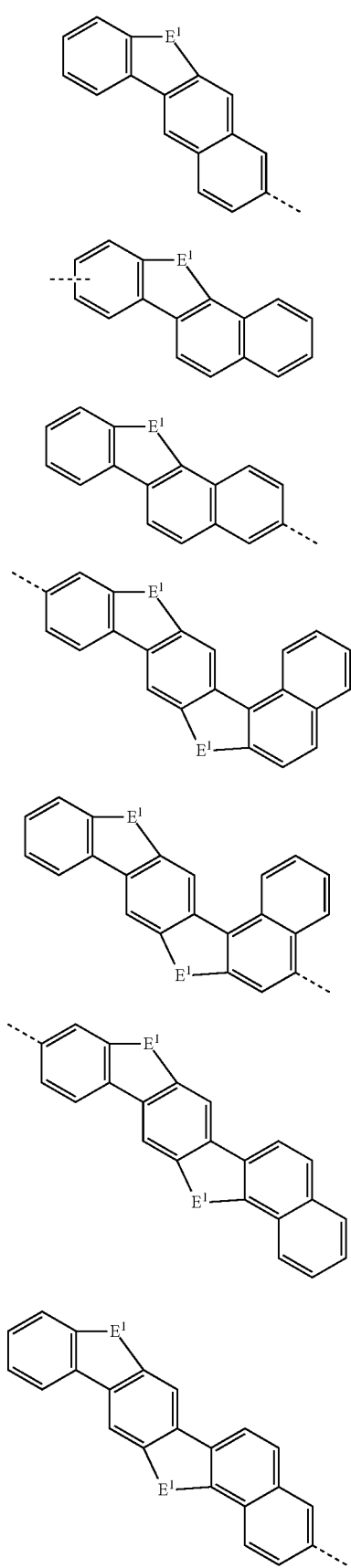
(Ar4-6-1)
(Ar4-7-1)
(Ar4-8-1)
(Ar4-9-1)
(Ar4-10-1)
(Ar4-11-1)
(Ar4-12-1)
-continued
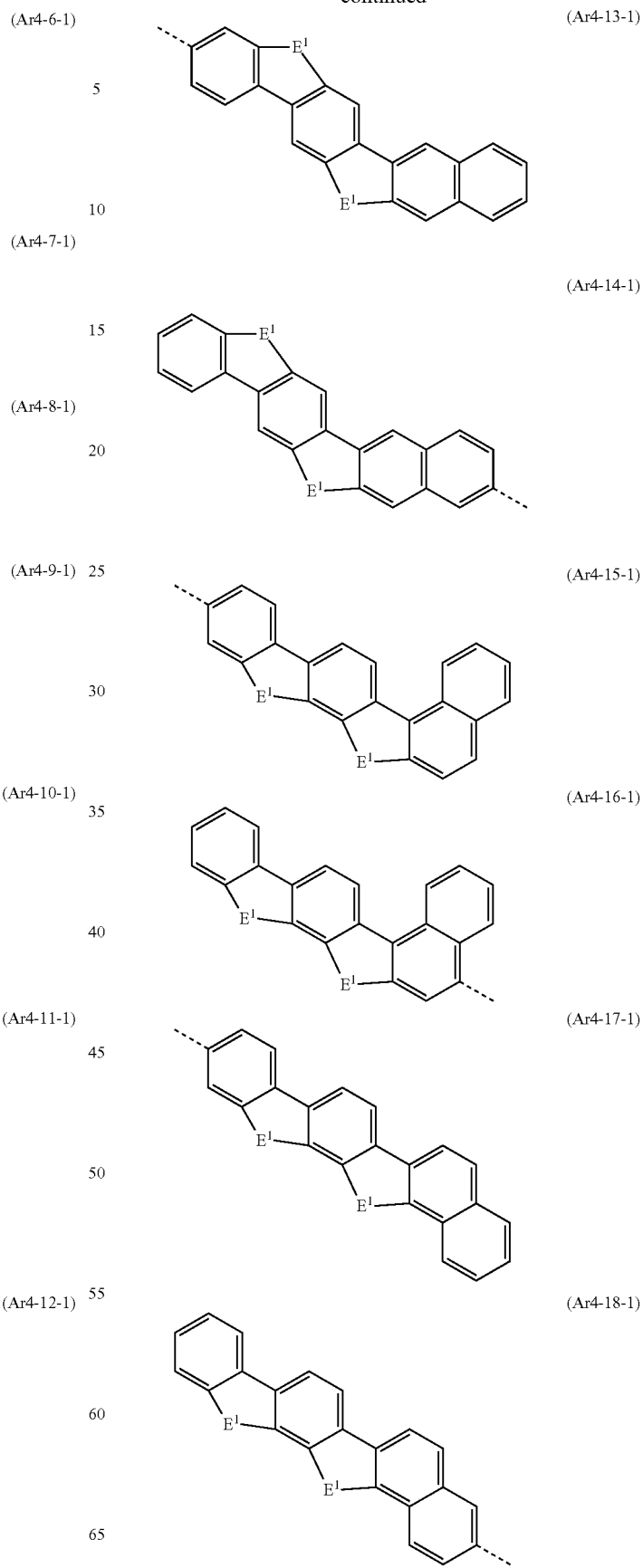
(Ar4-13-1)
(Ar4-14-1)
(Ar4-15-1)
(Ar4-16-1)
(Ar4-17-1)
(Ar4-18-1)

-continued
(Ar4-19-1)
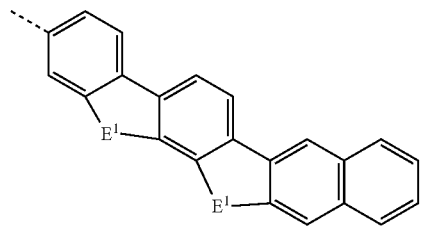
(Ar4-20-1)
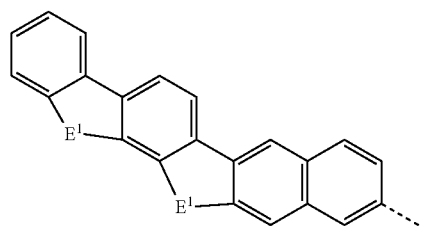
(Ar4-21-1)
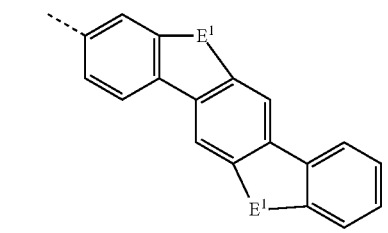
(Ar4-22-1)
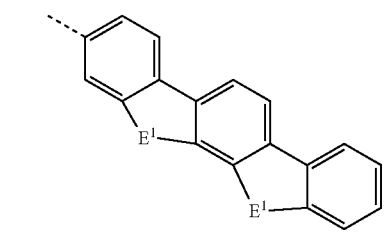
(Ar4-23-1)
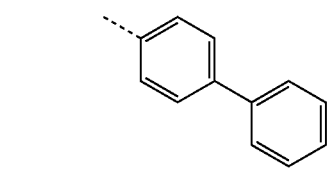
(Ar4-23-2)
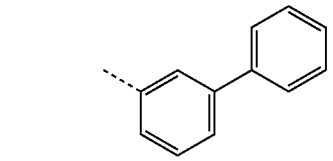
(Ar4-24-1)
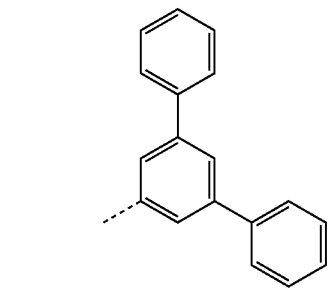
(Ar4-24-2)
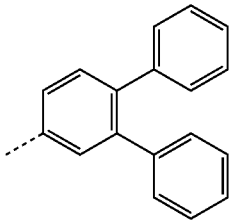
(Ar4-24-3)
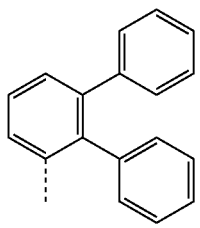
(Ar4-25-1)
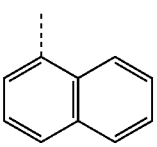
(Ar4-25-2)
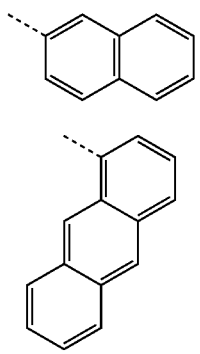
(Ar4-26-1)
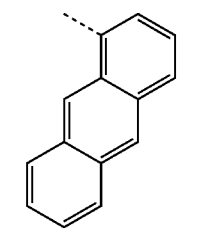
(Ar4-26-2)
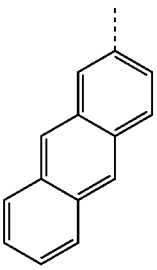
(Ar4-26-3)
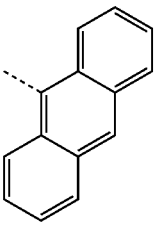

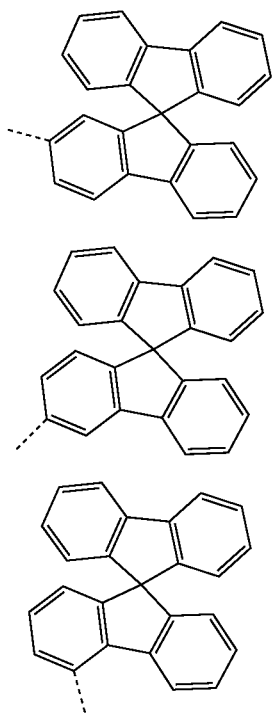

(Ar4-27-1)

(Ar4-27-2)

(Ar4-27-3)

where the dashed bond indicates the bonding to Ar$^3$ and where E$^1$ has the same meaning as above and the groups of formulae (Ar4-1-1) to (Ar4-27-3) may be substituted at each free position by a group R$^1$, which has the same meaning as above.

Among formulae (Ar4-1-1) to (Ar4-27-3), formulae (Ar4-1-1), (Ar4-2-1), (Ar4-3-1), (Ar4-9-1), (Ar4-15-1), (Ar4-23-1) and (Ar4-25-1) are preferred. Formulae (Ar4-1-1), (Ar4-2-1) and (Ar4-3-1) are particularly preferred.

In accordance with a preferred embodiment, compounds of formula (1), (1-1) and (1-2), (1-1-1) to (1-1-11) and (1-2-1) to (1-2-7) as well as (1-1-1-a) to (1-1-11-a) and (1-2-1-a) to (1-2-7-a) contain at least one group Ar$^3$, which stands for a group of formula (Ar3-2) and/or at least one group Ar$^4$, which stands for a group of formula (Ar4-2),

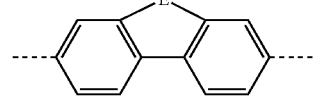

(Ar3-2)

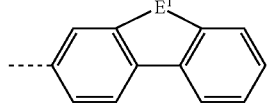

(Ar4-2)

where
the dashed bonds in formula (Ar3-2) indicate the bonding to Ar$^1$ and to a group Ar$^3$ or Ar4;
the dashed bond in formula (Ar4-2) indicates the bonding to Ar$^3$;
E$^1$ has the same meaning as above; and
the groups of formulae (Ar3-2) and (Ar4-2) may be substituted at each free position by a group R$^1$, which has the same meaning as above.

It is very particularly preferred that the compounds of formula (1) and the compounds corresponding to the preferred embodiments of formula (1) contain at least one group Ar$^3$, which stands for a group of formula (Ar3-2) and/or at least one group Ar$^4$, which stands for a group of formula (Ar4-2), in both chains "Ar$^4$—(Ar$^3$)$_n$---" that are represented in formulae (1), (1-1) and (1-2), (1-1-1) to (1-1-11) and (1-2-1) to (1-2-7) as well as (1-1-1-a) to (1-1-11-a) and (1-2-1-a) to (1-2-7-a).

In accordance with a very preferred embodiment, compounds of formula (1), (1-1) and (1-2), (1-1-1) to (1-1-11) and (1-2-1) to (1-2-7) as well as (1-1-1-a) to (1-1-11-a) and (1-2-1-a) to (1-2-7-a) contain at least one group Ar$^3$, which stands for a group of formula (Ar3-2-1) and/or at least one group Ar$^4$, which stands for a group of formula (Ar4-2-1),

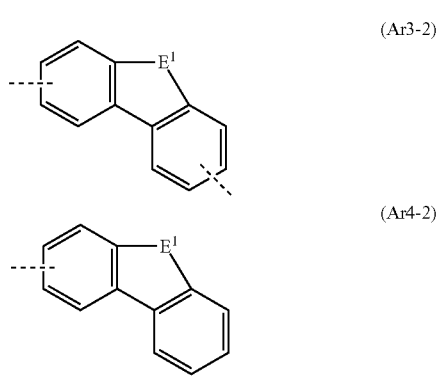

(Ar3-2-1)

(Ar4-2-1)

where
the dashed bonds in formula (Ar3-2-1) indicate the bonding to Ar$^1$ and to a group Ar$^3$ or Ar4;
the dashed bond in formula (Ar4-2-1) indicates the bonding to Ar$^3$;
E$^1$ has the same meaning as above; and
the groups of formulae (Ar3-2-1) and (Ar4-2-1) may be substituted at each free position by a group R$^1$, which has the same meaning as above.

It is particularly preferred that the compounds of formula (1) and the compounds corresponding to the preferred embodiments of formula (1) contain at least one group Ar$^3$, which stands for a group of formula (Ar3-2-1) and/or at least one group Ar$^4$, which stands for a group of formula (Ar4-2-1), in both chains "Ar$^4$—(Ar$^3$)$_n$---" that are represented in formulae (1), (1-1) and (1-2), (1-1-1) to (1-1-11) and (1-2-1) to (1-2-7) as well as (1-1-1-a) to (1-1-11-a) and (1-2-1-a) to (1-2-7-a).

In accordance with a preferred embodiment, compounds of formula (1), (1-1) and (1-2), (1-1-1) to (1-1-11) and (1-2-1) to (1-2-7) as well as (1-1-1-a) to (1-1-11-a) and (1-2-1-a) to (1-2-7-a) contain at least one group Ar$^3$, which stands for a group of formula (Ar3-2-1 b) and/or at least one group Ar$^4$, which stands for a group of formula (Ar4-2-1 b),

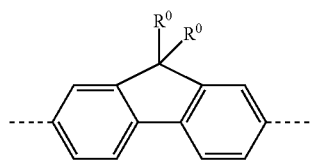

formula (Ar3-2-1b)

-continued formula (Ar4-2-1b)

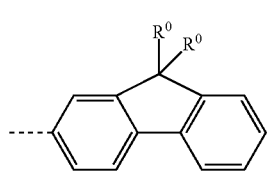

where
the dashed bonds in formula (Ar3-2-1b) indicate the bonding to $Ar^1$ and to a group $Ar^3$ or $Ar^4$;
the dashed bonds in formula (Ar4-2-1 b) indicates the bonding to $Ar^3$;
$R^0$ has the same meaning as in claim 1; and
the groups of formulae (Ar3-2-1 b) and (Ar4-2-1 b) may be substituted at each free position by a group $R^1$, which has the same meaning as in claim 1.

It is very particularly preferred that the compounds of formula (1) and the compounds corresponding to the preferred embodiments of formula (1) contain at least one group $Ar^3$, which stands for a group of formula (Ar3-2-1 b) and/or at least one group $Ar^4$, which stands for a group of formula (Ar4-2-1 b), in both chains "$Ar^4$—$(Ar^3)_n$---" that are represented in formulae (1), (1-1) and (1-2), (1-1-1) to (1-1-11) and (1-2-1) to (1-2-7) as well as (1-1-1-a) to (1-1-11-a) and (1-2-1-a) to (1-2-7-a).

The following compounds are examples of compounds of the formula (1):

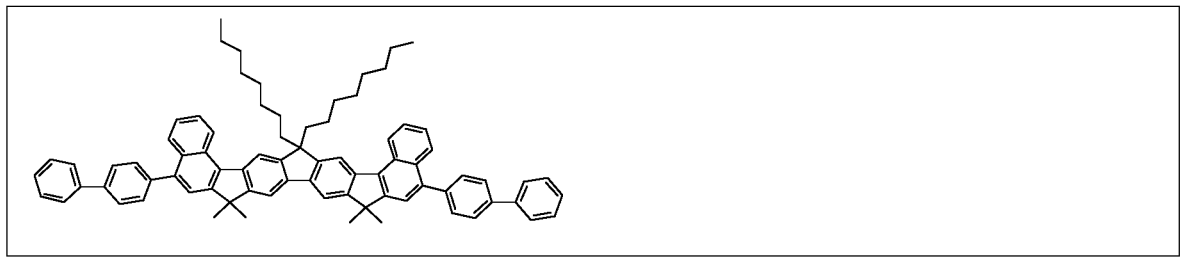

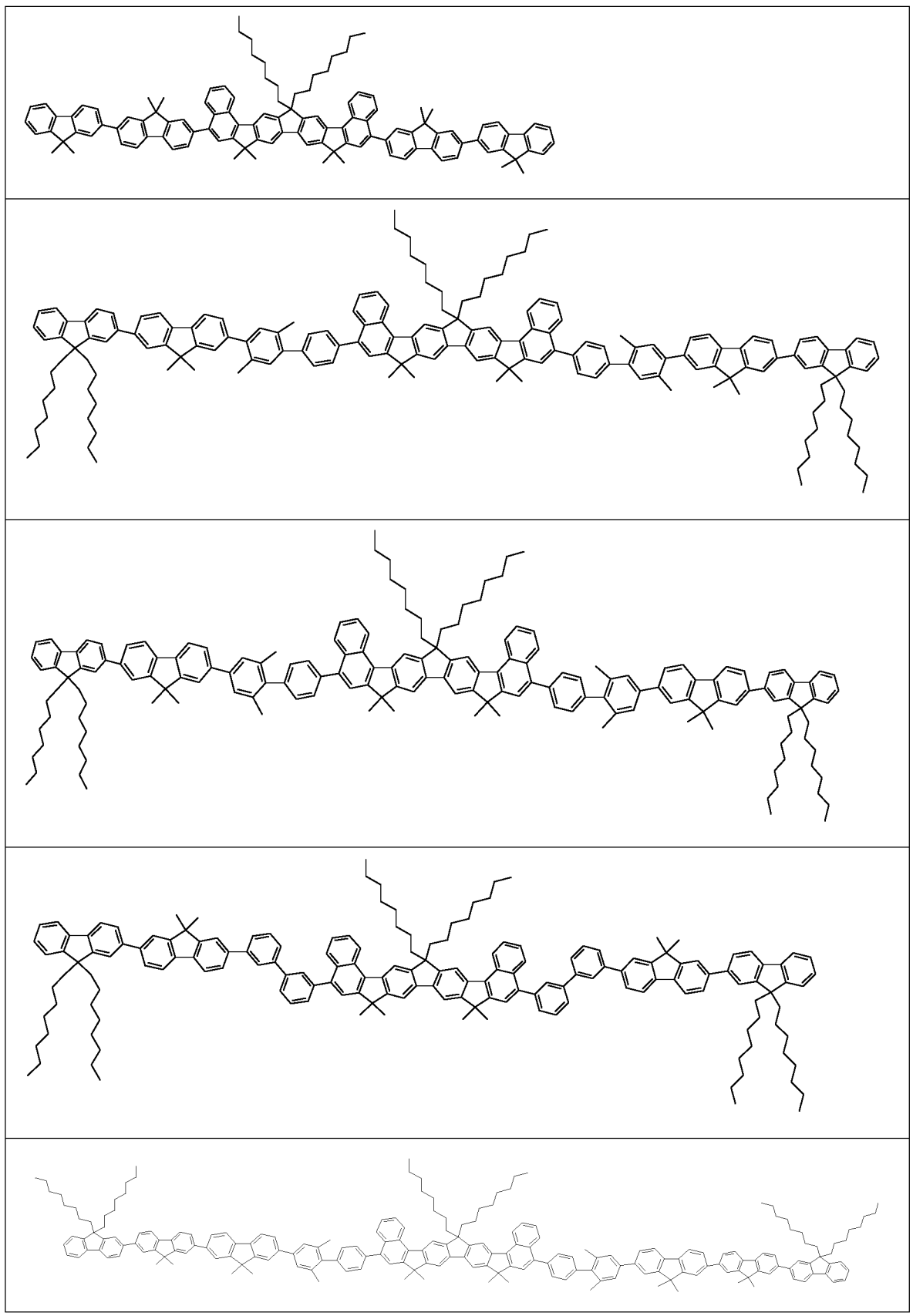

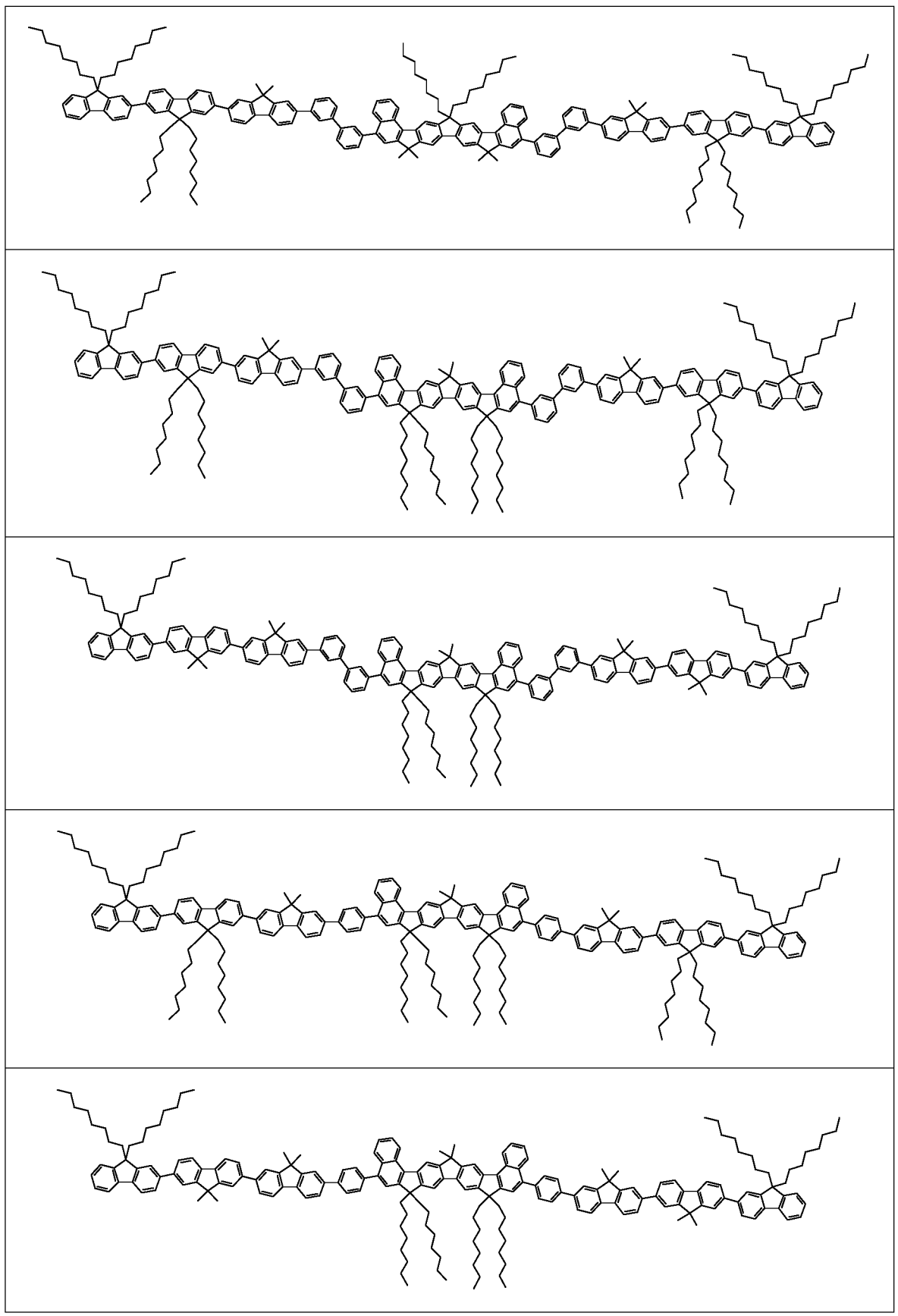

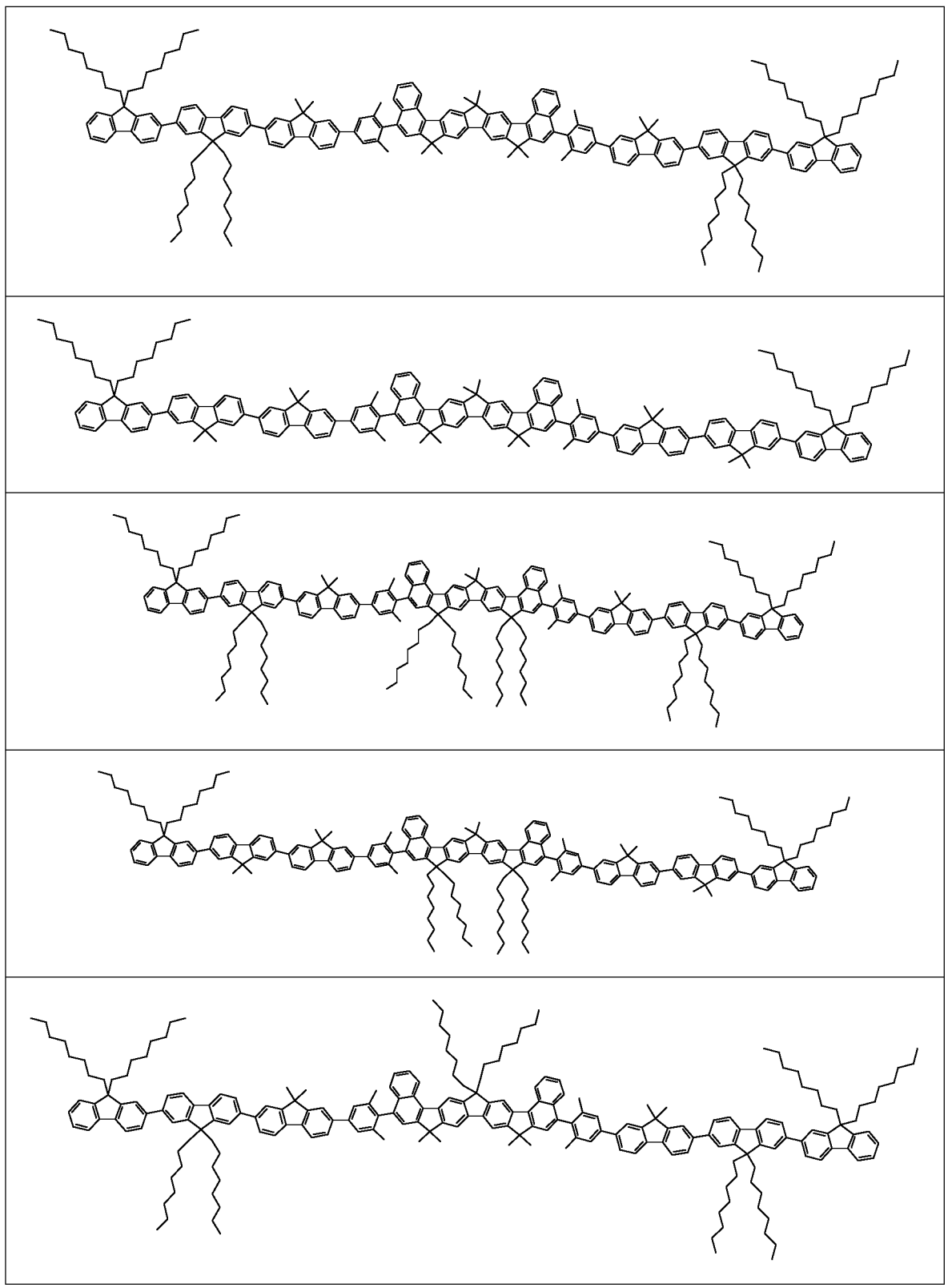

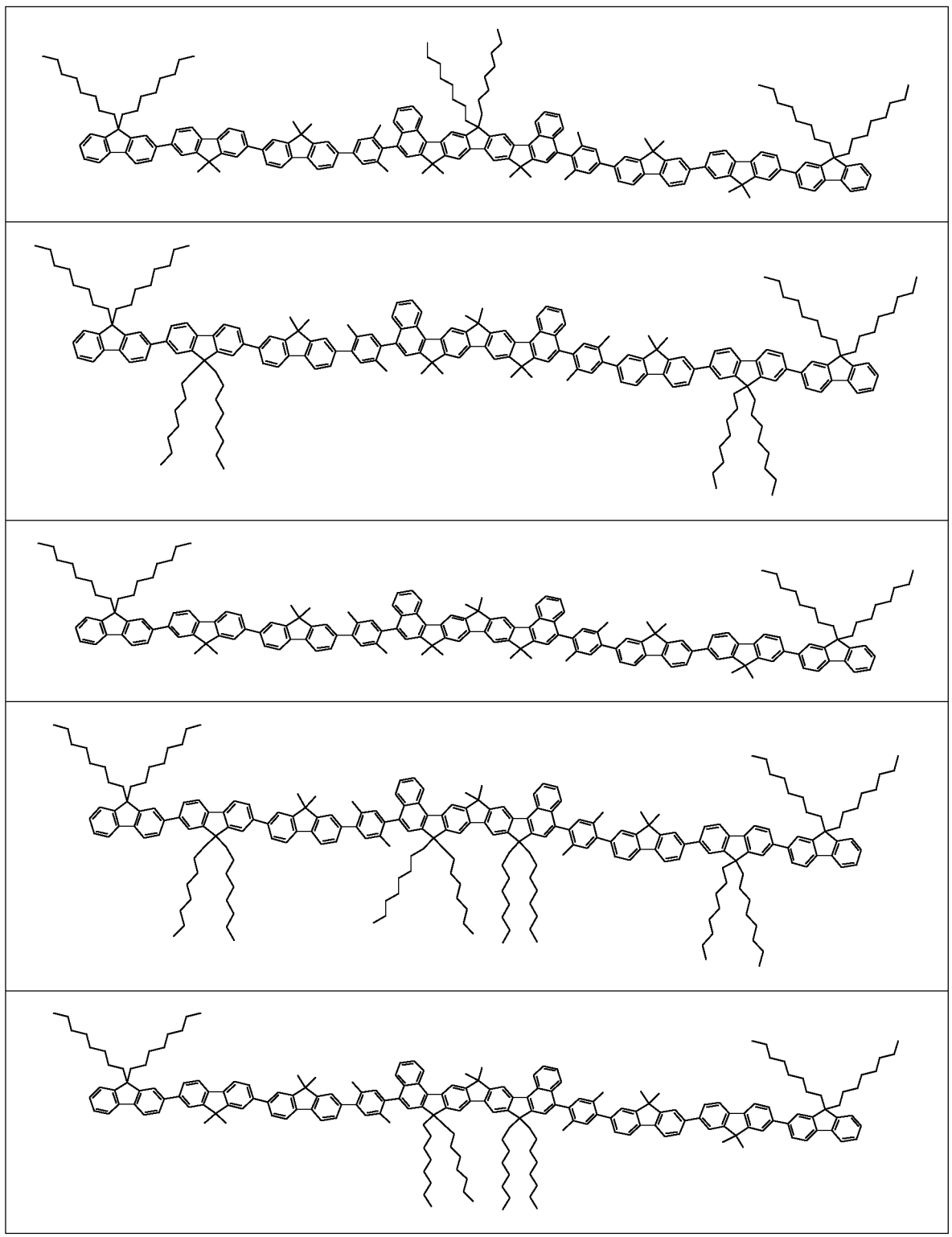

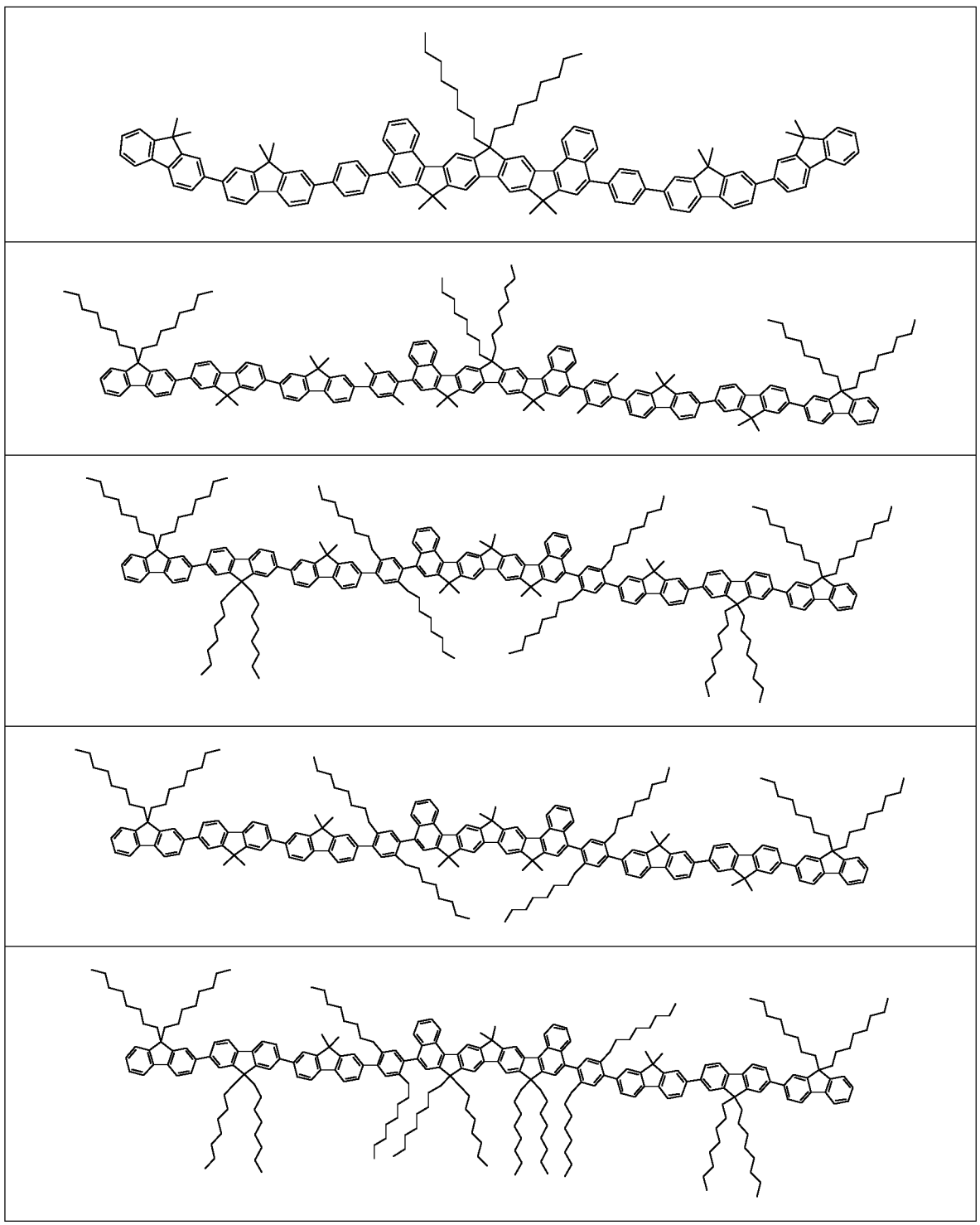

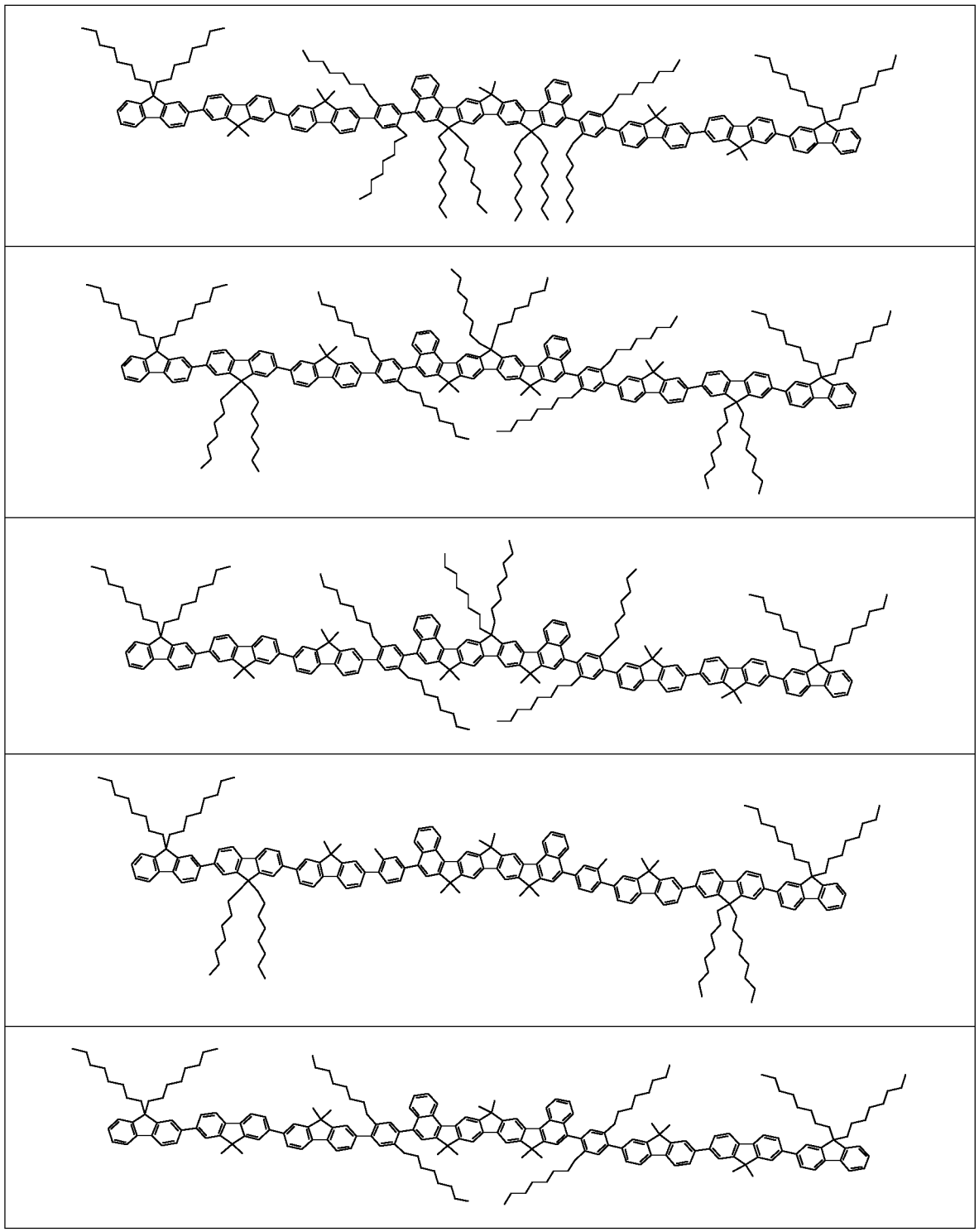

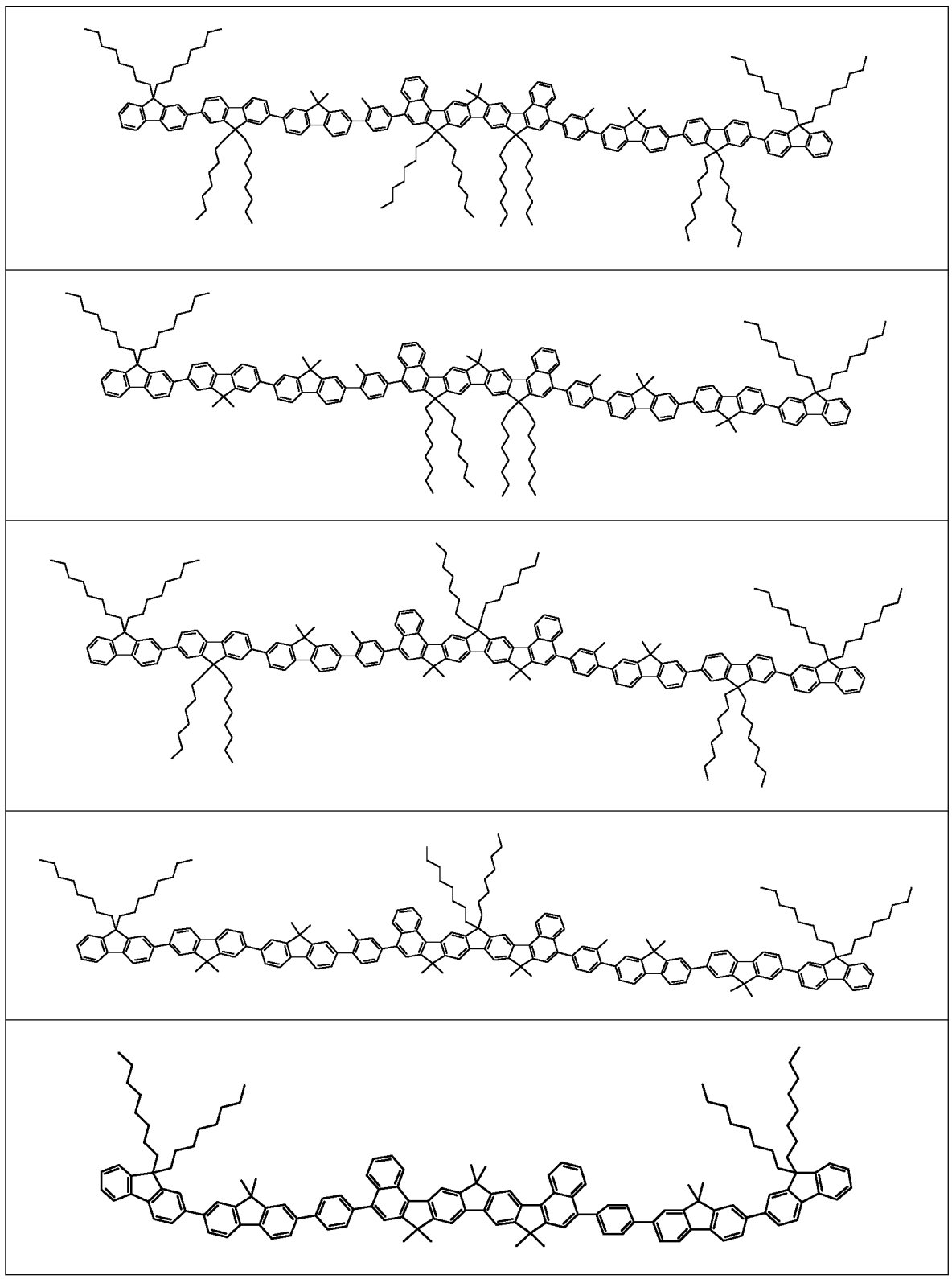

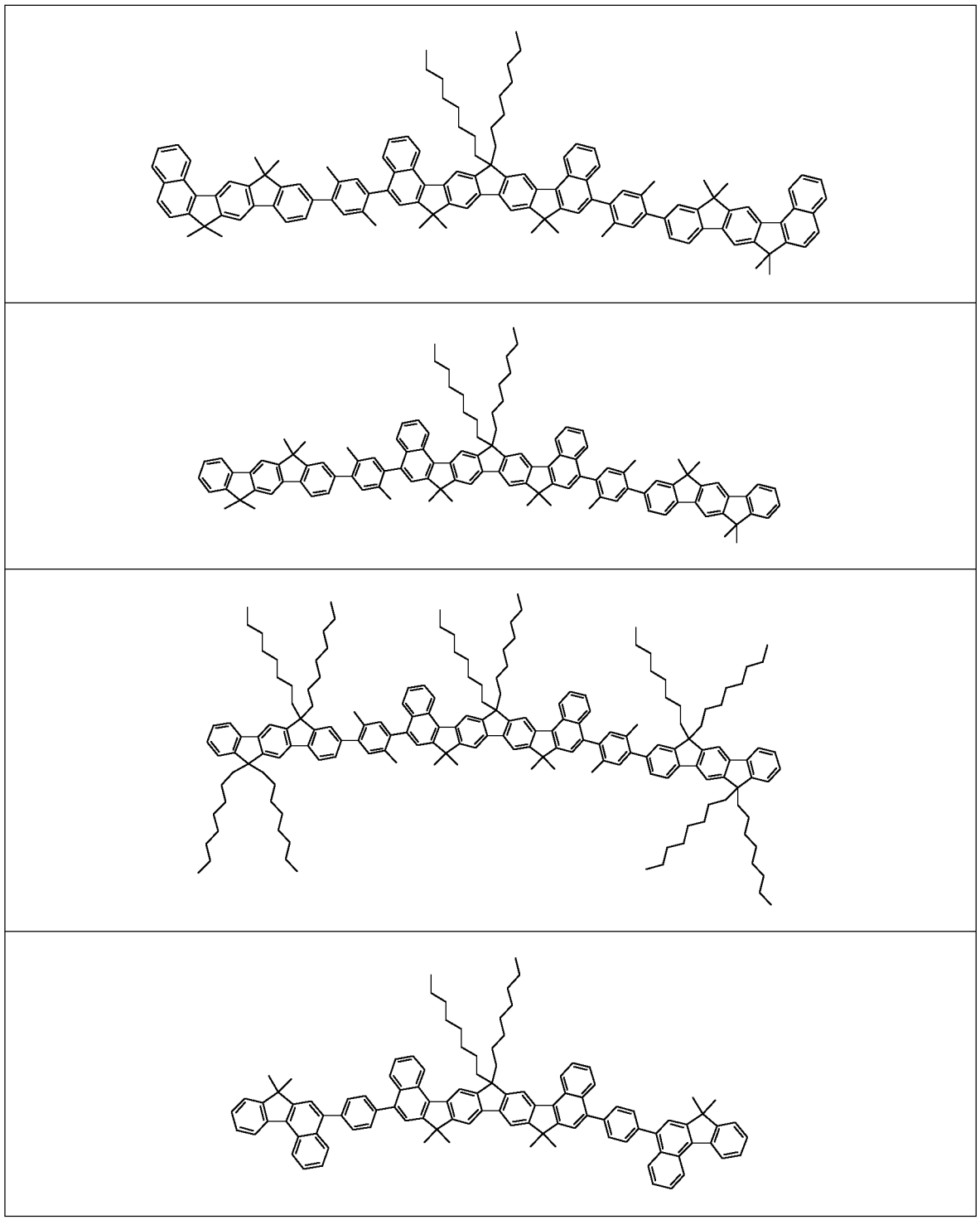

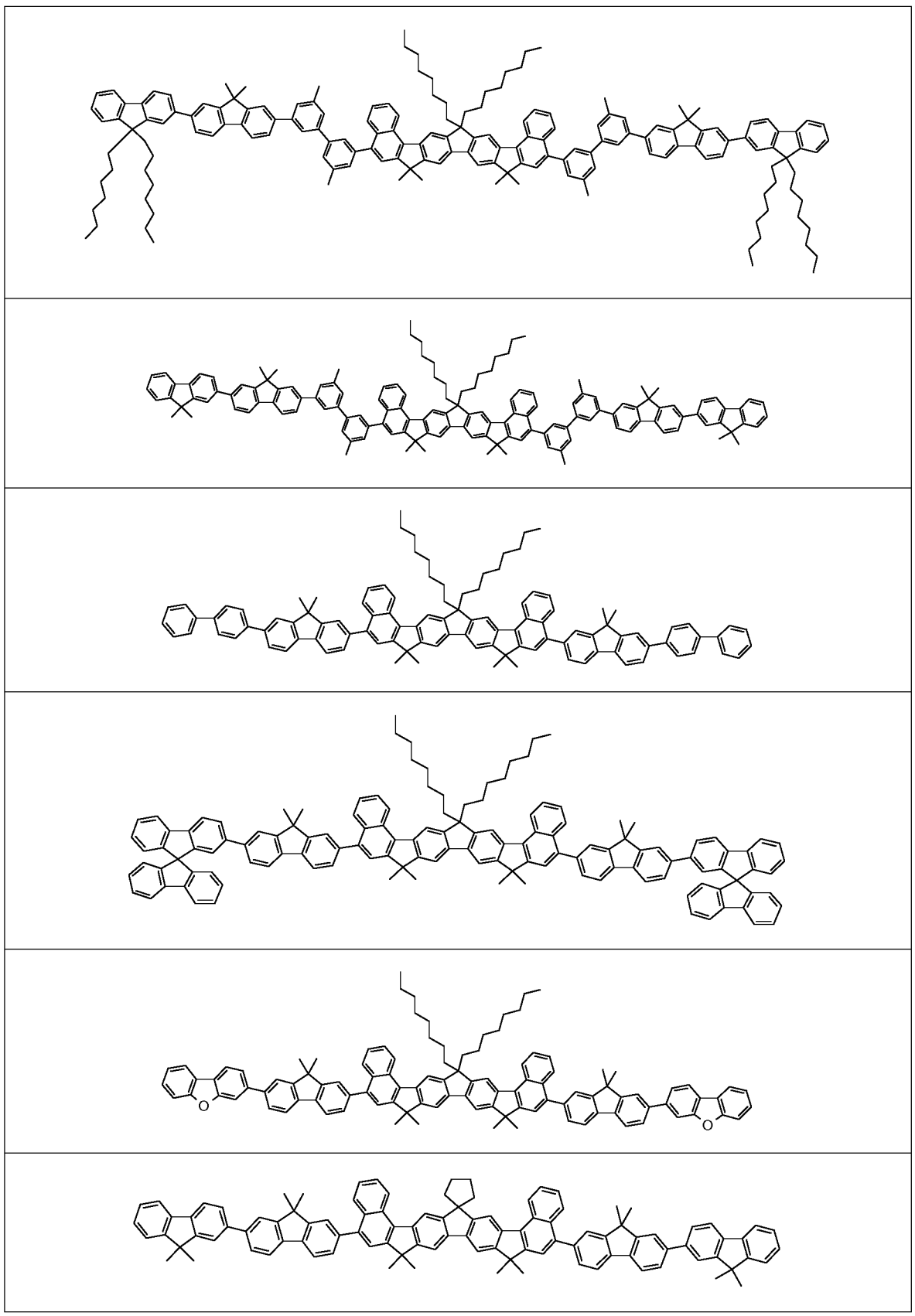

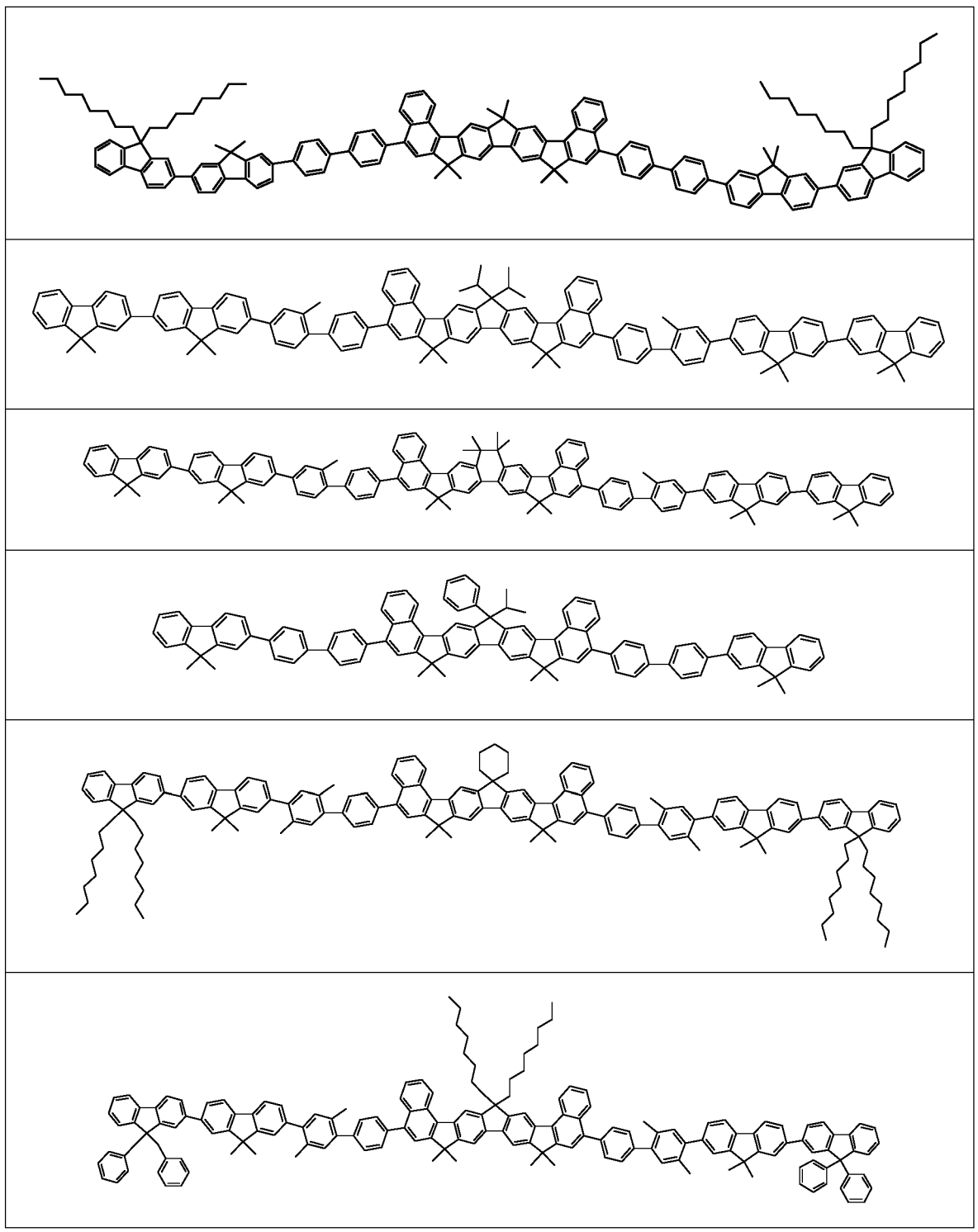

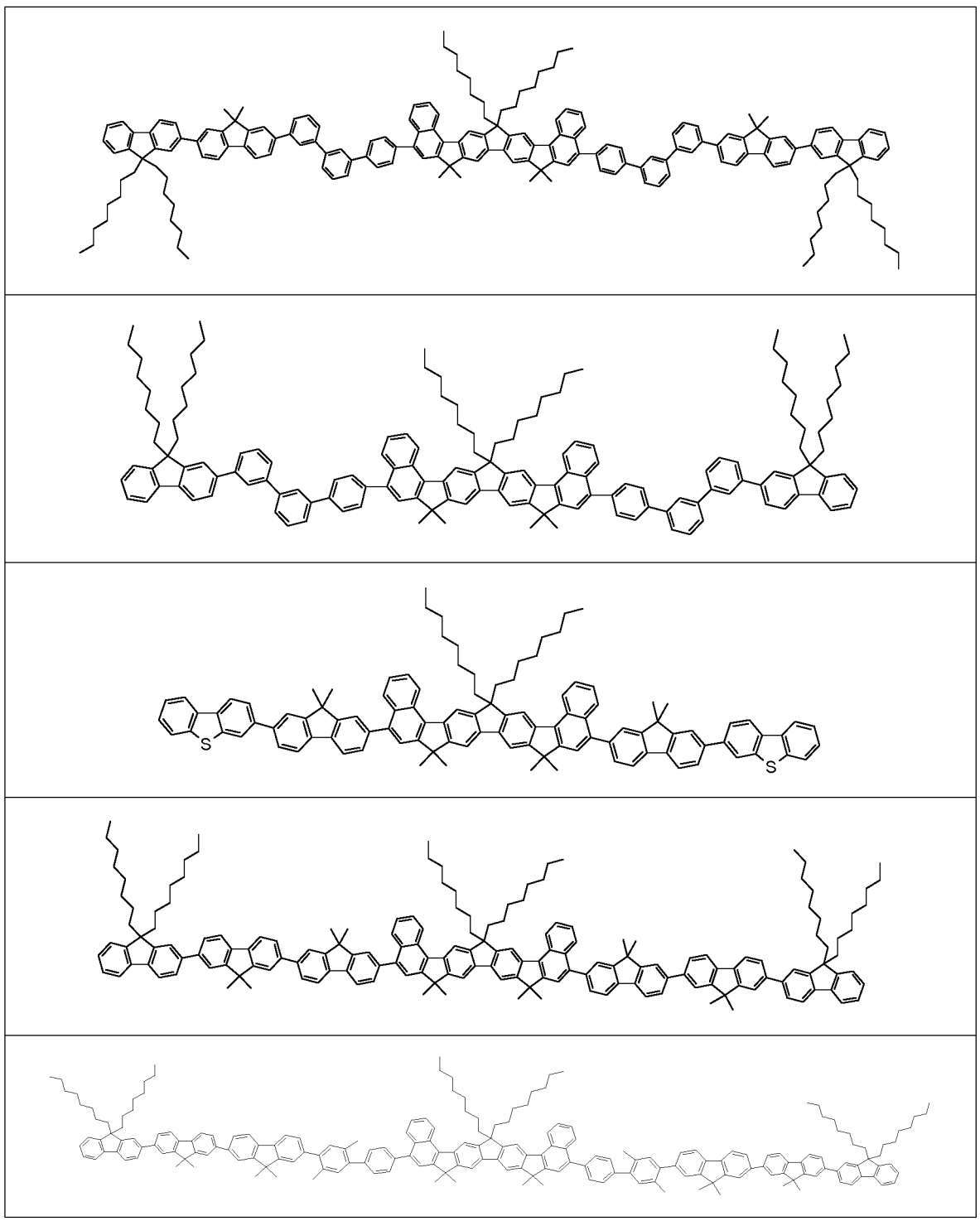

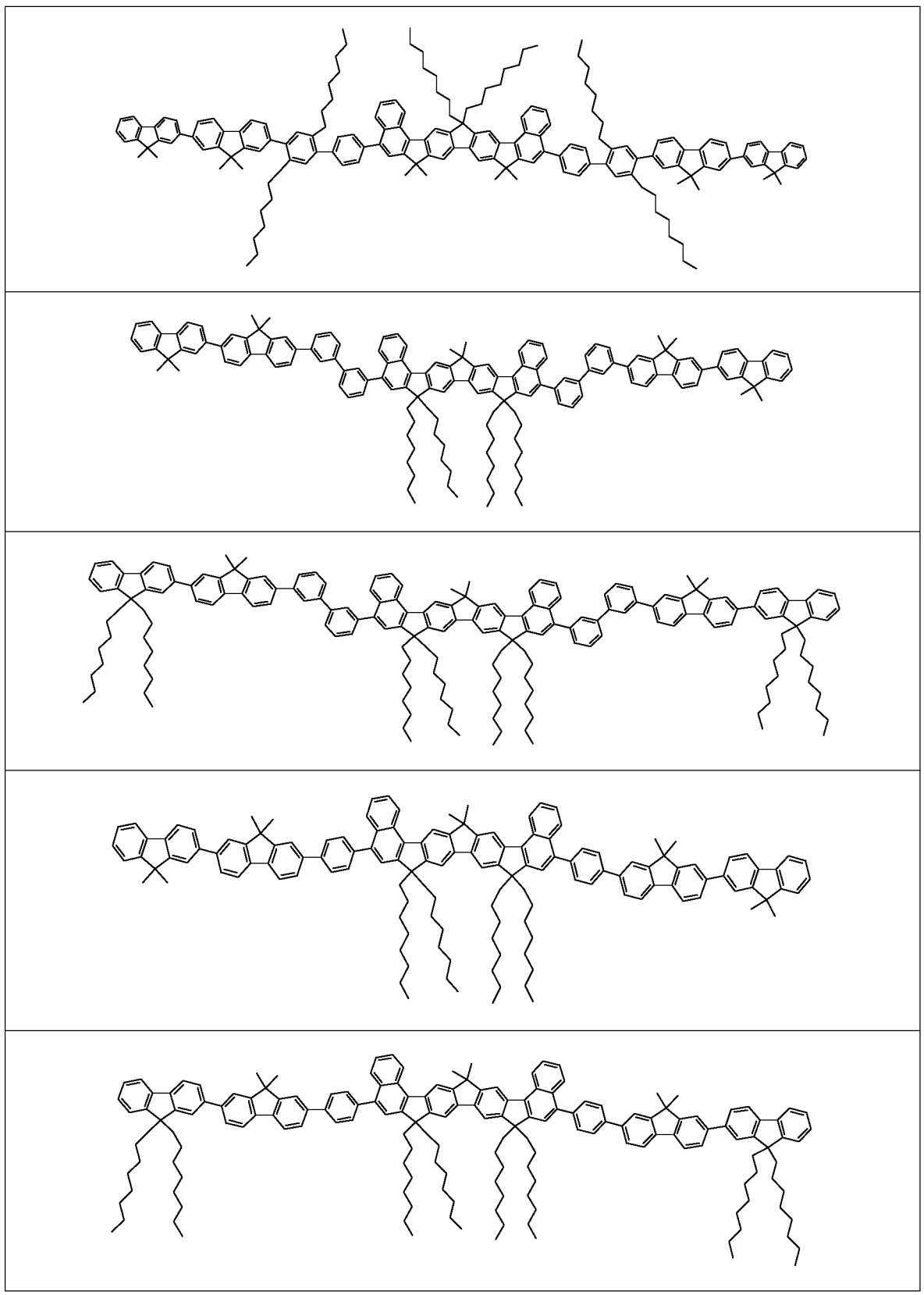

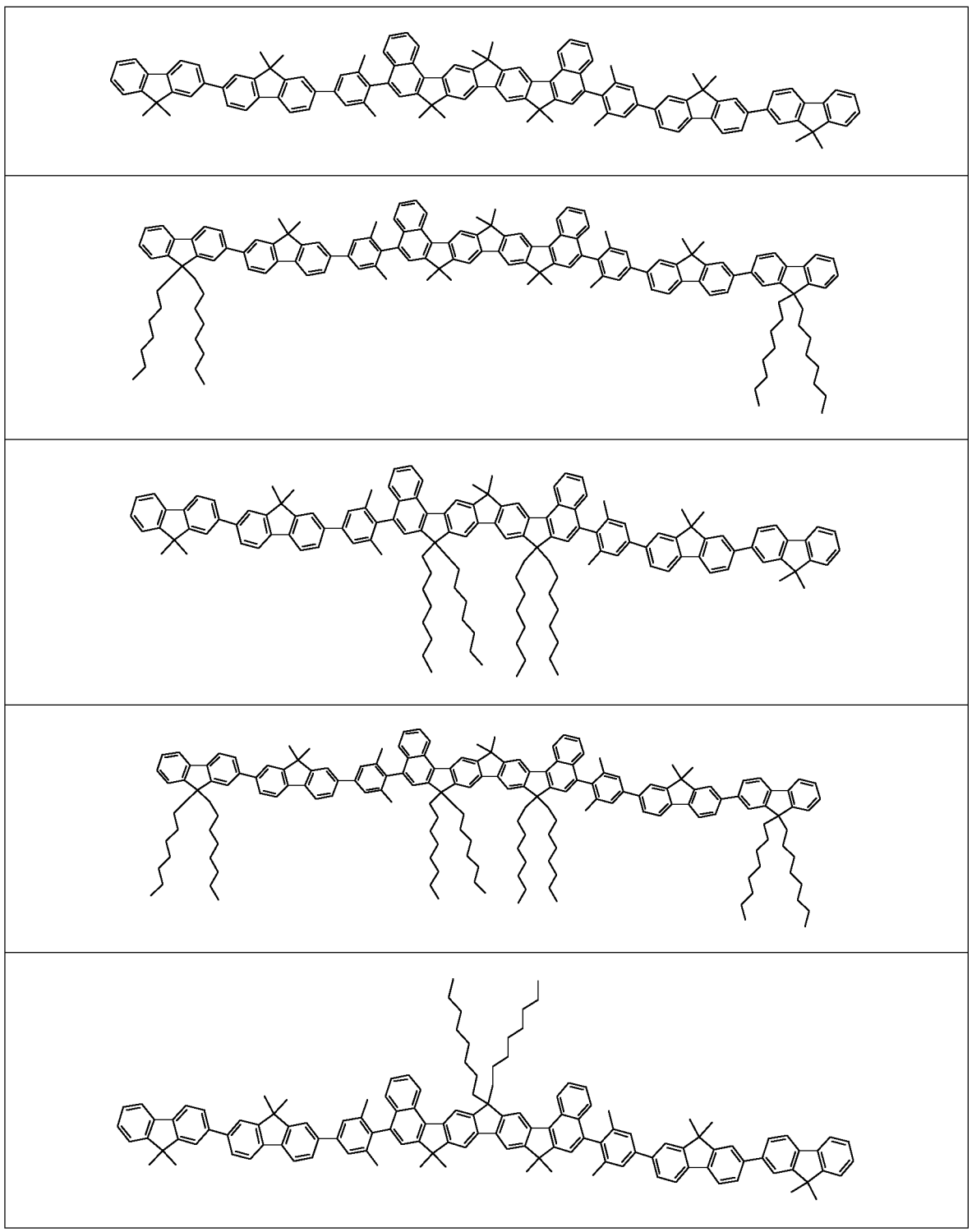

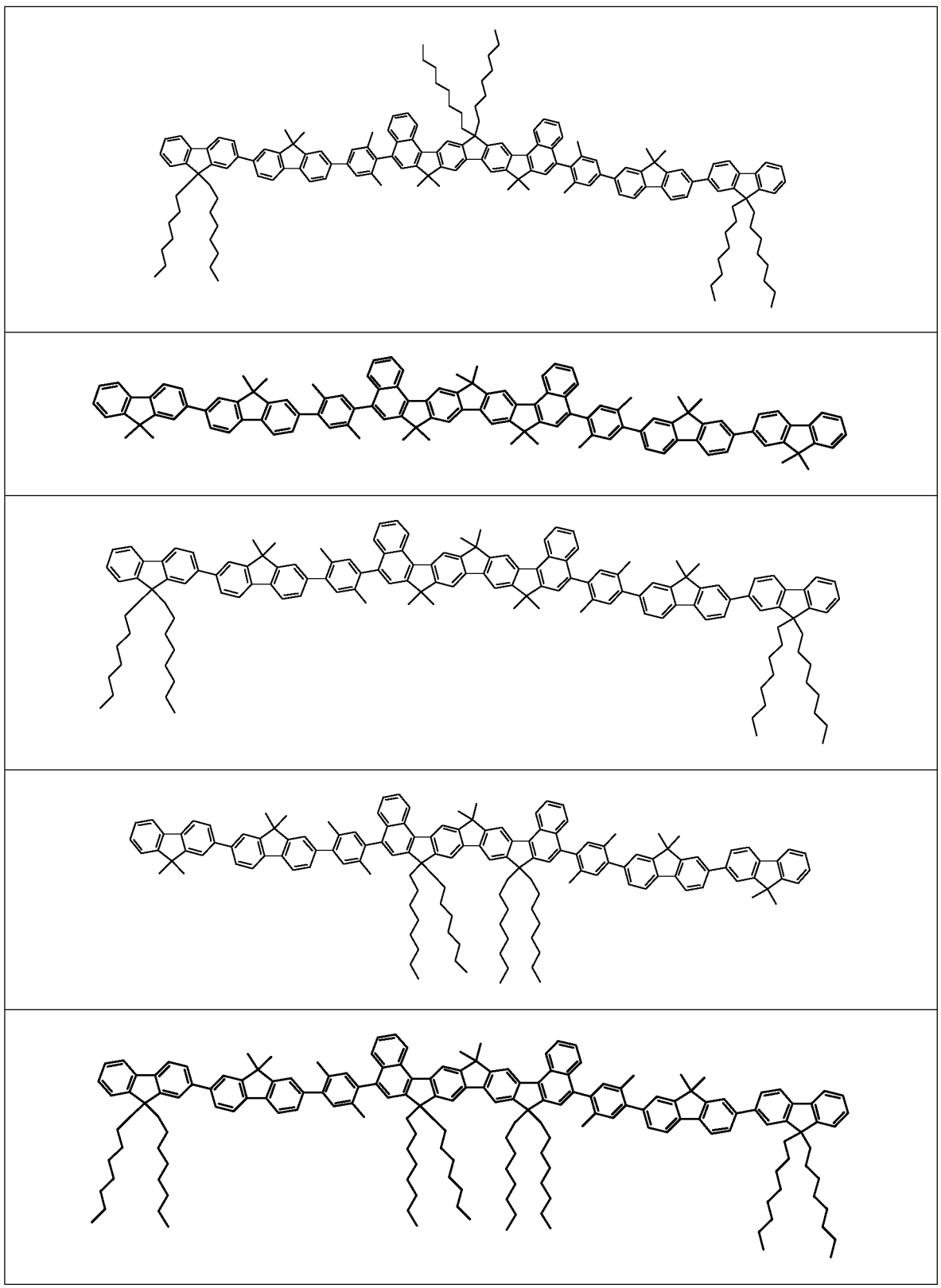

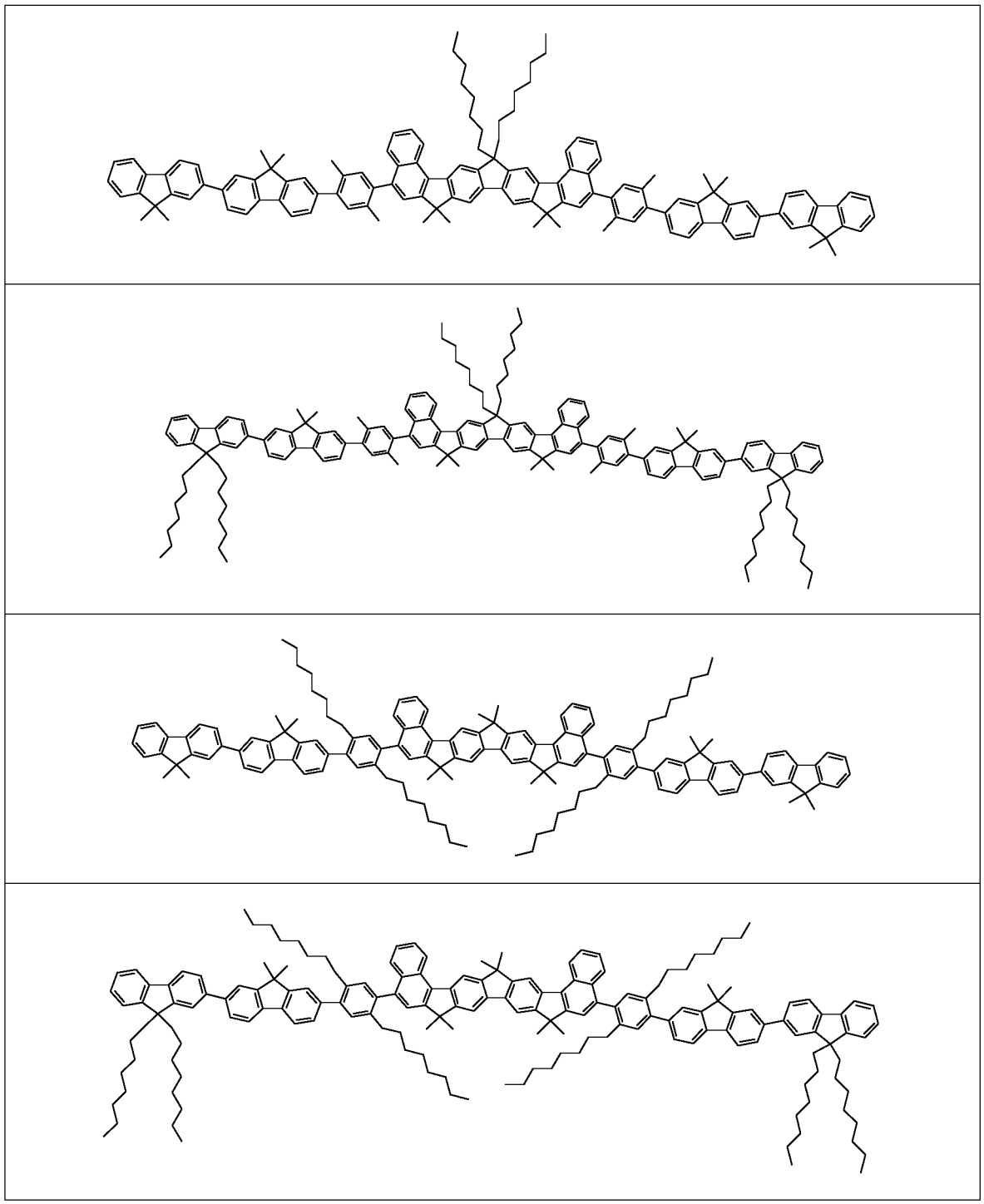

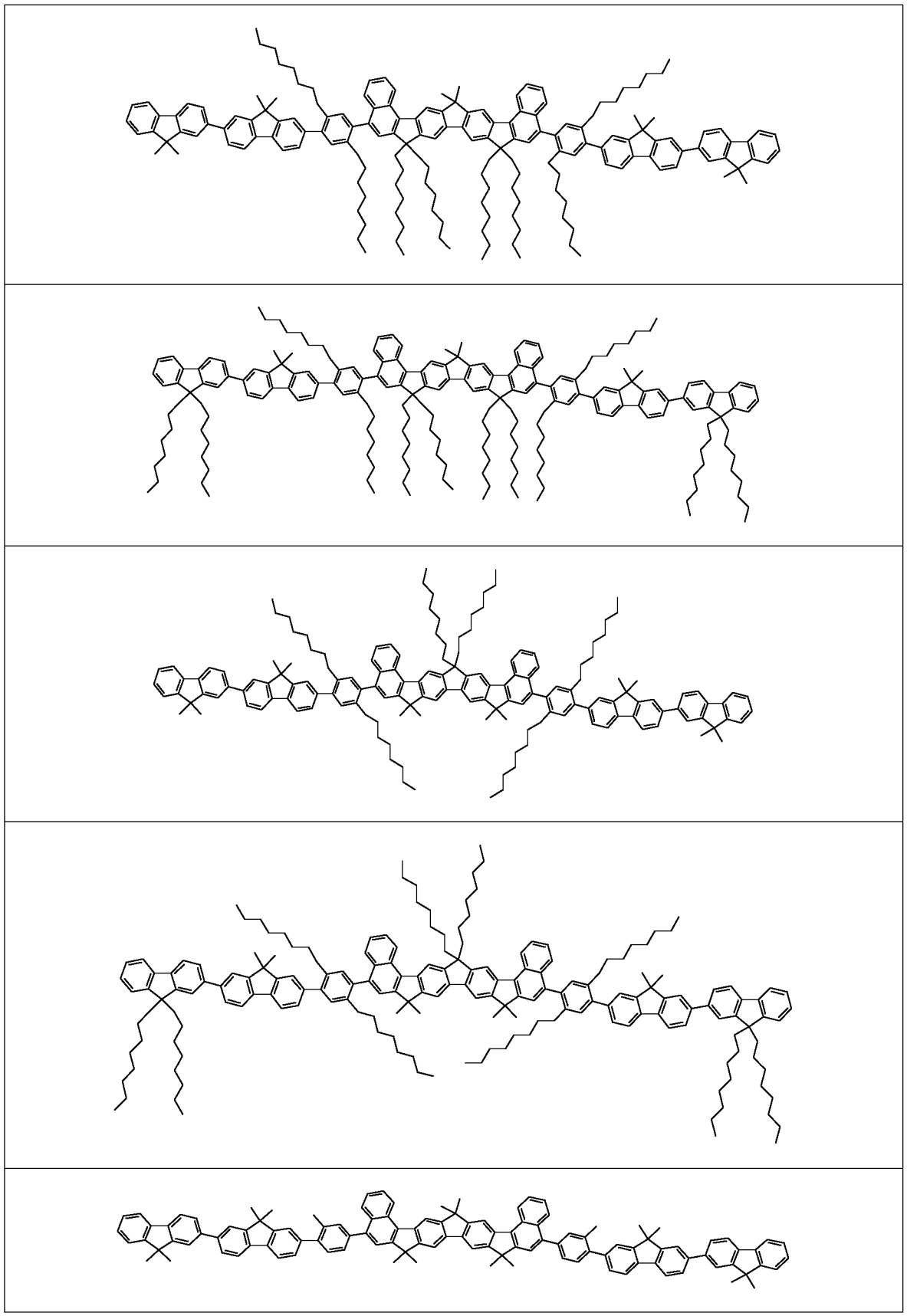

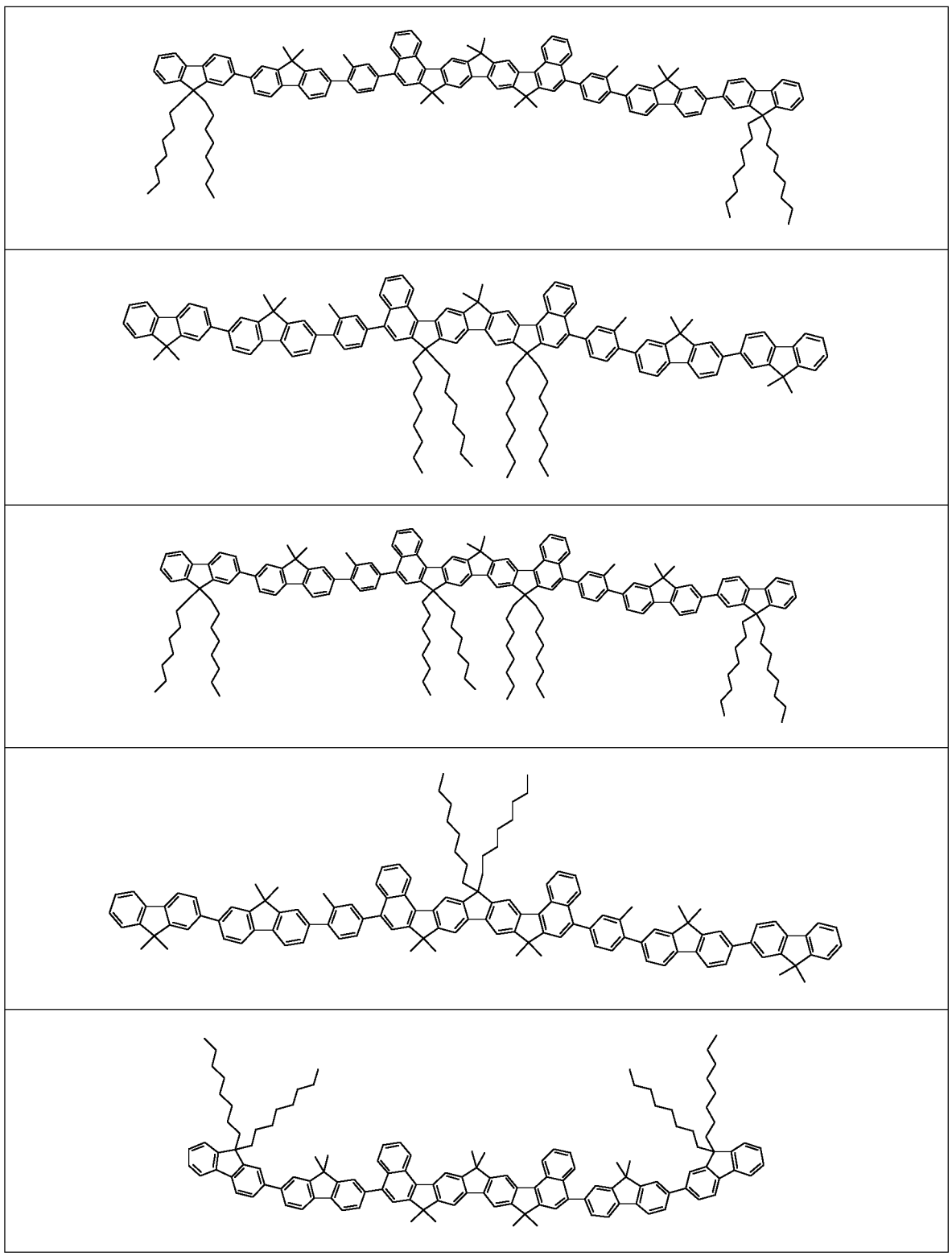

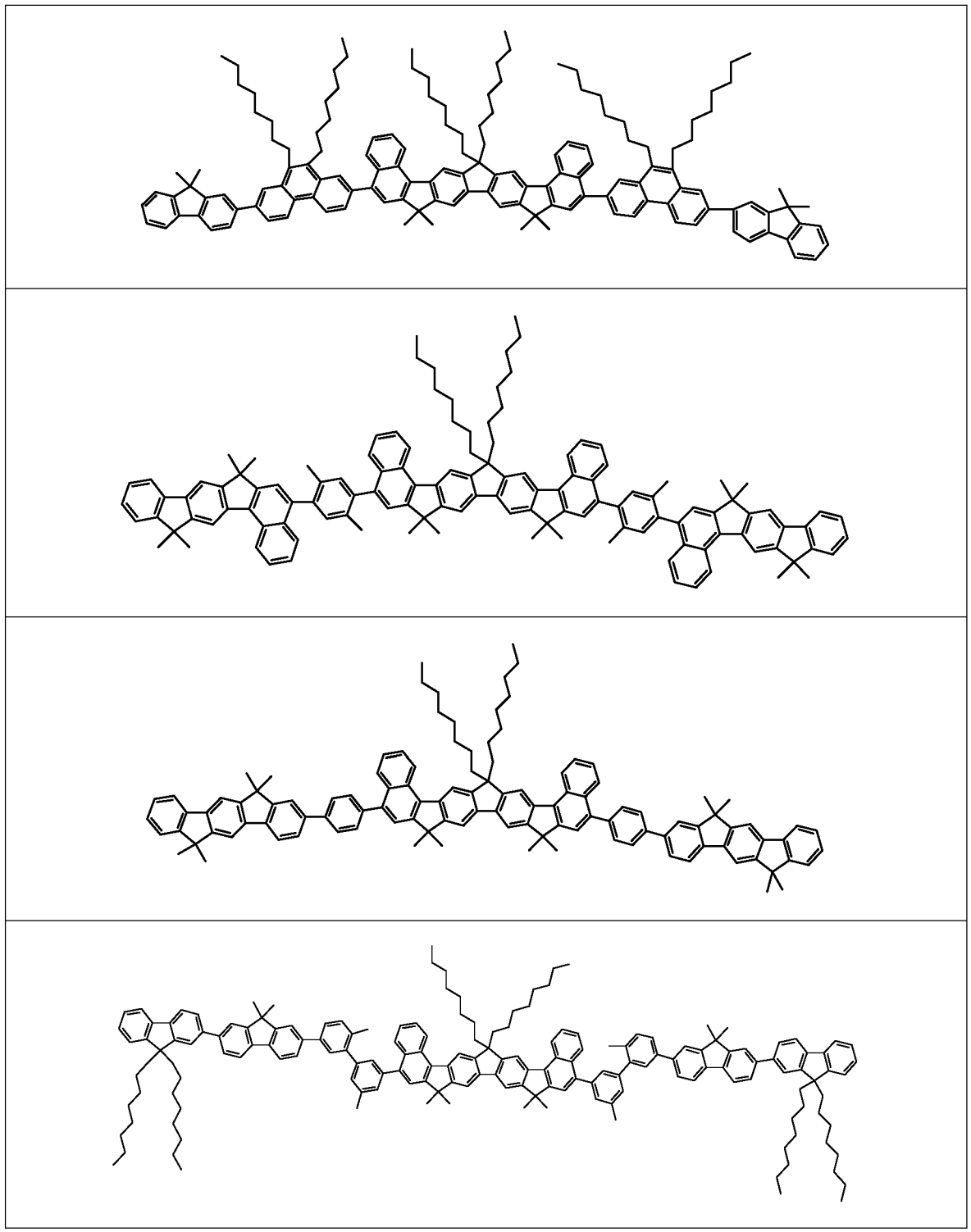

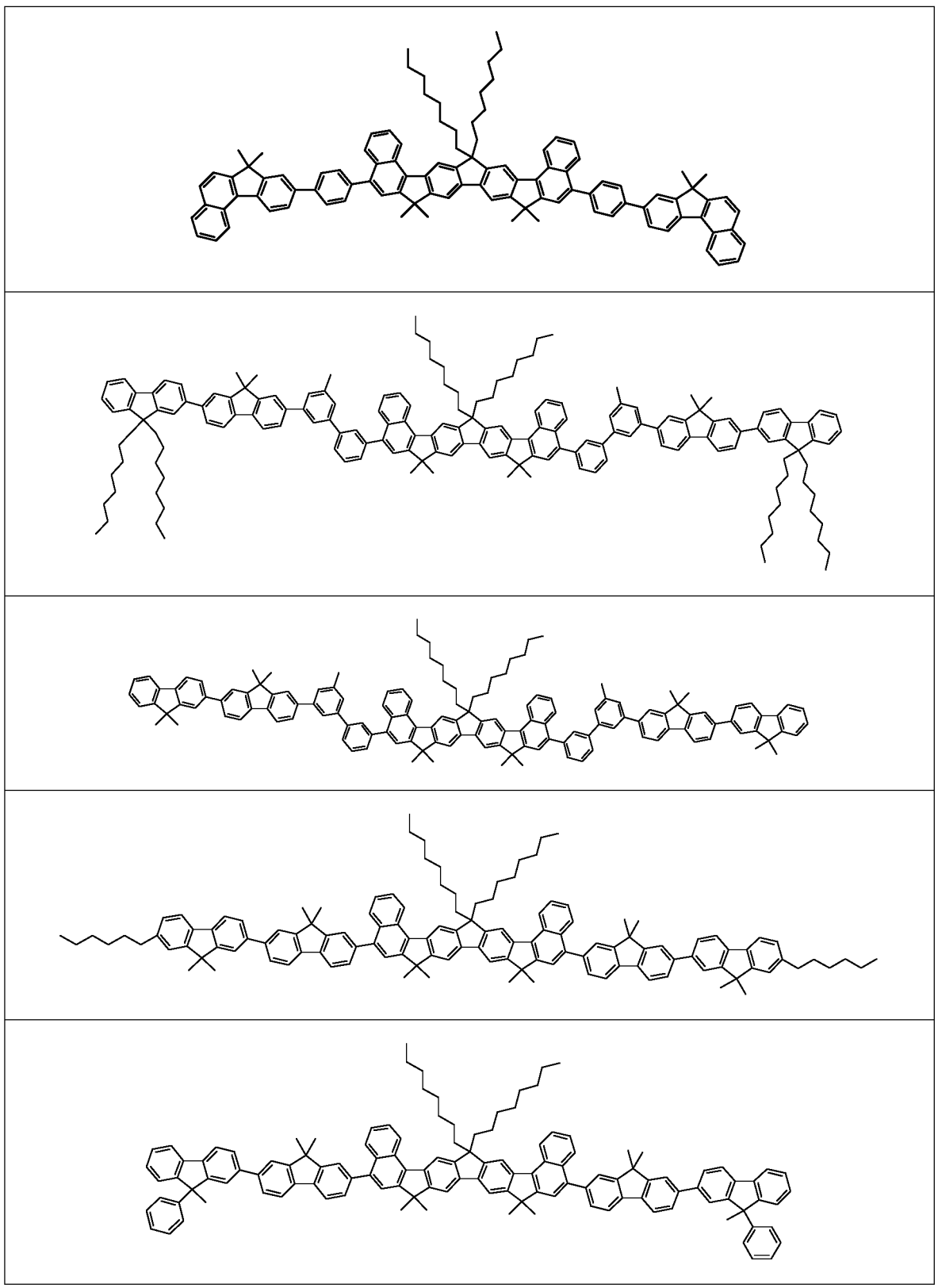

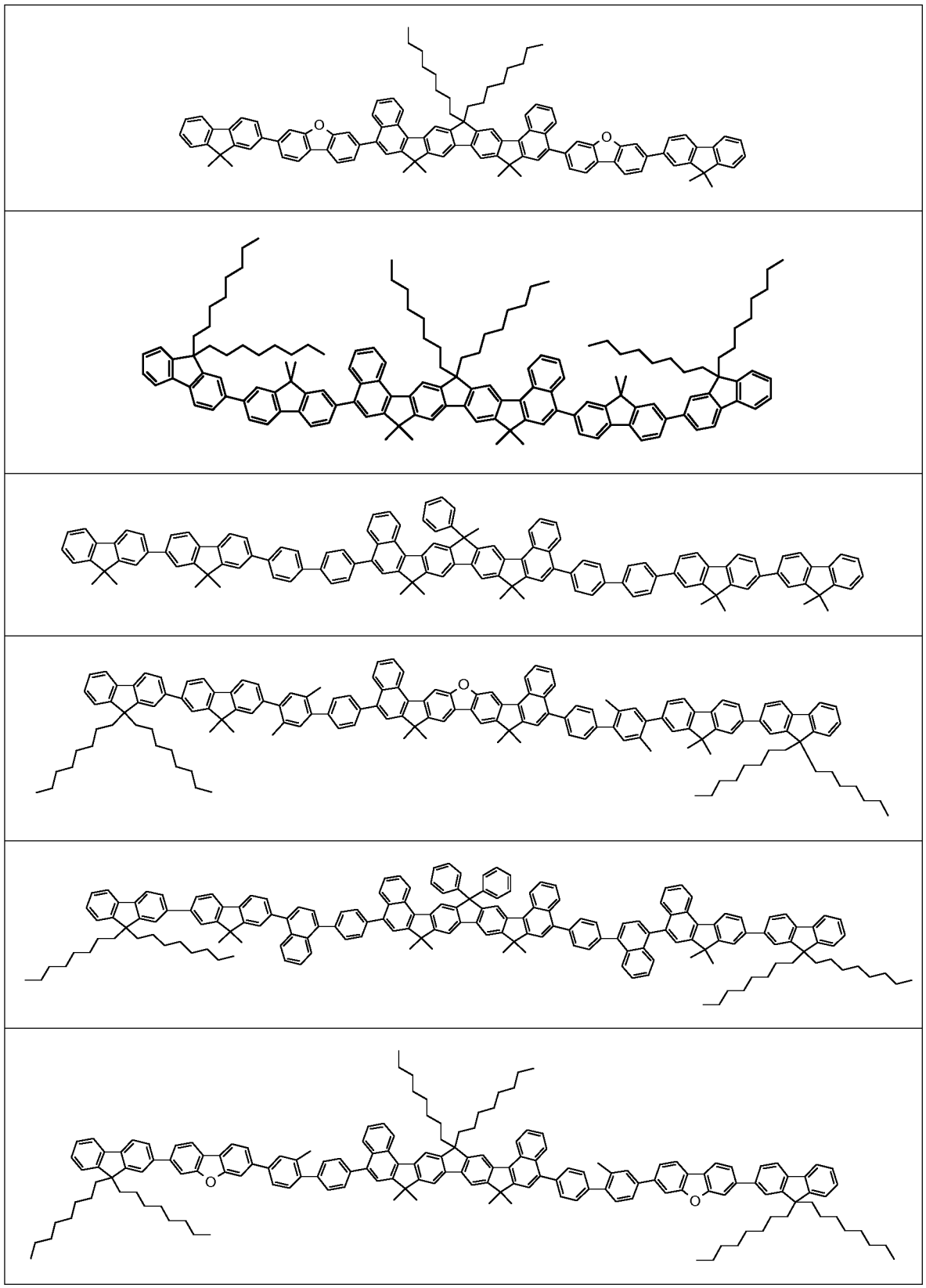

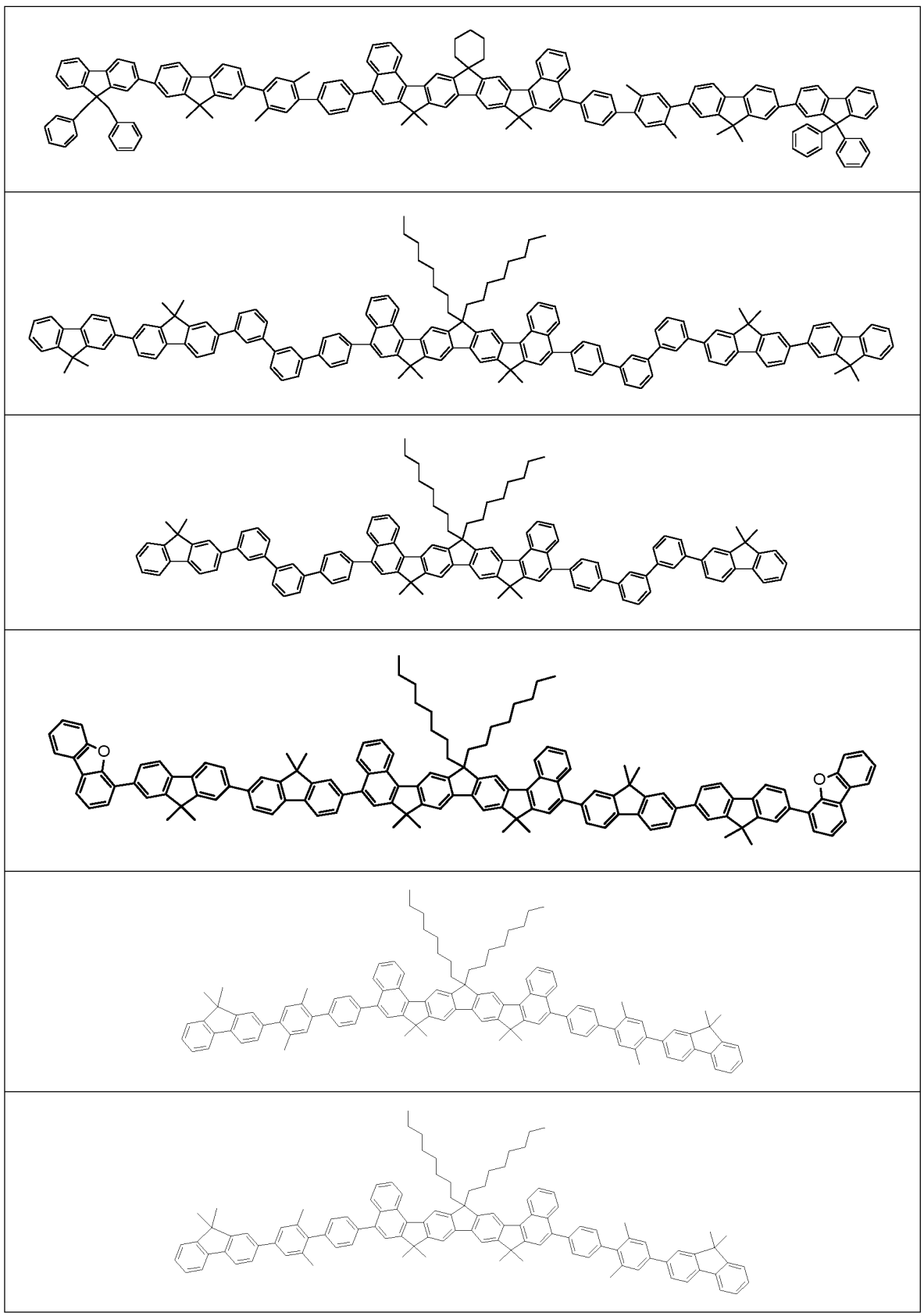

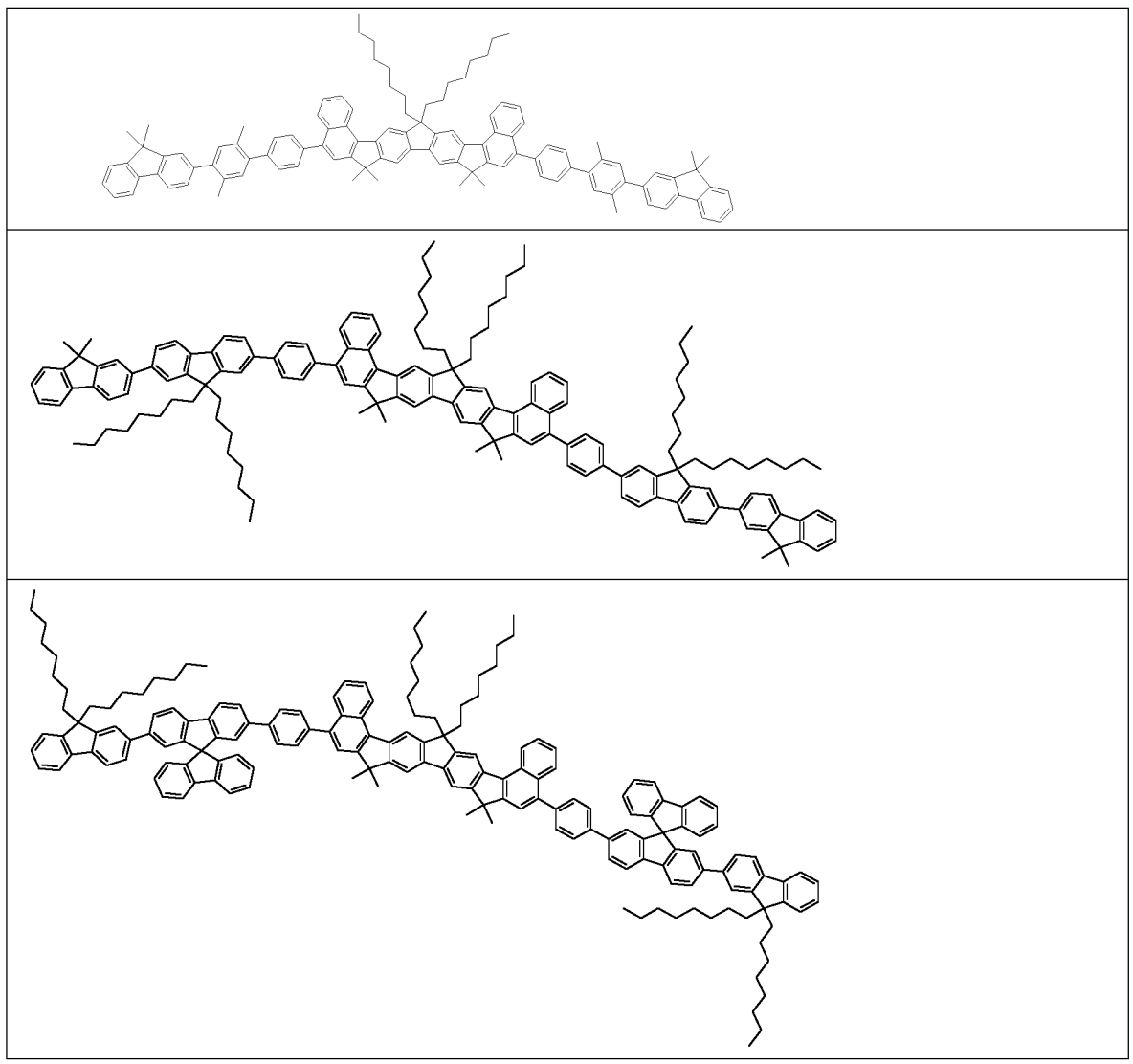

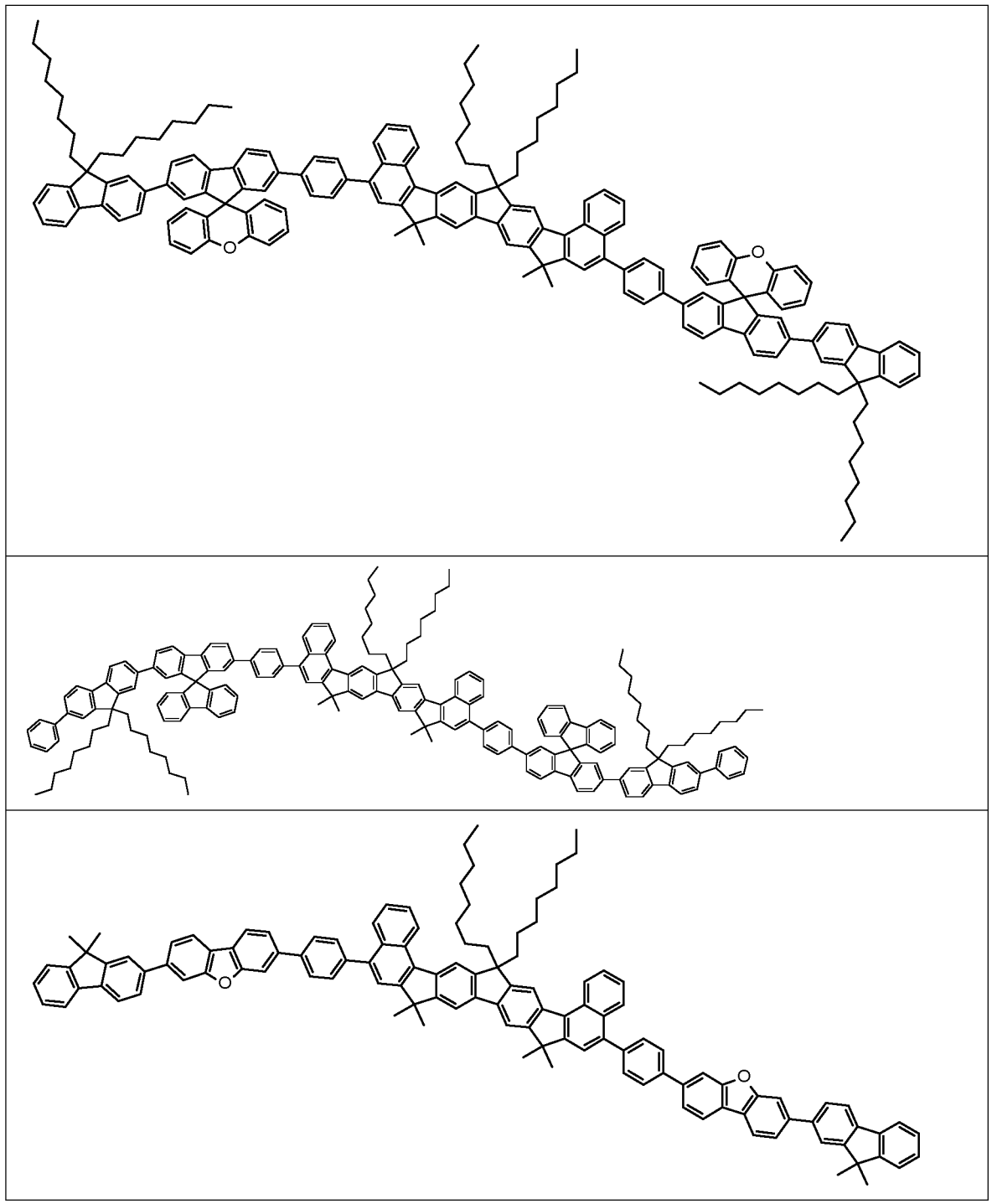

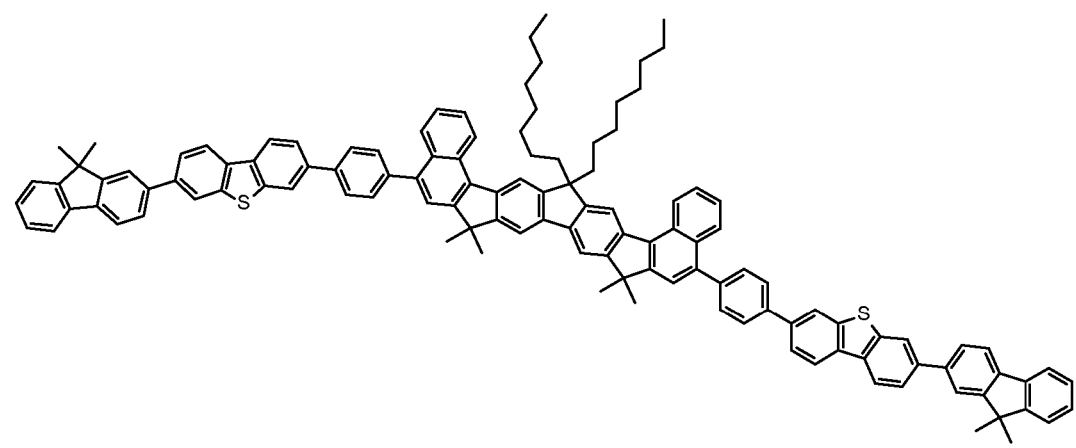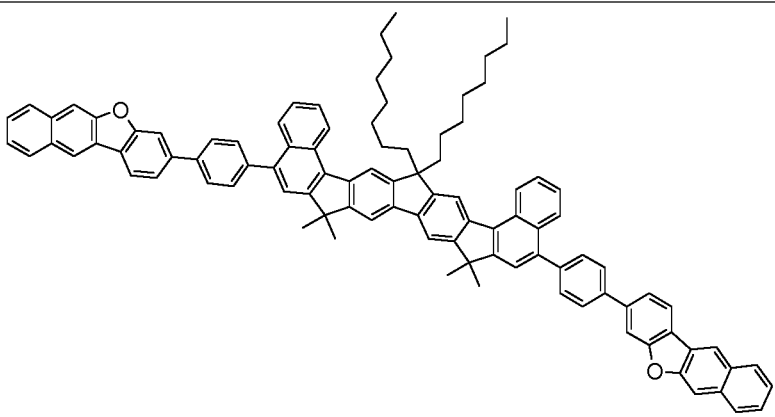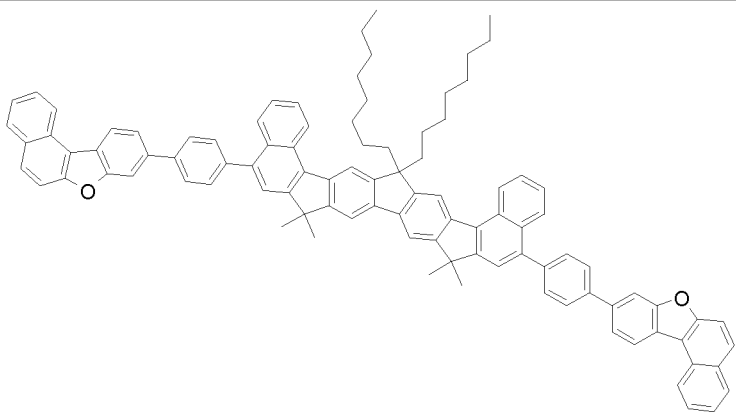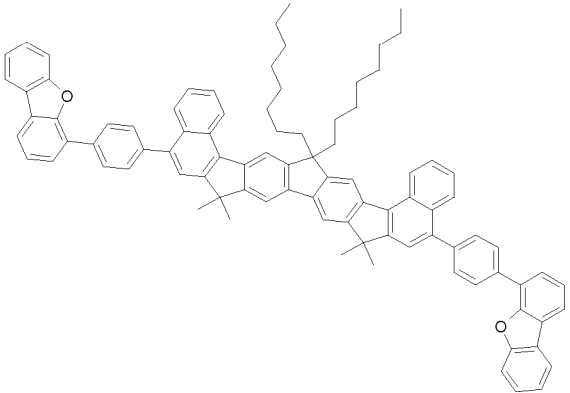

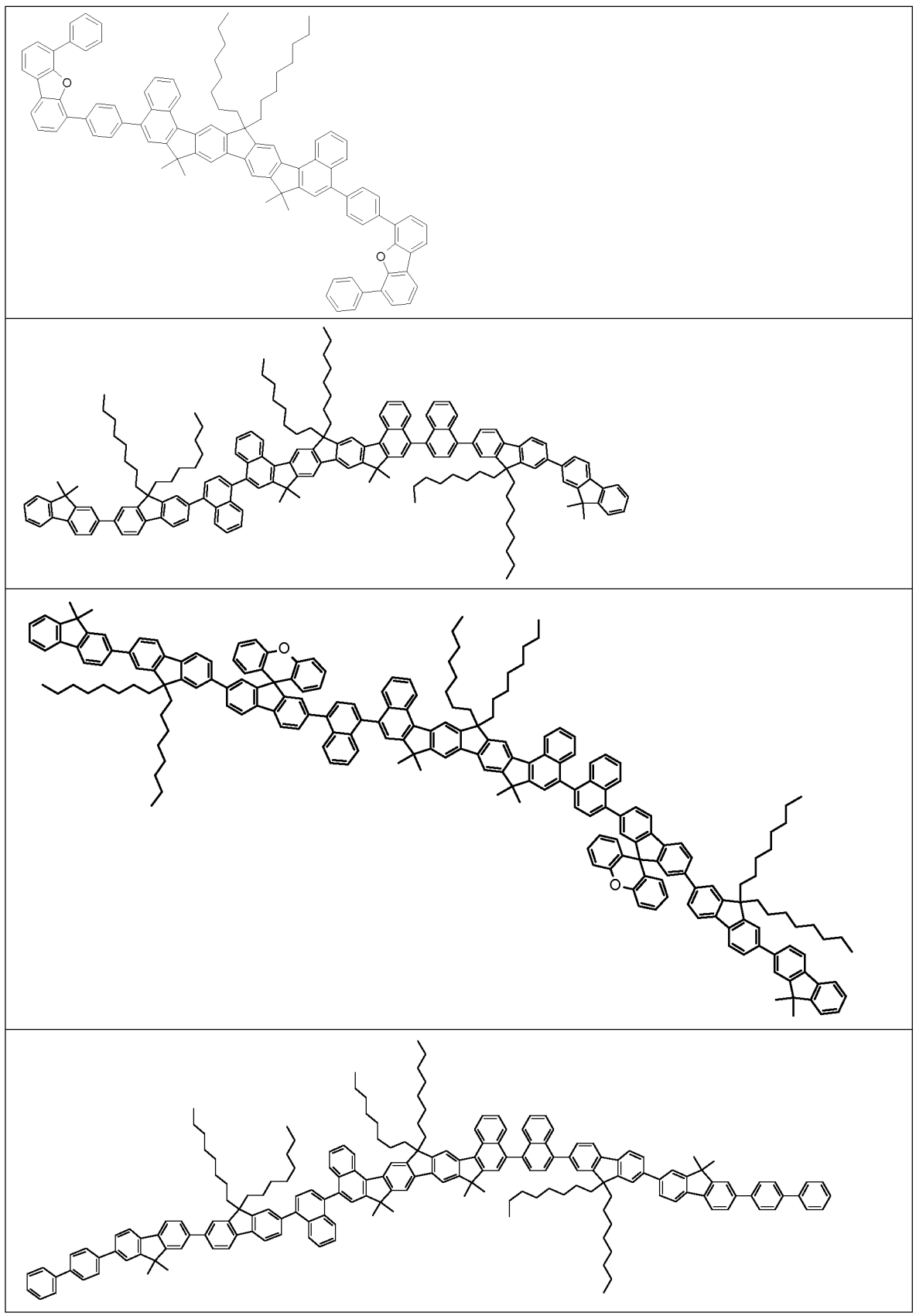

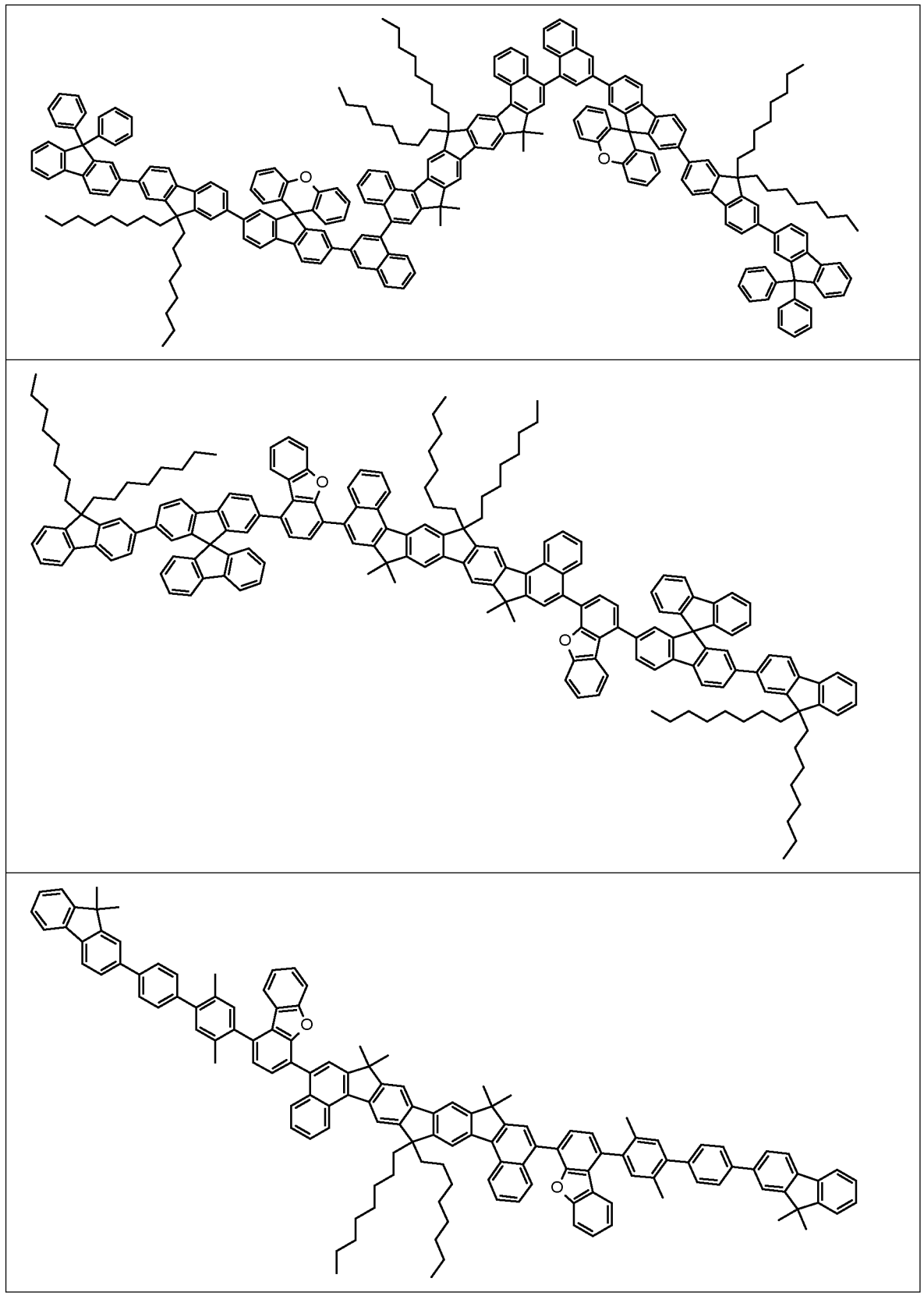

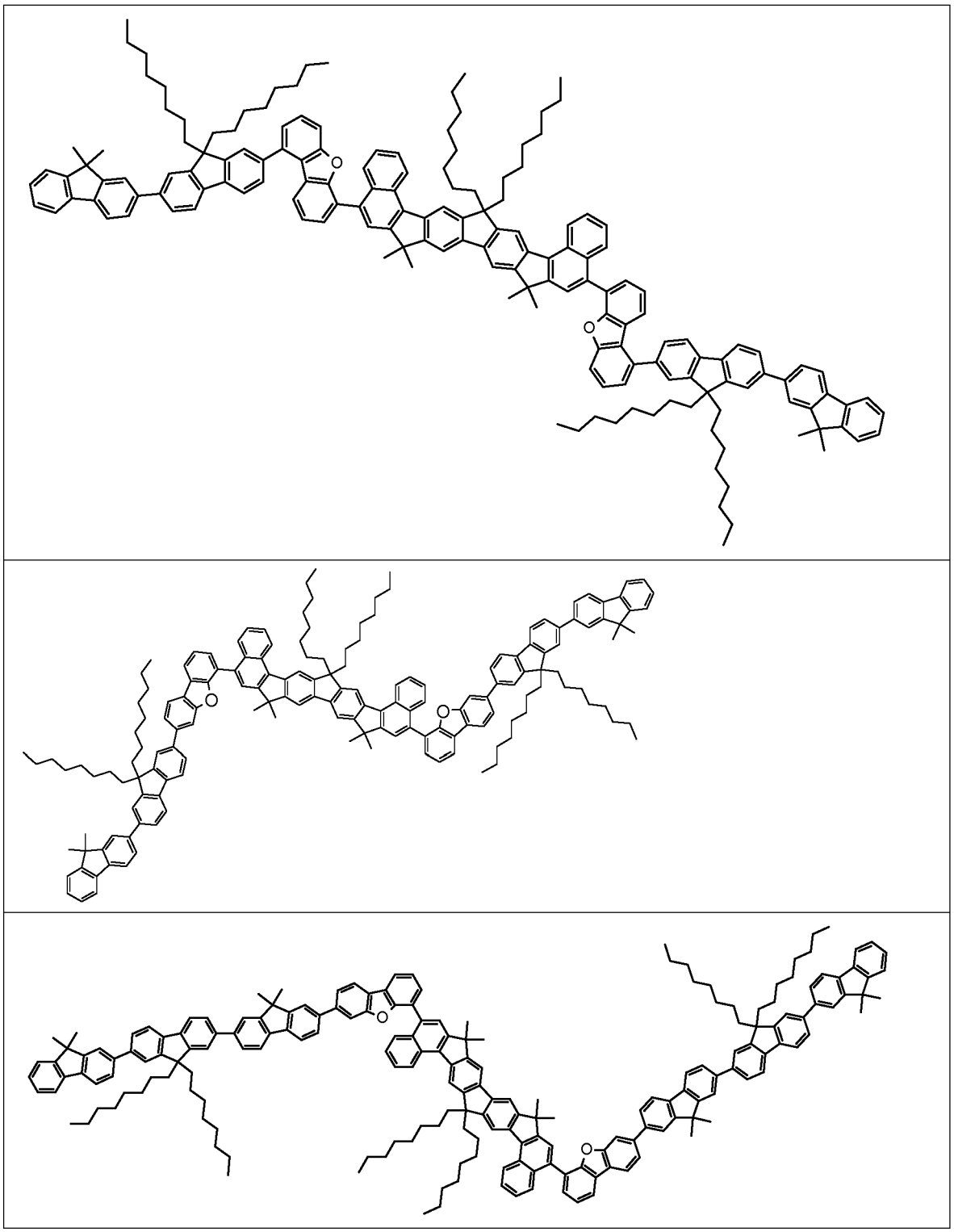

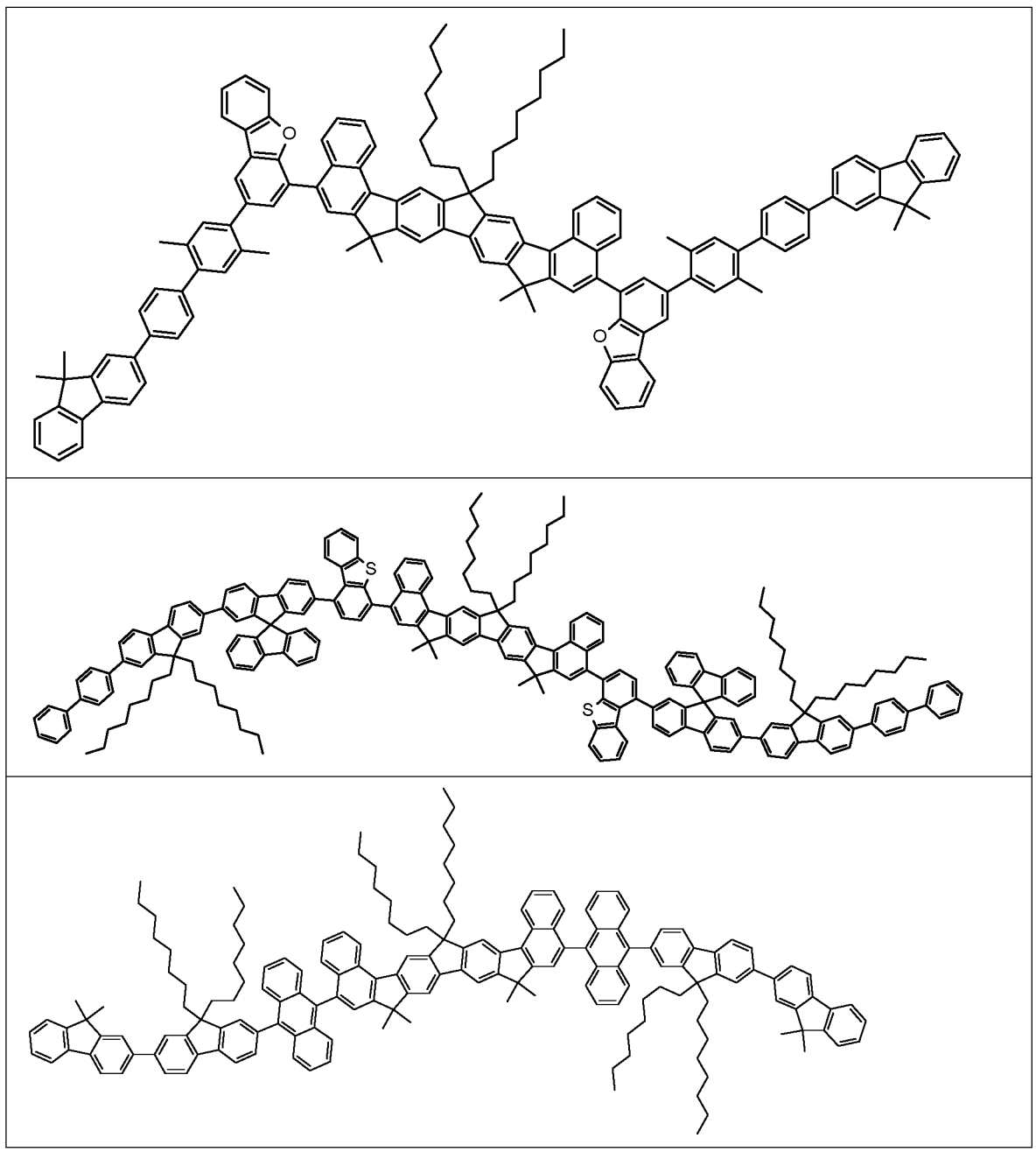

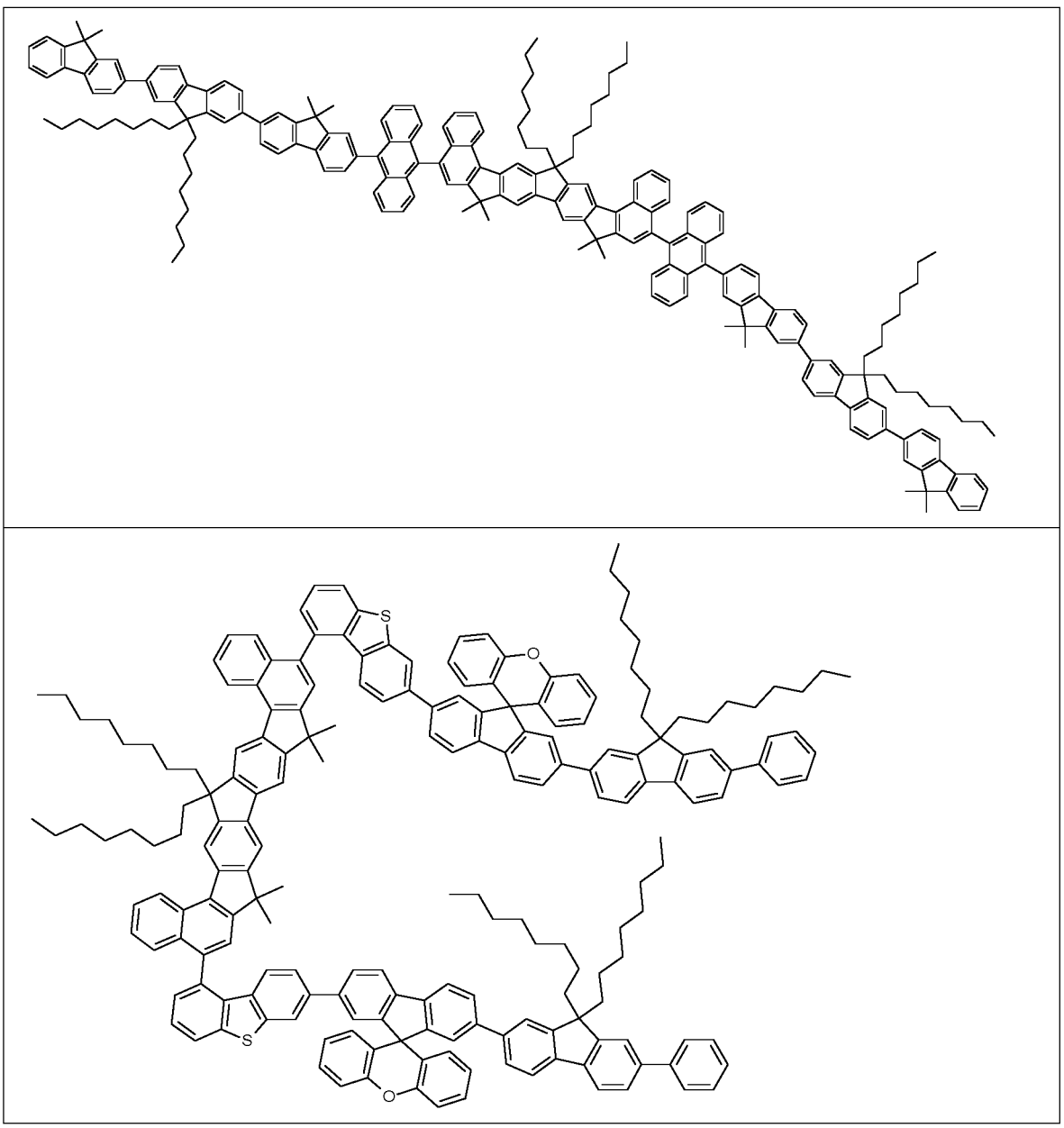

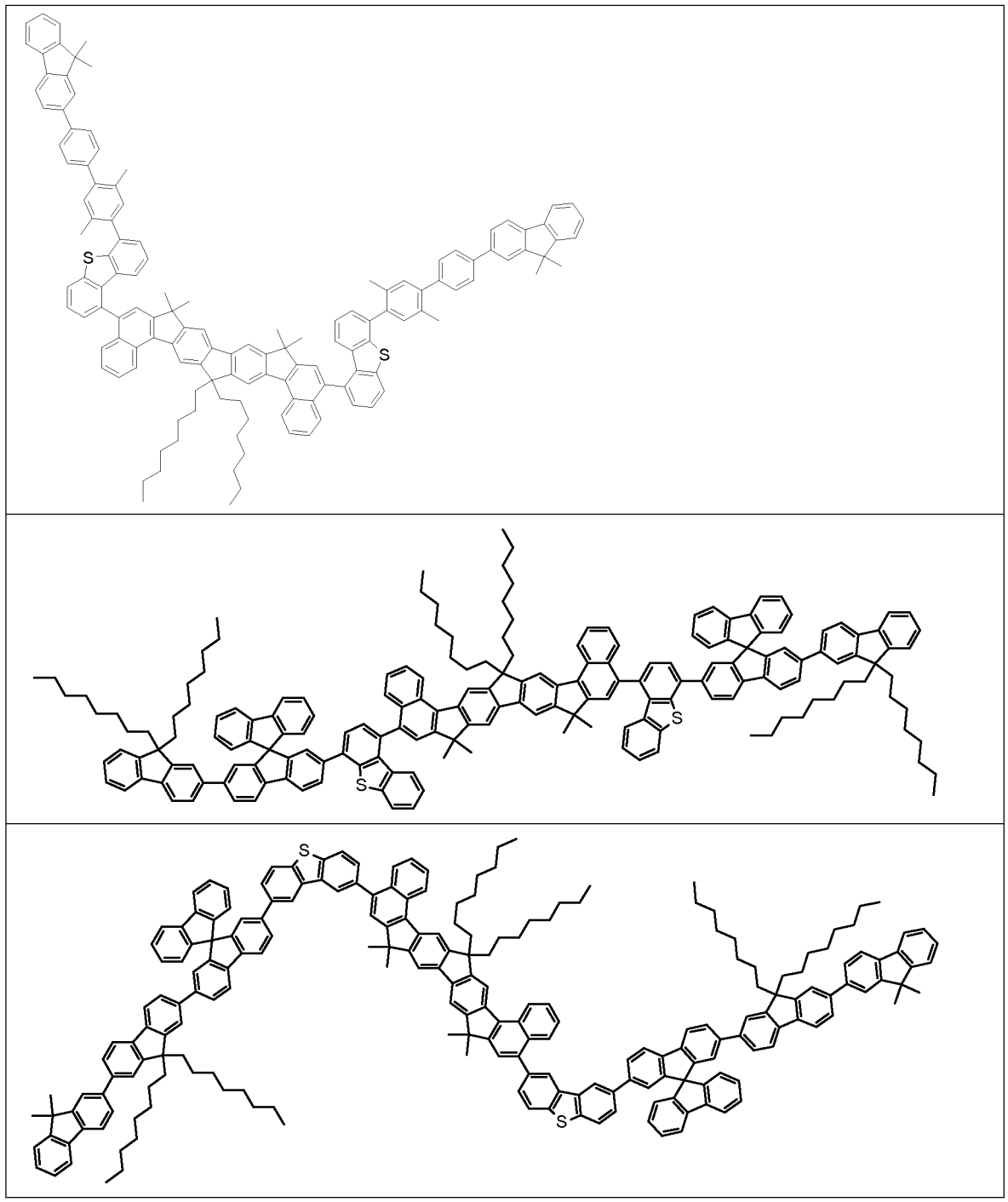

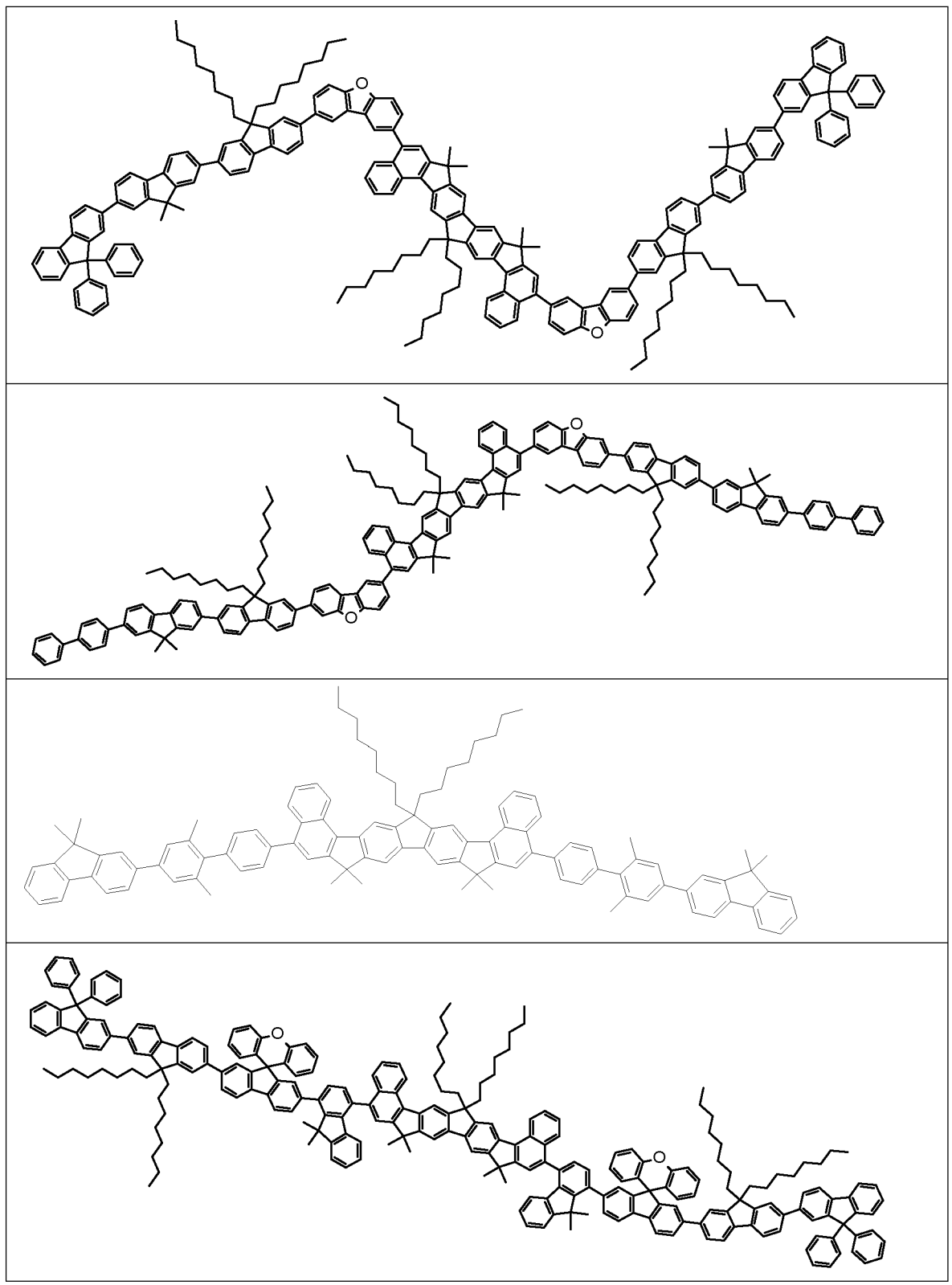

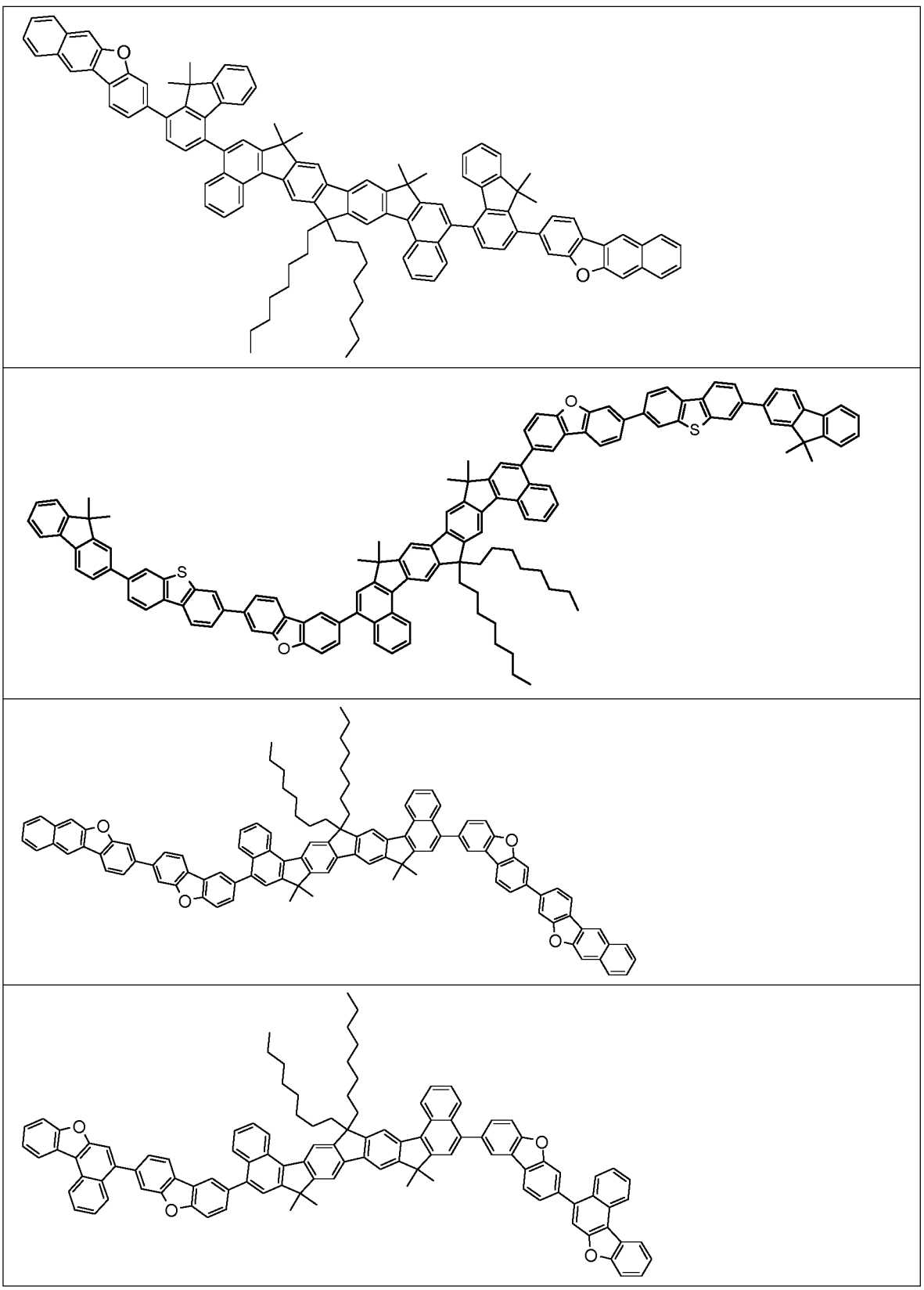

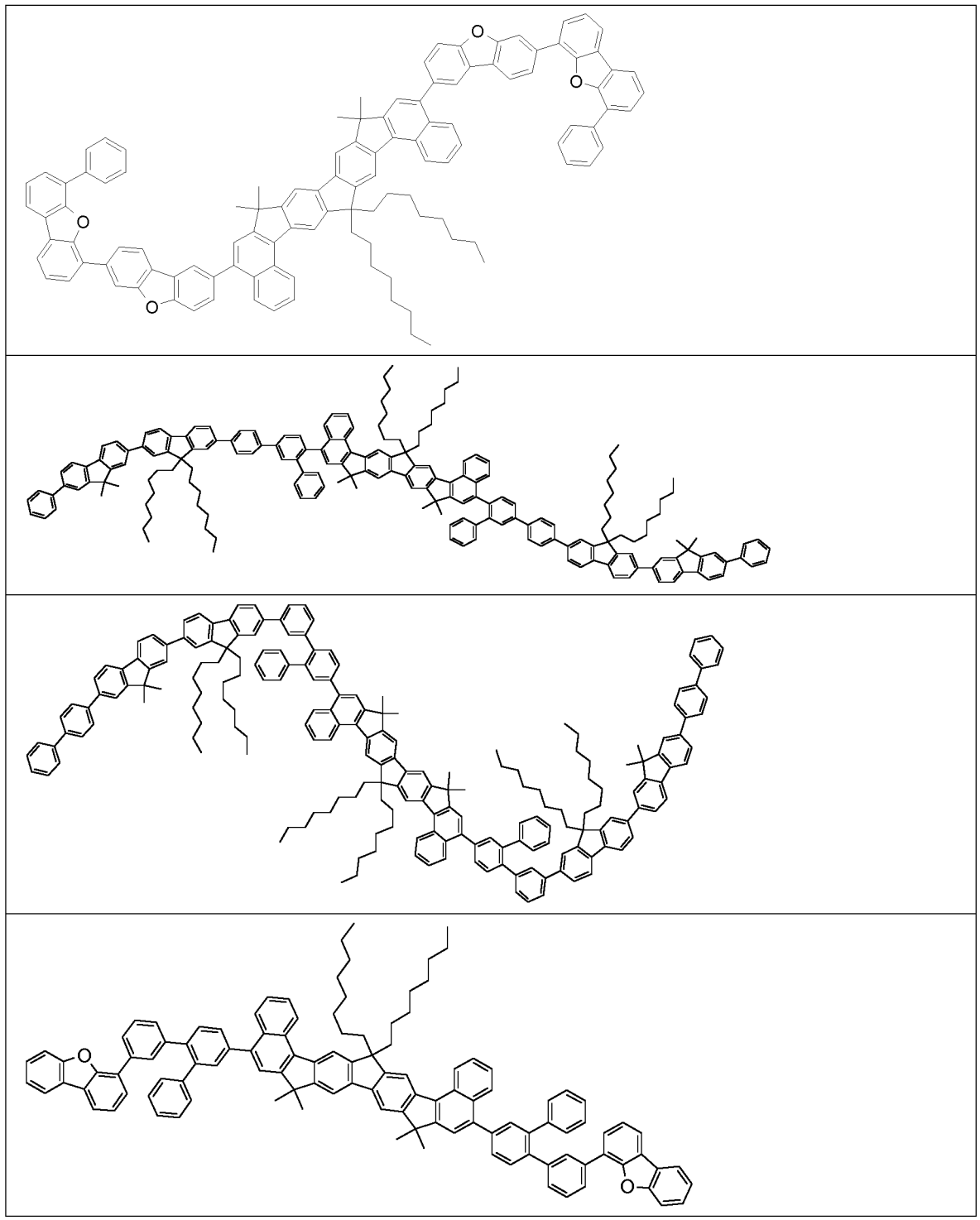

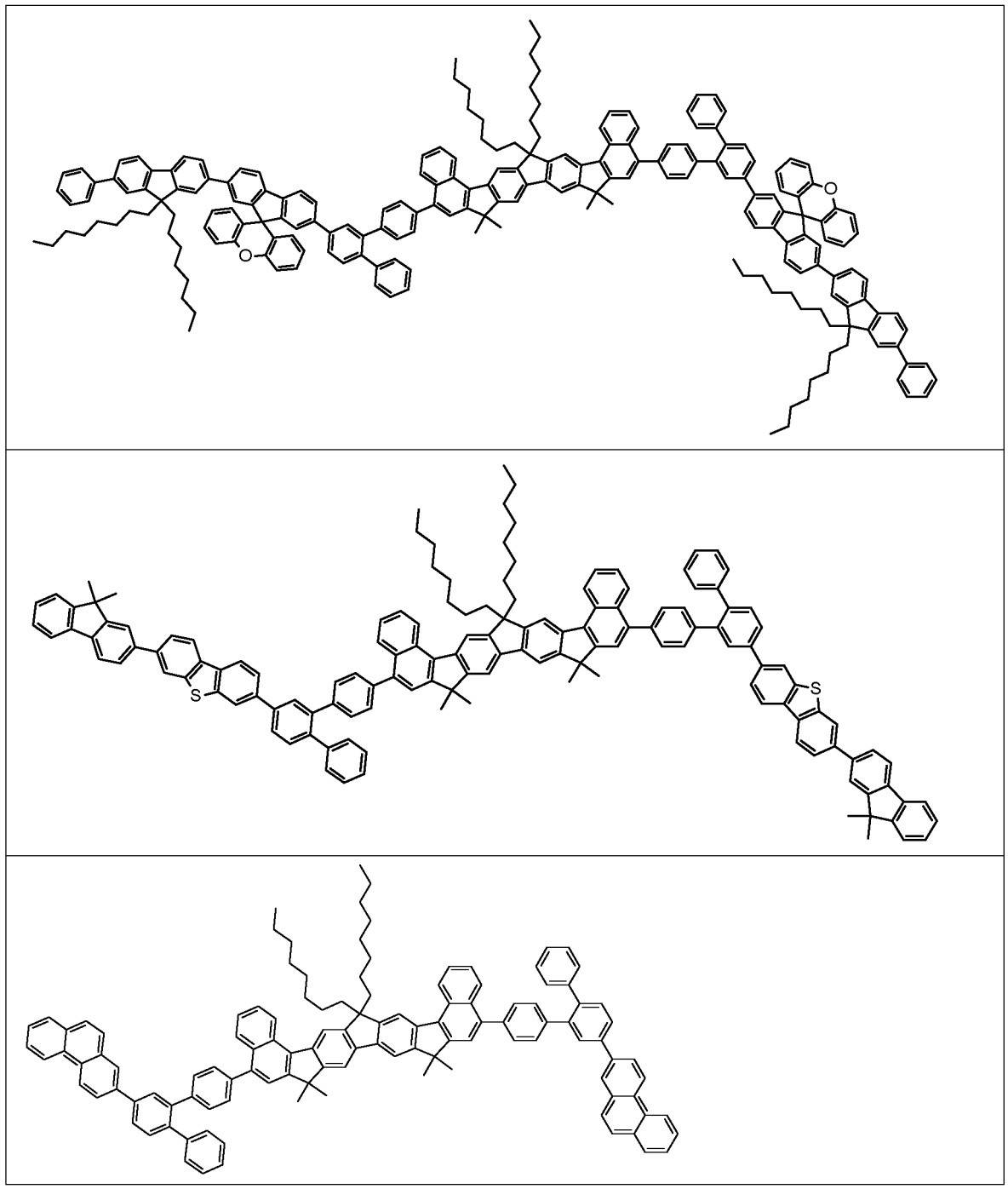

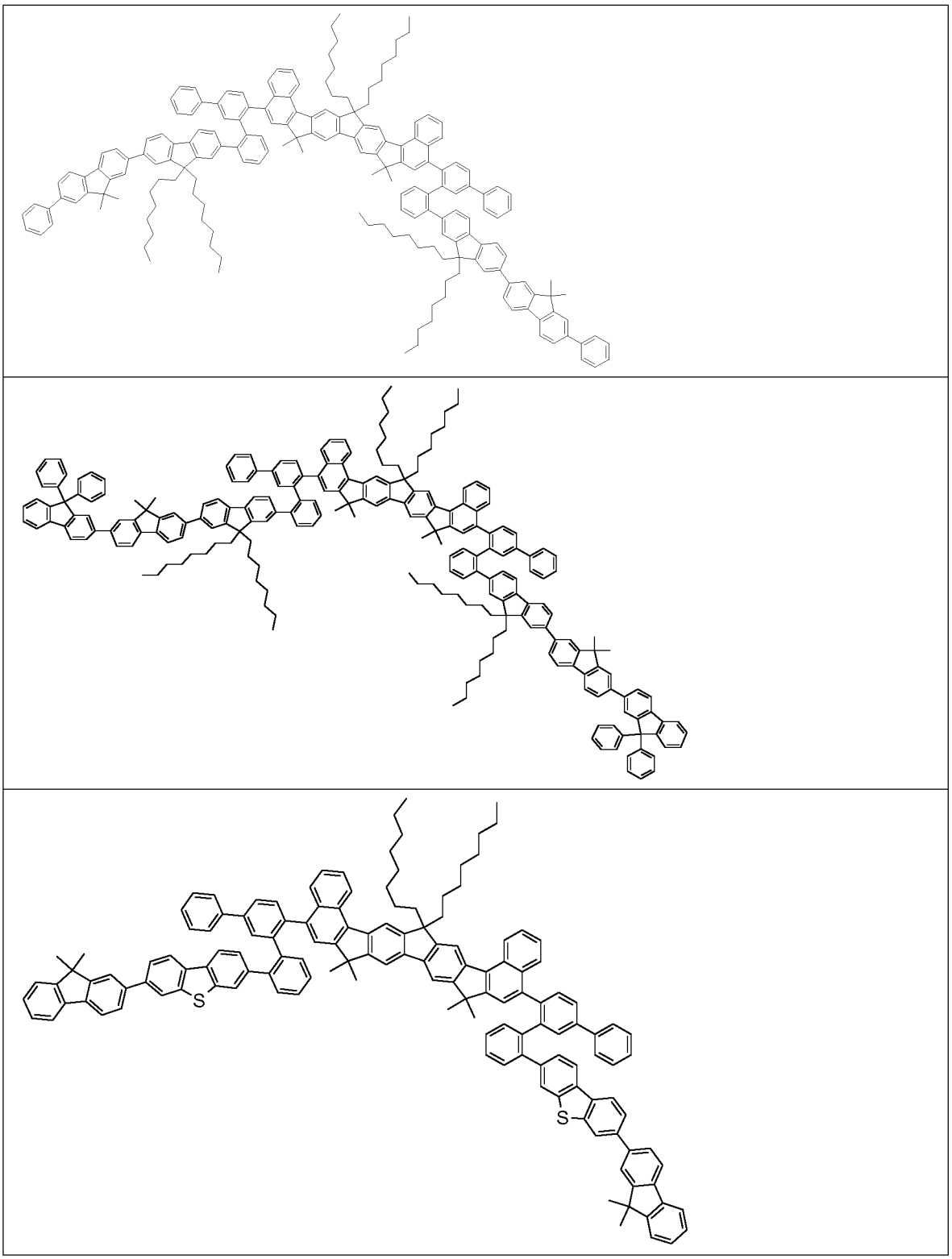

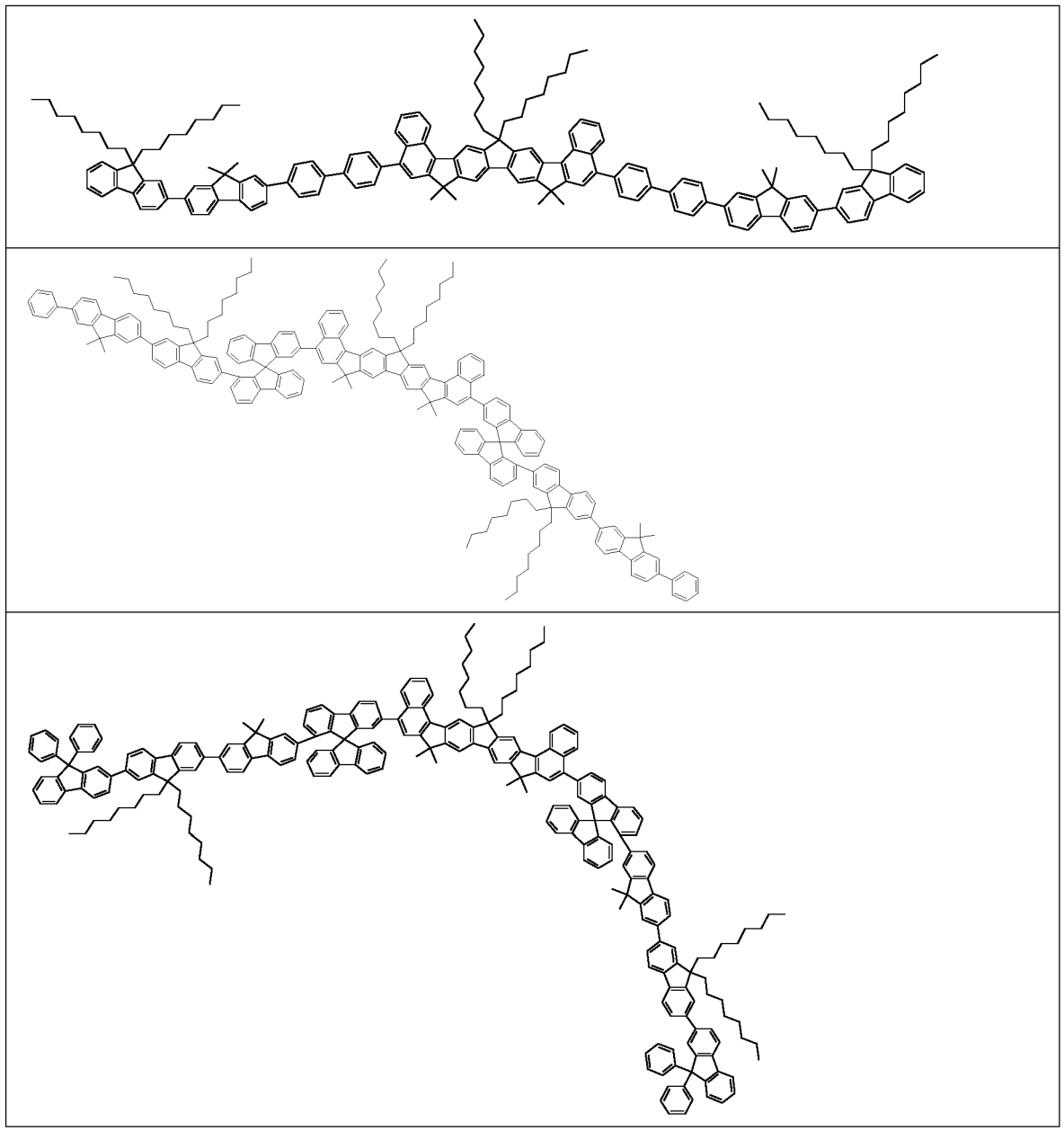

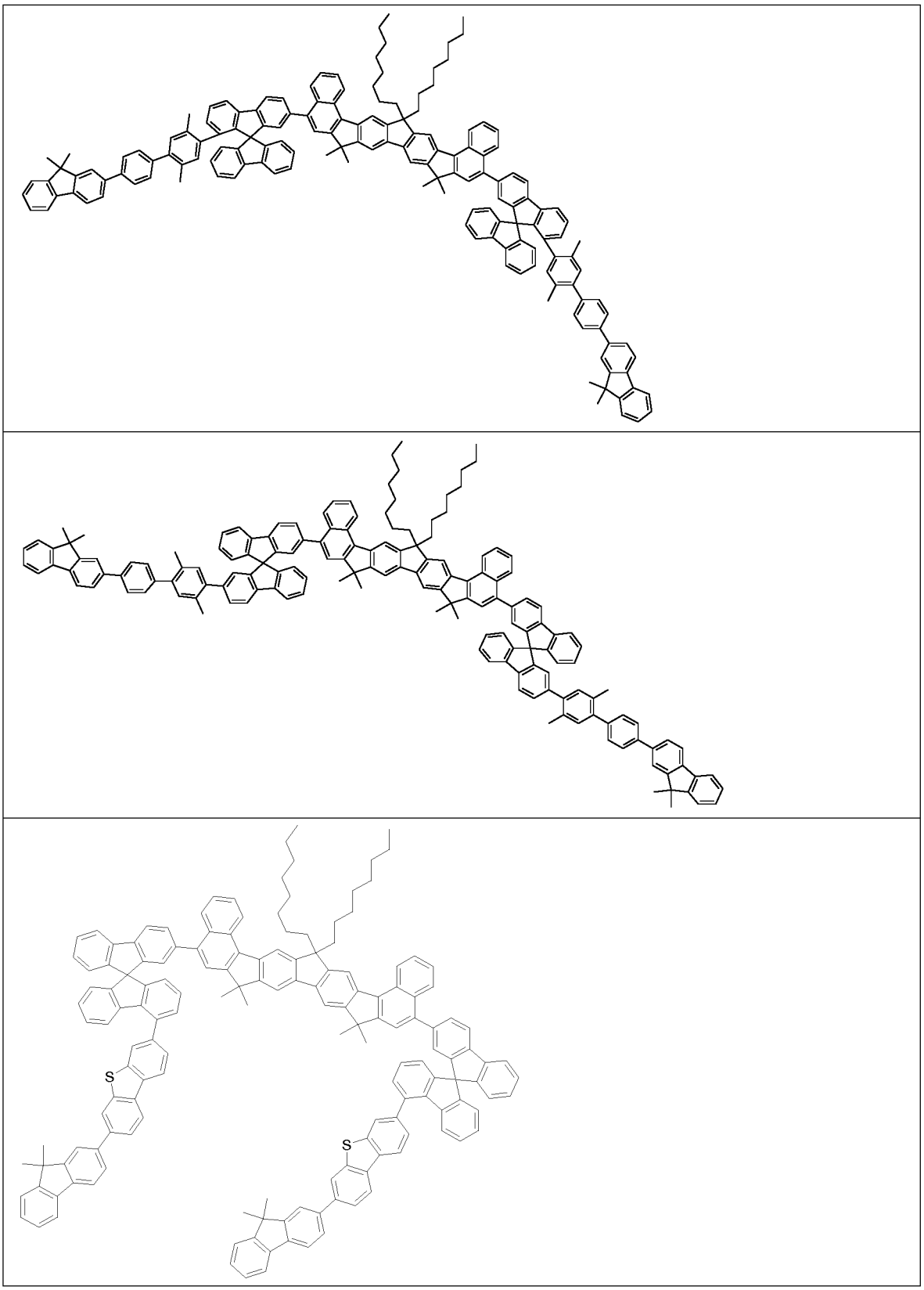

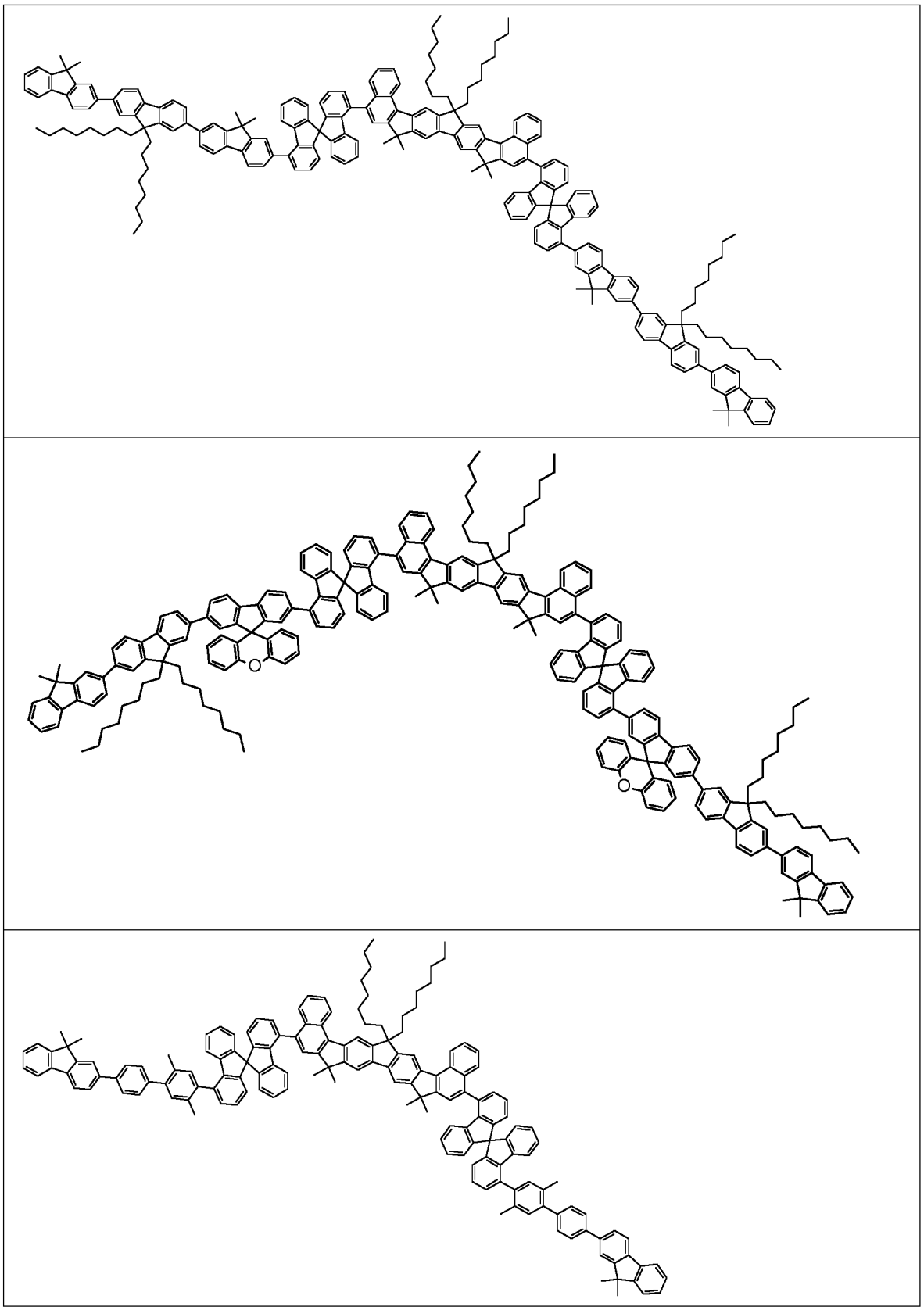

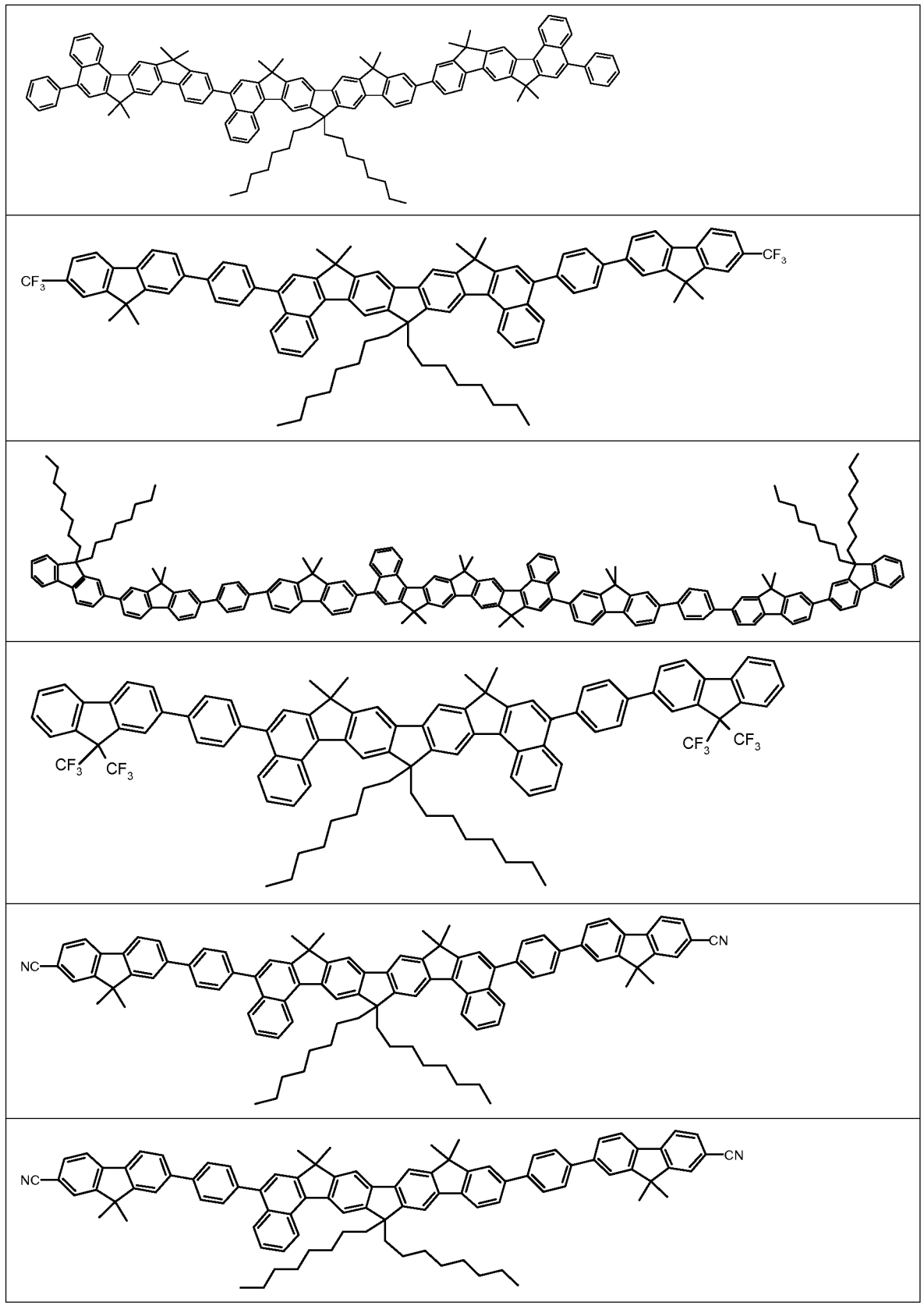

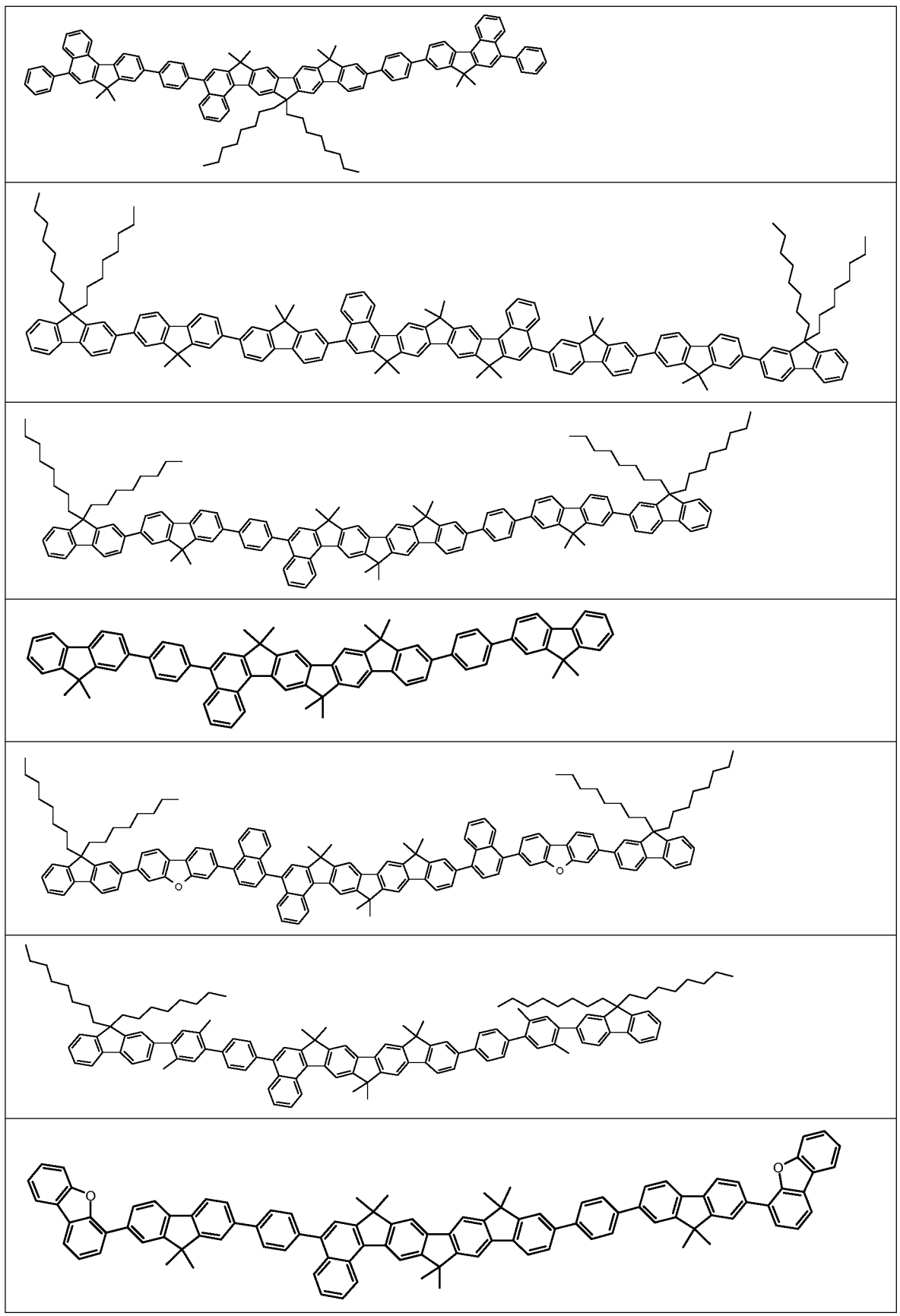

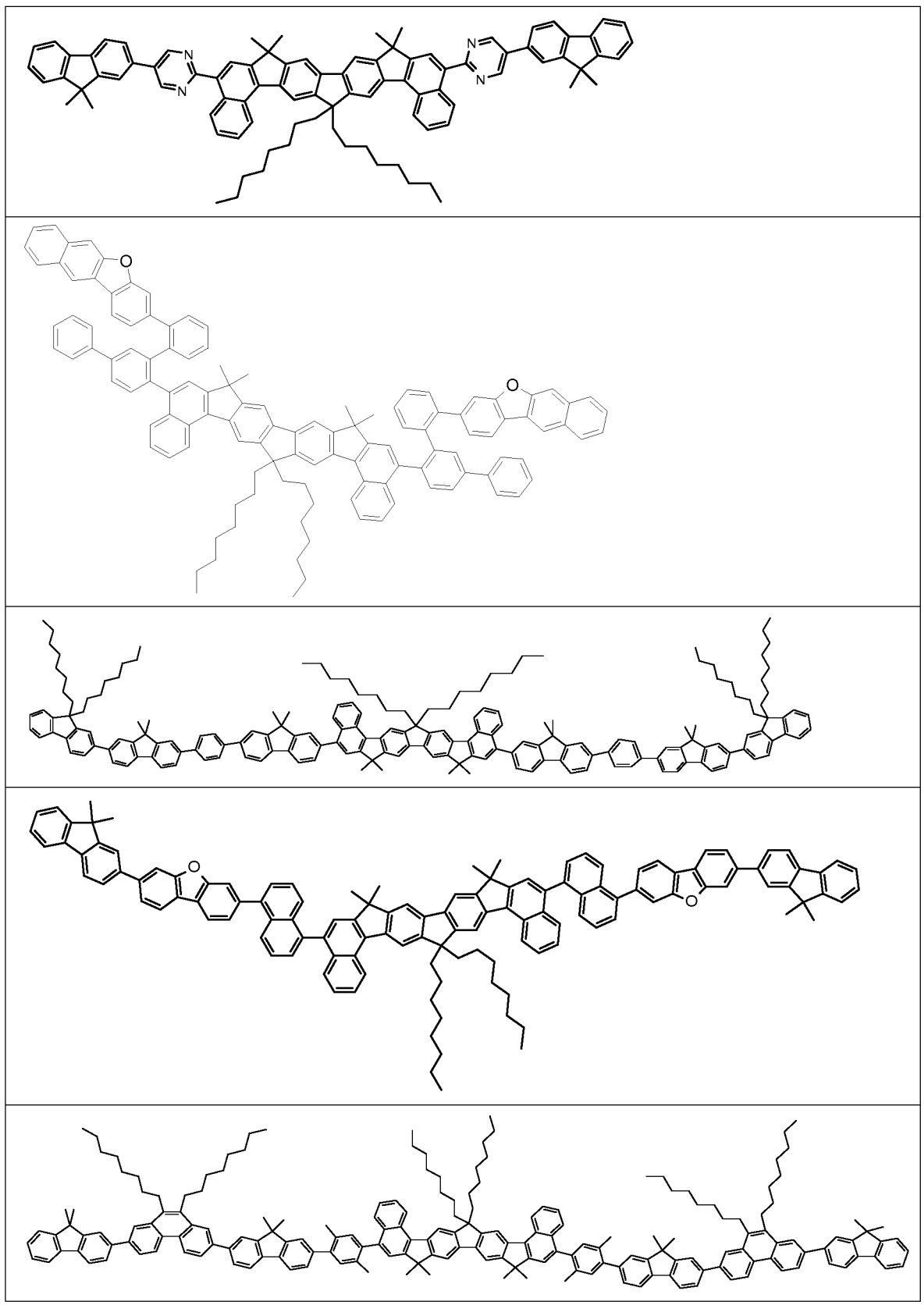

| 125 | 126 |
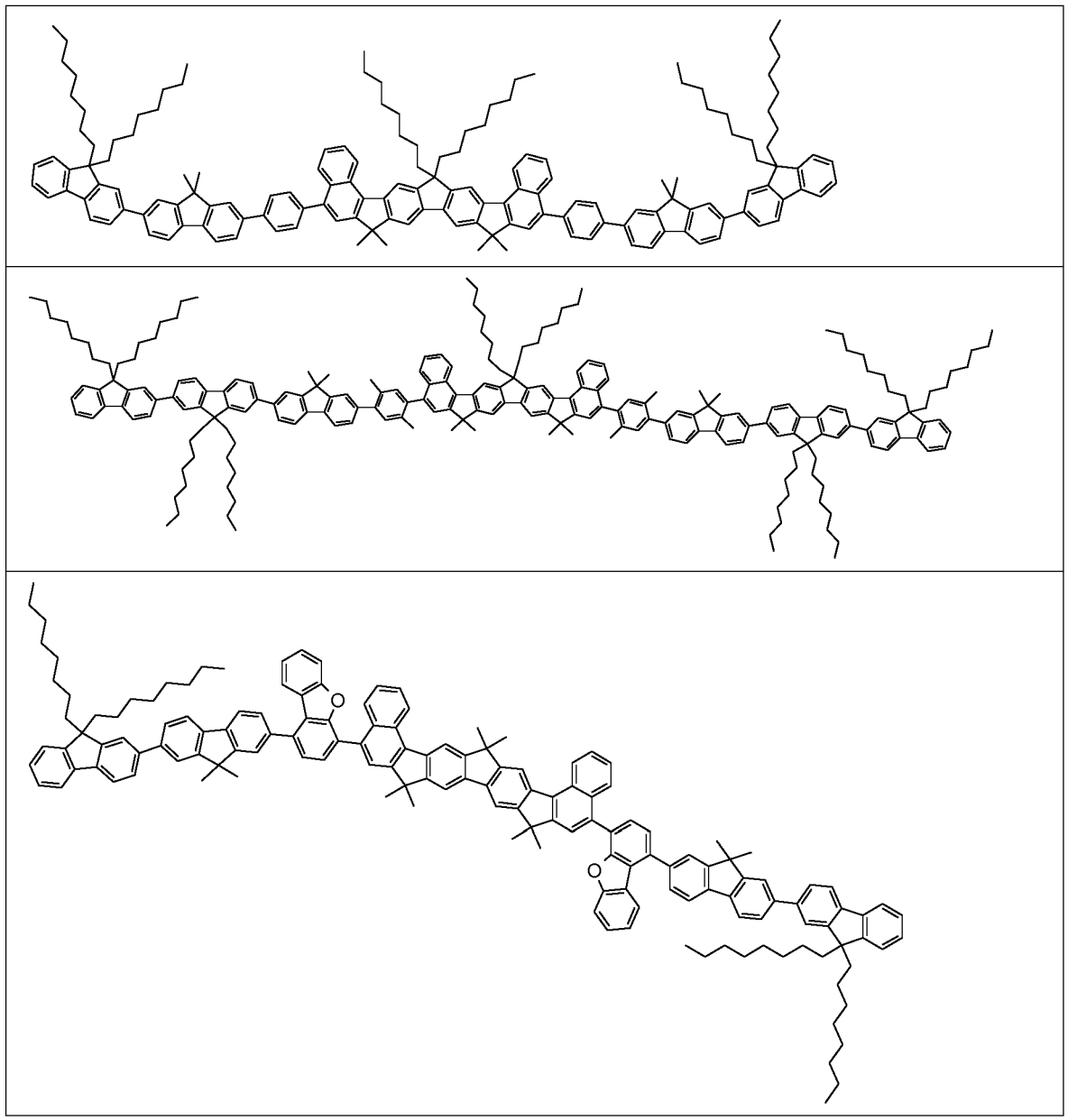

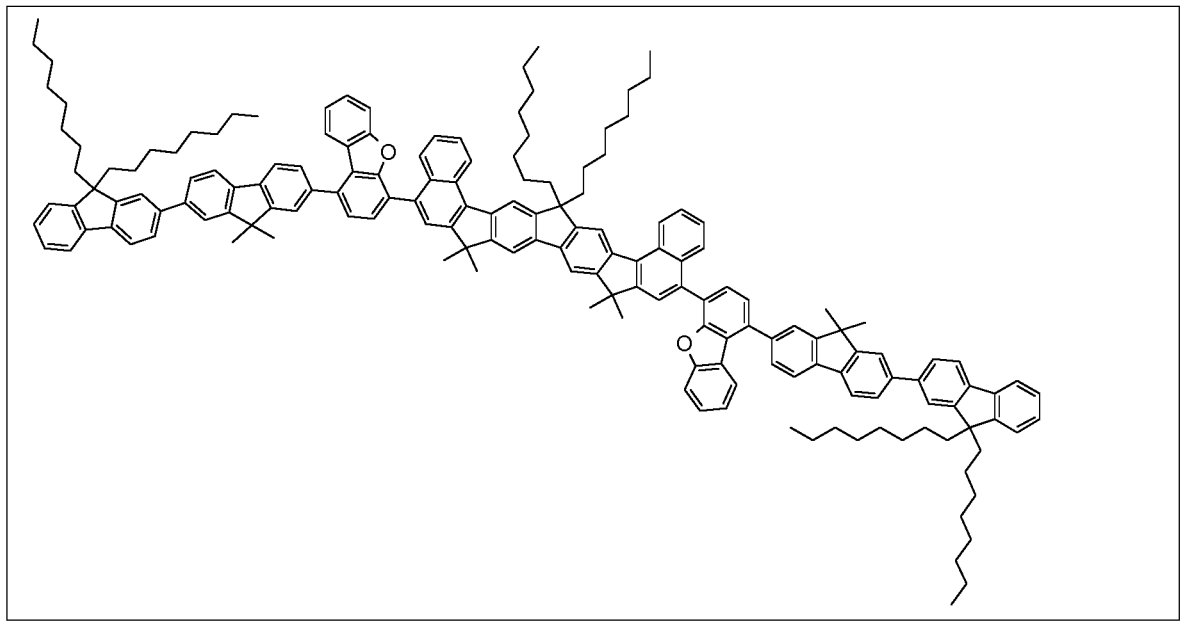

The compounds according to the invention can be prepared, for example, in accordance with the following reaction scheme:

1) First Step According to Scheme 1 or Scheme 2

Scheme 1

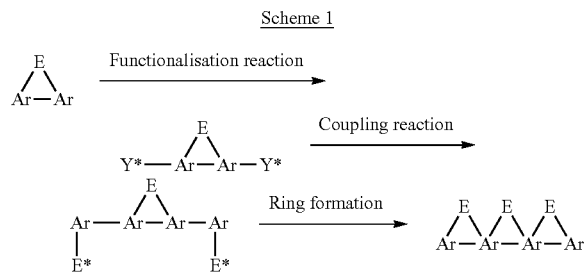

Ar: aromatic or heteroaromatic group
E: bridging group
E*: precursor of the bridging group
Y*: reactive group like Cl, Br, I Reactive groups are introduced in a starting compound, which is commercially available in many cases, for example by bromination, or by bromination and subsequent boronation. Subsequently, two other aromatic groups are introduced via a double coupling reaction, for example a Suzuki coupling reaction. These other aromatic groups contain a functional group E*, which can form a ring comprising the bridging group E.

Alternatively, as shown in scheme 2, one can start from a compound which already contains two bridging groups E. A process for the preparation of such compounds is known form the skilled person, for example from WO 2008/006449. The subsequent steps are the same as in scheme 1.

Scheme 2

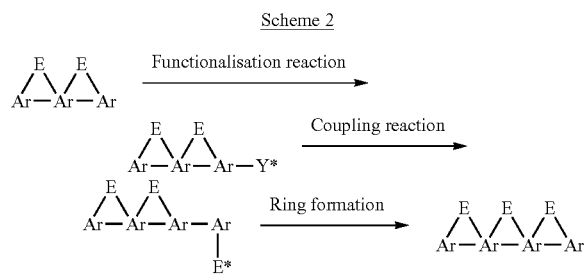

Ar: aromatic or heteroaromatic group
E: bridging group
E*: precursor of the bridging group
Y*: reactive group like Cl, Br, I 2) Second Step According to Scheme 3

Scheme 3

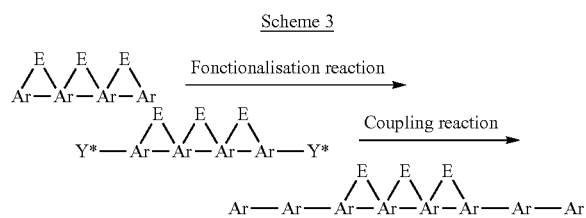

Ar: aromatic or heteroaromatic group
E: bridging group

E*: precursor of the bridging group
Y*: reactive group like Cl, Br, I

The compound obtained in step 1 is further functionalized (introduction of reactive groups via bromination or via bromination and subsequent boronation), so that two other aromatic groups are introduced via a double coupling reaction, for example a Suzuki coupling reaction.

The at least one blue light-emitting layer preferably has a thickness in the range from 10 to 100 nm, more preferably in the range from 20 to 70 nm.

Preferred matrix materials for the elongated bis-indenofluorene derivatives, are selected from the classes of the oligoarylenes (for example 2,2',7,7'-tetraphenyl-spirobifluorene in accordance with EP 676461 or dinaphthylanthracene), in particular the oligoarylenes containing condensed aromatic groups, the oligoarylenevinylenes (for example DPVBi or spiro-DPVBi in accordance with EP 676461), the polypodal metal complexes (for example in accordance with WO 2004/081017), the hole-conducting compounds (for example in accordance with WO 2004/058911), the electron-conducting compounds, in particular ketones, phosphine oxides, sulfoxides, etc. (for example in accordance with WO 2005/084081 and WO 2005/084082), the atropisomers (for example in accordance with WO 2006/048268), the boronic acid derivatives (for example in accordance with WO 2006/117052) or the benzanthracenes (for example in accordance with WO 2008/145239). Particularly preferred matrix materials are selected from the classes of the oligoarylenes, comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes, comprising anthracene, benzanthracene, benzophenanthrene and/or pyrene or atropisomers of these compounds. An oligoarylene in the sense of this invention is intended to be taken to mean a compound in which at least three aryl or arylene groups are bonded to one another.

The organic electroluminescent device according to the invention comprises at least one hole-transport layer.

A hole-transport layer for the purposes of the present application is taken to mean an organic layer which has hole-transporting properties. In particular, it is taken to mean an organic layer which is located between the anode and the emitting layer and has hole-transporting properties. A hole-transport material is correspondingly taken to mean a material having hole-transporting properties.

A hole-transport layer for the purposes of the present invention is furthermore taken to mean a layer, which simplifies or facilitates the transfer of holes, i.e. positive charges, from either the anode or the hole-injection layer into the light-emitting layer.

In a preferred embodiment, the polymer with non-conjugated units of the at least one hole-transport layer is a polymer containing at least one structural unit of formula (I)

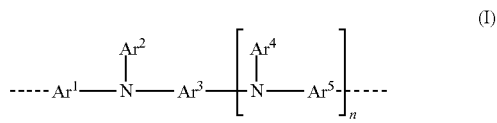

(I)

where the following applies to the variables occurring:
$Ar^1$, $Ar^2$, $Ar^3$, $Ar^4$ and $Ar^5$ are selected, identically or differently, from heteroaromatic ring systems having 5 to 40 aromatic ring atoms, which may be substituted by one or more radicals $R^1$, and from aromatic ring systems having 6 to 40 aromatic ring atoms, which may be substituted by one or more radicals $R^1$; with the proviso that at least one of the two groups $Ar^2$ and $Ar^4$ is in each case substituted by a group $R^4$ in at least one ortho position to the bond to N, where the group $R^4$ may form a ring with the corresponding group $Ar^2$ or $Ar^4$ to which it is bonded, and where $R^4$ is bonded to the group selected from groups $Ar^2$ and $Ar^4$ directly or via a linker group X;

$R^1$ is selected on each occurrence, identically or differently, from H, D, F, $C(=O)R^2$, CN, $Si(R^2)_3$, $N(R^2)_2$, $P(=O)(R^2)_2$, $OR^2$, $S(=O)R^2$, $S(=O)_2R^2$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^1$ may be linked to one another and may form a ring; where the said alkyl, alkoxy, alkenyl and alkynyl groups and the said aromatic ring systems and heteroaromatic ring systems may in each case be substituted by one or more radicals $R^2$, and where one or more $CH_2$ groups in the said alkyl, alkoxy, alkenyl and alkynyl groups may be replaced by $-R^2C=CR^2-$, $-C\equiv C-$, $Si(R^2)_2$, $C=O$, $C=NR^2$, $-C(=O)O-$, $-C(=O)NR^2-$, $NR^2$, $P(=O)(R^2)$, $-O-$, $-S-$, SO or $SO_2$;

$R^2$ is selected on each occurrence, identically or differently, from H, D, F, $C(=O)R^3$, CN, $Si(R^3)_3$, $N(R^3)_2$, $P(=O)(R^3)_2$, $OR^3$, $S(=O)R^3$, $S(=O)_2R^3$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^1$ or $R^2$ may be linked to one another and may form a ring; where the said alkyl, alkoxy, alkenyl and alkynyl groups and the said aromatic ring systems and heteroaromatic ring systems may in each case be substituted by one or more radicals $R^3$; and where one or more $CH_2$ groups in the said alkyl, alkoxy, alkenyl and alkynyl groups may be replaced by $-R^3C=CR^3-$, $-C\equiv C-$, $Si(R^3)_2$, $C=O$, $C=NR^3$, $-C(=O)O-$, $-C(=O)NR^3-$, $NR^3$, $P(=O)(R^3)$, $-O-$, $-S-$, SO or $SO_2$;

$R^3$ is selected on each occurrence, identically or differently, from H, D, F, CN, alkyl or alkoxy groups having 1 to 20 C atoms, alkenyl or alkynyl groups having 2 to 20 C atoms, aromatic ring systems having 6 to 40 aromatic ring atoms and heteroaromatic ring systems having 5 to 40 aromatic ring atoms; where two or more radicals $R^3$ may be linked to one another and may form a ring; and where the said alkyl, alkoxy, alkenyl and alkynyl groups, aromatic ring systems and heteroaromatic ring systems may be substituted by F or CN;

$R^4$ is selected on each occurrence, identically or differently, from heteroaromatic ring systems having 5 to 40 aromatic ring atoms, which may be substituted by one or more radicals $R^2$, and from aromatic ring systems having 6 to 40 aromatic ring atoms, which may be substituted by one or more radicals $R^2$;

X is selected on each occurrence, identically or differently, from $C(R^2)_2$, $Si(R^2)_2$, $NR^2$, O, S, and $C=O$;

n is equal to 0 or 1;

and at least one structural unit selected from structural units A, consisting of a planar aromatic group selected from aryl groups having 6 to 40 aromatic ring atoms and heteroaryl groups having 6 to 40 aromatic ring atoms, where the planar aromatic group has at least one radical $R^5$ which, owing to its space requirement, causes a rotation of the planar aromatic group relative to the plane formed by the planar aromatic groups of the directly adjacent structural units, and where the above-mentioned aryl groups and heteroaryl groups may in each case be substituted by one or more further radicals $R^5$;

structural units B which contain two groups, connected directly to one another, selected from aryl groups having 6 to 40 aromatic ring atoms, which may in each case be substituted by one or more radicals $R^5$, and heteroaryl groups having 5 to 40 aromatic ring atoms, which may in each case be substituted by one or more radicals $R^5$, where the plane of conjugation of the second aryl or heteroaryl group is rotated relative to the plane of conjugation of the first aryl or heteroaryl group about the axis of the bond between the two groups; and structural units C which conform to the formula (II-C)

formula (II-C)

where $Ar^6$ and $Ar^7$ are selected on each occurrence, identically or differently, from aromatic ring systems having 6 to 40 aromatic ring atoms, which may be substituted by one or more radicals $R^5$, and heteroaromatic ring systems having 5 to 40 aromatic ring atoms, which may be substituted by one or more radicals $R^5$;

$R^5$ is selected on each occurrence, identically or differently, from H, D, F, $C(=O)R^2$, CN, $Si(R^2)_3$, $N(R^2)_2$, $P(=O)(R^2)_2$, $OR^2$, $S(=O)R^2$, $S(=O)_2R^2$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; where two or more radicals $R^1$ may be linked to one another and may form a ring; where the said alkyl, alkoxy, alkenyl and alkynyl groups and the said aromatic ring systems and heteroaromatic ring systems may in each case be substituted by one or more radicals $R^2$; and where one or more $CH_2$ groups in the said alkyl, alkoxy, alkenyl and alkynyl groups may be replaced by $-R^2C=CR^2-$, $-C\equiv C-$, $Si(R^2)_2$, $C=O$, $C=NR^2$, $-C(=O)O-$, $-C(=O)NR^2-$, $NR^2$, $P(=O)(R^2)$, $-O-$, $-S-$, SO or $SO_2$;

k has a value of 0 to 9, and where one or more $CH_2$ units in the alkylene chain of formula (II-C) may be replaced by a divalent unit selected from $C=O$, $C=NR^5$, $-C(=O)O-$, $-C(=O)NR^5-$, $Si(R^5)_2$, $NR^5$, $P(=O)(R^5)$, O, S, SO and $SO_2$; and where one or more H atoms in the alkylene chain of formula (II-C) may in each case be replaced by a radical $R^5$.

In the formulae for structural units, the dashed lines denote the bonds to adjacent structural units of the polymer.

The term structural unit in the present application is taken to mean a unit which occurs in the polymer multiple times with the structure indicated. It may occur repetitively, i.e. multiple times one after the other, and/or individually in the polymer. A multiplicity of structural units having the structure indicated preferably occur in the polymer, particularly preferably 10 to 1000, very particularly preferably 50 to 500. If a unit is indicated as being a structural unit of the polymer, its proportion in the polymer is preferably in the range from 0.01 to 50 mol %, particularly preferably in the range from 0.1 to 30 mol %, and very particularly preferably in the range from 0.5 to 20 mol %, based on 100 mol % of all polymerised monomers which are present as structural units in the polymer.

A structural unit in the sense of the present application is furthermore preferably derived from a monomer employed in the polymerisation through the reactive groups of the monomer having reacted in accordance with their chemical reactivity and purpose. For example, in the case of a monomer containing two bromine atoms as reactive groups in a Suzuki polymerisation reaction, the structural unit formed in the polymer is characterised in that it corresponds to the monomer structure, with the difference that the bromine atoms are missing and the bonds to the bromine atoms are now bonds to the adjacent structural units.

In the case of monomers containing crosslinker groups or precursor groups for crosslinker groups, one or more further reactions of the crosslinker group or of the corresponding precursor groups of the crosslinker group may take place until the corresponding final structural unit of the polymer is obtained.

The formulation of the group $R^4$ may form a ring with the corresponding group $Ar^2$ or $Ar^4$ to which it is bonded is taken to mean that the corresponding group $R^4$, in addition to the bond to the group $Ar^2$ or $Ar^4$, is also bonded to the group $Ar^2$ or $Ar^4$ by a bridge, preferably selected from a single bond, $C(R^2)_2$, $Si(R^2)_2$, $NR^2$, O, S and C=O, particularly preferably selected from a single bond and $C(R^2)_2$. This is illustrated by the following scheme, in which the group $Ar^2$ is a phenyl group, in which the group $R^4$ is a phenyl group, and in which the bridge is equal to $C(R^2)_2$:

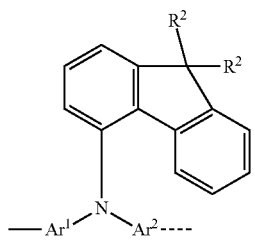

The term plane of conjugation of aryl or heteroaryl groups in the present application is taken to mean the plane in which the corresponding planar rings of the aryl or heteroaryl groups lie. Rotation of the plane of conjugation of one group relative to the plane of conjugation of the other group to which the first group is directly connected is taken to mean that the corresponding planar rings are rotated relative to one another about the axis of the bond between the two groups. The rotation here can adopt any desired value in degrees which is not negligibly small and which can by definition be up to 90°. Preference is given to values between 35° and 90°.

An aryl group in the sense of this invention contains 6 to 40 aromatic ring atoms, none of which is a heteroatom. An aryl group in the sense of this invention is taken to mean either a simple aromatic ring, i.e. benzene, or a condensed aromatic polycyclic ring system, for example naphthalene, phenanthrene or anthracene. A condensed aromatic polycyclic ring system in the sense of the present application consists of two or more simple aromatic rings condensed with one another. Condensation between rings here is taken to mean that the rings share at least one edge with one another.

A heteroaryl group in the sense of this invention contains 5 to 40 aromatic ring atoms, at least one of which is a heteroatom. The heteroatoms of the heteroaryl group are preferably selected from N, O and S. A heteroaryl group in the sense of this invention is taken to mean either a simple aromatic ring, i.e. benzene, or a simple heteroaromatic ring, for example pyridine, pyrimidine or thiophene, or a condensed heteroaromatic polycyclic ring system, for example quinoline or carbazole. A condensed heteroaromatic polycyclic ring system in the sense of the present application consists of two or more simple heteroaromatic rings condensed with one another. Condensation between rings here is taken to mean that the rings share at least one edge with one another.

An aryl or heteroaryl group, which may in each case be substituted by the above-mentioned radicals and which may be linked to the aromatic or heteroaromatic ring system via any desired positions, is taken to mean, in particular, groups derived from benzene, naphthalene, anthracene, phenanthrene, pyrene, dihydropyrene, chrysene, perylene, triphenylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, iso-quinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the sense of this invention contains 6 to 40 C atoms in the ring system and includes no heteroatoms as aromatic ring atoms. An aromatic ring system in the sense of this invention therefore contains no heteroaryl groups. An aromatic ring system in the sense of this invention is intended to be taken to mean a system which does not necessarily contain only aryl groups, but instead in which, in addition, a plurality of aryl groups may be connected by a single bond or by a non-aromatic unit, such as, for example, one or more optionally substituted C, Si, N, O or S atoms. The non-aromatic unit here preferably contains less than 10% of the atoms other than H, based on the total number of atoms other than H in the system. Thus, for example, systems such as 9,9'-spirobifluorene, 9,9'-diarylfluorene, triarylamine, diaryl ether and stilbene are also intended to be taken to be aromatic ring systems in the sense of this invention, as are systems in which two or more aryl groups are connected, for example, by a linear or cyclic alkyl, alkenyl or alkynyl group or by a silyl group. Furthermore, systems in which two or more aryl groups are linked to one another via single bonds are also taken to be aromatic ring systems in the sense of this invention, such as, for example, systems such as biphenyl and terphenyl.

A heteroaromatic ring system in the sense of this invention contains 5 to 40 aromatic ring atoms, at least one of which is a heteroatom. The heteroatoms of the heteroaromatic ring system are preferably selected from N, O and/or S. A heteroaromatic ring system corresponds to the above-mentioned definition of an aromatic ring system, but contains at least one heteroatom as one of the aromatic ring atoms. It consequently differs from an aromatic ring system in the sense of the definition of the present application, which, in accordance with this definition, cannot contain a heteroatom as aromatic ring atoms.

An aromatic ring system having 6 to 40 aromatic ring atoms or a heteroaromatic ring system having 5 to 40 aromatic ring atoms are taken to mean, in particular, groups derived from the groups mentioned above under aryl groups and heteroaryl groups and from biphenyl, terphenyl, quaterphenyl, fluorene, spirobifluorene, dihydrophenanthrene, dihydropyrene, tetrahydropyrene, indenofluorene, truxene, isotruxene, spirotruxene, spiroisotruxene, indenocarbazole, or from combinations of these groups.

For the purposes of the present invention, a straight-chain alkyl group having 1 to 20 C atoms or a branched or cyclic alkyl group having 3 to 40 C atoms or an alkenyl or alkynyl group having 2 to 20 C atoms, in which, in addition, individual H atoms or $CH_2$ groups may be substituted by the groups mentioned above under the definition of the radicals, is preferably taken to mean the radicals methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl.

An alkoxy or thioalkyl group having 1 to 20 C atoms, in which, in addition, individual H atoms or $CH_2$ groups may be substituted by the groups mentioned above in the definition of the radicals, is preferably taken to mean methoxy, tri-fluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The formulation that two or more radicals may form a ring with one another is, for the purposes of the present invention, intended to be taken to mean, inter alia, that the two radicals are linked to one another by a chemical bond. However, the formulation given above is furthermore also intended to be taken to mean that, in the case where one of the two radicals represents hydrogen, the second radical is bonded to the position to which the hydrogen atom was bonded, with formation of a ring.

$Ar^1$, $Ar^2$, $Ar^3$, $Ar^4$ and $Ar^5$ are preferably selected on each occurrence, identically or differently, from aromatic ring systems having 6 to 25 aromatic ring atoms, which may be substituted by one or more radicals $R^1$. $Ar^1$, $Ar^2$, $Ar^3$, $Ar^4$ and $Ar^5$ are particularly preferably selected on each occurrence, identically or differently, from benzene, biphenyl, terphenyl, fluorene, naphthalene, phenanthrene, indenofluorene and spirobifluorene, each of which may be substituted by one or more radicals $R^1$. $Ar^1$, $Ar^2$, $Ar^3$, $Ar^4$ and $Ar^5$ are very particularly preferably equal to benzene, which may be substituted by one or more radicals $R^1$.

$R^1$ is preferably selected on each occurrence, identically or differently, from H, D, F, ON, $Si(R^2)_3$, $N(R^2)_2$, straight-chain alkyl or alkoxy groups having 1 to 20 C atoms, branched or cyclic alkyl or alkoxy groups having 3 to 20 C atoms, aromatic ring systems having 6 to 40 aromatic ring atoms, and heteroaromatic ring systems having 5 to 40 aromatic ring atoms; where the said alkyl and alkoxy groups, the said aromatic ring systems and the said heteroaromatic ring systems may in each case be substituted by one or more radicals $R^2$; and where one or more $CH_2$ groups in the said alkyl or alkoxy groups may be replaced by —C≡C—, —$R^2$C=C$R^2$—, $Si(R^2)_2$, C=O, C=N$R^2$, —N$R^2$—, —O—, —S—, —C(=O)O— or —C(=O)N$R^2$—.

$R^2$ is preferably selected on each occurrence, identically or differently, from H, D, F, CN, $Si(R^3)_3$, $N(R^3)_2$, straight-chain alkyl or alkoxy groups having 1 to 20 C atoms, branched or cyclic alkyl or alkoxy groups having 3 to 20 C atoms, aromatic ring systems having 6 to 40 aromatic ring atoms, and heteroaromatic ring systems having 5 to 40 aromatic ring atoms; where the said alkyl and alkoxy groups, the said aromatic ring systems and the said heteroaromatic ring systems may in each case be substituted by one or more radicals $R^3$; and where one or more $CH_2$ groups in the said alkyl or alkoxy groups may be replaced by —C≡C—, —$R^3$C=C$R^3$—, $Si(R^3)_2$, C=O, C=N$R^3$, —N$R^3$—, —O—, —S—, —C(=O)O— or —C(=O)N$R^3$—.

$R^4$ is preferably selected on each occurrence, identically or differently, from aromatic ring systems having 6 to 20 aromatic ring atoms, which may be substituted by one or more radicals $R^2$.

X is preferably equal to $C(R^2)_2$.

n is preferably equal to 0. A preferred structural unit of the formula (I) thus conforms to the formula (I-1)

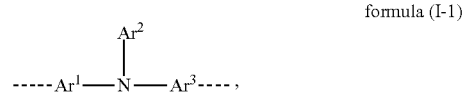

formula (I-1)

where the variables occurring are as defined above for formula (I).

If n=1, which may likewise be preferred, the structural unit of the formula (I) conforms to the formula (I-2)

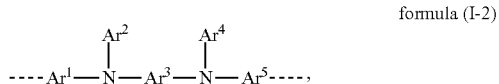

formula (I-2)

where the variables occurring are as defined above for formula (I).

Preferably, at least one group selected from groups $Ar^2$ and $Ar^4$ contains precisely one or precisely two groups $R^4$ in the ortho position to the nitrogen atom, particularly preferably precisely one group $R^4$ in the ortho position to the nitrogen atom, where $R^4$ is bonded to the group selected from groups $Ar^2$ and $Ar^4$ directly or via a linker group.

According to a preferred embodiment of the invention, the group $R^4$ does not form a ring with the group $Ar^2$ or $Ar^4$ to which it is bonded.

According to this embodiment, preferred structural units of the formula (I) conform to one of the formulae (I-1-A), (I-2-A-1), (I-2-A-2) and (I-2-A-3)

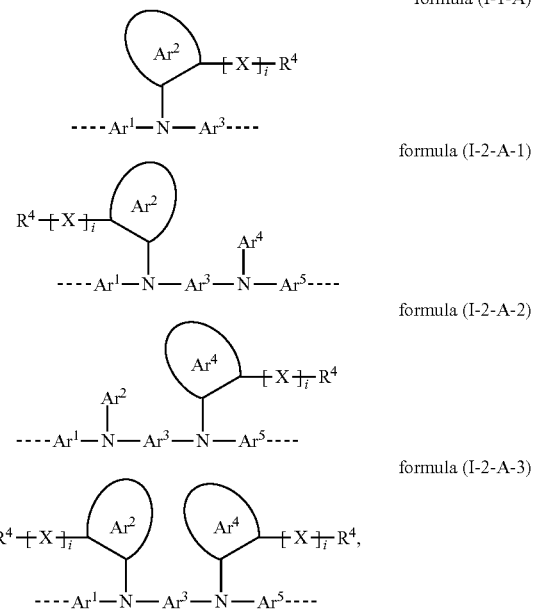

formula (I-1-A)

formula (I-2-A-1)

formula (I-2-A-2)

formula (I-2-A-3)

where i is equal to 0 or 1 and is preferably equal to 0, and the other variables are defined as above. In the above formulae, $Ar^2$ and $Ar^4$ are preferably equal to phenyl, which may in each case be substituted by one or more radicals $R^1$. The groups $Ar^2$ and $Ar^4$ here may also be substituted by a further group $[X]_i$—$R^4$ in the ortho position in addition to the first group $[X]_i$—$R^4$ drawn in.

If i is equal to 0, the units $R^4$ and $Ar^2$ or $Ar^4$ in question are connected directly to one another.

Of the above-mentioned formulae, the formula (I-1-A) is particularly preferred.

The bonding position of $[X]_i$—$R^4$ and N on the ring $Ar^2$ or $Ar^4$ indicated diagrammatically in the above formulae denotes here that these two groups are in each case in the ortho position to one another.

According to an alternative, likewise preferred embodiment of the invention, the group $R^4$ forms a ring with the group $Ar^2$ or $Ar^4$ to which it is bonded.

Corresponding preferred embodiments of the formula (I) in this case conform to the following formulae (I-1-B), (I-2-B-1), (I-2-B-2) and (I-2-B-3)

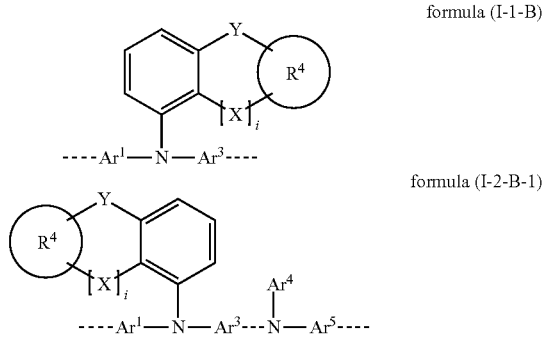

formula (I-1-B)

formula (I-2-B-1)

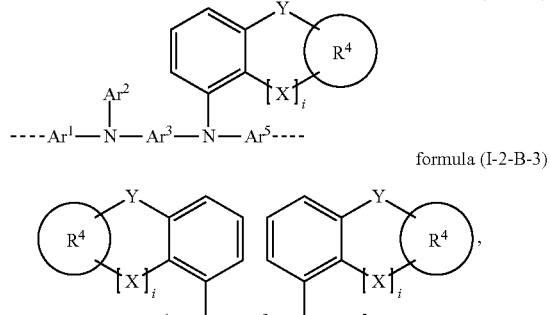

formula (I-2-B-2)

formula (I-2-B-3)

where i is equal to 0 or 1 and is preferably equal to 0,
where Y is selected on each occurrence, identically or differently, from a single bond, $C(R^2)_2$, $Si(R^2)_2$, $NR^2$, O, S and C=O and is preferably selected from a single bond and $C(R^2)_2$,
and the other variables are defined as above.

According to a preferred embodiment, the two radicals $R^2$ on a group Y equal to $C(R^2)_2$ form a ring, so that a spiro unit is formed. A spirobifluorene is preferably formed here through the radicals $R^2$ being equal to phenyl, the two radicals $R^2$ being connected to one another by a single bond, $R^4$ being equal to phenyl, and the index i being equal to zero, so that $R^4$ is connected directly to the relevant group to which it is bonded.

Of the above-mentioned formulae, the formula (I-1-B) is particularly preferred.

The structural unit of the formula (I) particularly preferably conforms to one of the formulae (I-1-A-A), (I-1-A-B) and (I-1-B-A)

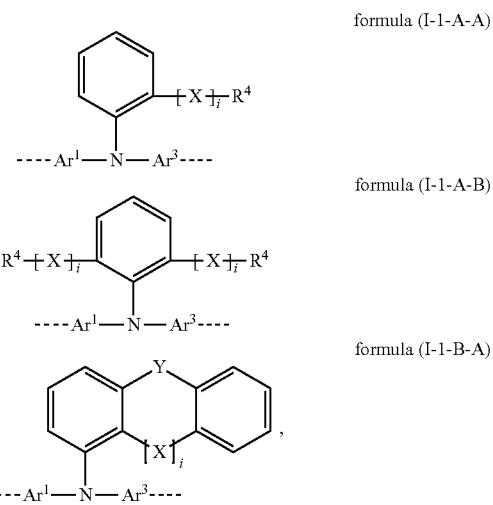

formula (I-1-A-A)

formula (I-1-A-B)

formula (I-1-B-A)

where i is equal to 0 or 1 and is preferably equal to 0,
where the aromatic six-membered rings may in each case be substituted by a radical $R^1$ or $R^2$ at the positions drawn as unsubstituted, and where the variables occurring are defined as above. Of the formulae indicated above, the formulae (I-1-A-A) and (I-1-B-A) are particularly preferred.

In formulae (I-1-A-A) and (I-1-A-B), i is preferably equal to 0, so that $R^4$ and the phenyl group are connected directly to one another.

In formula (I-1-B-A), i is preferably equal to 0, so that the two phenyl groups are connected directly to one another, and Y is equal to $C(R^2)_2$. It corresponds to a preferred embodiment here that $R^2$ in a group Y which corresponds to $C(R^2)_2$ is equal to phenyl, and the two groups $R^2$ are bonded to one another via a single bond, so that a spirobifluorene unit is bonded to the nitrogen atom.

Preferred embodiments of the formula (I) conform to the formulae (VIIIa) to (VIIIh), (IXa) to (IXg), and (Xa) to (Xc) in WO 2013/156130, where R should be replaced by $R^1$ or $R^2$, k, m, n and p denote the possible number of substituents on the ring in question in each case, and v is equal to 1 to 20, preferably 1 to 10. Preferred embodiments of the formula (I) are furthermore the formulae disclosed in WO 2013/156129 in the tables on pp. 26-34, where R should be replaced by $R^1$ or $R^2$, k, m, n and p denote the possible number of substituents on the ring in question in each case, s is equal to 1 to 20, preferably 1 to 10, and C is equal to $C(R^5)_2$.

Particularly preferred structural units of the formula (I) are depicted in the following table:

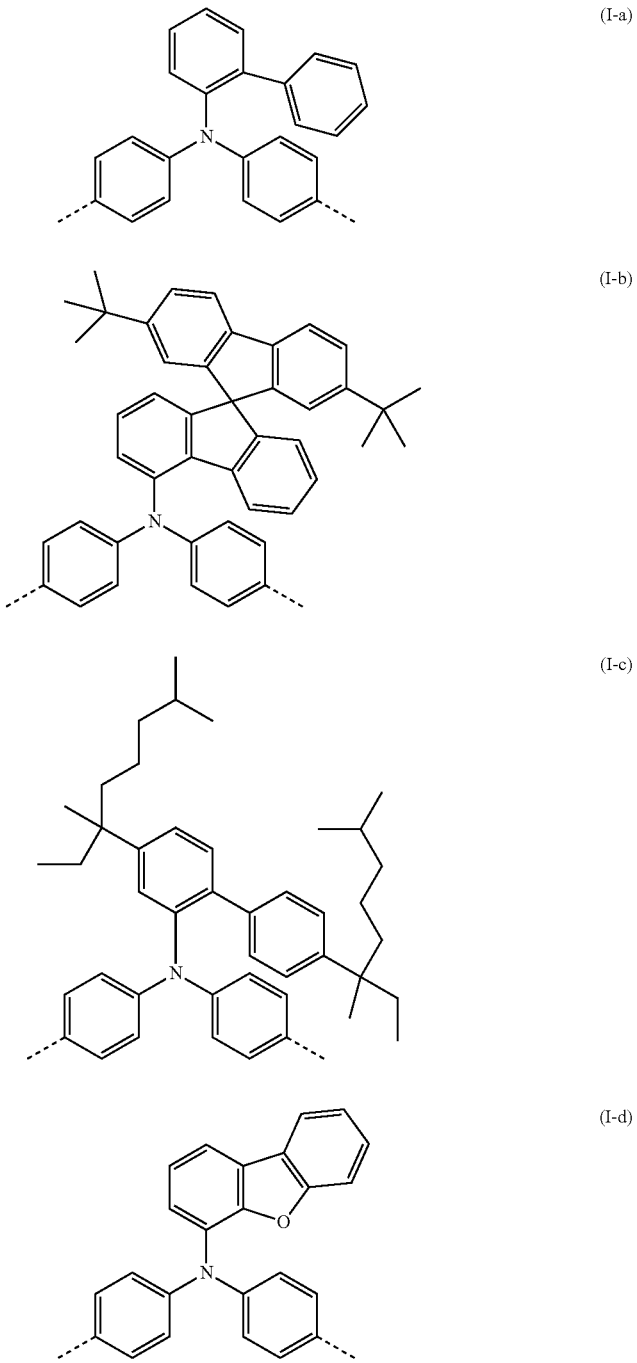

-continued
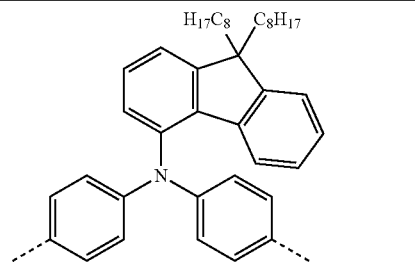
(I-e)
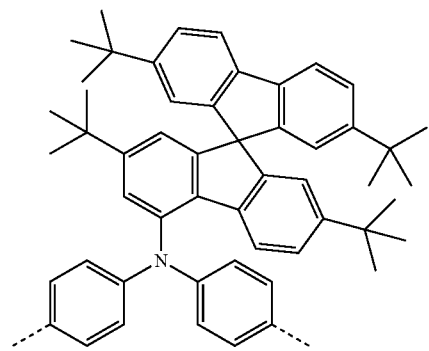
(I-f)
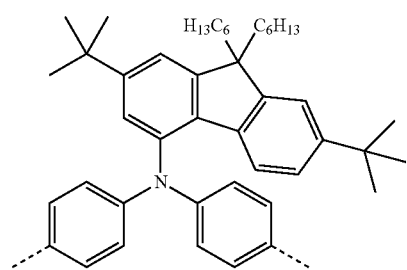
(I-g)
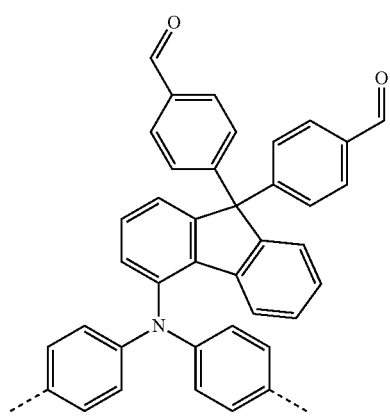
(I-h)
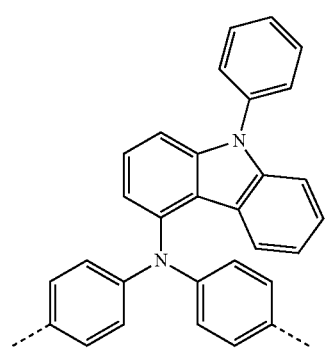
(I-i)

-continued
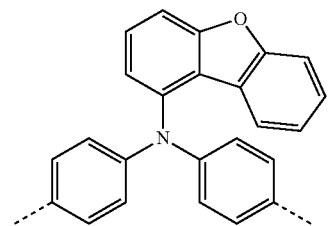
(I-j)
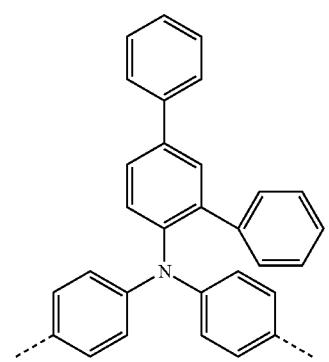
(I-k)
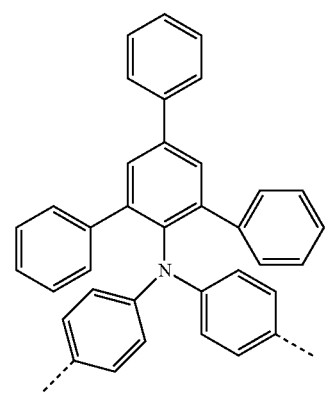
(I-l)
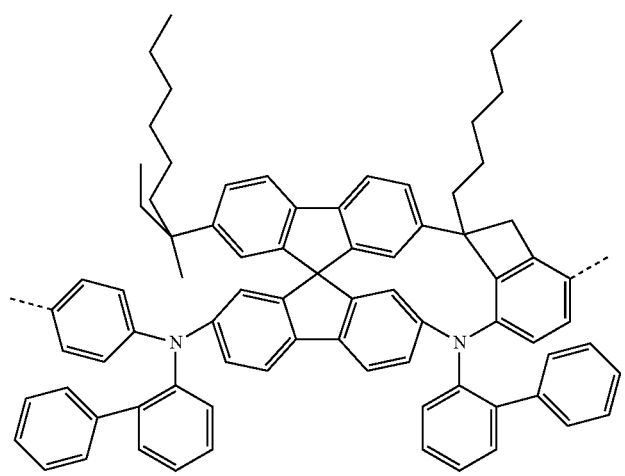
(I-m)

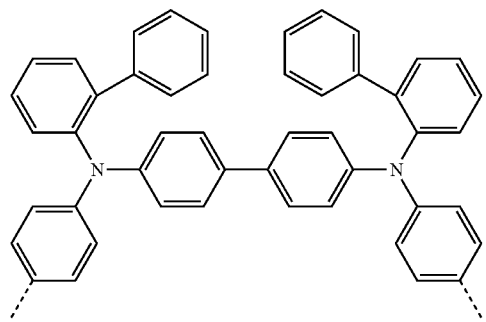
(I-n)
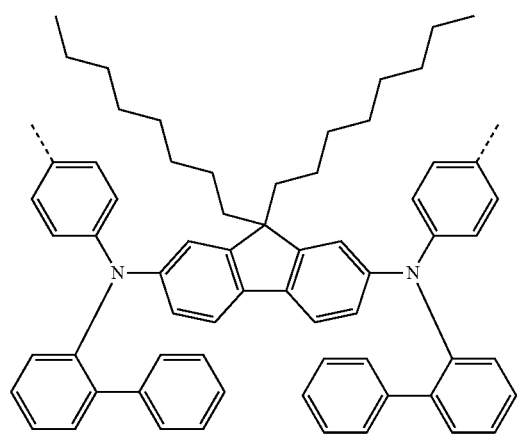
(I-o)
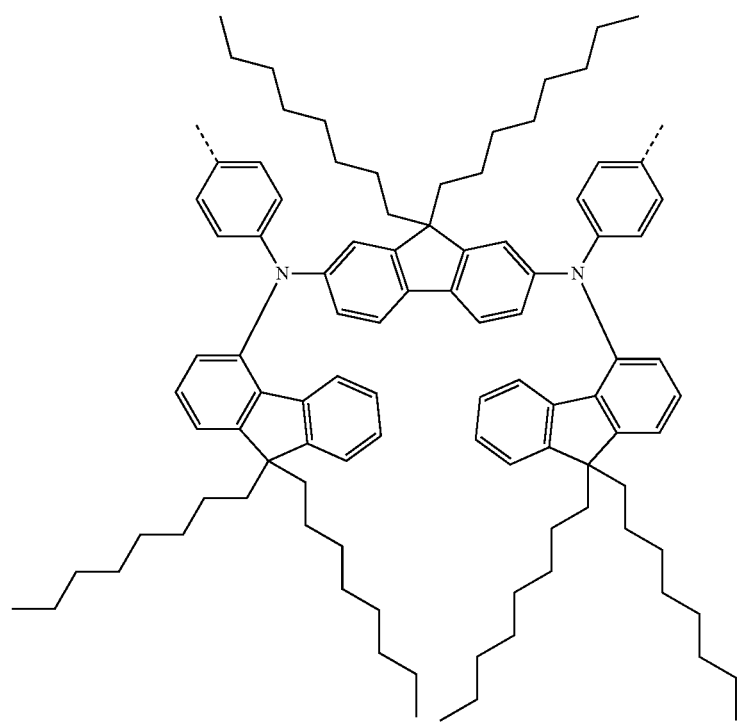
(I-p)

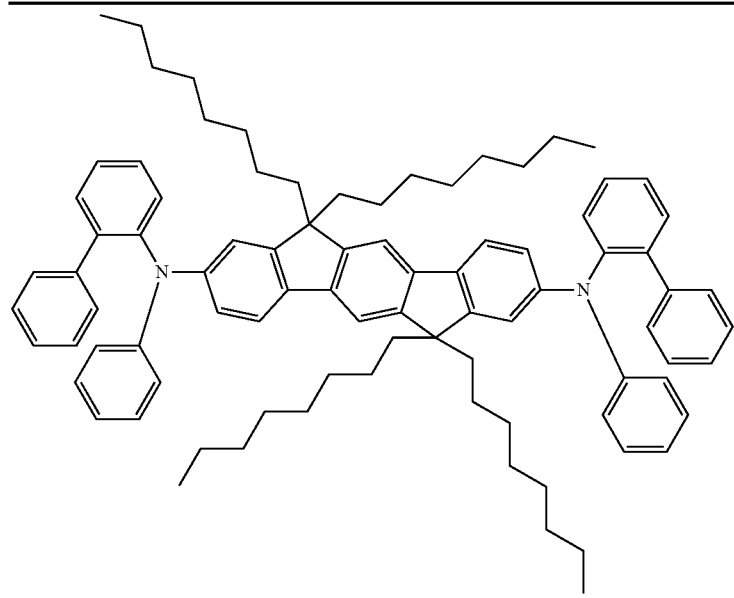

(I-q)

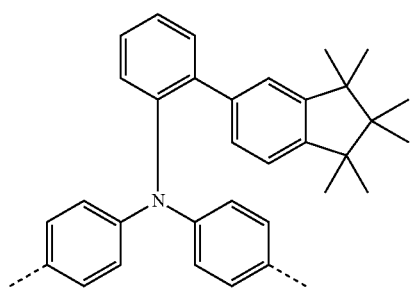

(I-r)

Preferred structural units A conform to the formula (II-A)

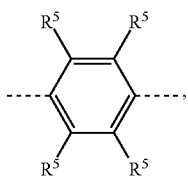

formula (II-A)

where $R^5$ is defined as above, and at least one group $R^5$ which is not equal to H or D is present. Formula (II-A) preferably contains at least two groups $R^5$ which are not equal to H or D. Formula (II-A) particularly preferably contains precisely two groups $R^5$ which are not equal to H or D.

Formula (II-A) preferably contains at least one group $R^5$ which is selected from straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms, where the said alkyl, alkoxy, alkenyl and alkynyl groups and the said aromatic ring systems and heteroaromatic ring systems may in each case be substituted by one or more radicals $R^2$. Preferably, precisely two groups $R^5$ of this type are present.

A preferred embodiment of the (II-A) conforms to the formula (II-A-1)

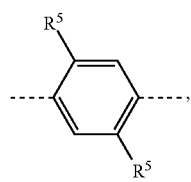

formula (II-A-1)

where $R^5$ is selected on each occurrence, identically or differently, from straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms, where the said alkyl, alkoxy, alkenyl and alkynyl groups and the said aromatic ring systems and heteroaromatic ring systems may in each case be substituted by one or more radicals $R^2$ Particularly preferred structural units of the formula (II-A) are shown below:
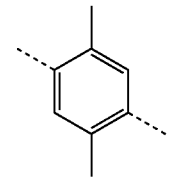
(II-A-a)
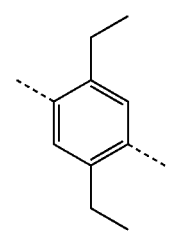
(II-A-b)
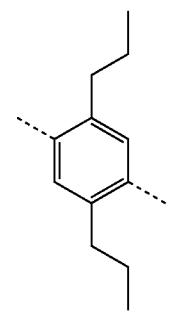
(II-A-c)
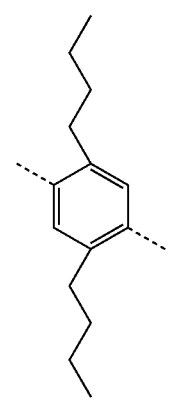
(II-A-d)
-continued
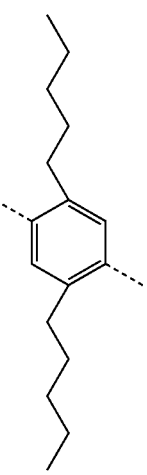
(II-A-e)
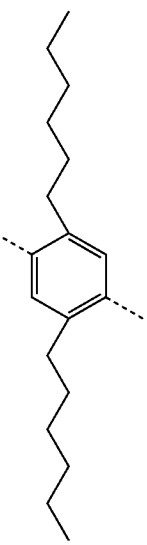
(II-A-f)
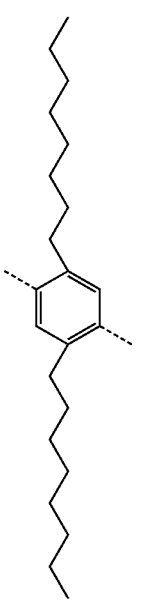
(II-A-g)

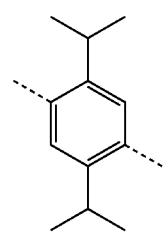 (II-A-h)
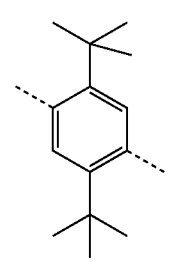 (II-A-i)
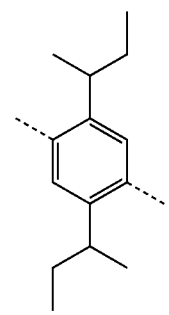 (II-A-j)
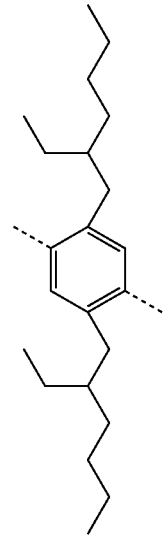 (II-A-k)
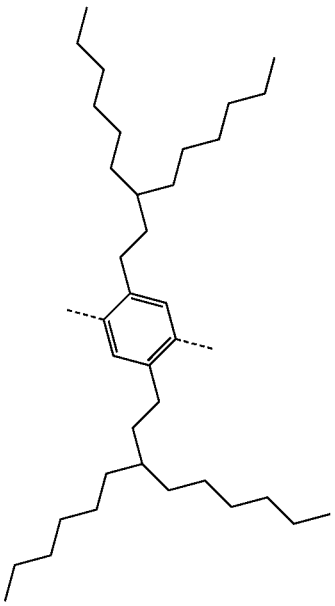 (II-A-l)
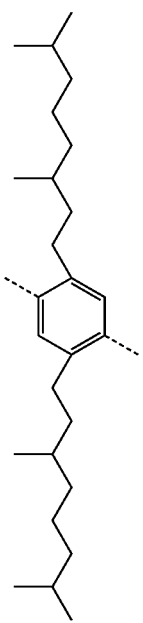 (II-A-m)

-continued
(II-A-n)
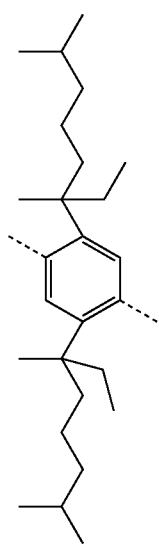
(II-A-o)
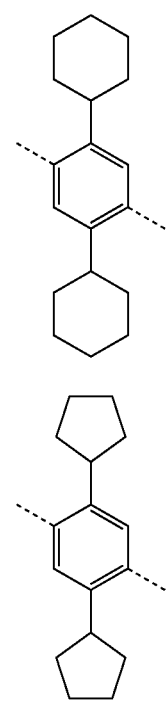
(II-A-p)
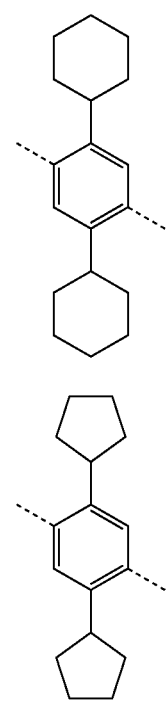
(II-A-q)
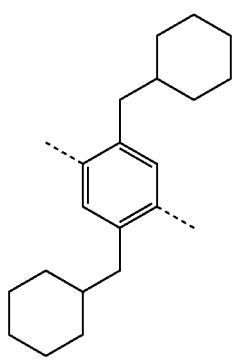
-continued
(II-A-r)
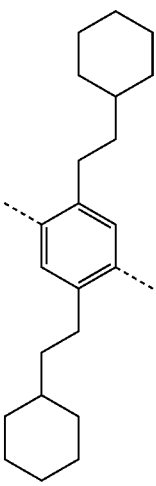
(II-A-s)
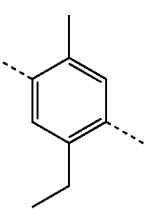
(II-A-t)
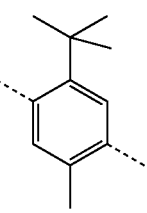
(II-A-u)
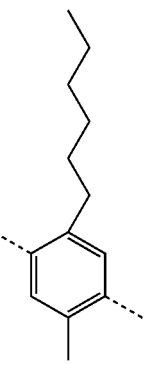

-continued
(II-A-v)
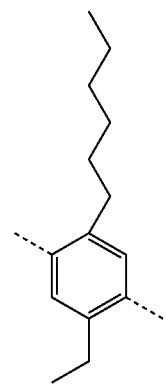
(II-A-w)
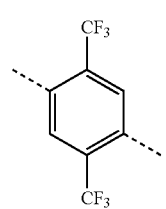
(II-A-x)
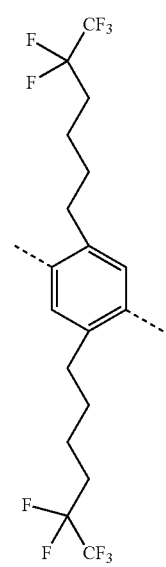
(II-A-y)
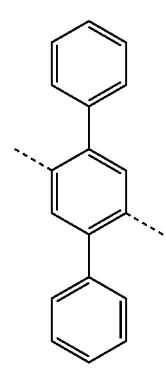
-continued
(II-A-z)
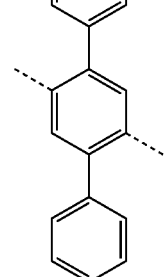
(II-A-aa)
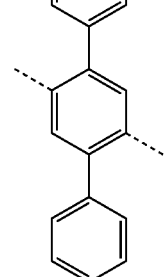
(II-A-ab)
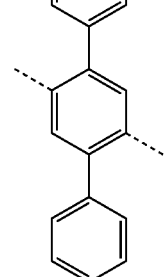
(II-A-ac)
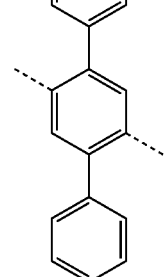
(II-A-ad)
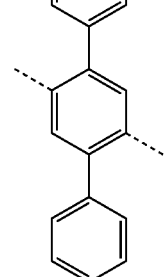

-continued

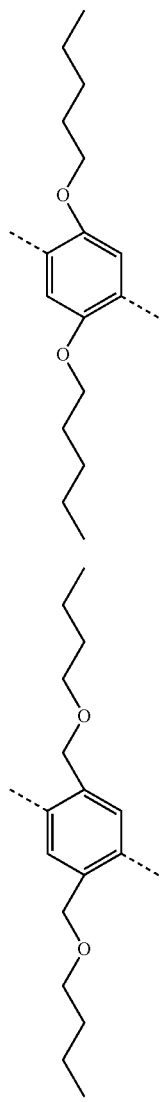

(II-A-ae)

(II-A-af)

Preferred structural units B conform to the formula (II-B)

formula (II-B)

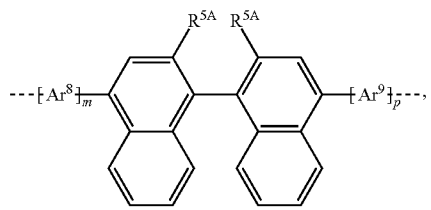

where $R^{5A}$ is selected on each occurrence, identically or differently, from H, D, F, C(=O)$R^2$, CN, Si($R^2$)$_3$, N($R^2$)$_2$, P(=O)($R^2$)$_2$, O$R^2$, S(=O)$R^2$, S(=O)$_2$$R^2$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms;

where two or more radicals $R^1$ may be linked to one another and may form a ring; where the said alkyl, alkoxy, alkenyl and alkynyl groups and the said aromatic ring systems and heteroaromatic ring systems may in each case be substituted by one or more radicals $R^2$; and where one or more CH$_2$ groups in the said alkyl, alkoxy, alkenyl and alkynyl groups may be replaced by —$R^2$C=C$R^2$—, —C≡C—, Si($R^2$)$_2$, C=O, C=N$R^2$, —C(=O)O—, —C(=O)N$R^2$—, N$R^2$, P(=O)($R^2$), —O—, —S—, SO or SO$_2$;

$Ar^8$ and $Ar^9$ are selected on each occurrence, identically or differently, from aromatic ring systems having 6 to 40 aromatic ring atoms, which may be substituted by one or more radicals $R^5$, and heteroaromatic ring systems having 5 to 40 aromatic ring atoms, which may be substituted by one or more radicals $R^5$;

m and p are selected on each occurrence, identically or differently, from 0 and 1;

and the naphthyl groups may in each case be substituted by a radical $R^5$ at the positions depicted as unsubstituted.

m and p in formula (II-B) are preferably equal to 0.

The groups $R^5$ in formula (II-B) are furthermore preferably equal to H.

At least one group $R^{5A}$ in the compound of the formula (II-B) is furthermore preferably not equal to H or D.

At least one of the two groups $R^{5A}$, particularly preferably both of the two groups $R^{5A}$, in formula (II-B) is/are furthermore preferably selected on each occurrence, identically or differently, from straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms, where the said alkyl, alkoxy, alkenyl and alkynyl groups and the said aromatic ring systems and heteroaromatic ring systems may in each case be substituted by one or more radicals $R^2$. Particularly preferably, both groups $R^{5A}$ in formula (II-B) are selected identically.

Particularly preferred structural units of the formula (II-B) are shown in the following table:

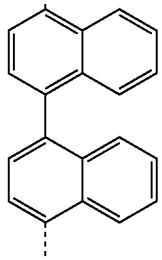

(II-B-a)

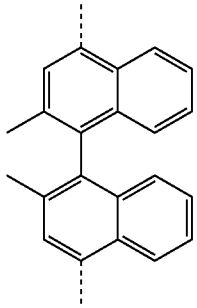

(II-B-b)

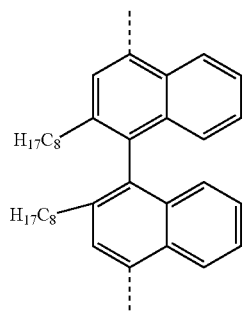
(II-B-c)
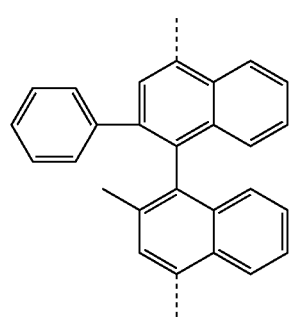
(II-B-d)
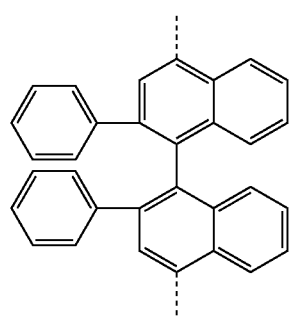
(II-B-e)
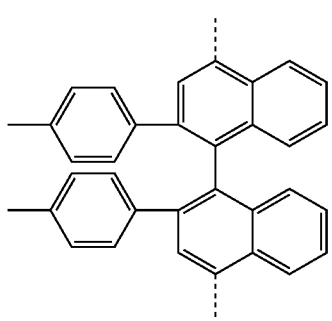
(II-B-f)
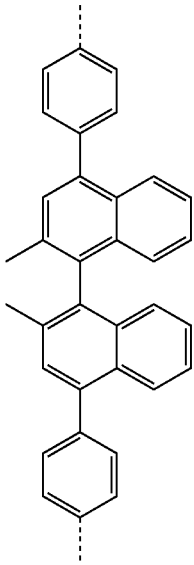
(II-B-g)
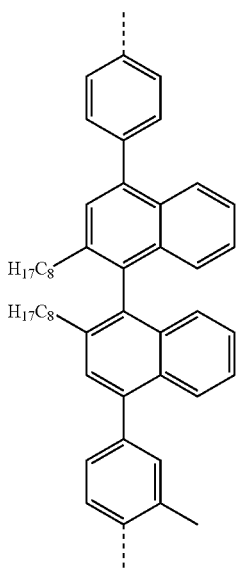
(II-B-h)

(II-B-i)

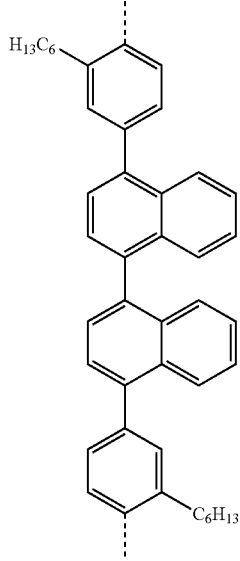

(II-B-j)

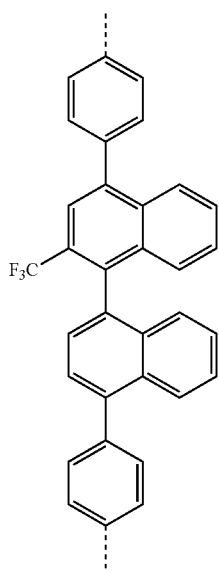

(II-B-k)

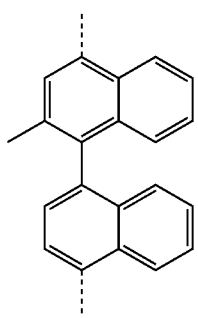

(II-B-l)

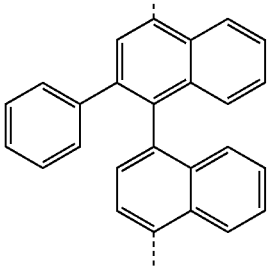

In the structural unit of the formula (III-C), k preferably has a value of 1 to 9, particularly preferably 3 to 8, very particularly preferably 4 to 8.

It is furthermore preferred that the alkylene chain of formula (II-C) is unsubstituted, i.e. no H atoms in the alkylene chain have been replaced by radicals $R^5$.

It is furthermore preferred that no $CH_2$ groups in the alkylene chain of formula (II-C) have been replaced by the above-mentioned divalent groups. If $CH_2$ groups have been replaced by the above-mentioned groups, these are preferably one, two or three $CH_2$ groups. The divalent groups which may be replaced by $CH_2$ groups are preferably equal to O.

Preferred structural units C conform to the formula (II-C-1)

formula (II-C-1)

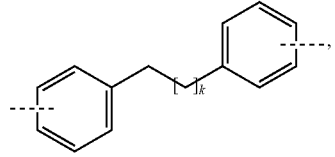

where the positions drawn as unsubstituted on the benzene rings and on the alkylene chain may in each case be substituted by a radical $R^5$, and where k has a value of 0 to 9, and where $CH_2$ groups in the alkylene chain may in each case be replaced by a divalent group O.

k here preferably has a value as indicated above as generally being preferred.

Particularly preferred structural units of the formula (II-C) are shown in the following table:

(II-C-1-a)

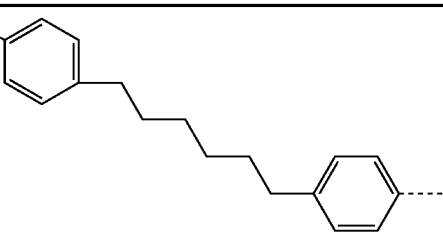

(II-C-1-b)

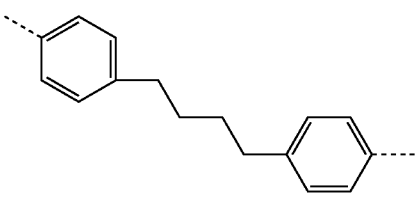

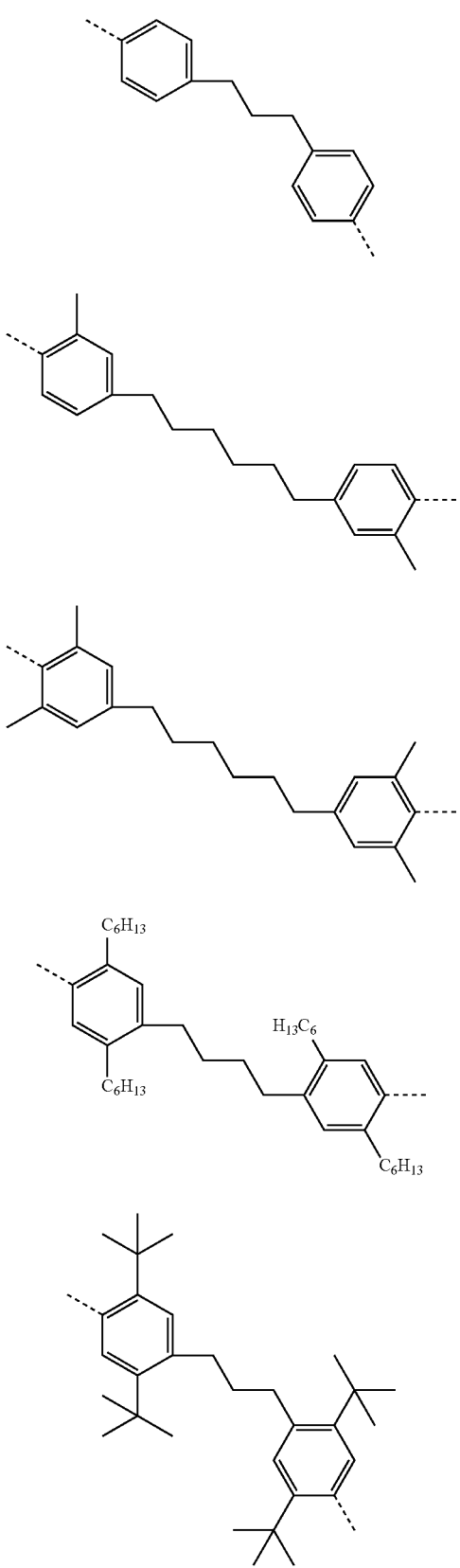

(II-C-1-c)
(II-C-1-d)
(II-C-1-e)
(II-C-1-f)
(II-C-1-g)

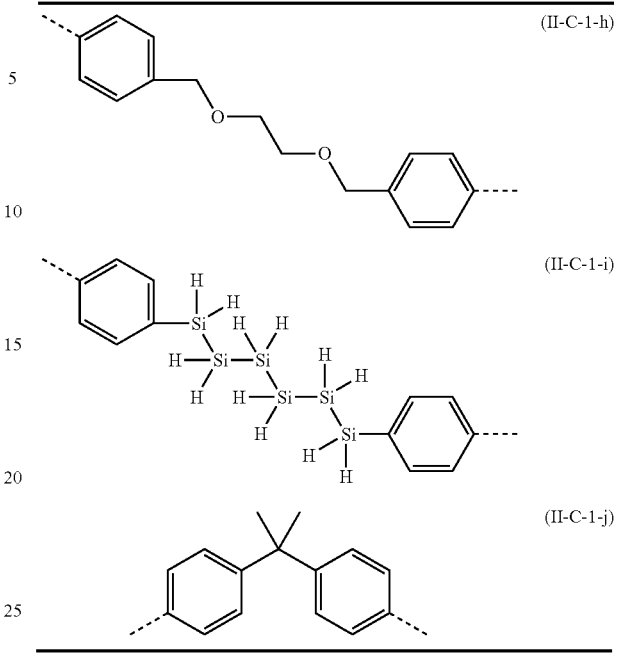

(II-C-1-h)
(II-C-1-i)
(II-C-1-j)

The polymer preferably contains between 20 and 75 mol %, particularly preferably between 30 and 60 mol %, of structural units which correspond to the structural units A, B and/or C, based on 100 mol % of all copolymerised monomers which are present in the polymer as structural units.

The polymer preferably contains between 10 and 60 mol %, particularly preferably between 20 and 50 mol %, very particularly preferably between 25 and 45 mol %, of structural units which conform to the formula (I), based on 100 mol % of all copolymerised monomers which are present in the polymer as structural units.

The polymer preferably contains at least one structural unit which contains a crosslinkable group Q. The structural unit containing the crosslinkable group Q can be a structural unit of the formula (I), a structural unit A, a structural unit B, a structural unit C or another structural unit. Other structural units which contain a crosslinkable group Q are preferably selected from structural units from group 1 indicated below (=units which influence the hole-injection and/or hole-transport properties of the polymers), in particular triarylamine structural units, and structural units from group 4 indicated below (=units which are typically used as polymer backbone), in particular fluorene, indenofluorene and spirobifluorene structural units.

Crosslinkable group in the sense of the present application means a functional group which is capable of undergoing a reaction in the polymer and thus forming an insoluble compound. The reaction here can take place with a further, identical group Q, a further, different group Q or any desired other part thereof or of another polymer chain. The crosslinkable group is thus a reactive group. The result of the chemical reaction of the crosslinkable group is a correspondingly crosslinked polymer.

The crosslinking reaction can be carried out in a polymer layer comprising a polymer which contains a structural unit containing a crosslinkable group, where an insoluble polymer layer is formed. The crosslinking may be supported by heat or by UV, microwave, X-ray or electron radiation, and is optionally carried out in the presence of an initiator.

"Insoluble" in the sense of the present application preferably means that the polymer, after the crosslinking reaction, i.e. after the reaction of the crosslinkable groups, has a solubility in an organic solvent at room temperature which is at least a factor of 3, preferably at least a factor of 10, lower than that of the corresponding, uncrosslinked polymer according to the invention in the same organic solvent.

The job of the crosslinkable group is, in particular, to link the polymers to one another by a crosslinking reaction. The general expert knowledge of the person skilled in the art in the area of the present application includes which chemical groups are basically suitable as crosslinkable groups.

The crosslinking reaction results in a crosslinked polymer compound and, if the reaction is carried out in a polymer layer, in a crosslinked polymer layer. A crosslinked layer in the sense of the present invention is taken to mean a layer which is obtainable by carrying out the crosslinking reaction from a layer of the crosslinkable polymer. The crosslinking reaction can in general be initiated by heat and/or by UV, microwave, X-ray or electron radiation and/or by the use of free-radical formers, anions, cations, acids and/or photoacids. The presence of catalysts and/or initiators may likewise be sensible or necessary. The crosslinking reaction is preferably a reaction for which no initiator and no catalyst has to be added.

Crosslinkable groups Q which are preferred in accordance with the invention are the groups indicated below:

a) Terminal or Cyclic Alkenyl or Terminal Dienyl and Alkynyl Groups:

These include units which contain a terminal or cyclic double bond, a terminal dienyl group or a terminal triple bond, in particular terminal or cyclic alkenyl, terminal or cyclic alkenyl, terminal dienyl or terminal alkynyl groups having 2 to 40 C atoms, preferably having 2 to 10 C atoms. Suitable groups are furthermore also those which are precursors of the above-mentioned groups and which are capable of formation of a double or triple bond in situ, for example aldehyde groups.

b) Alkenyloxy, Dienyloxy or Alkynyloxy Groups:

These include alkenyloxy, dienyloxy and alkynyloxy groups, preferably alkenyloxy groups.

c) Acrylic Acid Groups:

These include acrylic acid units in the broadest sense, preferably acrylates, acrylamides, methacrylates and methacrylamides. Particular preference is given to $C_{1-10}$-alkyl acrylate and $C_{1-10}$-alkyl methacrylate.

The crosslinking reaction of the groups mentioned above under a) to c) can be carried out via a free-radical, cationic or anionic mechanism, but also via cyclo-addition.

It may be appropriate to add a corresponding initiator for the crosslinking reaction. Suitable initiators for free-radical crosslinking are, for example, dibenzoyl peroxide, AIBN or TEMPO. Suitable initiators for cationic crosslinking are, for example, $AlCl_3$, $BF_3$, triphenylmethyl perchlorate or tropylium hexachloro-antimonate. Suitable initiators for anionic crosslinking are bases, in particular butyllithium.

In a preferred embodiment of the present invention, however, the crosslinking is carried out without the addition of initiator and is initiated exclusively thermally.

This has the advantage that the absence of the initiator prevents contamination of the layer, which could result in impairment of the device properties.

d) Oxetanes and Oxiranes:

A further suitable class of crosslinkable groups Q are oxetanes and oxiranes, which crosslink cationically by ring opening.

It may be appropriate to add a corresponding initiator for the crosslinking reaction. Suitable initiators are, for example, $AlCl_3$, $BF_3$, triphenylmethyl perchlorate or tropylium hexachlorantimonate. Photoacids can likewise be added as initiators.

e) Silanes:

A further suitable class of crosslinkable groups are silane groups $SiR_3$, where at least two groups R, preferably all three groups R, stand for Cl or an alkoxy group having 1 to 20 C atoms. This group reacts in the presence of water to give an oligo- or polysiloxane.

f) Cyclobutane Groups

These include, in particular, cyclobutane groups which have been condensed onto an aryl or heteroaryl group, for example have been condensed onto a phenyl group.

The above-mentioned crosslinkable groups Q are generally known to the person skilled in the art, as are the suitable reaction conditions used for the reaction of these groups.

Of the above-mentioned groups Q, particular preference is given to groups Q from the above-mentioned groups a) and f), very particularly preferably terminal alkenyl groups and cyclobutane groups.

Particularly preferred crosslinkable groups Q are the following:

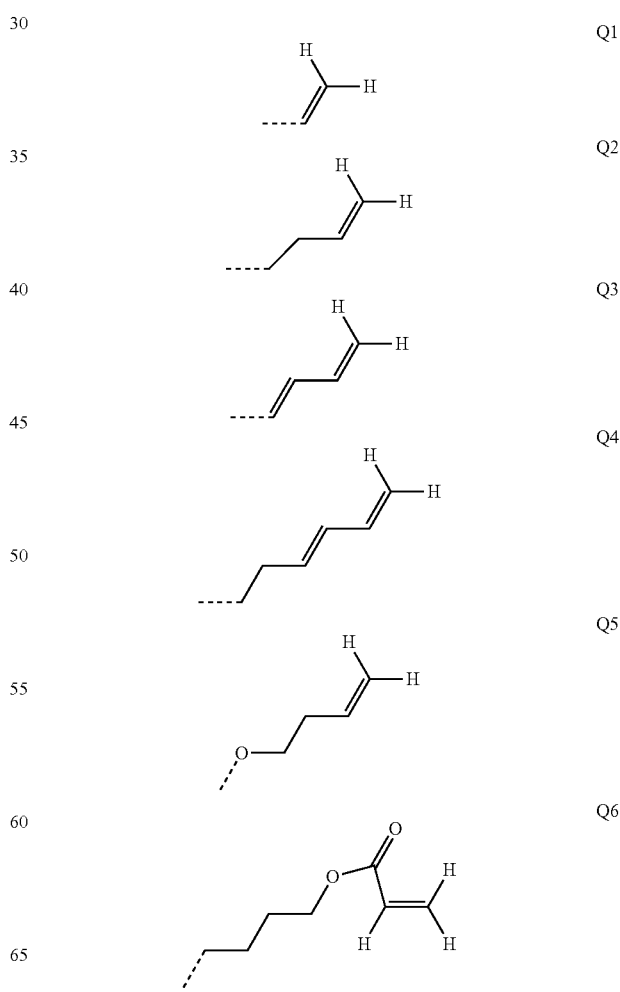

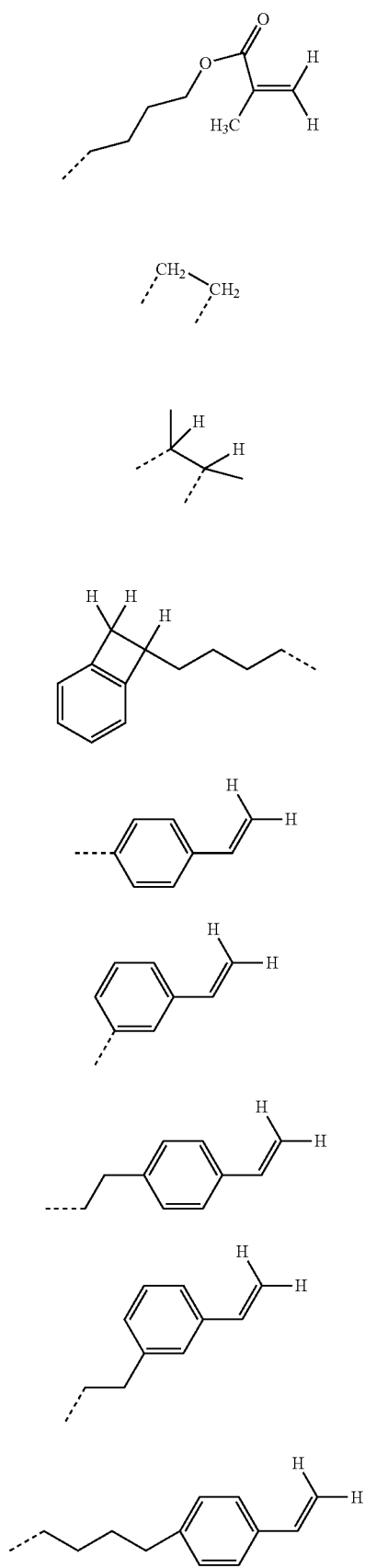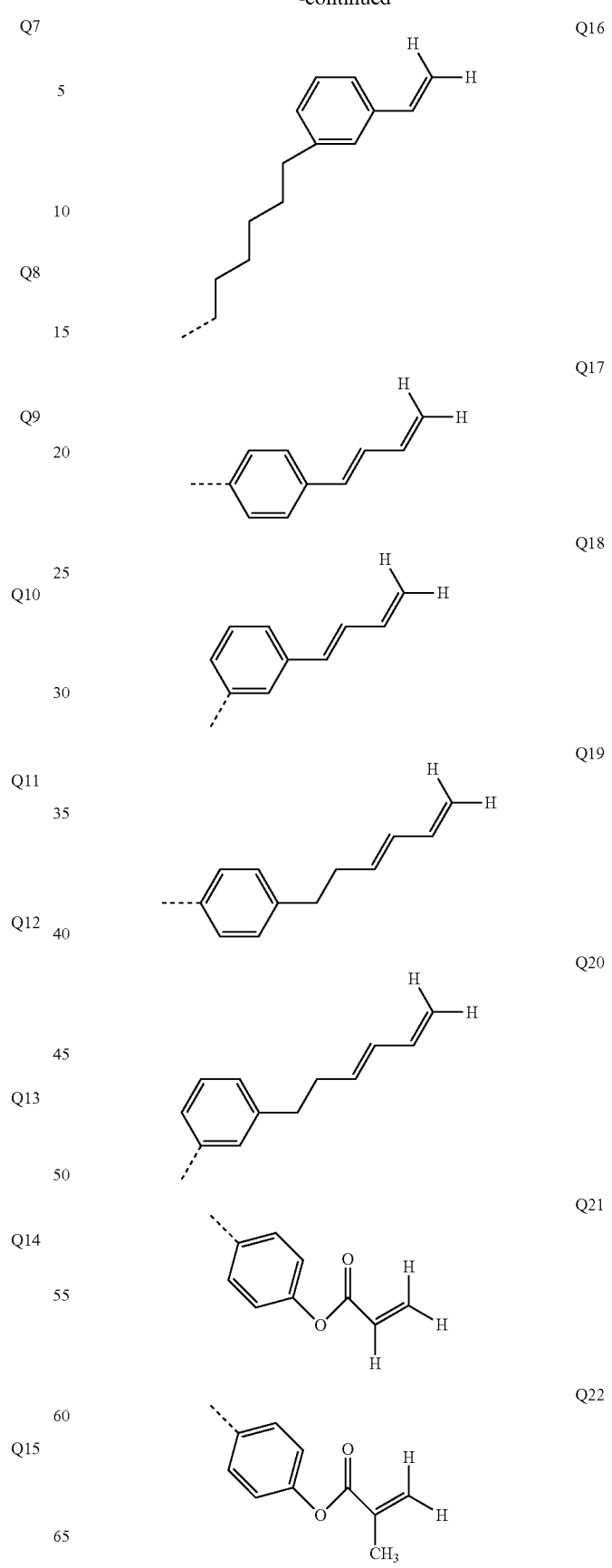

Q23

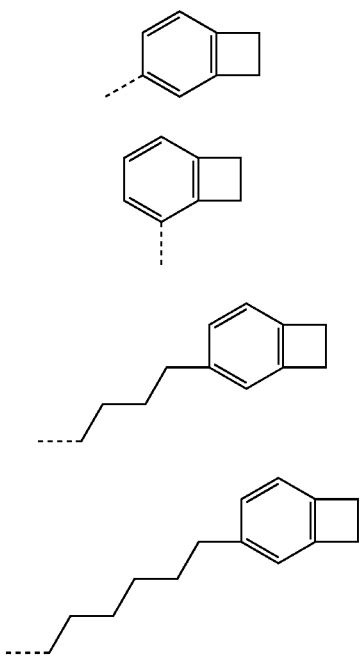

Q24

Q25

Q26

The dashed lines here represent the bonds to the structural unit to which the crosslinkable group in question is bonded.

Preferred structural units which carry a group Q are selected from structural units of the formula (I) defined above. Corresponding structural units are described by the formula (I-Q), where the number of groups Q per structural unit is not limited, but is preferably 1 or 2, particularly preferably 1, where Q is as defined above, where "formula (I)" represents a unit of the formula (I), as defined above:

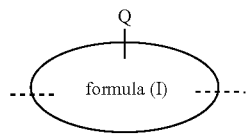

formula (I-Q)

The groups Q here and generally below are preferably selected from the preferred embodiments of the groups Q indicated above.

Particularly preferred structural units of the formula (I-Q) conform to the formula (I-1-Q), where the number of groups Q per structural unit is not limited, but is preferably 1 or 2, particularly preferably 1, where Q is as defined above, and where "formula (I-1)" represents a unit of the formula (I-1), as defined above:

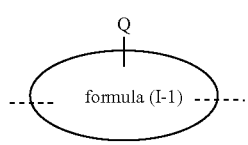

formula (I-1-Q)

Very particularly preferred embodiments of the formula (I-1-Q) conform to the formula (I-1-A-Q-1) or (I-1-A-Q-2)

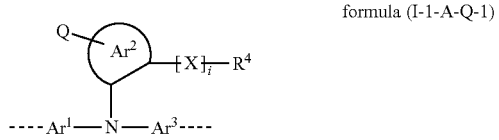

formula (I-1-A-Q-1)

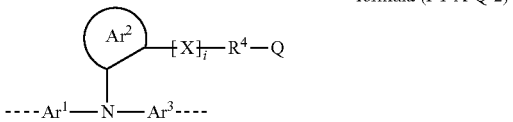

formula (I-1-A-Q-2)

where the groups occurring are as defined for formula (I-1-A), and where Q is defined as above and preferably corresponds to the preferred embodiments indicated above.

Very particularly preferred embodiments of the formula (I-1-Q) conform to one of the formulae (I-1-B-Q-1), (I-1-B-Q-2), (I-1-B-Q-3) and (I-1-B-Q-4)

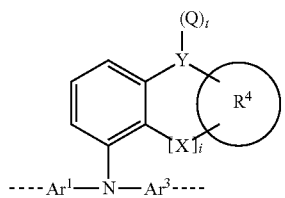

formula (I-1-B-Q-1)

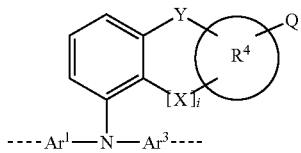

formula (I-1-B-Q-2)

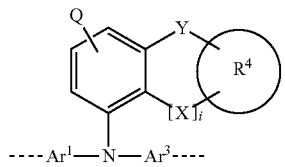

formula (I-1-B-Q-3)

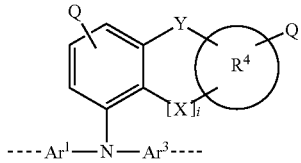

formula (I-1-B-Q-4)

where the groups occurring are as defined for formula (I-1-B), and where Q is defined as above and preferably corresponds to the preferred embodiments indicated above, and where t is 0, 1 or 2, depending on the valence of the group Y.

Particularly preferred structural units of the formula (I-Q) conform to the formula (I-2-Q), which is defined in a corresponding manner to formula (I-Q):

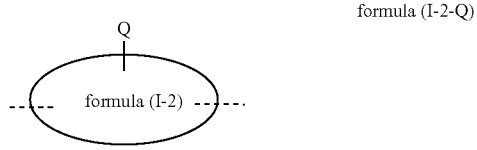

formula (I-2-Q)

Very particularly preferred embodiments of the formula (I-2-Q) conform to the formula (I-2-A-Q-1) or (I-2-A-Q-1)

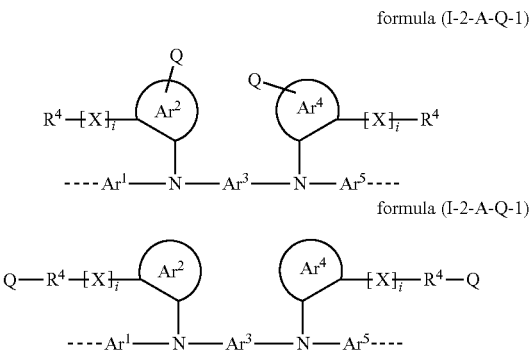

formula (I-2-A-Q-1)

formula (I-2-A-Q-1)

where the groups occurring are as defined for formula (1-2-A), and where Q is defined as above and preferably corresponds to the preferred embodiments indicated above.

Very particularly preferred embodiments of the formula (I-2-Q) conform to the formula (I-2-B-3-Q-1), (I-2-B-3-Q-2) or (I-2-B-3-Q-3)

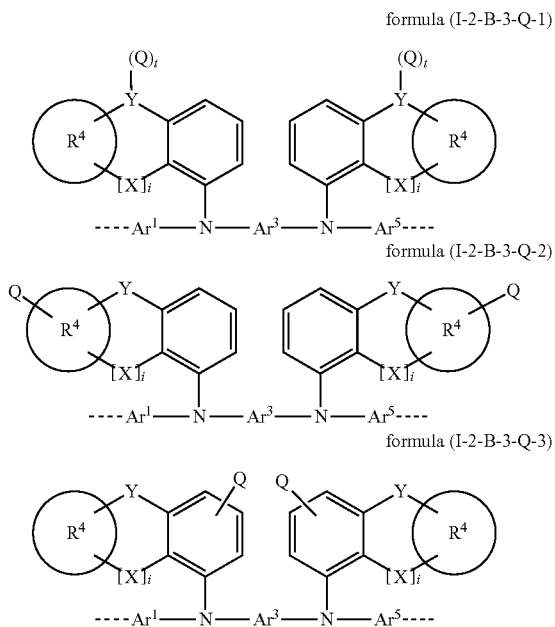

formula (I-2-B-3-Q-1)

formula (I-2-B-3-Q-2)

formula (I-2-B-3-Q-3)

where the groups occurring are as defined for formula (I-2-B-3), and where Q is defined as above and preferably corresponds to the preferred embodiments indicated above, and where t is 0, 1 or 2, depending on the valence of the group Y.

Very particularly preferred structural units of the formula (I-Q) are the structural units (11a) to (11f) and (11g) to (11o) depicted in the tables on pp. 30 and 32 of WO 2013/156130, where R should be replaced by $R^1$ or $R^2$, and k, m, n and p denote the possible number of substituents on the ring in question in each case.

Preferred structural units which carry a group Q are selected from structural units of the formula (II-A) defined above. Corresponding structural units are described by the formula (II-A-Q), where the number of groups Q per structural unit is not limited, but is preferably 1 or 2, particularly preferably 1, where Q is as defined above, where "formula (II-A)" represents a unit of the formula (II-A), as defined above:

formula (II-A-Q)

Particularly preferred structural units of the formula (II-A-Q) conform to the formula (II-A-1-Q), where the number of groups Q per structural unit is not limited, but is preferably 1 or 2, particularly preferably 1, where Q is as defined above, where "formula (II-A-1)" represents a unit of the formula (II-A-1), as defined above:

formula (II-A-1-Q)

Very particularly preferred embodiments of the formula (II-A-1-Q) conform to one of the formulae (II-A-1-Q-1), (II-A-1-Q-2) and (II-A-1-Q-3)

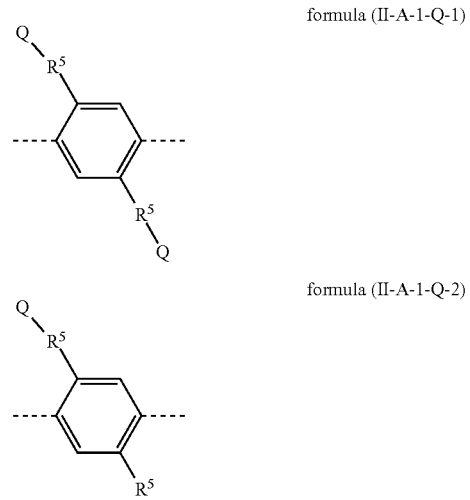

formula (II-A-1-Q-1)

formula (II-A-1-Q-2)

-continued formula (II-A-1-Q-3)

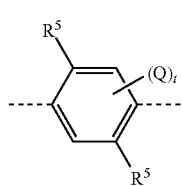

where the groups occurring are as defined for formula (II-A-1), and where Q is defined as above and preferably corresponds to the preferred embodiments indicated above, and where t is equal to 1 or 2.

Preferred structural units which carry a group Q are selected from structural units of the formula (II-B) defined above. Corresponding structural units are described by the formula (II-B-Q), where the number of groups Q per structural unit is not limited, but is preferably 1 or 2, particularly preferably 1, where Q is as defined above, where "formula (II-B)" represents a unit of the formula (II-B), as defined above:

formula (II-B-Q)

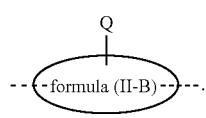

Very particularly preferred embodiments of the formula (II-B-Q) conform to one of the formulae (II-B-Q-1), (II-B-Q-2) and (II-B-Q-3)

formula (II-B-Q-1)

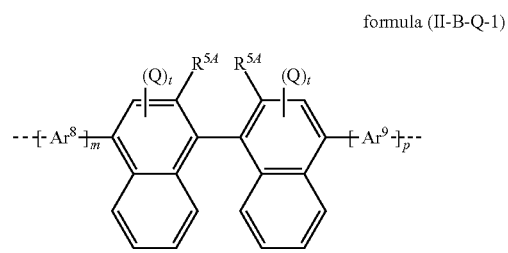

formula (II-B-Q-2)

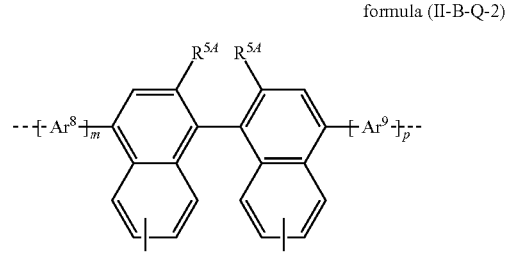

formula (II-B-Q-3)

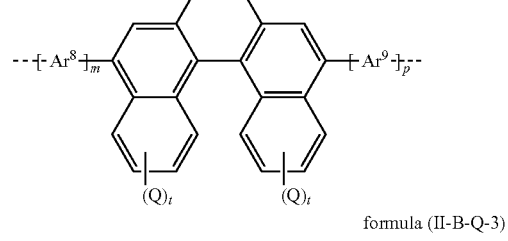

-continued formula (III-Q-1)

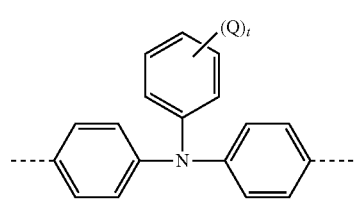

formula (III-Q-2)

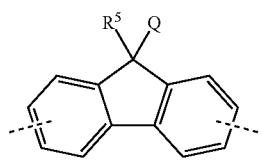

where the benzene rings may in each case be substituted at the free positions by a radical $R^5$, as defined above, and where t has a value of 1 to 5 and is preferably equal to 1 or 2, particularly preferably equal to 1.

Further preferred embodiments of structural units containing a group Q are the structural units of the formulae (IV-Q-1) to (IV-Q-3) shown below formula (IV-Q-1)

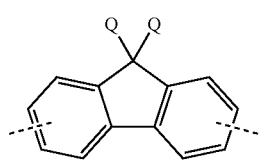

formula (IV-Q-2)

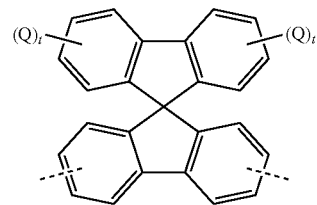

formula (IV-Q-3)

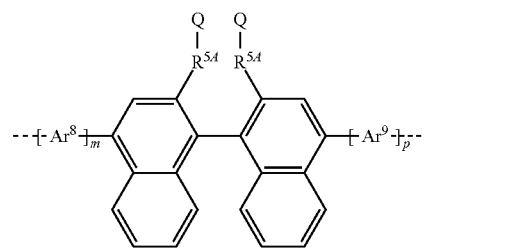

where the benzene rings may in each case be substituted at the free positions by a radical $R^5$, as defined above, and where t has a value of 1 to 5 and is preferably equal to 1 or 2, particularly preferably equal to 1.

Preferred specific embodiments of structural units containing one or more groups Q are shown in the following table:

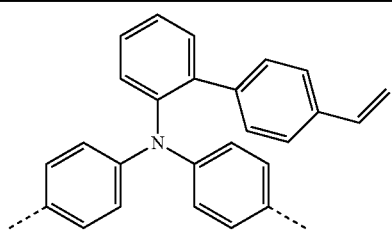
SE-Q-1
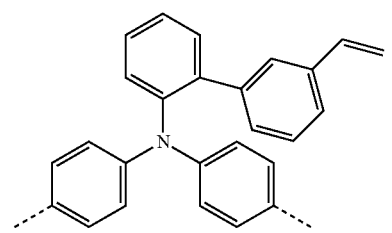
SE-Q-2
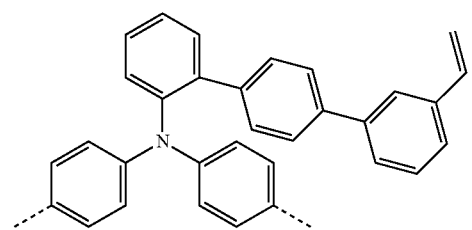
SE-Q-3
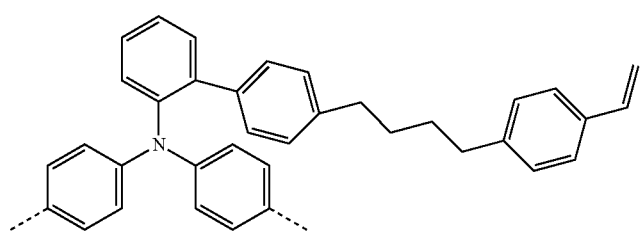
SE-Q-4
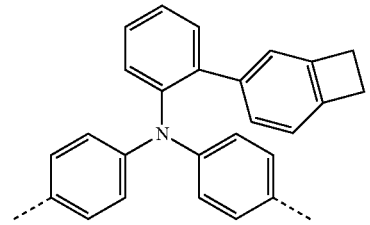
SE-Q-5
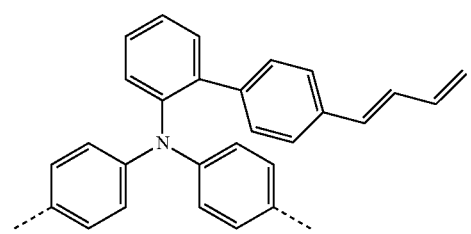
SE-Q-6
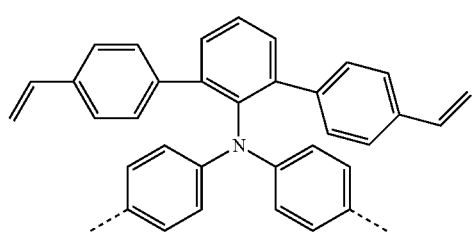
SE-Q-7

SE-Q-8
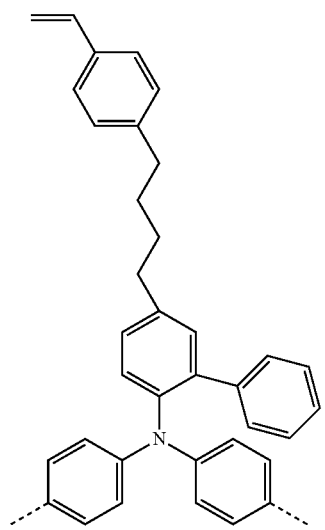
SE-Q-9
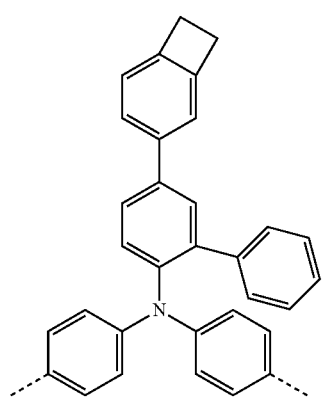
SE-Q-10
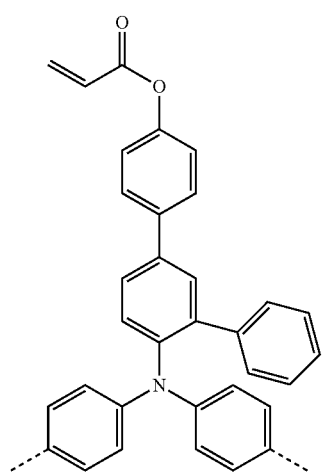

SE-Q-11
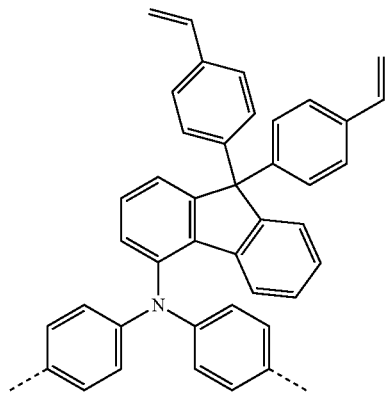
SE-Q-12
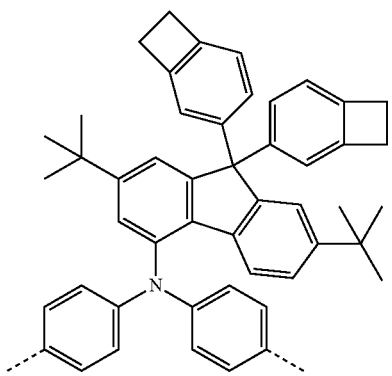
SE-Q-13
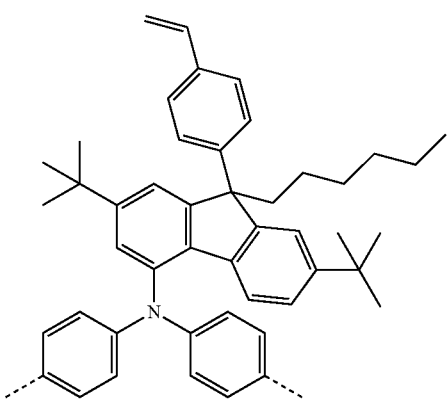

SE-Q-14
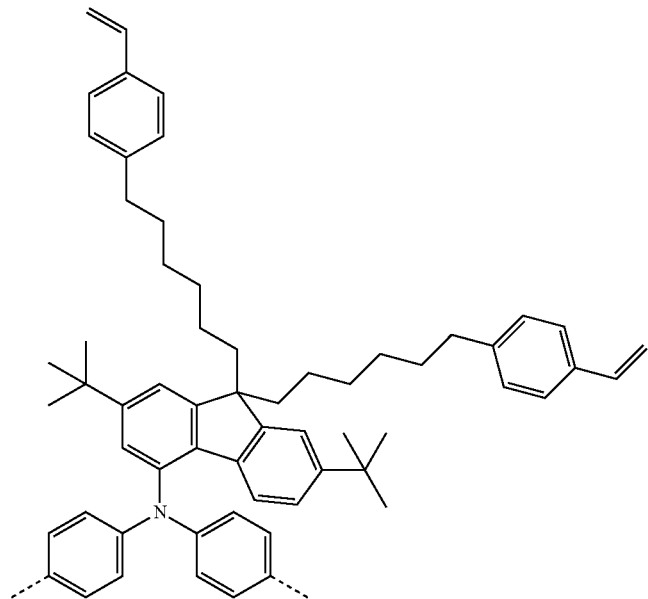
SE-Q-15
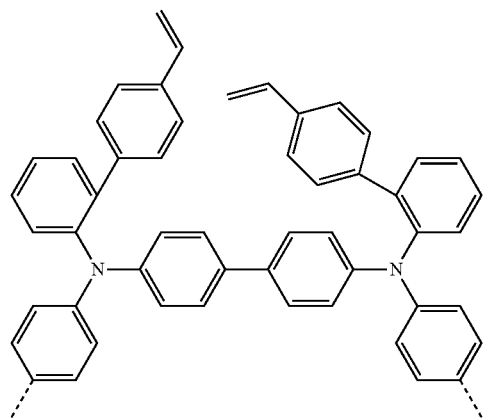
SE-Q-16
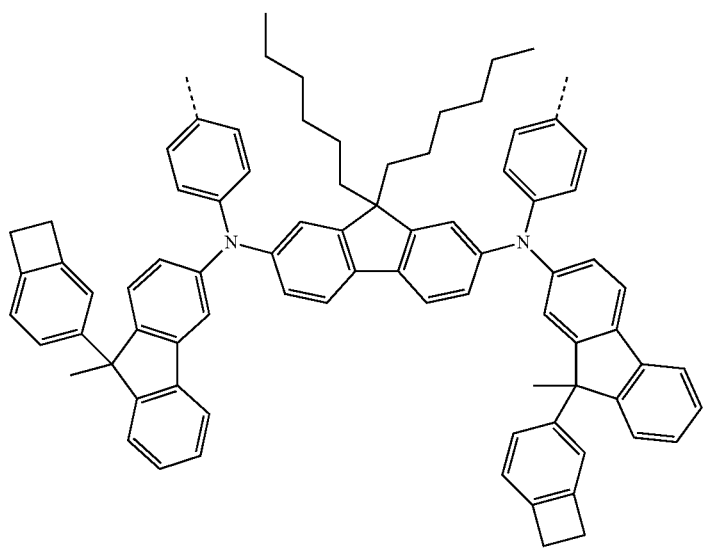

-continued
SE-Q-17
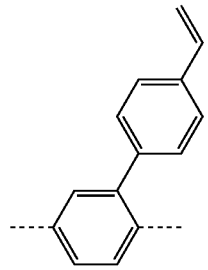
SE-Q-18
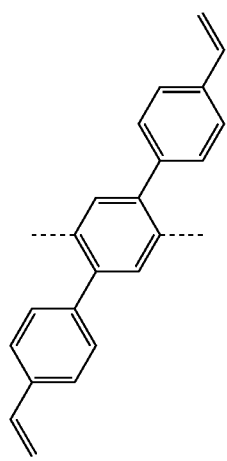
SE-Q-19
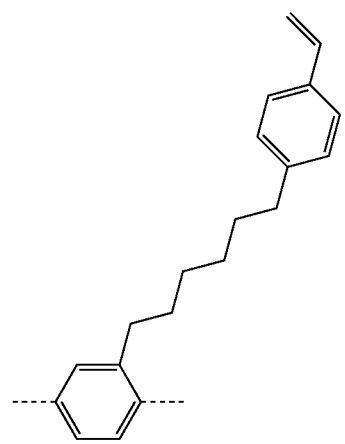

SE-Q-20
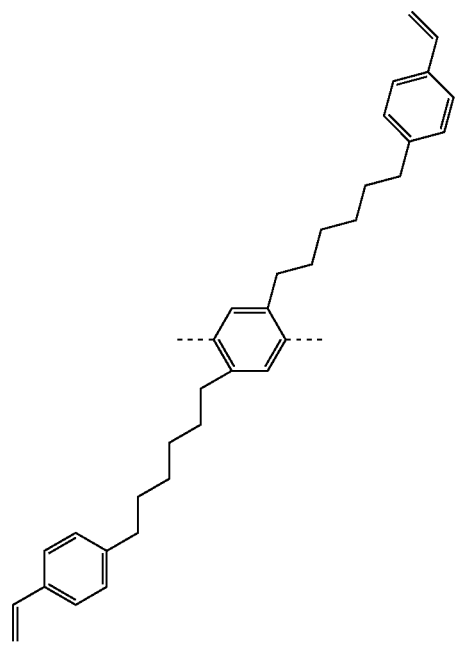
SE-Q-21
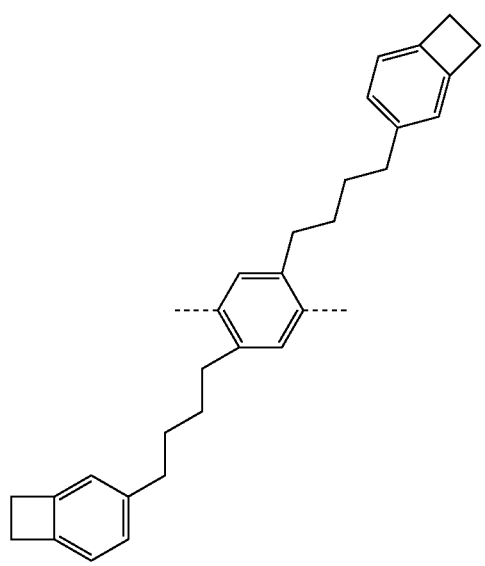
SE-Q-22
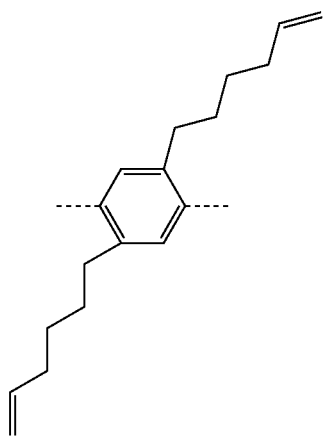

-continued
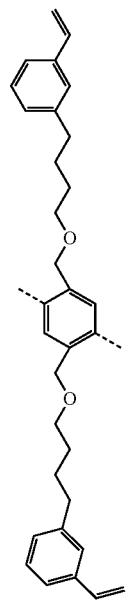
SE-Q-23
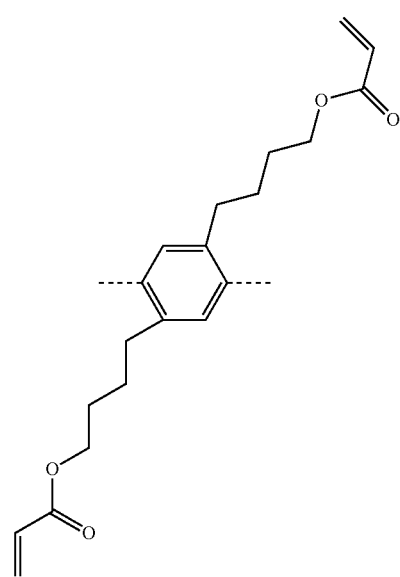
SE-Q-24

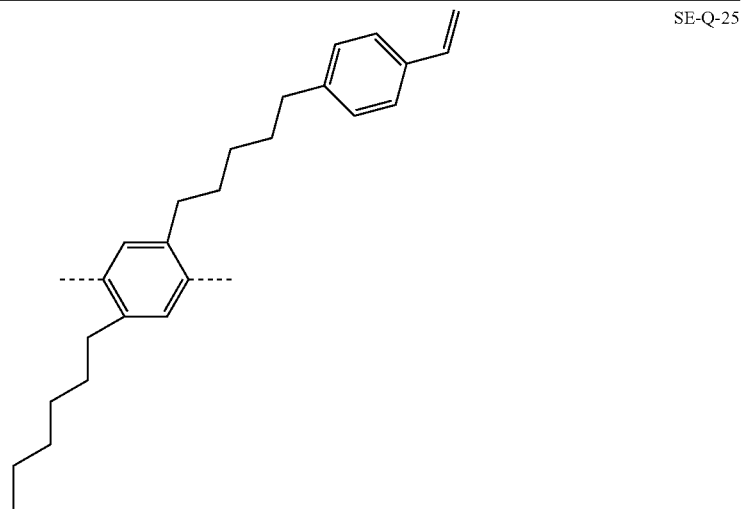
SE-Q-25
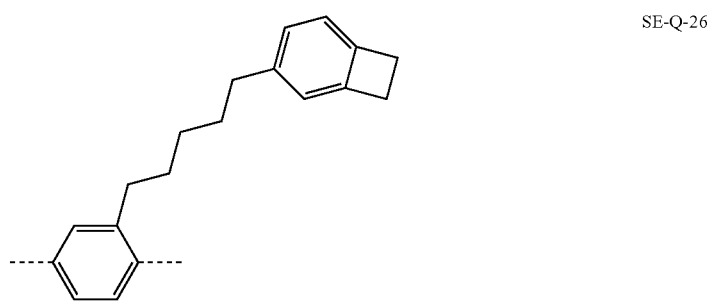
SE-Q-26
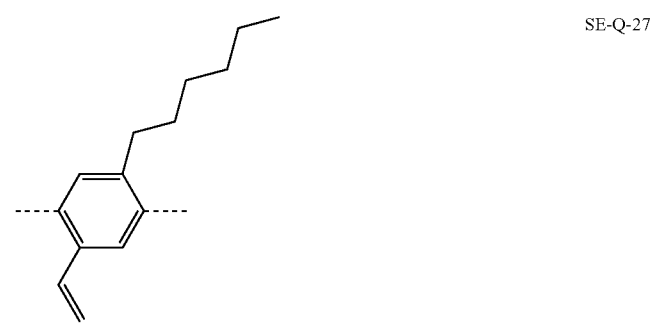
SE-Q-27
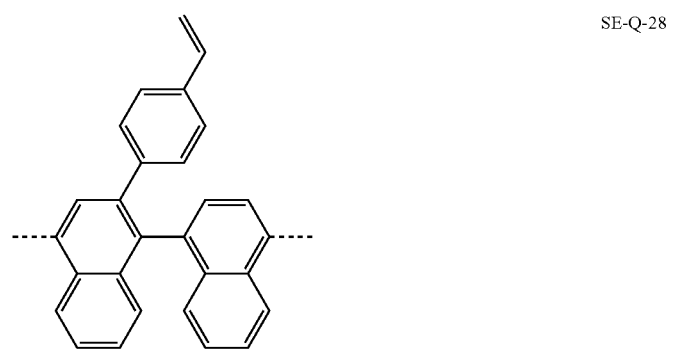
SE-Q-28

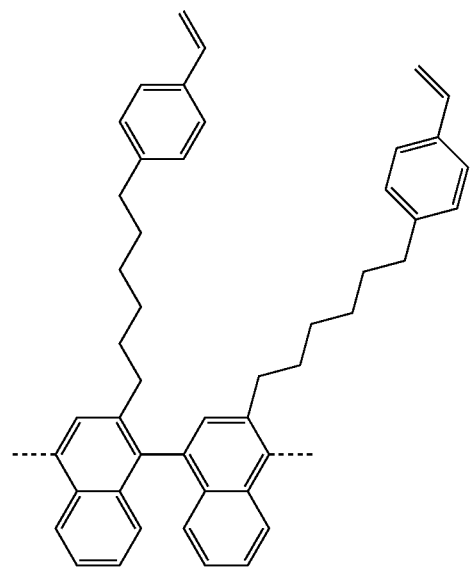
SE-Q-29
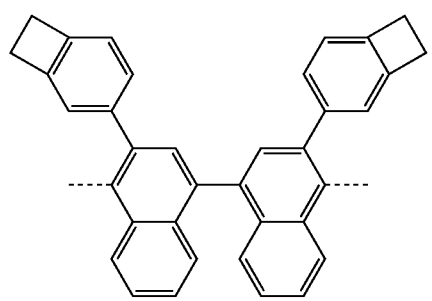
SE-Q-30
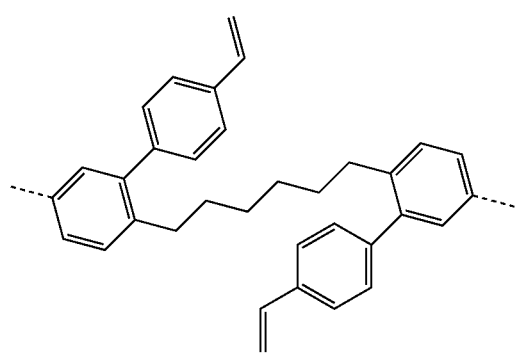
SE-Q-31

-continued
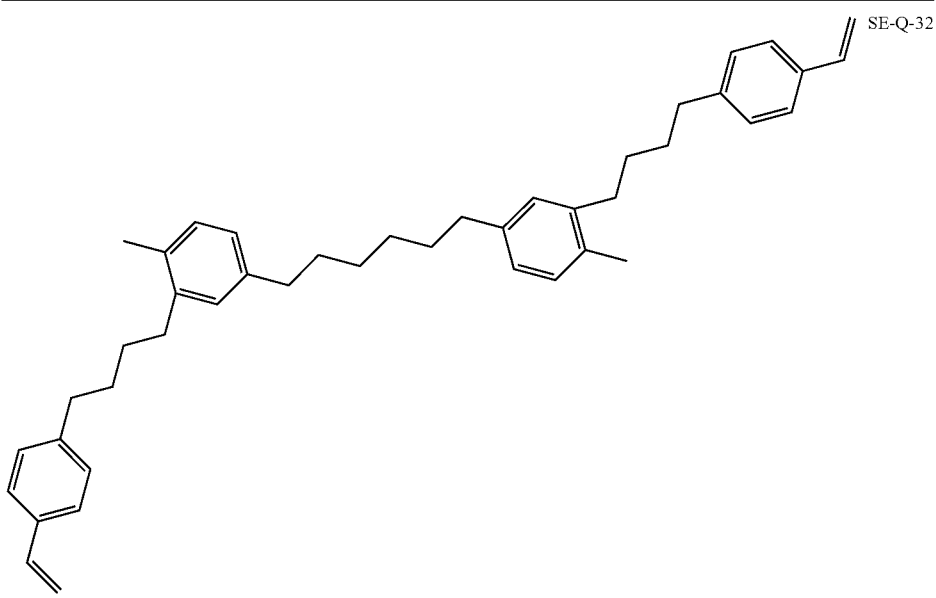
SE-Q-32
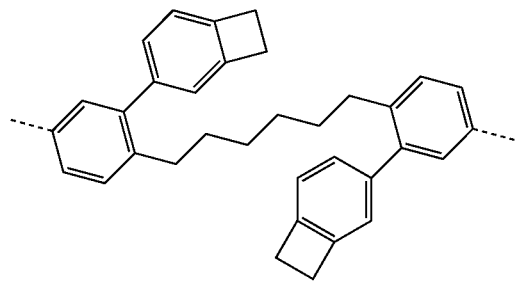
SE-Q-33
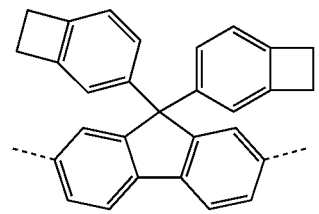
SE-Q-34
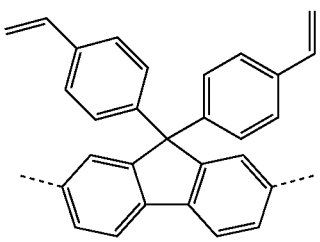
SE-Q-35
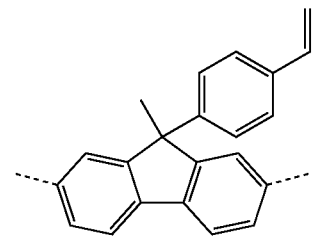
SE-Q-36

-continued
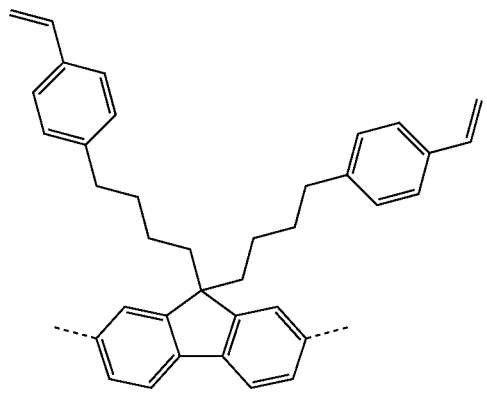
SE-Q-37
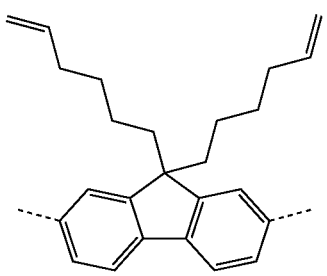
SE-Q-38
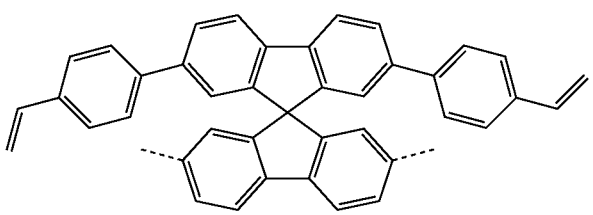
SE-Q-39
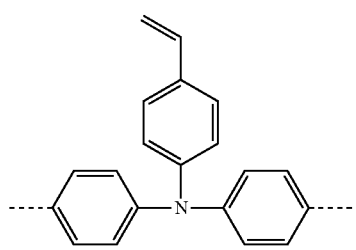
SE-Q-40
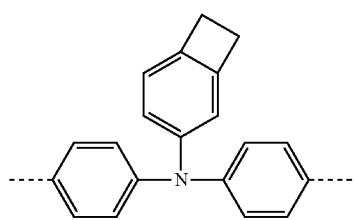
SE-Q-41
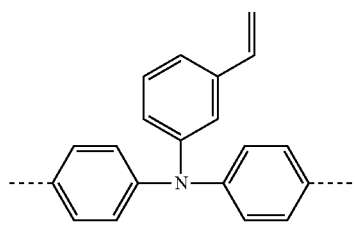
SE-Q-42

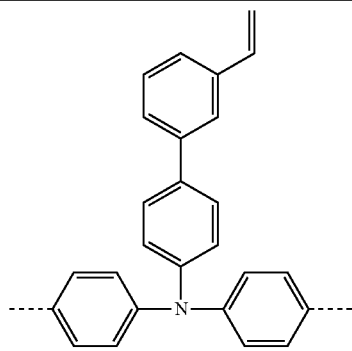

SE-Q-43

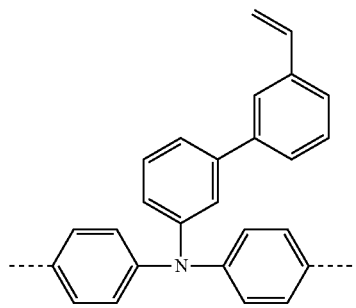

SE-Q-44

The proportion of crosslinkable structural units in the polymer is in the range from 1 to 50 mol %, preferably in the range from 2 to 40 mol %, particularly preferably in the range from 5 to 30 mol %, based on 100 mol % of all copolymerised monomers which are present in the polymer as structural units.

In addition to structural units of the formula (I), structural units A, B and C, and crosslinkable structural units, the polymer may also contain further structural units.

The further structural units can originate, for example, from the following classes:
group 1: units which influence the hole-injection and/or hole-transport properties of the polymers;
group 2: units which influence the electron-injection and/or electron-transport properties of the polymers;
group 3: units which have combinations of individual units from group 1 and group 2;
group 4: units which are typically used as polymer backbone;
group 5: units which influence the film morphology and/or the rheological properties of the resultant polymers.

Structural units from group 1 which have hole-injection and/or hole-transport properties are, for example, triarylamine, benzidine, tetraaryl-para-phenylene-diamine, triarylphosphine, phenothiazine, phenoxazine, dihydrophenazine, thian-threne, dibenzo-para-dioxin, phenoxathiyne, carbazole, azulene, thiophene, pyrrole and furan derivatives and further O—, S- or N-containing heterocycles.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O—, S- or N-containing heterocycles.

It may be preferred for the polymers according to the invention to contain units from group 3 in which structures which influence the hole mobility and structures which increase the electron mobility (i.e. units from group 1 and 2) are bonded directly to one another or to contain structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but also 1,2-, 1,3- or 1,4-phenylene, 1,2-, 1,3- or 1,4-naphthylene, 2,2'-, 3,3'- or 4,4'-biphenylylene, 2,2"-, 3,3"- or 4,4"-terphenylylene, 2,2'-, 3,3'- or 4,4'-bi-1,1'-naphthylylene or 2,2'''-, 3,3'''- or 4,4'''-quaterphenylylene derivatives.

Structural units from group 5 are those which influence the film morphology and/or the rheological properties of the polymers, such as, for example, siloxanes, alkyl chains or fluorinated groups, but also particularly rigid or flexible units, liquid-crystal-forming units or crosslinkable groups.

In the present application, the term polymer is taken to mean both polymeric compounds, oligomeric compounds and dendrimers. The polymeric compounds according to the invention preferably contain 10 to 10,000, particularly preferably 10 to 5000 and very particularly preferably 10 to 2000 structural units. The oligomeric compounds according to the invention preferably contain 3 to 9 structural units. The branching factor of the polymers here is between 0 (linear polymer, no branching points) and 1 (fully branched dendrimer).

The polymers according to the invention preferably have a molecular weight $M_w$ in the range from 1000 to 2,000,000 g/mol, particularly preferably a molecular weight $M_w$ in the range from 10,000 to 1,500,000 g/mol and very particularly preferably a molecular weight $M_w$ in the range from 20,000 to 250,000 g/mol. The molecular weight $M_w$ is determined by means of GPC (=gel permeation chromatography) against an internal polystyrene standard.

The polymers according to the invention preferably have a polydispersity of 1 to 15, particularly preferably 2 to 8. The polydispersity is measured here by gel permeation chromatography against an internal polystyrene standard.

The polymers according to the invention can be linear or branched, preferably linear. The polymers according to the invention can contain random, alternating or block-like structures or also have a plurality of these structures in an alternating sequence. The polymers according to the invention particularly preferably contain random or alternating structures. The polymers are particularly preferably random or alternating polymers. The way in which polymers having block-like structures can be obtained and what further structural elements are particularly preferred for this purpose is described, for example, in detail in WO 2005/014688 A2. This is part of the present application by way of reference. It should likewise again be emphasised at this point that the polymer may also have dendritic structures.

The polymers according to the invention containing structural units of the above-mentioned formulae are generally prepared by polymerisation of corresponding monomers. In each case, a particular monomer results in a particular structural unit. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of SUZUKI coupling, YAMAMOTO coupling and STILLE coupling, particularly preferably SUZUKI coupling; the C—N linking reaction is preferably a HARTWIG-BUCHWALD coupling.

The at least one hole-transport layer preferably has a thickness in the range from 5 to 300 nm, more preferably in the range from 10 to 200 nm, and most preferably in the range from 20 to 100 nm.

In a preferred embodiment of the present invention, the organic electroluminescent device comprises at least one hole-injection layer.

Suitable charge-transport materials, as can be used in the hole-injection layer of the organic electroluminescent device according to the invention, are, for example, the compounds disclosed in Y. Shirota et al., Chem. Rev. 2007, 107(4), 953-1010, or other materials as are employed in these layers in accordance with the prior art.

The at least one hole-injection layer has preferably a thickness in the range from 0.5 to 300 nm, more preferably in the range from 5 to 200 nm, and most preferably in the range from 10 to 150 nm.

It is furthermore preferred that the hole-injection layer is adjacent to the anode on the anode side and adjacent to the hole-transport layer on the cathode side.

The anode of the organic electroluminescent device preferably consists of a material having a high work function. Both electrodes must be highly conducting to provide ample currents during device operation, and at least one electrode must be transparent enough to out-couple the emitted light. The anode is preferably transparent and has a work function of greater than 4.5 eV vs. vacuum. Suitable materials for the anode are conductive mixed metal oxides like indium tin oxide (ITO) or indium zinc oxide (IZO).

The cathode of the organic electroluminescent device according to the invention preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). Also suitable are alloys comprising an alkali metal or alkaline-earth metal and silver, for example an alloy comprising magnesium and silver. In the case of multilayered structures, further metals which have a relatively high work function, such as, for example, Ag or Al, can also be used in addition to the said metals, in which case combinations of the metals, such as, for example, Ca/Ag, Mg/Ag or Ba/Ag, are generally used. It may also be preferred to introduce a thin interlayer of a material having a high dielectric constant between a metallic cathode and the organic semiconductor. Suitable for this purpose are, for example, alkali metal fluorides or alkaline-earth metal fluorides, but also the corresponding oxides or carbonates (for example LiF, $Li_2O$, $BaF_2$, MgO, NaF, CsF, $Cs_2CO_3$, etc.). Furthermore, lithium quinolinate (LiQ) can be used for this purpose. The layer thickness of this layer is preferably between 0.5 and 5 nm.

Besides anode, cathode, emitting layer, hole-transport layer and hole-injection layer, the organic electroluminescent device according to the invention preferably also comprises further functional layers selected from further hole-injection layers, further hole-transport layers, electron-blocking layers, further emitting layers, interlayers, electron-transport layers, electron-injection layers, hole-blocking layers, exciton-blocking layers, charge-generation layers, p/n junctions and coupling-out layers.

The organic electroluminescent device according to the invention preferably has at least one electron-transport layer, which is arranged between emitting layer and cathode.

The electron-transport layer preferably comprises at least one n-dopant and at least one electron-transport material matrix.

An n-dopant is taken to mean a compound which is able to at least partially reduce the other compound present in the layer (the matrix) and in this way increases the conductivity of the layer. n-Dopants in accordance with the present application are typically electron-donor compounds or strong reducing agents. n-Dopants which can be used are, for example, the materials disclosed in Chem. Rev. 2007, 107, pp. 1233 ff., Section 2.2, such as alkali metals, alkaline-earth metals and electron-rich and readily oxidisable organic compounds or transition-metal complexes.

Furthermore, the organic electroluminescent device according to the invention preferably has at least one electron-injection layer, which is arranged between electron-transport layer and cathode. The electron-injection layer is preferably directly adjacent to the cathode.

The materials used for the electron-transport layer and electron-injection layer can be all materials as are used in accordance with the prior art as electron-transport materials in the electron-transport layer. In particular, aluminium complexes, for example $Alq_3$, zirconium complexes, for example $Zrq_4$, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives are suitable. Furthermore suitable materials are derivatives of the above-mentioned compounds, as disclosed in JP 2000/053957, WO 2003/060956, WO 2004/028217, WO 2004/080975 and WO 2010/072300.

During production, the organic electroluminescent device is preferably structured, provided with contacts and finally sealed in order to exclude water and/or air.

A further object of the present invention is a method for the production of an organic electroluminescent device according to the invention. The preferred method comprises the following steps:

a. Deposition of at least one hole-transport layer comprising a polymer with non-conjugated units on an anode;

b. Deposition of at least one blue light-emitting layer, comprising an elongated bis-indenofluorene derivative, on the at least one hole-transport layer; and c. Formation of a cathode.

In a preferred embodiment, the organic electroluminescent device according to the invention is characterised in that one or more layers are coated by means of a sublimation process, in which the materials are applied by vapour deposition in vacuum sublimation units at an initial pressure of less than $10^{-5}$ mbar, preferably less than $10^{-6}$ mbar. However, it is also possible here for the initial pressure to be even lower, for example less than $10^{-7}$ mbar.

It is likewise preferred for one or more layers in the organic electroluminescent device according to the invention to be coated by means of the OVPD (organic vapour phase deposition) process or with the aid of carrier-gas sublimation, in which the materials are applied at a pressure of between $10^{-5}$ mbar and 1 bar. A special case of this process is the OVJP (organic vapour jet printing) process, in which the materials are applied directly through a nozzle and are thus structured (for example M. S. Arnold et al., *Appl. Phys. Lett.* 2008, 92, 053301).

It is likewise preferred for one or more layers in the organic electroluminescent device according to the invention to be produced from solution, such as, for example, by spin coating, or by means of any desired printing process, such as, for example, screen printing, flexographic printing, nozzle printing or offset printing, but particularly preferably LITI (light induced thermal imaging, thermal transfer printing) or ink-jet printing.

It is furthermore preferred, for the production of the organic electroluminescent device according to the invention, to apply one or more layers from solution and one or more layers by a sublimation process.

The organic electroluminescent device according to the invention can be employed in displays, as light sources in lighting applications and as light sources in medical and/or cosmetic applications (for example phototherapy).

The invention is explained in greater detail below with reference to working examples, but without being restricted thereby.

WORKING EXAMPLES

A) Synthesis Examples of the Elongated Bis-Indenofluorene Derivatives

A-1)

Synthesis Scheme:

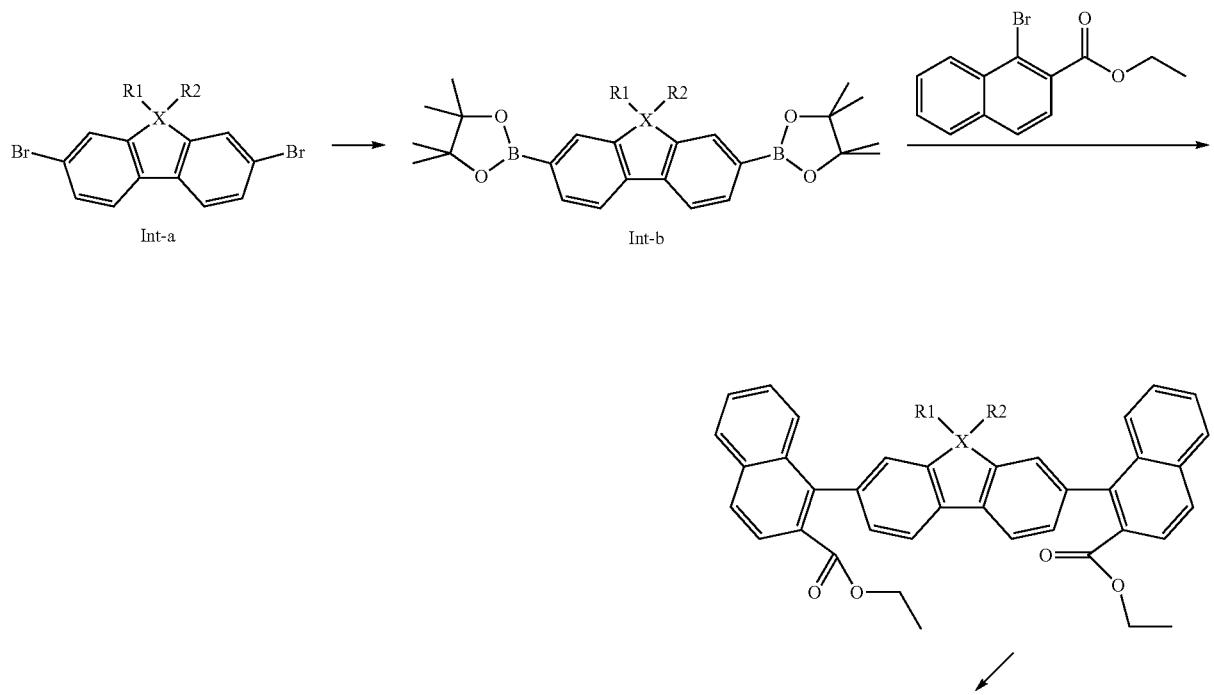

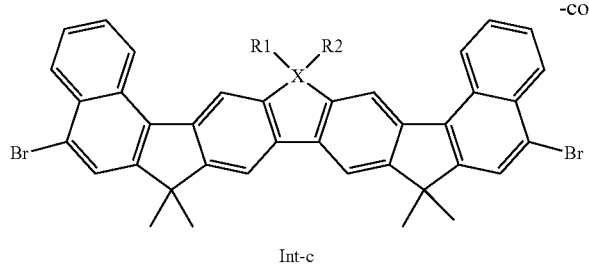

Int-c

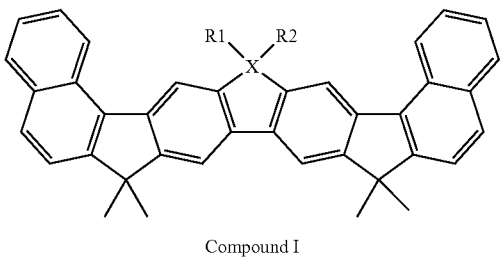

Compound I

| Compound | 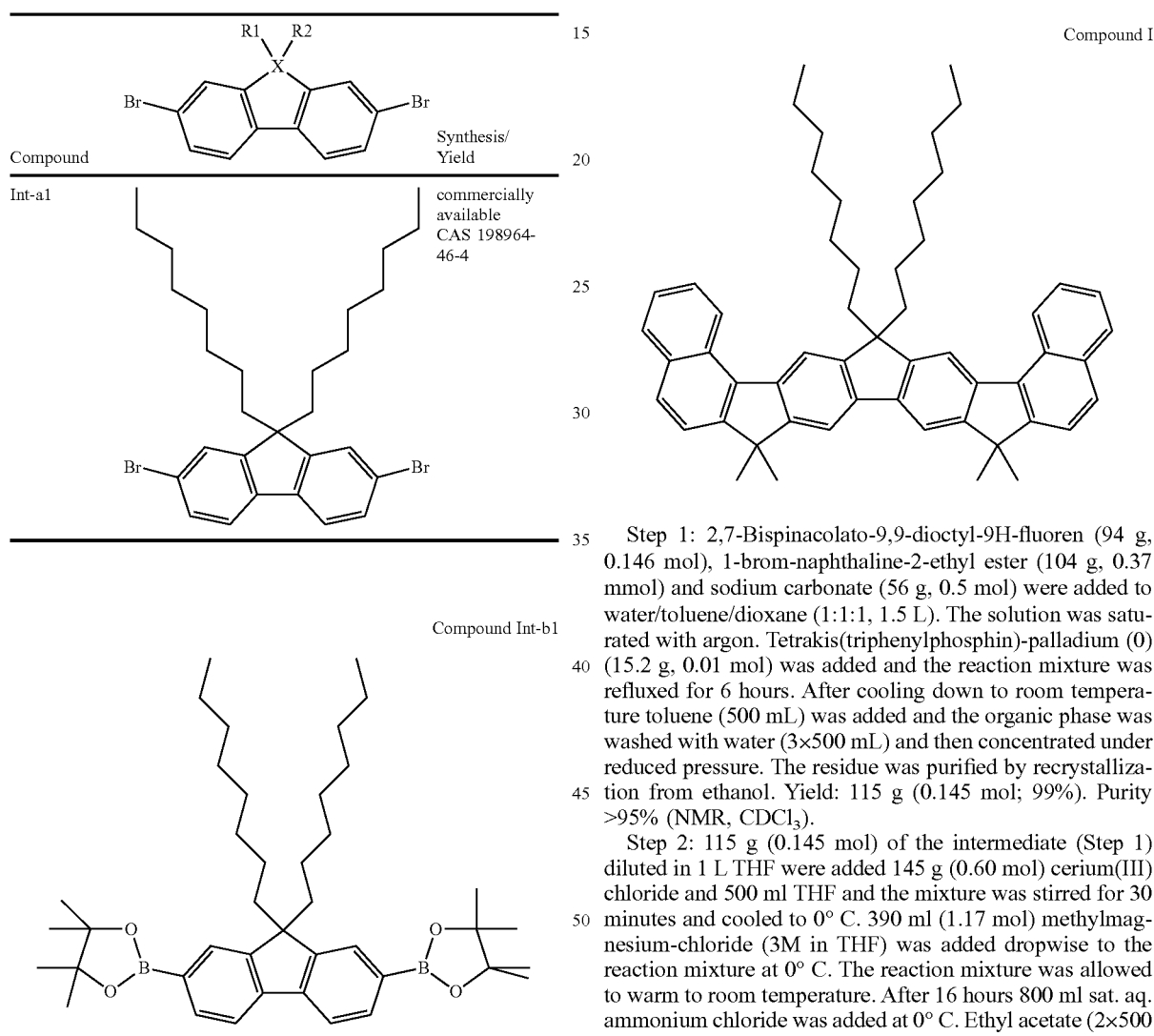 | Synthesis/ Yield |
|---|---|---|
| Int-a1 | | commercially available CAS 198964-46-4 |
| Compound Int-b1 | | 2,7-Dibromo-9,9-dioctyl-9H-fluorene (100 g, 0.17 mol), bis(pinacolato)-diboron (94.9 g, 0.37 mol) and potassium acetate (50 g, 0.51 mol) were suspended in 1.4 L dioxane. The solution was saturated with argon. PdCl$_2$(dppf)-CH$_2$Cl$_2$ (4.2 g, 0.01 mol) was added. The reaction mixture was refluxed for sixteen hours and then cooled to room temperature. Ethyl acetate and water were added. The organic phase was washed with water (3×500 mL). The organic phase was concentrated under reduced pressure and the residue was purified by recrystallization from ethanol. Yield: 98 g (90%). Purity >95% (NMR in CDCl$_3$). |
| Compound I | | Step 1: 2,7-Bispinacolato-9,9-dioctyl-9H-fluoren (94 g, 0.146 mol), 1-brom-naphthaline-2-ethyl ester (104 g, 0.37 mmol) and sodium carbonate (56 g, 0.5 mol) were added to water/toluene/dioxane (1:1:1, 1.5 L). The solution was saturated with argon. Tetrakis(triphenylphosphin)-palladium (0) (15.2 g, 0.01 mol) was added and the reaction mixture was refluxed for 6 hours. After cooling down to room temperature toluene (500 mL) was added and the organic phase was washed with water (3×500 mL) and then concentrated under reduced pressure. The residue was purified by recrystallization from ethanol. Yield: 115 g (0.145 mol; 99%). Purity >95% (NMR, CDCl$_3$).<br><br>Step 2: 115 g (0.145 mol) of the intermediate (Step 1) diluted in 1 L THF were added 145 g (0.60 mol) cerium(III) chloride and 500 ml THF and the mixture was stirred for 30 minutes and cooled to 0° C. 390 ml (1.17 mol) methylmagnesium-chloride (3M in THF) was added dropwise to the reaction mixture at 0° C. The reaction mixture was allowed to warm to room temperature. After 16 hours 800 ml sat. aq. ammonium chloride was added at 0° C. Ethyl acetate (2×500 mL) was added, the combined organic phases were washed with water (2×500 mL) and concentrated under reduced pressure. The residue was purified by recrystallization from ethanol. Yield: 103 g (0.146 mol, 93%).<br><br>Step 3: 103 g (0.14 mol) of the intermediate (Step 2) were solved in 1.5 L toluene and 275 g amberlyst 15 were added. The reaction mixture was refluxed for 16 hours using a Dean-Stark apparatus. After cooling down to room temperature amberlyst was removed by filtration and the organic phase was concentrated under reduced pressure. The residue was purified by several recrystallizations from ethanol or heptane/toluene.<br><br>Yield: 73 g (0.101 mol; 75%). |

Compound Int-c1

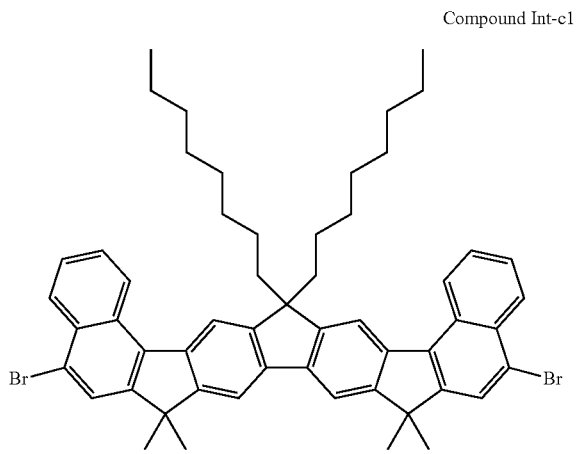 [SMILES: CCCCCCCCC1(CCCCCCCC)c2cc3c(cc2-c2cc4c(cc21)-c1c(cc(Br)c2ccccc12)C4(C)C)C(C)(C)c1cc(Br)c2ccccc2c1-3]

Ia (73 g, 101 mmol) was dissolved in 1 L DCM and cooled to −10° C. Br₂ (33.1 g, 207 mmol) in 500 ml DCM was added dropwise. The reaction mixture was stirred one hour at 0° C. and then allowed to warm to room temperature. After 16 hours, 20 ml aqueous, saturated sodium thiosulfate solution was added and the mixture was stirred for 15 minutes. Water (1 L) was added, the organic phase was washed with water (3×500 mL) and the combined organic phases were concentrated under reduced pressure. The residue was purified by several recrystallizations from ethanol or heptane/toluene.

Yield: 66.4 g (75 mmol; 74%)

Synthesis of Compound C1

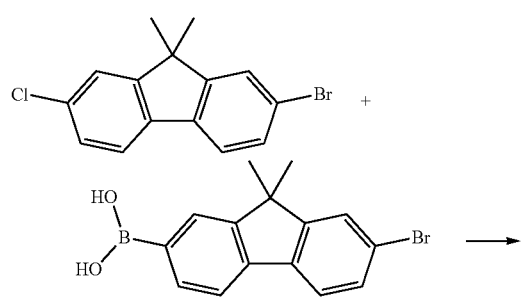

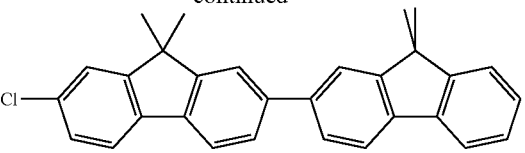

30 g (97.5 mmol) 2-Bromo-7-Chloro-9,9-dimethyl-9H-fluorene (see JP 2003277305 A), 25.5 g (107.3 mmol) (9,9-dimethylfluoren-2-yl) boronic acid 90 g (390 mmol), 0.9 g (4 mmol) palladium(II)acetate and 3.6 g (11.7 mmol) tri(o-tolyl)-phosphine were dissolved in 1 L toluene, dioxane, water (1:1:1) and stirred at reflux overnight. After cooling down to room temperature 200 ml toluene were added and the organic phase was separated and washed with water (2×200 ml) and the combined organic phases were concentrated under reduced pressure. The residue was purified by recrystallization from toluene/heptane.

Yield: 39.1 g (93 mmol; 96%)

Following compound can be synthesized in an analogous manner:

| Compound | Starting material | Product | Yield |
|---|---|---|---|
| C2 | CAS 302554-81-0 | | 89% |

Synthesis of D1

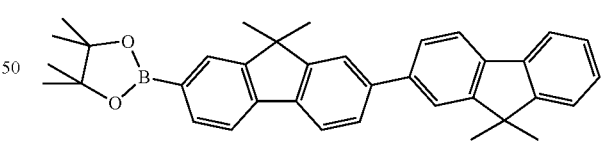

40 g (95 mmol) C1, 38.6 g (152 mmol) bis-(pinacolato)-diboron, 4.2 g (5.7 mmol) trans-dichloro(tricyclohexylphosphine)palladium(II) and 28 g (285 mmol) potassium acetate were dissolved in 400 ml dioxane and stirred for 16 h at reflux. The reaction mixture was allowed to cool to room temperature and 400 ml toluene were added. The organic phase was separated, washed with water (2×200 mL) and filtered through Celite. The solution was concentrated to dryness under reduced pressure. The residue was purified by recrystallization from toluene/heptane.

Yield: 36 g (70 mmol; 74%)

Following compound can be synthesized in an analogous manner:

| Compound | Starting material | Product | Yield |
|---|---|---|---|
| D2 | C2 | 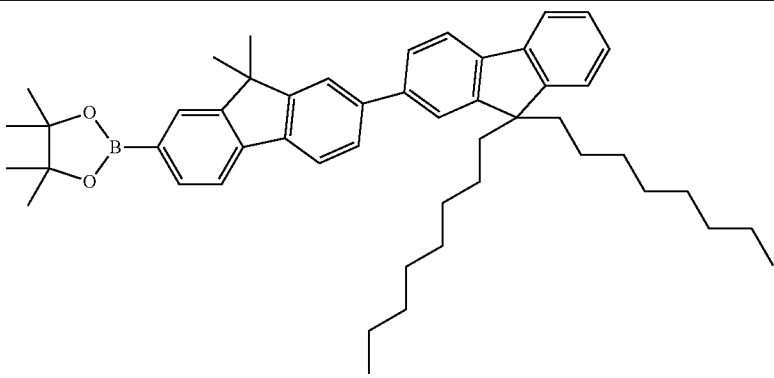 | 89% |

Synthesis of E1

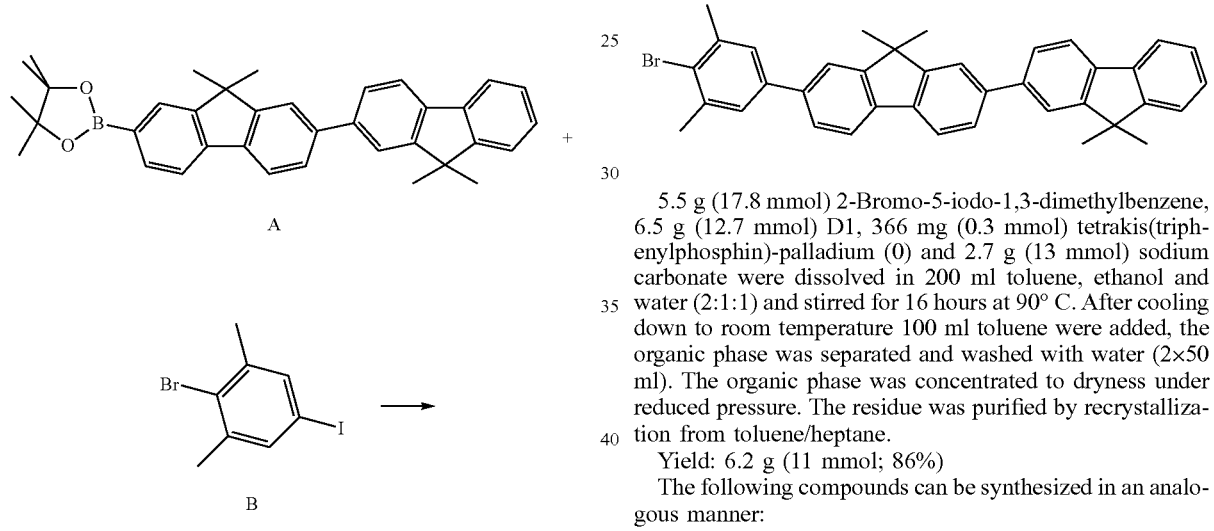

A

B 5.5 g (17.8 mmol) 2-Bromo-5-iodo-1,3-dimethylbenzene, 6.5 g (12.7 mmol) D1, 366 mg (0.3 mmol) tetrakis(triphenylphosphin)-palladium (0) and 2.7 g (13 mmol) sodium carbonate were dissolved in 200 ml toluene, ethanol and water (2:1:1) and stirred for 16 hours at 90° C. After cooling down to room temperature 100 ml toluene were added, the organic phase was separated and washed with water (2×50 ml). The organic phase was concentrated to dryness under reduced pressure. The residue was purified by recrystallization from toluene/heptane.

Yield: 6.2 g (11 mmol; 86%)

The following compounds can be synthesized in an analogous manner:

| Compound | Starting material A | Starting material B | Product | Yield |
|---|---|---|---|---|
| E2 | D2 | CAS 699119-05-6 | 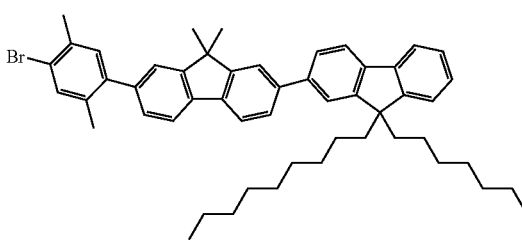 | 87% |

-continued

| Compound | Starting material A | Starting material B | Product | Yield |
|---|---|---|---|---|
| E3 | D2 | 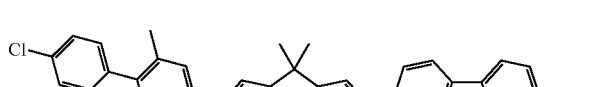see JP 20032 77305 A | | 78% |

Synthesis of Compound F
Compound F can be synthesized in an analogous manner to E1:

| Compound | Starting material A | Starting material B | Product | Yield |
|---|---|---|---|---|
| F1 | CAS 1679-18-1 | E2 | 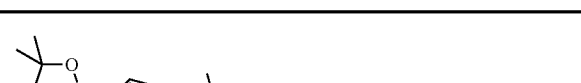 | 72% |

Synthesis of Compounds G
Compounds G can be synthesized in an analogous manner to D1:

| Compound | Starting material | Product | Yield |
|---|---|---|---|
| G1 | F1 | | 83% |

-continued

| Com-pound | Starting material | Product | Yield |
|---|---|---|---|
| G2 | E3 | 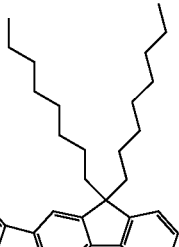 | 72% |

Compound IIa

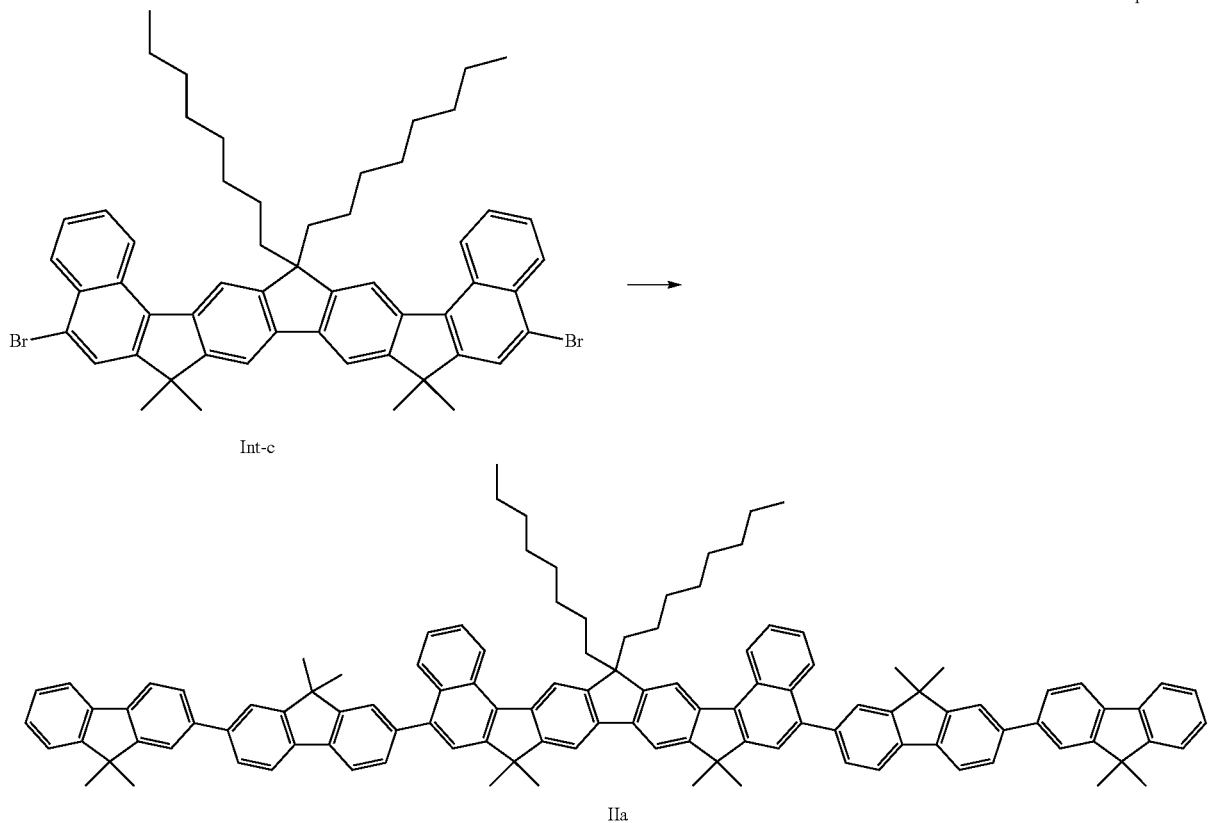

Int-c (18.7 g, 21.2 mmol), D1 (23.9 g, 46.7 mmol) and sodium carbonate (4.5 g, 42.4 mmol) were dissolved in a mixture of toluene, ethanol and water (2:1:1) and the solution was saturated with argon. Tetrakis(triphenylphosphine)-palladium (0) (613 mg, 0.53 mmol) was added and stirred for 6 hours at 110° C. The reaction mixture was allowed to cool to room temperature, toluene (400 mL) and water (200 mL) were added and the organic phase was separated and washed twice with water (400 mL). The organic phase was concentrated under reduced pressure. The residue was further purified by filtration through silica (eluting with toluene), recrystallization from heptane/toluene.

Yield: 16.4 g (11.0 mmol; 52%)

Following compounds IIb and IIc can be synthesized in an analogous manner:

| Starting material A | Starting material B | | Yield |
|---|---|---|---|
| IIb | Int-C1 | G1 | 58% |
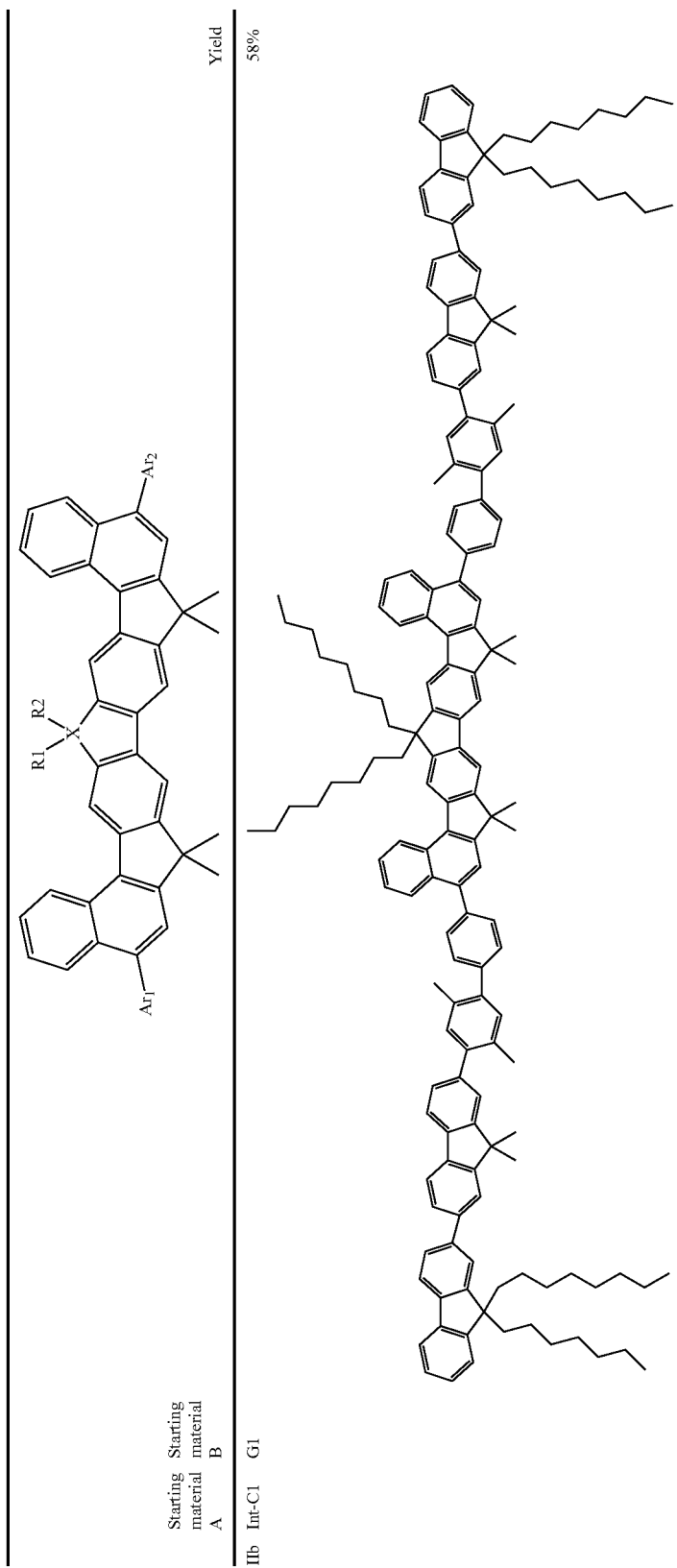

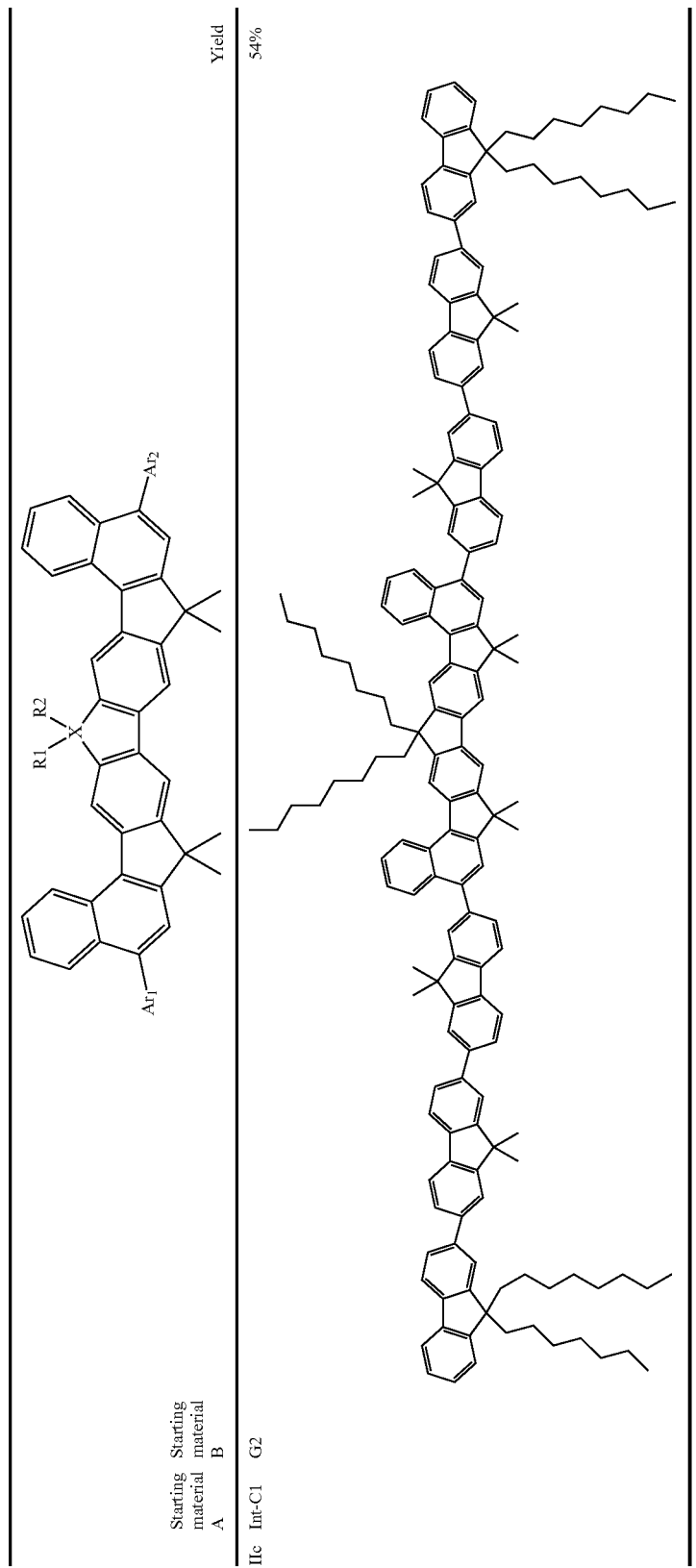
| Starting material A | Starting material B | | Yield |
|---|---|---|---|
| I1c | Int-C1 | G2 | 54% |

B) Synthesis Examples of the Polymers with Non-Conjugated Units

The polymers of the present invention HTL1 to HTL7 as well as the comparative polymer V-HTL1 are prepared via Suzuki-coupling according to the method as described in WO 2003/048225, using the monomers as described in the following Table 2

TABLE B1

Structures of the monomers which are used for the preparation of the polymers with non-conjugated units

| name | structure | Synthesis according to/ CAS |
|---|---|---|
| MON-1-Br | | WO2013/156130 |
| MON-1-BE | | WO2013/156130 |
| MON-2-Br | | WO2013/156130 |
| MON-3-Br | | Macromolecules 2000, 33, 2016-2020 |

TABLE B1-continued

Structures of the monomers which are used for the preparation of the polymers with non-conjugated units

| name | structure | Synthesis according to/ CAS |
|---|---|---|
| MON-4-Br | | WO2013/156130 |
| MON-5-BE | | CAS 374934-77-7 |
| MON-6-Br | | CAS 1257064-91-7 |
| MON-7-Br | | WO2010/097155 |

TABLE B1-continued

Structures of the monomers which are used for the preparation of the polymers with non-conjugated units

| name | structure | Synthesis according to/ CAS |
|---|---|---|
| MON-7-BE | | WO2010/097155 |
| MON-8-BE | | WO2013/156130 |
| MON-9-Br | | CAS 852534-20-4 |

For the preparation of the polymers, the monomers are used in the reaction mixture in the percentage proportions, as indicated below in Table B2. The polymers HTL1-HTL7 as well as V-HTL1 prepared in this way contain the structural units in the percentage proportions (percent data=mol %) indicated in Table B2 after removal of the leaving groups.

In the case of polymers, which are prepared from monomers containing aldehyde groups, these aldehyde groups will be transferred into crosslinkable vinyl groups after the polymerization by WITTIG reaction, according to the method as described in WO 2010/097155. The corresponding polymers as described in Table B2 contain accordingly crosslinkable vinyl groups instead of the originally contained aldehyde groups.

The palladium and bromine contents of the polymers are determined by ICP-MS. The values determined are below 10 ppm.

The molecular weights $M_w$ and the polydispersities D are determined by means of gel permeation chromatography (GPC) (model: Agilent HPLC system series 1100) (column: PL-RapidH from Polymer Laboratories; solvent: THF comprising 0.12% by vol. of o-dichlorobenzene; detection: UV and refractive index; temperature: 40° C.). The calibration is carried out using polystyrene standards.

The compositions of the polymers are summarised in Table B2.

TABLE B2

Composition of the prepared polymers

| Polymer | MON A | % | MON B | % | MON C | % | Mw/D |
|---|---|---|---|---|---|---|---|
| V-HTL1 | MON-3-Br | 50 | MON-1-BE | 40 | MON-7-BE | 10 | 138K/ 2.1 |

TABLE B2-continued

Composition of the prepared polymers

| Polymer | MON A | % | MON B | % | MON C | % | Mw/D |
|---|---|---|---|---|---|---|---|
| HTL1 | MON-1-Br | 30 | MON-5-BE | 50 | MON-7-Br | 20 | 150K/3.9 |
| HTL2 | MON-2-Br | 30 | MON-5-BE | 50 | MON-9-Br | 20 | 50K/2.3 |
| HTL3 | MON-2-Br | 30 | MON-5-BE | 50 | MON-7-Br | 20 | 65K/2.8 |
| HTL4 | MON-4-Br | 30 | MON-5-BE | 50 | MON-9-Br | 20 | 95K/3.4 |
| HTL5 | MON-4-Br | 40 | MON-5-BE | 50 | MON-7-Br | 10 | 85K/2.6 |
| HTL6 | MON-4-Br | 30 | MON-5-BE | 50 | MON-7-Br | 20 | 68K/2.5 |
| HTL7 | MON-1-BE | 30 | MON-6-Br | 50 | MON-8-BE | 20 | 66K/2.7 |

C) Preparation of the OLEDs

The production of solution-based OLEDs has already been described many times in the literature, for example in WO 2004/037887 and WO 2010/097155. The process is adapted to the circumstances described below (layer-thickness variation, materials).

The inventive material combinations are used in the following layer sequence:
substrate,
ITO (50 nm),
hole-injection layer HIL (20 nm),
hole-transport layer (HTL) (20 nm),
emission layer (EML) (30 nm),
hole-blocking layer (HBL) (10 nm)
electron-transport layer (ETL) (40 nm),
cathode (Al) (100 nm).

Glass plates coated with structured ITO (indium tin oxide) in a thickness of 50 nm serve as substrate. The hole-injection layer is applied via spin coating in an inert atmosphere. For this, a hole-transporting, crosslinkable polymer and a p-dopant salt are dissolved in toluene. Corresponding materials are for example described in WO 2016/107668, WO 2013/081052 and EP 2325190. The solids content of such solutions is about 6 mg/ml if, as here, the layer thicknesses of 20 nm is to be achieved by means of spin coating. The layers are applied by spin coating in an inert-gas atmosphere, and dried by heating at 200° C. for 30 minutes on a heating plate. The hole-transport and the emission layer are applied to these coated glass plates.

The compounds according to the invention and comparative compounds, in each case dissolved in toluene, are used as hole-transport layer. The solids content of such solutions is about 5 mg/ml if, as here, the layer thicknesses of 20 nm is to be achieved by means of spin coating. The layers are applied by spin coating in an inert-gas atmosphere, and dried by heating at 220° C. for 30 minutes on a heating plate.

The emission layer is composed of the matrix material (host material) 1 and the emitting dopant (emitter) D1. Both material are present in the emission layer in a proportion of 92% by weight H1 and 8% by weight D1. The mixture for the emission layer is dissolved in toluene. The solids content of such solutions is about 9 mg/ml if, as here, the layer thickness of 30 nm which is typical for a device is to be achieved by means of spin coating. The layers are applied by spin coating in an inert-gas atmosphere, and dried by heating at 150° C. for 10 minutes.

The materials used in the present case are shown in Table C1.

TABLE C1
Structural formulae of the materials used in the emission layer
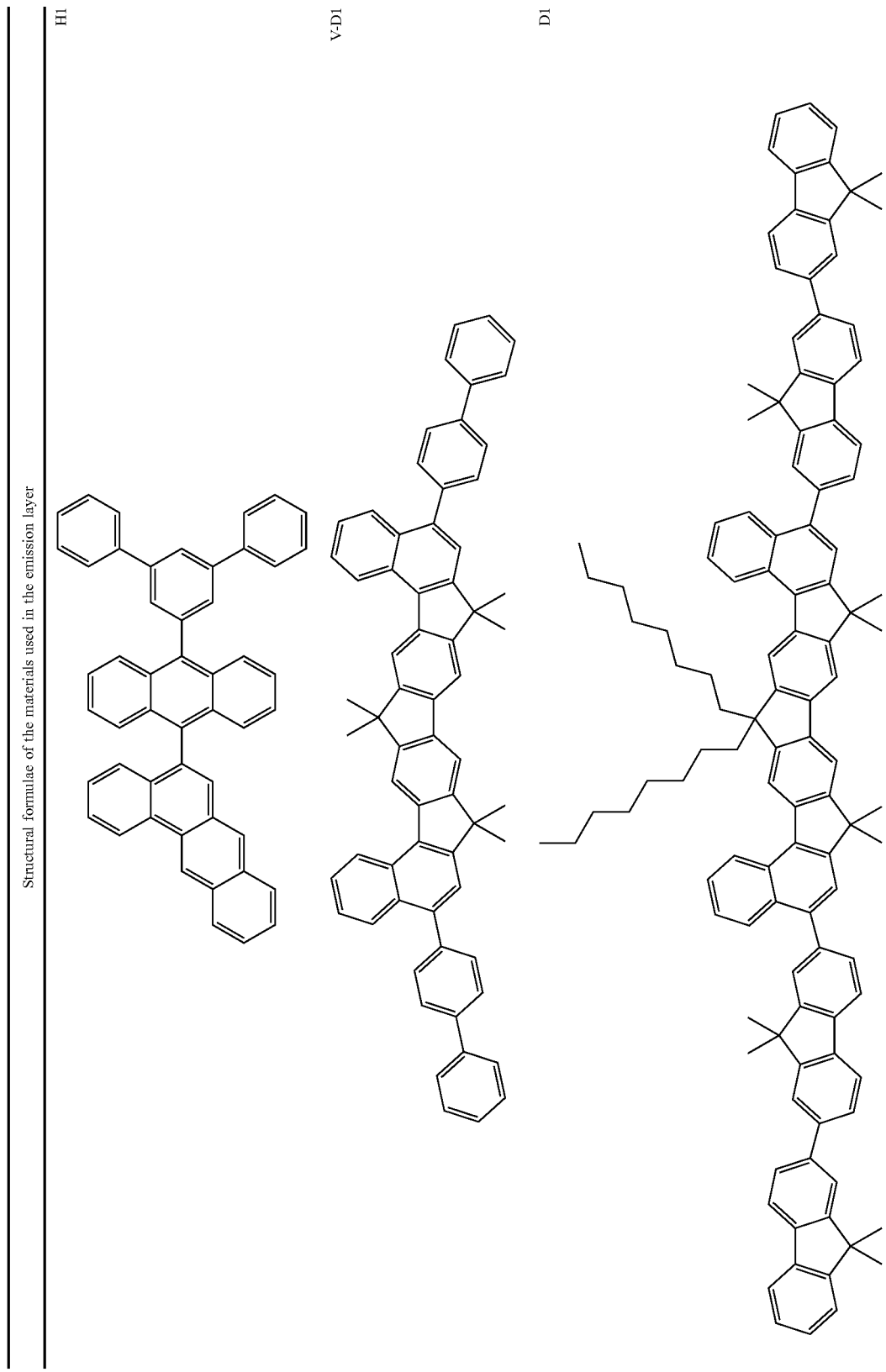

TABLE C1-continued
Structural formulae of the materials used in the emission layer
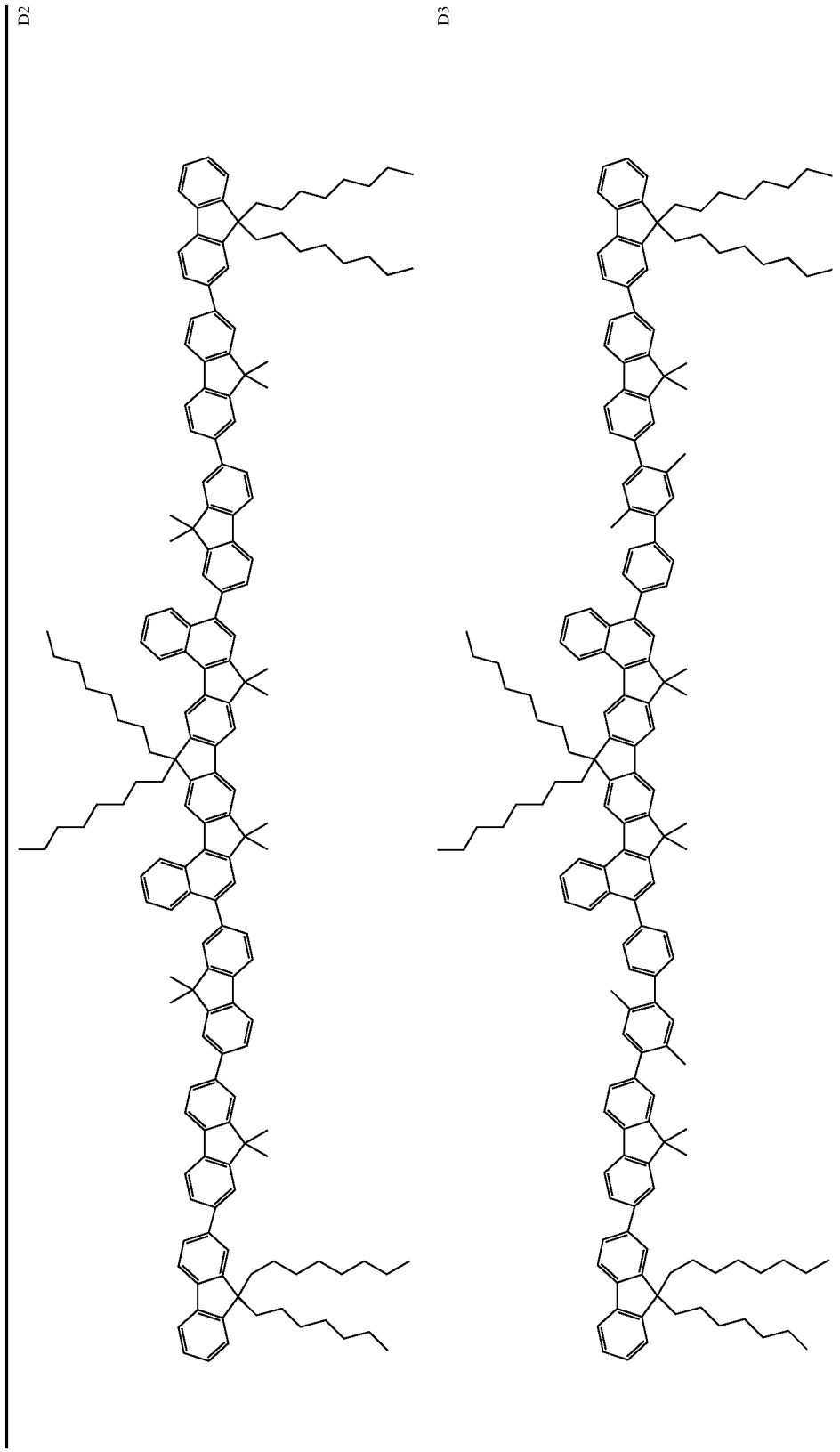

The materials for the hole-blocking layer and electron-transport layer are likewise applied by thermal vapour deposition in a vacuum chamber and are shown in Table C2. The hole-blocking layer consists of ETM1. The electron-transport layer consists of the two materials ETM1 and ETM2, which are mixed with one another in a proportion by volume of 50% each by co-evaporation.

TABLE C2

HBL and ETL materials used

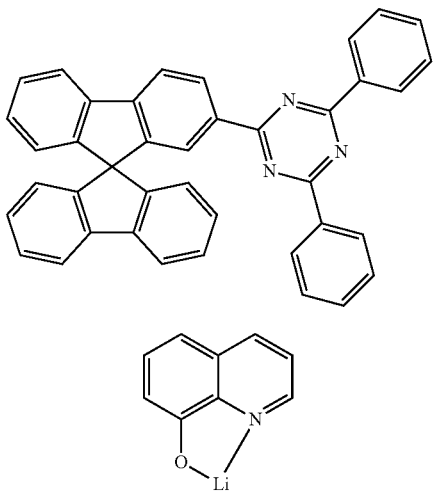

ETM1

ETM2

The cathode is formed by the thermal evaporation of an aluminium layer with a thickness of 100 nm.

The OLEDs are characterised by standard methods. For this purpose, the electroluminescence spectra, current/voltage/luminous density characteristic lines (IUL characteristic lines) assuming Lambert emission characteristics and the (operating) lifetime are determined. The IUL characteristic lines are used to determine characteristic numbers such as external quantum efficiency (in %) at a certain luminance. LT80 @ 1000 cd/m² is the lifetime by which the OLED has dropped from an initial luminance of 1000 cd/m² to 80% of the initial intensity, i.e. to 800 cd/m².

The properties of the various OLEDs are summarised in Table C3. Examples V01, V02 and V03 are comparative examples, all other examples show properties of OLEDs containing material combinations according to the invention. Blue emitting OLEDs are prepared using the material combinations according to the invention as hole-transport layer (HTL) and emission layer (EML).

TABLE C3

Properties of the OLEDs

| Example | HTL polymer | EML dopant | efficiency at 1000 cd/m² % EQE | LD80 at 1.000 cd/m² [h] |
|---|---|---|---|---|
| V01 | V-HTL1 | V-D1 | 4.4 | 198 |
| V02 | HTL2 | V-D1 | 7.6 | 143 |
| V03 | V-HTL1 | D1 | 5.7 | 205 |
| C01 | HTL1 | D1 | 8.9 | 265 |
| C02 | HTL2 | D1 | 8.8 | 235 |
| C03 | HTL3 | D1 | 9.0 | 290 |
| C04 | HTL4 | D1 | 8.9 | 285 |
| C05 | HTL5 | D1 | 9.1 | 310 |
| C06 | HTL6 | D1 | 9.0 | 270 |
| C07 | HTL1 | D2 | 9.4 | 285 |
| C08 | HTL2 | D2 | 9.5 | 260 |

TABLE C3-continued

Properties of the OLEDs

| Example | HTL polymer | EML dopant | efficiency at 1000 cd/m² % EQE | LD80 at 1.000 cd/m² [h] |
|---|---|---|---|---|
| C09 | HTL3 | D2 | 9.3 | 305 |
| C10 | HTL4 | D2 | 9.3 | 290 |
| C11 | HTL5 | D2 | 9.6 | 325 |
| C12 | HTL6 | D2 | 9.4 | 280 |
| C13 | HTL1 | D3 | 8.7 | 255 |
| C14 | HTL2 | D3 | 8.6 | 230 |
| C15 | HTL3 | D3 | 8.8 | 260 |
| C16 | HTL4 | D3 | 8.6 | 255 |
| C17 | HTL5 | D3 | 8.7 | 290 |
| C18 | HTL6 | D3 | 9.0 | 250 |

Table C3 shows, that the material combinations according to the present invention give rise to improvements over the prior art, in particular with respect to efficiency and lifetime.

The invention claimed is:
1. An organic electroluminescent device comprising:
an anode;
a cathode;
at least one blue light-emitting layer arranged between the cathode and the anode; and
at least one hole-transport layer arranged between the anode and the at least one blue light-emitting layer;
wherein the at least one blue light-emitting layer comprises an elongated bis-indenofluorene derivative, and
wherein the at least one hole-transport layer comprises a polymer with non-conjugated units and
wherein the elongated bis-indenofluorene derivative is a compound of formula (1):

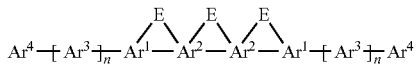

wherein
$Ar^1$ is identically or differently on each occurrence an aryl or heteroaryl group having 6 to 18 aromatic ring atoms, which in each case is optionally substituted by one or more radicals $R^1$, wherein at least one group $Ar^1$ in formula (1) has 10 or more aromatic ring atoms;
$Ar^2$ is identically or differently on each occurrence an aryl or heteroaryl group having 6 aromatic ring atoms, which in each case is optionally substituted by one or more radicals $R^1$;
$Ar^3$ and $Ar^4$
are identically or differently on each occurrence an aromatic or heteroaromatic ring system having 5 to 25 aromatic ring atoms, which in each case is optionally substituted by one or more radicals R1;
E is identically or differently on each occurrence selected from the group consisting of —BR⁰—, —C(R⁰)₂—, —C(R⁰)₂—C(R⁰)₂—, —C(R⁰)₂—O—, —C(R⁰)₂—S—, —R⁰C═CR⁰—, —R⁰C═N—, —Si(R⁰)₂—, —Si(R⁰)₂—Si(R⁰)₂—, —C(═O)—, —C(═NR⁰)—, —C(═C(R⁰)₂)—, —O—, —S—, —S(═O)—, —SO₂—, —N(R⁰)—, —P(R⁰)— and —((═O)R⁰)—, and two groups E are optionally in a cis- or trans-position relative to each other;
$R^0$ and $R^1$
are identically or differently on each occurrence H, D, F, Cl, Br, I, CHO, CN, N(Ar⁵)₂, C(═O)Ar⁵, P(═O)(Ar⁵)₂, S(═O)Ar⁵, S(═O)₂Ar⁵, NO₂, Si(R²)₃, B(OR²)₂, OSO₂R², a straight-chain alkyl, alkoxy, or thioalkyl group having 1 to 40 C atoms or a branched or a cyclic alkyl, alkoxy, or thioalkyl group having 3 to 40 C atoms, each of which is optionally substituted by one or more radicals $R^2$, wherein in each case one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $P(=O)(R^2)$, $SO$, $SO_2$, $O$, $S$ or $CONR^2$ and wherein one or more H atoms are optionally replaced by D, F, Cl, Br, I, CN, or $NO_2$, an aromatic or hetero-aromatic ring system having 5 to 60 aromatic ring atoms, which in each case is optionally substituted by one or more radicals $R^2$, or an aryloxy group having 5 to 40 aromatic ring atoms, which is optionally substituted by one or more radicals $R^2$, and wherein two adjacent substituents $R^0$ and/or two adjacent substituents $R^1$ optionally define a mono- or polycyclic, aliphatic ring system or aromatic ring system, which is optionally substituted by one or more radicals $R^2$;

$R^2$ is identically or differently on each occurrence H, D, F, Cl, Br, I, CHO, CN, $N(Ar^5)_2$, $C(=O)Ar^5$, $P(=O)(Ar^5)_2$, $S(=O)Ar^5$, $S(=O)_2Ar^5$, $NO_2$, $Si(R^3)_3$, $B(OR^3)_2$, $OSO_2R^3$, a straight-chain alkyl, alkoxy, or thioalkyl group having 1 to 40 C atoms or a branched or cyclic alkyl, alkoxy, or thioalkyl group having 3 to 40 C atoms, each of which is optionally substituted by one or more radicals $R^3$, wherein in each case one or more non-adjacent $CH_2$ groups are optionally replaced by $R^3C=CR^3$, $C\equiv C$, $Si(R^3)_2$, $Ge(R^3)_2$, $Sn(R^3)_2$, $C=O$, $C=S$, $C=Se$, $P(=O)(R^3)$, $SO$, $SO_2$, $O$, $S$, or $CONR^3$ and wherein one or more H atoms are optionally replaced by D, F, Cl, Br, I, CN, or $NO_2$, an aromatic or heteroaromatic ring system having 5 to 60 aromatic ring atoms, which in each case is optionally substituted by one or more radicals $R^3$, or an aryloxy group having 5 to 60 aromatic ring atoms, which is optionally substituted by one or more radicals $R^3$, and wherein two adjacent substituents $R^2$ optionally define a mono- or polycyclic, aliphatic ring system or aromatic ring system, which is optionally substituted by one or more radicals $R^3$;

$R^3$ is identically or differently on each occurrence H, D, F, Cl, Br, I, CN, a straight-chain alkyl, alkoxy, or thioalkyl group having 1 to 20 C atoms or a branched or cyclic alkyl, alkoxy, or thioalkyl group having 3 to 20 C atoms, wherein in each case one or more non-adjacent $CH_2$ groups are optionally replaced by $SO$, $SO_2$, $O$, or $S$ and wherein one or more H atoms are optionally replaced by D, F, Cl, Br, or I, or an aromatic or heteroaromatic ring system having 5 to 24 C atoms;

$Ar^5$ is an aromatic or heteroaromatic ring system having 5 to 24 aromatic ring atoms, which in each case also optionally substituted by one or more radicals $R^3$;

n is an integer from 1 to 20;

wherein if n is equal to 1 and at least one of group $Ar^3$ or group $Ar^4$ is a phenyl group, then the compound of formula (1) bears at least one group $R^0$ or $R^1$, which is a straight-chain alkyl group having 2 to 40 C atoms or a branched or cyclic alkyl group having 3 to 40 C atoms, each of which is optionally substituted by one or more radicals $R^2$, and wherein the at least one non-conjugated polymer is a polymer comprising at least one structural unit of formula (I):

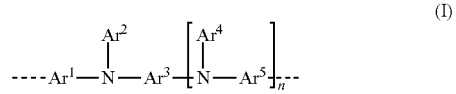

(I)

wherein $Ar^1$, $Ar^2$, $Ar^3$, $Ar^4$, and $Ar^5$
are identically or differently selected from the group consisting of heteroaromatic ring systems having 5 to 40 aromatic ring atoms, which are optionally substituted by one or more radicals $R^1$, and aromatic ring systems having 6 to 40 aromatic ring atoms, which are optionally substituted by one or more radicals $R^1$; with the proviso that at least one of groups $Ar^2$ and $Ar^4$ is in each case substituted by a group $R^4$ in at least one position ortho to the bond to N, wherein the group $R^4$ optionally defines a ring with the corresponding group $Ar^2$ or $Ar^4$ to which it is bonded, and wherein $R^4$ is bonded to a group selected from the group consisting of groups $Ar^2$ and $Ar^4$ directly or via a linker group X;

$R^1$ is identically or differently on each occurrence selected from the group consisting of H, D, F, $C(=O)R^2$, CN, $Si(R^2)_3$, $N(R^2)_2$, $P(=O)(R^2)_2$, $OR^2$, $S(=O)R^2$, $S(=O)_2R^2$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; wherein two or more radicals $R^1$ are optionally linked to one another and optionally define a ring; wherein the alkyl, alkoxy, alkenyl, and alkynyl groups and the aromatic ring systems and heteroaromatic ring systems are in each case optionally substituted by one or more radicals $R^2$, and wherein one or more $CH_2$ groups in the alkyl, alkoxy, alkenyl, and alkynyl groups are optionally replaced by $-R^2C=CR^2-$, $-C\equiv C-$, $Si(R^2)_2$, $C=O$, $C=NR^2$, $-C(=O)O-$, $-C(=O)NR^2-$, $NR^2$, $P(=O)(R^2)$, $-O-$, $-S-$, $SO$, or $SO_2$;

$R^2$ is identically or differently on each occurrence selected from the group consisting of H, D, F, $C(=O)R^3$, CN, $Si(R^3)_3$, $N(R^3)_2$, $P(=O)(R^3)_2$, $OR^3$, $S(=O)R^3$, $S(=O)_2R^3$, straight-chain alkyl or alkoxy groups having 1 to 20 C atoms, branched, or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; wherein two or more radicals $R^1$ or $R^2$ are optionally linked to one another and optionally define a ring; wherein the alkyl, alkoxy, alkenyl, and alkynyl groups and the aromatic ring systems and heteroaromatic ring systems are in each case optionally substituted by one or more radicals $R^3$; and wherein one or more $CH_2$ groups in the alkyl, alkoxy, alkenyl, and alkynyl groups are optionally replaced by $-R^3C=CR^3-$, $-C\equiv C-$, $Si(R^3)_2$, $C=O$, $C=NR^3$, $-C(=O)O-$, $-C(=O)NR^3-$, $NR^3$, $P(=O)(R^3)$, $-O-$, $-S-$, $SO$, or $SO_2$;

$R^3$ is identically or differently on each occurrence selected from the group consisting of H, D, F, CN, alkyl, or alkoxy groups having 1 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; wherein two or more radicals $R^3$ are optionally linked to one another and optionally define a ring; and wherein the alkyl, alkoxy, alkenyl, and alkynyl groups, aromatic ring systems, and heteroaromatic ring systems are optionally substituted by F or CN;

R[4] is identically or differently on each occurrence selected from the group consisting of heteroaromatic ring systems having 5 to 40 aromatic ring atoms, which are optionally substituted by one or more radicals R[2], and aromatic ring systems having 6 to 40 aromatic ring atoms, which are optionally substituted by one or more radicals R[2];

X is identically or differently on each occurrence selected from the group consisting of $C(R^2)_2$, $Si(R^2)_2$, $NR^2$, O, S, and C=O;

n is equal to 0 or 1;

and at least one structural unit selected from the group consisting of:

structural units A, consisting of a planar aromatic group selected from the group consisting of aryl groups having 6 to 40 aromatic ring atoms and heteroaryl groups having 6 to 40 aromatic ring atoms, wherein the planar aromatic group has at least one radical R[5] which, owing to its space requirement, causes a rotation of the planar aromatic group relative to the plane formed by the planar aromatic groups of the directly adjacent structural units, and wherein the above-mentioned aryl groups and heteroaryl groups are in each case optionally substituted by one or more further radicals R[5];

structural units B which comprise two groups, connected directly to one another, selected from the group consisting of aryl groups having 6 to 40 aromatic ring atoms, which are in each case optionally substituted by one or more radicals R[5], and heteroaryl groups having 5 to 40 aromatic ring atoms, which are in each case optionally substituted by one or more radicals R[5], wherein the plane of conjugation of the second aryl or heteroaryl group is rotated relative to the plane of conjugation of the first aryl or heteroaryl group about the axis of the bond between the two groups; and structural units C of formula (II-C):

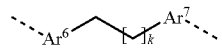

wherein

Ar[6] and Ar[7]

are identically or differently on each occurrence selected from the group consisting of aromatic ring systems having 6 to 40 aromatic ring atoms, which are optionally substituted by one or more radicals R[5], and heteroaromatic ring systems having 5 to 40 aromatic ring atoms, which are optionally substituted by one or more radicals R[5];

R[5] is identically or differently on each occurrence selected from the group consisting of H, D, F, $C(=O)R^2$, CN, $Si(R^2)_3$, $N(R^2)_2$, $P(=O)(R^2)_2$, $OR^2$, $S(=O)R^2$, $S(=O)_2R^2$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; wherein two or more radicals R[1] are optionally linked to one another and optionally define a ring; wherein the alkyl, alkoxy, alkenyl, and alkynyl groups and the aromatic ring systems and heteroaromatic ring systems are in each case optionally substituted by one or more radicals R[2]; and wherein one or more $CH_2$ groups in the alkyl, alkoxy, alkenyl, and alkynyl groups are optionally replaced by $-R^2C=CR^2-$, $-C\equiv C-$, $Si(R^2)_2$, C=O, $C=NR^2$, $-C(=O)O-$, $-C(=O)NR^2-$, $NR^2$, $P(=O)(R^2)$, $-O-$, $-S-$, SO, or $SO_2$;

k has a value of 0 to 9;

wherein one or more $CH_2$ units in the alkylene chain of formula (II-C) are optionally replaced by a divalent unit selected from the group consisting of C=O, $=NR^5$, $-C(=O)O-$, $-C(=O)NR^5-$, $Si(R^5)_2$, $NR^5$, $P(=O)(R^5)$, O, S, SO, and $SO_2$; and wherein one or more H atoms in the alkylene chain of formula (II-C) are in each case optionally replaced by a radical R[5].

2. The organic electroluminescent device of claim 1, wherein the elongated bis-indenofluorene derivative of formula (1) is selected from the group consisting of compounds of formulae (1-1) and (1-2):

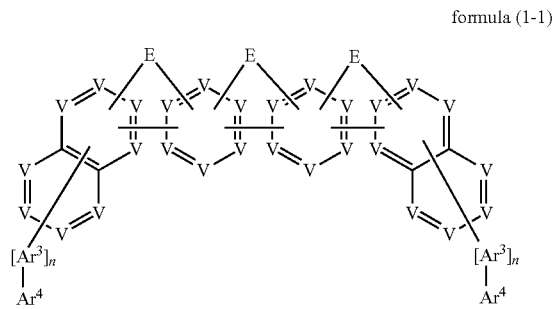

formula (1-1)

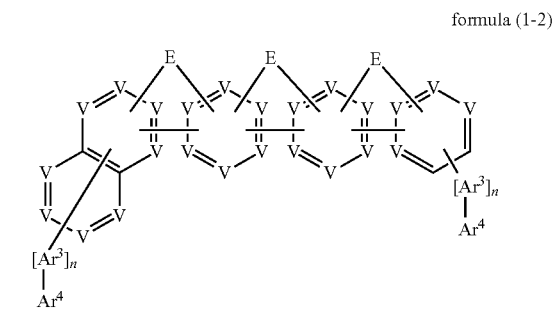

formula (1-2)

wherein

V is identically or differently on each occurrence CR[1] or N, and V is C when V is bonded to a group Ar[3] or to a group E.

3. The organic electroluminescent device of claim 2, wherein the elongated bis-indenofluorene derivative of formulae (1-1) and (1-2) are selected from the group consisting of compounds of formulae (1-1-1) to (1-1-11) and (1-2-1) to (1-2-7):

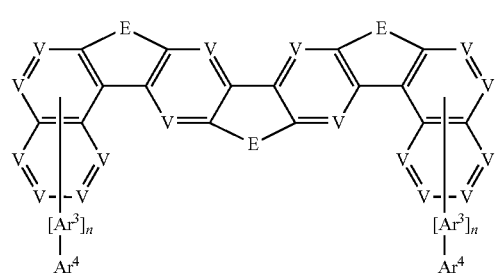
(1-1-1)
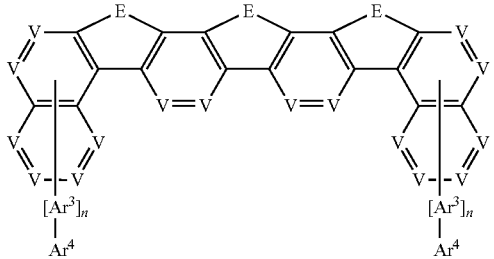
(1-1-2)
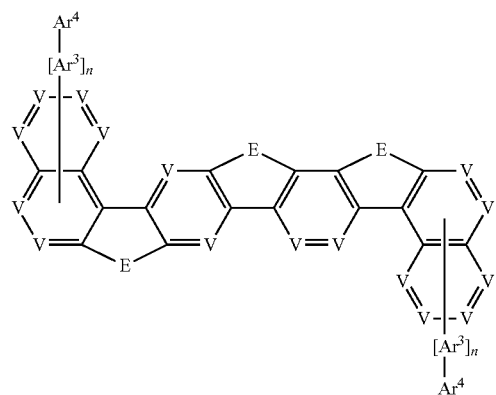
(1-1-3)
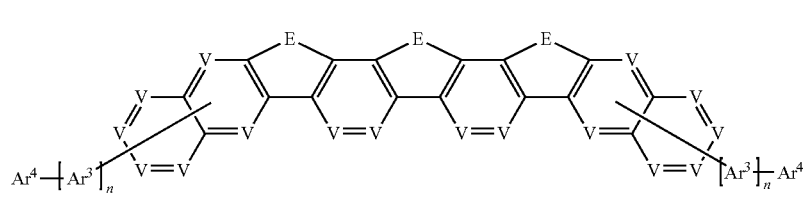
(1-1-4)
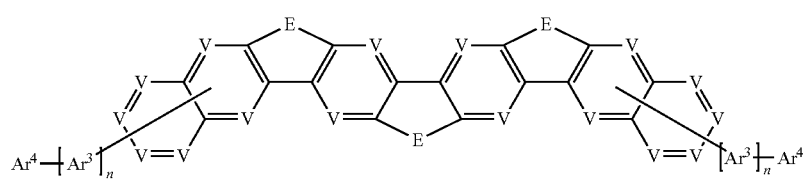
(1-1-5)
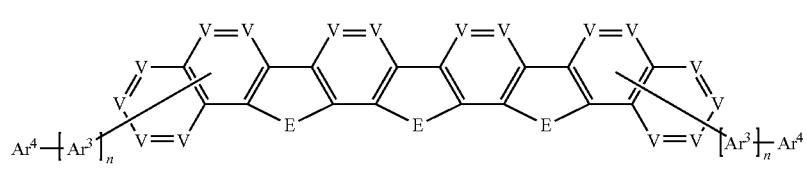
(1-1-6)
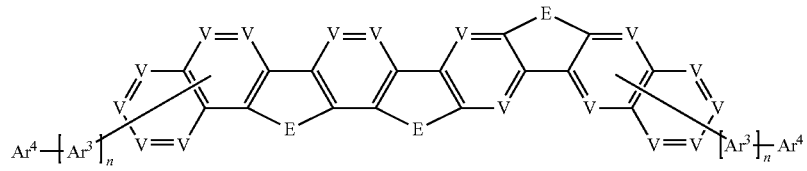
(1-1-7)
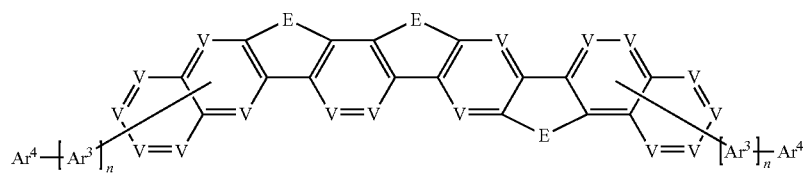
(1-1-8)

(1-1-9)
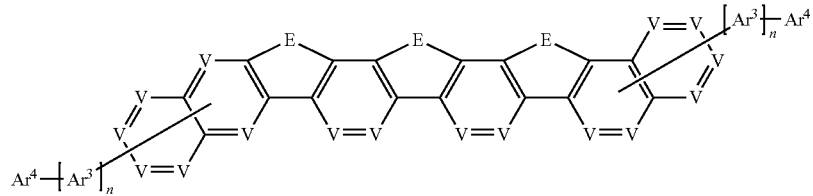
(1-1-10)
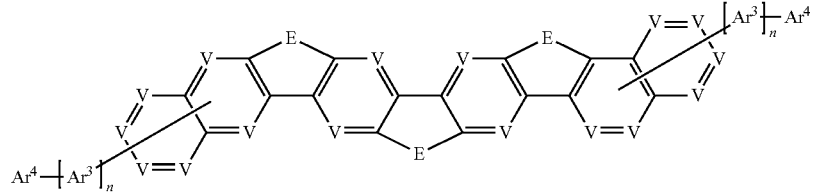
(1-1-11)
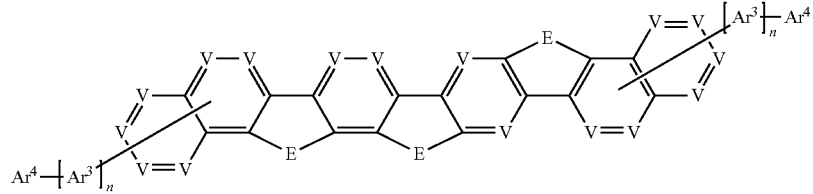
(1-2-1)
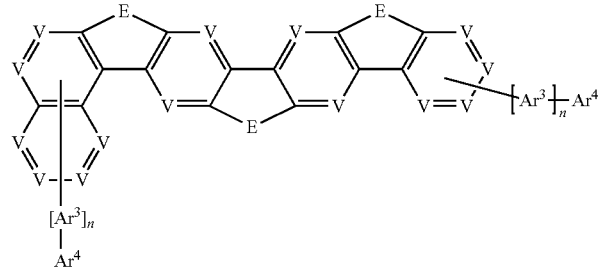
(1-2-2)
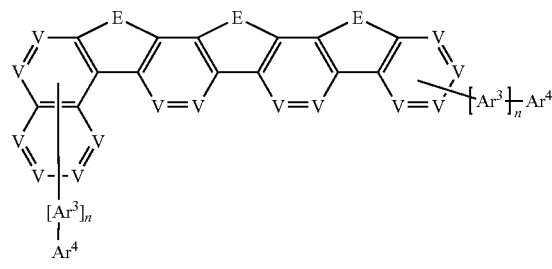
(1-2-3)
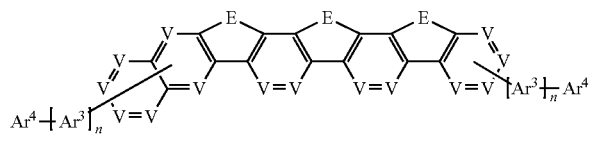
(1-2-4)
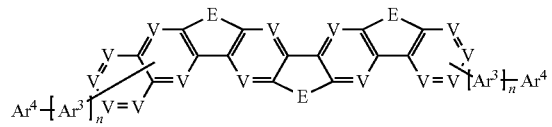
(1-2-5)
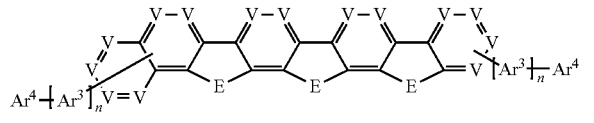
(1-2-6)
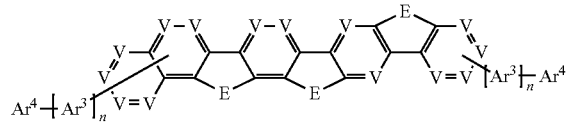
(1-2-7)
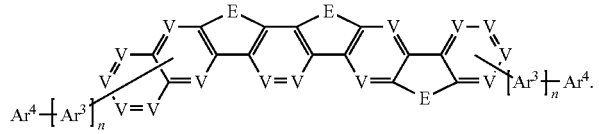

4. The organic electroluminescent device of claim 1, wherein the at least one structural unit of formula (I) is selected from the group consisting of formulae (I-1-A), (I-2-A-1), (I-2-A-2), and (I-2-A-3):

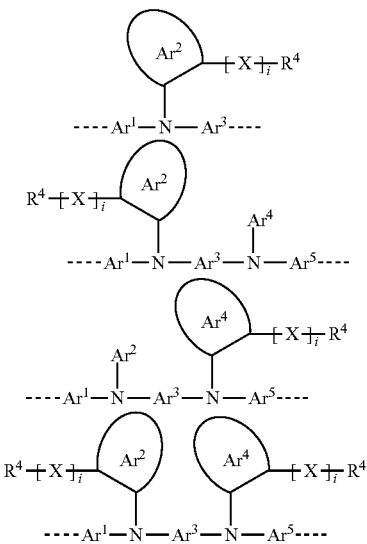

wherein
i is equal to 0 or 1.

5. The organic electroluminescent device of claim 1, wherein the at least one non-conjugated polymer comprises between 10 and 60 mol % structural units of formula (I), based on 100 mol % of all copolymerized monomers present in the polymer as structural units.

6. The organic electroluminescent device of claim 1, wherein the structural unit A is selected from the group consisting of formula (II-A):

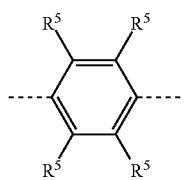

wherein at least one group $R^5$ is not equal to H or D.

7. The organic electroluminescent device of claim 1, wherein the structural unit B is selected from the group consisting of formula (II-B):

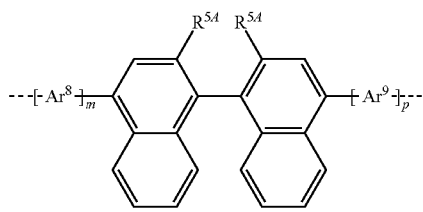

wherein
$R^{5A}$ is identically or differently on each occurrence selected from the group consisting of H, D, F, C(=O)$R^2$, CN, Si($R^2$)$_3$, N($R^2$)$_2$, P(=O)($R^2$)$_2$, O$R^2$, S(=O)$R^2$, S(=O)$_2R^2$, straight-chain alkyl or alkoxy groups having 1 to 20 C atoms, branched or cyclic alkyl or alkoxy groups having 3 to 20 C atoms, alkenyl or alkynyl groups having 2 to 20 C atoms, aromatic ring systems having 6 to 40 aromatic ring atoms, and heteroaromatic ring systems having 5 to 40 aromatic ring atoms; wherein two or more radicals $R^1$ are optionally linked to one another and optionally define a ring; wherein the alkyl, alkoxy, alkenyl, and alkynyl groups and the aromatic ring systems and heteroaromatic ring systems are in each case optionally substituted by one or more radicals $R^2$; and wherein one or more CH$_2$ groups in the alkyl, alkoxy, alkenyl, and alkynyl groups are optionally replaced by —$R^2$C=C$R^2$—, —C≡C—, Si($R^2$)$_2$, C=O, C=N$R^2$, —C(=O)O—, —C(=O)N$R^2$—, N$R^2$, P(=O)($R^2$), —O—, —S—, SO, or SO$_2$;

$Ar^8$ and $Ar^9$
are identically or differently on each occurrence selected from the group consisting of aromatic ring systems having 6 to 40 aromatic ring atoms, which are optionally substituted by one or more radicals $R^5$, and heteroaromatic ring systems having 5 to 40 aromatic ring atoms, which are optionally substituted by one or more radicals $R^5$;

m and p
are identically or differently on each occurrence selected from 0 and 1;

and the naphthyl groups are in each case be optionally substituted by a radical $R^5$ at the positions depicted as unsubstituted.

8. The organic electroluminescent device of claim 1, wherein the structural unit C is selected from the group consisting of formula (II-C-1):

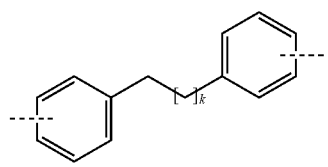

wherein the positions depicted as unsubstituted on the benzene rings and on the alkylene chain are in each case optionally substituted by a radical $R^5$, wherein k has a value of 0 to 9, wherein CH$_2$ groups in the alkylene chain are in each case optionally replaced by a divalent group 0.

9. The organic electroluminescent device of claim 1, wherein the at least one non-conjugated polymer comprises between 20 and 75 mol % of structural units A, B, and/or C, based on 100 mol % of all copolymerized monomers present in the polymer as structural units.

10. The organic electroluminescent device of claim 1, wherein the at least one non-conjugated polymer comprises at least one crosslinkable structural unit comprising a crosslinkable group Q.

11. The organic electroluminescent device of claim 1, wherein the at least one non-conjugated polymer which comprises a structural unit of formula (I), a structural unit of A, B, and/or C, and optionally at least one crosslinkable structural unit comprising a crosslinkable group Q, and further comprises further structural units.

12. A method for producing the organic electroluminescent device of claim 1 comprising the following steps:

(a) depositing at least one hole-transport layer comprising a polymer with non-conjugated units on an anode;
(b) depositing at least one blue light-emitting layer comprising an elongated bis-indenofluorene derivative on the at least one hole-transport layer; and
(c) forming a cathode.

13. The organic electroluminescent device of claim 1, wherein $Ar^5$ is an aromatic or heteroaromatic ring system having 5 to 18 aromatic ring atoms, which is in each case also optionally substituted by one or more radicals $R^3$.

14. The organic electroluminescent device of claim 4, wherein i is equal to 0.

15. The organic electroluminescent device of claim 10, wherein the at least one non-conjugated polymer comprises from 1 to 50 mol %, based on 100 mol % of all copolymerized monomers present in the polymer as structural units, of at least one crosslinkable structural unit comprising a crosslinkable group Q.

\* \* \* \* \*